US012396302B2

(12) United States Patent
Sakai et al.

(10) Patent No.: US 12,396,302 B2
(45) Date of Patent: Aug. 19, 2025

(54) LIGHT-EMITTING DEVICE

(71) Applicant: NICHIA CORPORATION, Anan (JP)

(72) Inventors: Kazuaki Sakai, Tokushima (JP); Kenta Mitsuyama, Anan (JP); Yoshio Ichihara, Anan (JP)

(73) Assignee: NICHIA CORPORATION, Anan (JP)

( * ) Notice: Subject to any disclaimer, the term of this patent is extended or adjusted under 35 U.S.C. 154(b) by 477 days.

(21) Appl. No.: 17/937,408

(22) Filed: Sep. 30, 2022

(65) Prior Publication Data

US 2023/0106437 A1 Apr. 6, 2023

(30) Foreign Application Priority Data

Sep. 30, 2021 (JP) ................................ 2021-162286
Feb. 18, 2022 (JP) ................................ 2022-024240
May 23, 2022 (JP) ................................ 2022-083492

(51) Int. Cl.
*H10H 20/85* (2025.01)
*H01L 25/075* (2006.01)
*H10H 20/856* (2025.01)
*H10H 20/857* (2025.01)

(52) U.S. Cl.
CPC ....... *H10H 20/856* (2025.01); *H01L 25/0753* (2013.01); *H10H 20/857* (2025.01)

(58) Field of Classification Search
CPC .... H10H 20/856; H10H 20/857; H10H 20/85; H10H 20/855; H01L 25/0753
See application file for complete search history.

(56) References Cited

U.S. PATENT DOCUMENTS 7,821,023 B2 10/2010 Yuan et al.
7,956,378 B2 6/2011 Son
8,138,507 B2 * 3/2012 Seok .................. H10H 20/853 257/98
8,207,546 B2 6/2012 Harada et al.
8,614,451 B2 12/2013 Hanya
8,937,324 B2 1/2015 Helbing et al.
2003/0168720 A1 9/2003 Kamada
(Continued)

FOREIGN PATENT DOCUMENTS

CN 113875026 A 12/2021
JP 2000164939 A 6/2000
(Continued)

*Primary Examiner* — Nicholas J Tobergte
(74) *Attorney, Agent, or Firm* — Hunton Andrews Kurth LLP

(57) ABSTRACT

A light-emitting device includes a resin package including a plurality of recessed portions, a plurality of light-emitting elements, each disposed in the corresponding one of the plurality of recessed portions, a plurality of reflective members, and a mold resin portion including a first lens portion, a second lens portion, and a third lens portion. In the plan view, a maximum width of the first lens portion is less than a maximum width of an inner upper surface of the corresponding one of the plurality of recessed portions, a maximum width of the second lens portion is less than a maximum width of an inner upper surface of the corresponding one of the plurality of recessed portions, and a maximum width of the third lens portion is less than a maximum width of an inner upper surface of the corresponding one of the plurality of recessed portions.

32 Claims, 76 Drawing Sheets

(56) References Cited

U.S. PATENT DOCUMENTS

| | | | |
|---|---|---|---|
| 2006/0065957 A1 | 3/2006 | Hanya | |
| 2008/0298063 A1 | 12/2008 | Hayashi | |
| 2010/0072496 A1 | 3/2010 | Kobayakawa | |
| 2012/0001208 A1 | 1/2012 | Brick et al. | |
| 2012/0061709 A1 | 3/2012 | Pachler | |
| 2012/0162998 A1 | 6/2012 | Takahashi et al. | |
| 2012/0193665 A1 | 8/2012 | Yamada | |
| 2012/0243261 A1 | 9/2012 | Yamamoto et al. | |
| 2013/0170208 A1 | 7/2013 | Kuwaharada et al. | |
| 2015/0270450 A1 | 9/2015 | Kuroki et al. | |
| 2015/0308634 A1* | 10/2015 | van de Ven | G09F 9/33 362/84 |
| 2018/0151790 A1 | 5/2018 | Kim et al. | |
| 2018/0180249 A1 | 6/2018 | Yamada et al. | |
| 2018/0358521 A1 | 12/2018 | Marutani | |
| 2020/0098957 A1 | 3/2020 | Pang et al. | |
| 2020/0176643 A1 | 6/2020 | Pang et al. | |
| 2020/0313058 A1 | 10/2020 | Ukawa et al. | |
| 2022/0068894 A1* | 3/2022 | Ichihara | H10H 20/855 |
| 2022/0069181 A1* | 3/2022 | Mitsuyama | H10H 20/8506 |
| 2023/0095815 A1* | 3/2023 | Ichihara | H01L 25/0753 257/79 |

FOREIGN PATENT DOCUMENTS

| | | | |
|---|---|---|---|
| JP | 2002223005 | A | 8/2002 |
| JP | 2002305328 | A | 10/2002 |
| JP | 2003332634 | A | 11/2003 |
| JP | 2004363632 | A | 12/2004 |
| JP | 2005057310 | A | 3/2005 |
| JP | 2006093435 | A | 4/2006 |
| JP | 2006237652 | A | 9/2006 |
| JP | 2010219324 | A | 9/2010 |
| JP | 2010238846 | A | 10/2010 |
| JP | 2012089728 | A | 5/2012 |
| JP | 2012156442 | A | 8/2012 |
| JP | 2012519975 | A | 8/2012 |
| JP | 2012522359 | A | 9/2012 |
| JP | 2012204370 | A | 10/2012 |
| JP | 5233170 | B2 | 4/2013 |
| JP | 2013219397 | A | 10/2013 |
| JP | 2014033168 | A | 2/2014 |
| JP | 2014093464 | A | 5/2014 |
| JP | 2014220312 | A | 11/2014 |
| JP | 2014239263 | A | 12/2014 |
| JP | 2015173287 | A | 10/2015 |
| JP | 2015179777 | A | 10/2015 |
| JP | 2016225664 | A | 12/2016 |
| JP | 2017055093 | A | 3/2017 |
| JP | 2018019091 | A | 2/2018 |
| JP | 2018085515 | A | 5/2018 |
| JP | 2018107279 | A | 7/2018 |
| JP | 2019003994 | A | 1/2019 |
| JP | 2019083343 | A | 5/2019 |
| JP | 2020115584 | A | 7/2020 |
| JP | 2020170737 | A | 10/2020 |
| WO | 2008038708 | A1 | 4/2008 |
| WO | 2012049854 | A1 | 4/2012 |
| WO | 2012090576 | A1 | 7/2012 |
| WO | 2020232668 | A1 | 11/2020 |

* cited by examiner

LIGHT-EMITTING DEVICE

CROSS-REFERENCE TO RELATED APPLICATION

This application claims priority to Japanese Patent Application No. 2021-162286, filed on Sep. 30, 2021, Japanese Patent Application No. 2022-024240 filed on Feb. 18, 2022 and Japanese Patent Application No. 2022-083492 filed on May 23, 2022, the disclosures of which are hereby incorporated by reference in their entirety.

BACKGROUND

The present disclosure relates to a light-emitting device.

As a light-emitting device including a light-emitting diode (LED), a shell-shaped (lamp-type) light-emitting device, a surface mounting type (SMD type) light-emitting device, and the like are known. Because he lamp-type light-emitting devices have high light distribution in a frontward direction, such light-emitting devices are preferably used for large display devices, such as an LED display device, in which light-emitting devices are arranged in a matrix pattern as pixels.

JP 2006-93435 A and US 2020/0176643 describe a surface-mountable light-emitting device including a lens on a light-emitting surface of the light-emitting device.

SUMMARY

One non-limiting exemplary embodiment of the present disclosure provides a light-emitting device that can extract light with high efficiency in the frontward direction and that can be miniaturized.

A light-emitting device according to an embodiment of the present disclosure includes a resin package including a plurality of leads and a resin member fixing at least a part of the plurality of leads. The resin package is provided, on a primary surface, with a plurality of recessed portions including a first recessed portion, a second recessed portion, and a third recessed portion each defined by the resin member and the plurality of leads. An inner upper surface of each of the first recessed portion, the second recessed portion, and the third recessed portion includes an exposed region where a part of any one of the plurality of leads is exposed. The light-emitting device further includes a first light-emitting element disposed in the exposed region of the first recessed portion, a second light-emitting element disposed in the exposed region of the second recessed portion, a third light-emitting element disposed in the exposed region of the third recessed portion, a first reflective member disposed in the first recessed portion and surrounding, in a plan view, the first light-emitting element, a second reflective member disposed in the second recessed portion and surrounding, in the plan view, the second light-emitting element, a third reflective member disposed in the third recessed portion and surrounding, in the plan view, the third light-emitting element, and a mold resin portion including a first lens portion positioned above the first light-emitting element, a second lens portion positioned above the second light-emitting element, and a third lens portion positioned above the third light-emitting element. Each of the first lens portion, the second lens portion, and the third lens portion has a convex shape protruding upward from the primary surface. In the plan view, a maximum width of the first lens portion is less than a maximum width of the inner upper surface of the first recessed portion, a maximum width of the second lens portion is less than a maximum width of the inner upper surface of the second recessed portion, and a maximum width of the third lens portion is less than a maximum width of the inner upper surface of the third recessed portion.

A light-emitting device according to another embodiment of the present disclosure includes a resin package including a plurality of leads and a resin member fixing at least a part of the plurality of leads. The resin package is provided, on a primary surface, with a first region, a second region, and a third region each defined by the resin member and the plurality of leads. Each of the first region, the second region, and the third region includes an exposed region where a part of any one of the plurality of leads is exposed. The light-emitting device further includes a first light-emitting element disposed in the exposed region of the first region, a second light-emitting element disposed in the exposed region of the second region, a third light-emitting element disposed in the exposed region of the third region, a first reflective member disposed in the first region and surrounding, in a plan view, the first light-emitting element, a second reflective member disposed in the second region and surrounding, in the plan view, the second light-emitting element, a third reflective member disposed in the third region and surrounding, in the plan view, the third light-emitting element, and a mold resin portion including a first lens portion positioned above the first light-emitting element, a second lens portion positioned above the second light-emitting element, and a third lens portion positioned above the third light-emitting element. Each of the first lens portion, the second lens portion, and the third lens portion has a convex shape protruding upward from the primary surface. A width of the first lens portion in a cross-section in which the width of the first lens portion is minimized, among cross-sections including a line connecting a vertex of the first lens portion and a center point, in the plan view, of the first lens portion, is no greater than 5 times a width of the first light-emitting element. A width of the second lens portion in a cross-section in which the width of the second lens portion is minimized, among cross-sections including a line connecting a vertex of the second lens portion and a center point, in the plan view, of the second lens portion, is no greater than 5 times a width of the second light-emitting element. A width of the third lens portion in a cross-section in which the width of the third lens portion is minimized, among cross-sections including a line connecting a vertex of the third lens portion and a center point, in the plan view, of the third lens portion, is no greater than 5 times a width of the third light-emitting element.

According to an embodiment of the present disclosure, it is possible to provide a light-emitting device that can extract light with high efficiency in the frontward direction and that can be miniaturized.

DESCRIPTION OF EMBODIMENTS

Figure 1:
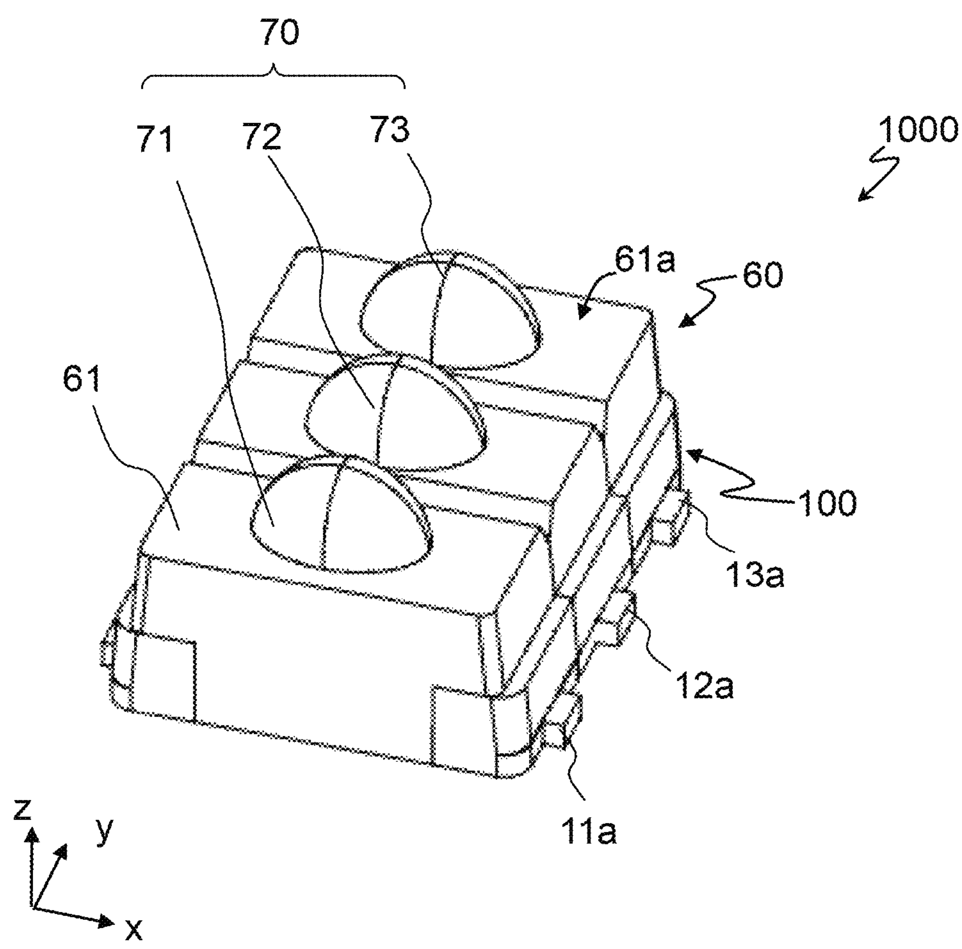
FIG. 1 is a schematic perspective view of a light-emitting device according to an embodiment of the present disclosure.

Embodiments of the present disclosure will be described below with reference to the drawings as appropriate. Light-emitting devices to be described below are intended to embody technical idea of the present disclosure, and the present disclosure is not limited to the description below unless otherwise specified. Further, the content described in one embodiment can also be applied to another embodiment or modified example. Furthermore, sizes, positional relationships, or the like of members illustrated in each of the drawings may be exaggerated for clarity of description.

In the description below, components having substantially the same function may be denoted by the same reference numerals and respective description thereof may be omitted. Also, components that are not referenced in the description may not be designated with reference numerals. In the following description, terms indicating a specific direction or position ("upper", "lower", "right", "left", and other terms including those terms) may be used. These terms are used merely facilitate understanding relative directions or positions in the referenced drawing. As long as the relative direction or position is the same as that described in the referenced drawing using the term such as "upper" or "lower", in drawings other than the drawings of the present disclosure, actual products, manufacturing devices, and the like, components is not necessarily arranged in the same manner as in the referenced drawing. In the present disclosure "parallel" includes, unless otherwise stated, in a case in which two straight lines, sides, faces, or the like are in a range from 0° to about +5°. Further, in the present disclosure, "perpendicular" or "orthogonal" includes, unless otherwise stated, in a case in which two straight lines, sides, faces, or the like are in a range of about +5° from 90°.

When describing a direction with reference to an axis and a positive (+) direction or a negative (−) direction of the axis relative to a reference is important, description will be made by distinguishing + and − of the axis. Accordingly, a direction toward the + side of the x-axis will be referred to as a "+x direction" and a direction toward the − side of the x-axis will be referred to as a "−x direction". Similarly, directions toward the + sides of the y-axis and the z-axis will be referred to as a "+y direction" and a "+z direction" and directions toward the − sides of the y-axis and the z-axis will be referred to as a "−y direction" and a "−z direction". On the other hand, in a case in which the direction along a certain axis is important and whether the direction is the + direction or the − direction of the axis is inconsequential, the direction will simply be described as the "axis direction". Further, a plane including the x-axis and the y-axis will be referred to as an "xy plane", a plane including the x-axis and the z-axis will be referred to as an "xz plane", and a plane including the y-axis and the z-axis will be referred to as a "yz plane".

First Embodiment

FIG. 1 is a schematic perspective view of a light-emitting device 1000 of a first embodiment according to the present disclosure.

In FIG. 1, arrows indicating an x-axis, a y-axis, and a z-axis that are mutually orthogonal are illustrated together. The arrows indicating these directions may also be illustrated in other drawings of the present disclosure. In a configuration exemplified in FIG. 1, an outer shape of the light-emitting device 1000 is a basically rectangular shape in a top view. Each side of the rectangular outer shape is parallel to the x-axis or the y-axis illustrated in the drawing. The z-axis is perpendicular to the x-axis and the y-axis. Note that the outer shape of the light-emitting device 1000 may not be the rectangular shape in a top view.

Figure 2A:
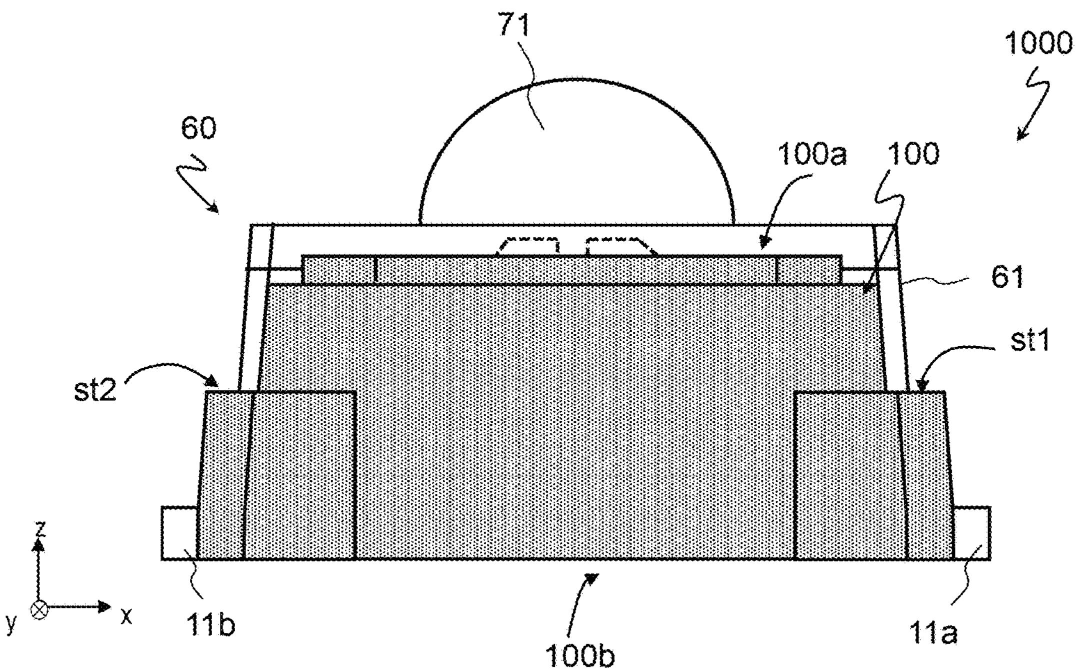
FIG. 2A is a schematic lateral side view of the light-emitting device illustrated in FIG. 1 when viewed in a y-axis direction.
Figure 2B:
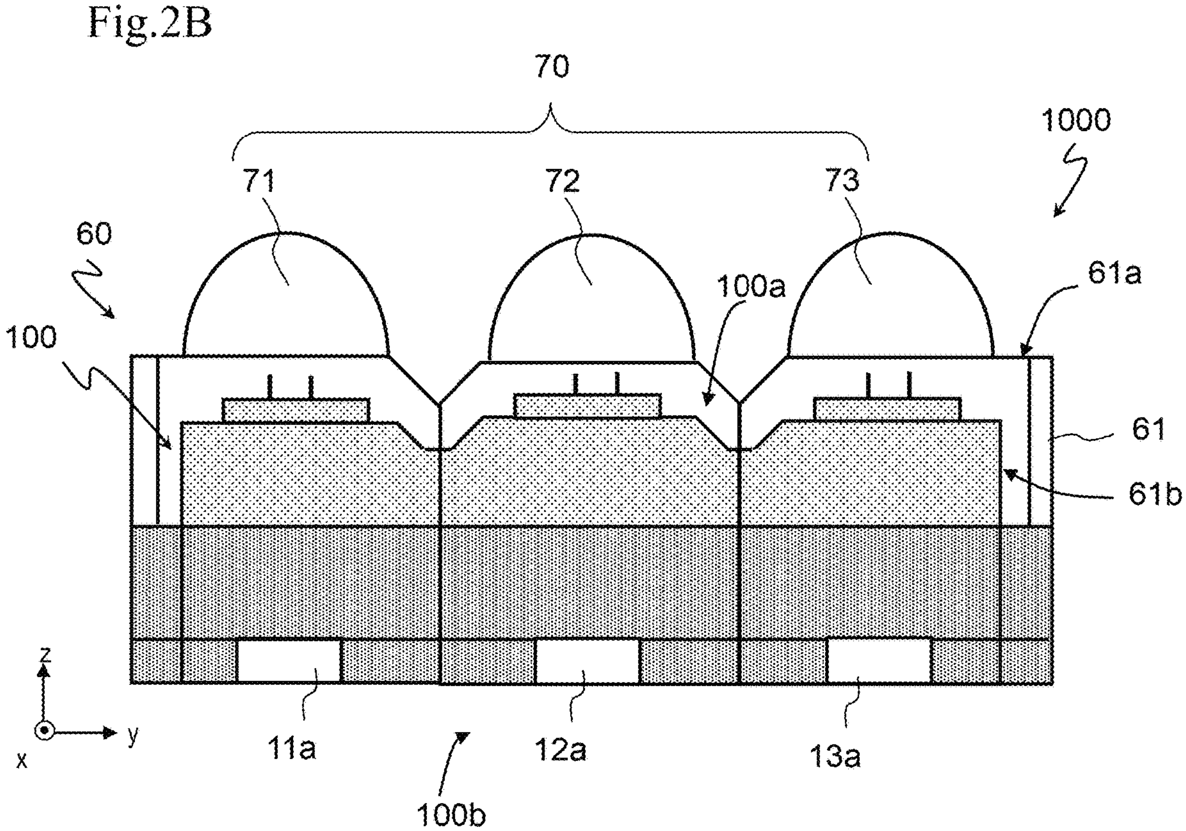
FIG. 2B is a schematic lateral side view of the light-emitting device illustrated in FIG. 1 when viewed in an x-axis direction.
Figure 2C:
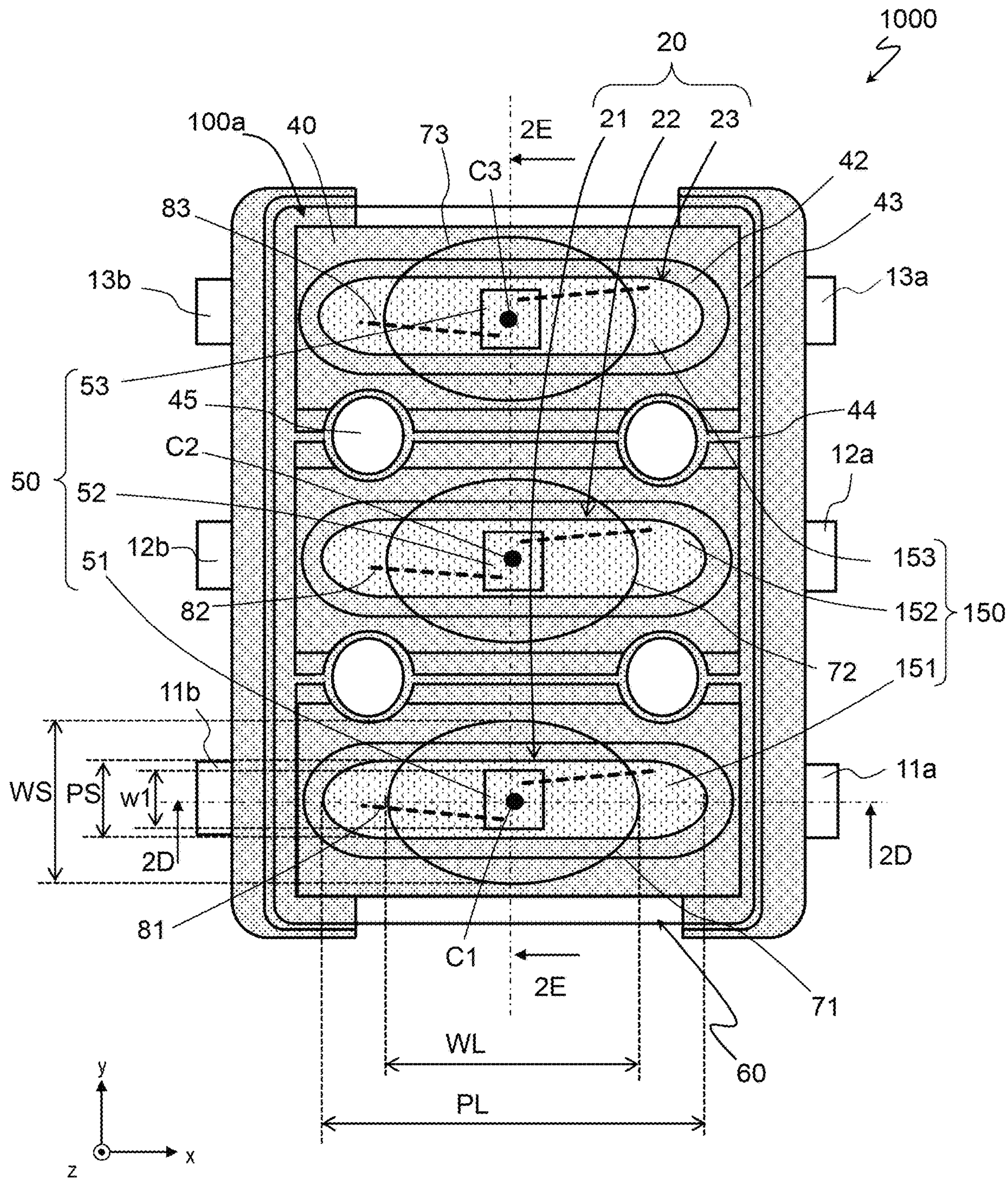
FIG. 2C is a schematic top view of the light-emitting device illustrated in FIG. 1.
Figure 2D:
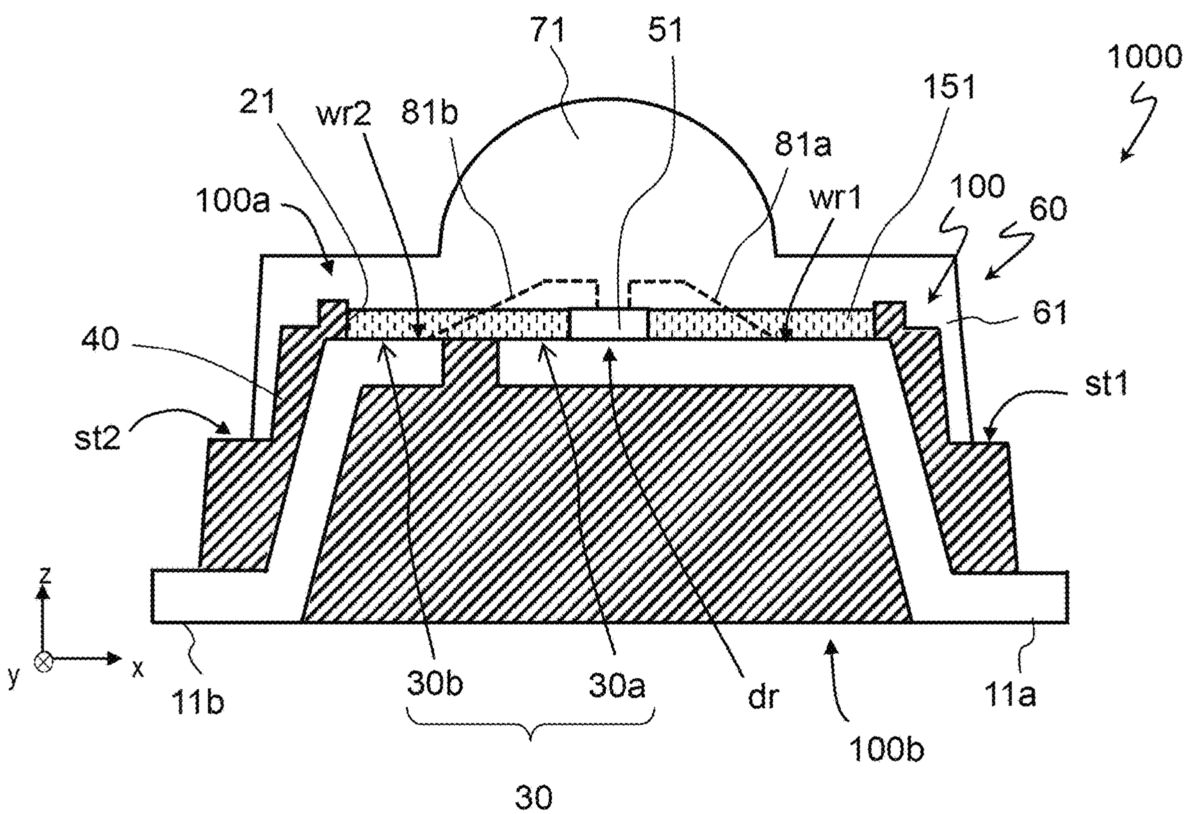
FIG. 2D is a schematic cross-sectional view taken along line 2D-2D illustrated in FIG. 2C.
Figure 2E:
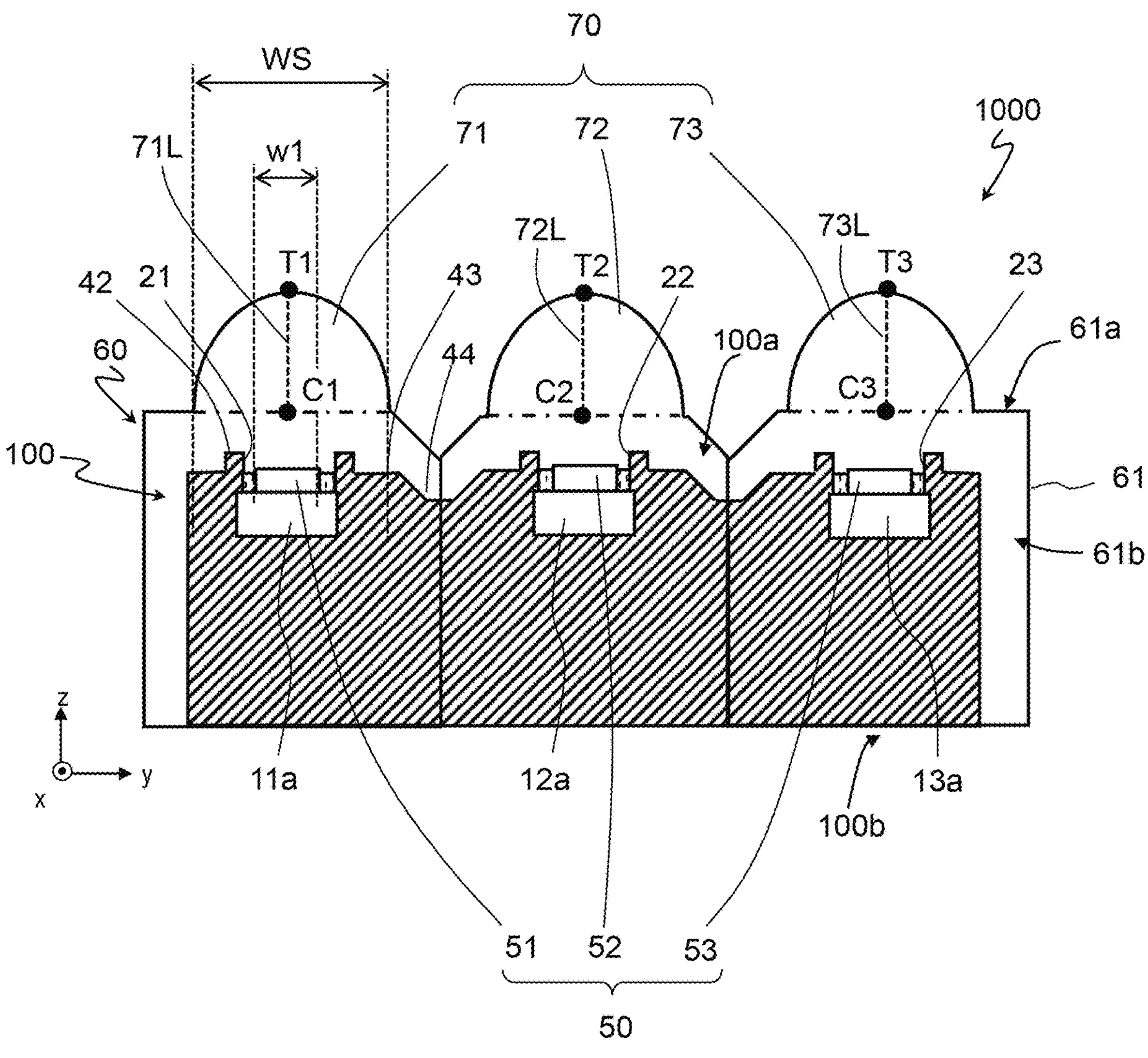
FIG. 2E is a schematic cross-sectional view taken along line 2E-2E illustrated in FIG. 2C.

FIG. 2A is a schematic lateral side view of the light-emitting device 1000 when viewed in the y-axis direction, and FIG. 2B is a schematic lateral side view of the light-emitting device 1000 when viewed in the x-axis direction. FIG. 2C is a schematic top view of the light-emitting device 1000. FIGS. 2D and 2E are schematic cross-sectional views taken along line 2D-2D illustrated in FIG. 2C and line 2E-2E illustrated in FIG. 2C, respectively.

As illustrated in FIGS. 2C to 2E, the light-emitting device 1000 includes a resin package 100, a plurality of light-emitting elements 50, a plurality of reflective members 150, and a mold resin portion 60 including a plurality of lens portions 70.

The resin package 100 includes a plurality of leads 11*a* to 13*b* and a resin member. In the present embodiment, the resin member is, for example, a first dark-colored resin member 40 formed of a dark-colored resin. The resin member may be formed of a dark-colored resin as a whole. Further, the resin member may be formed of a dark-colored resin in at least a portion exposed at a primary surface 100*a* of the resin package 100 in a plan view. The resin package 100 includes a plurality of recessed portions 20 including a first recessed portion 21, a second recessed portion 22, and a third recessed portion 23. Each of the recessed portions 20 is defined by the plurality of leads 11*a* to 13*b* and the first dark-colored resin member 40. An inner upper surface of each recessed portion 20 includes an exposed region 30 where a part of any one of the plurality of leads 11*a* to 13*b* is exposed.

Each of the plurality of light-emitting elements 50 is disposed in the exposed region 30 exposed in the corresponding one recessed portion 20. The plurality of light-emitting elements 50 include a first light-emitting element 51 disposed in the first recessed portion 21, a second light-emitting element 52 disposed in the second recessed portion 22, and a third light-emitting element 53 disposed in the third recessed portion 23.

Each of the plurality of reflective members 150 is disposed in a corresponding one recessed portion 20. In a plan view, each reflective member 150 surrounds the light-emitting element 50 in the recessed portion 20.

The plurality of lens portions 70 include a first lens portion 71, a second lens portion 72, and a third lens portion 73 respectively positioned above (light emission side, +z direction) the first light-emitting element 51, the second light-emitting element 52, and the third light-emitting element 53. Each of the plurality of lens portions 70 has a convex shape protruding upwardly from the primary surface 100*a* of the resin package 100.

In the present embodiment, the lens portions 70 are provided on the emission side of the corresponding light-emitting elements 50. With this structure, light can be extracted in a frontward direction (+z direction) with high efficiency, making it possible to obtain the light-emitting device 1000 having high brightness. Further, in a plan view when viewed in the z-axis direction, the reflective member 150 surrounds the light-emitting element 50, and thus the light emission of the light-emitting element 50 can be made into a point light source. Creating the point light source refers to light being emitted from the lateral surface of the light-emitting element 50 at 10% or less. With this structure, the size of each lens portion 70 can be reduced, making it possible to miniaturize the light-emitting device 1000.

As illustrated in FIG. 2C, in a plan view as viewed in the z-axis direction, a maximum width of each lens portion 70 is smaller than a maximum width of the inner upper surface of the corresponding recessed portion 20, for example. That is, in a plan view, the maximum width of the first lens portion 71 is smaller than the maximum width of the inner upper surface of the first recessed portion 21. Similarly, the maximum width of the second lens portion 72 is smaller than the maximum width of the inner upper surface of the second recessed portion 22, and the maximum width of the third lens portion 73 is smaller than the maximum width of the inner upper surface of the third recessed portion 23. In this description, "lens portion" is a portion having a convex shape and an optical function, and "the maximum width of the lens portion" is a maximum length passing through an optical axis (center) of the lens portion in a plan view. In FIG. 2C, a position of the optical axis of the lens portion 70 is indicated by a center point C1. The center point C1 of the lens portion 70 in a plan view is a center of a shape demarcated by the lens portion 70 in a plan view, that is, a center of a shape demarcated by the outer shape of the lens portion 70 (shape of an imaginary plane corresponding to a bottom surface of the lens portion 70 indicated by the dot-dash line in FIG. 2E). For example, in a case in which a planar shape of the lens portion is elliptical as illustrated, the maximum width is a length WL of a major axis of the ellipse. When the planar shape of the lens portion is circular, a diameter of the circle is the maximum width.

Further, as illustrated in FIG. 2E, among cross-sections including a line 71L connecting a vertex T1 of the first lens portion 71 and the center point C1 of the first lens portion 71 (that matches the optical axis, here) in a plan view, in a first cross-section in which the width of the first lens portion 71 is smallest, the width (length WS in this example) of the first lens portion 71 may be no greater than 5 times a width (length w1 in this example) of the first light-emitting element 51. Similarly, among cross-sections including a line 72L connecting a vertex T2 of the second lens portion 72 and a center point C2 of the second lens portion 72 in a plan view, in a second cross-section in which the width of the second lens portion 72 is smallest, the width of the second lens portion 72 may be no greater than 5 times a width of the second light-emitting element 52. Among cross-sections including a line 73L connecting a vertex T3 of the third lens portion 73 and a center point C3 of the third lens portion 73 in a plan view, in a third cross-section in which the width of the third lens portion 73 is smallest, the width of the third lens portion 73 is no greater than 5 times a width of the third light-emitting element 53. In a case in which the first lens portion 71 to the third lens portion 73 are each elliptical or circular in a plan view, the center points C1 to C3 described above are the centers of the elliptical or circular shapes. In this example, the first cross-section to the third cross-section are all the cross-sections illustrated in FIG. 2E (cross-section parallel to the yz plane). In FIG. 2E, the center point C1 of the lens portion 70 in a plan view is illustrated at the same height as a height of a base portion 61 in the z-axis direction to be described below. For example, in a case in which the lens portion 70 has an elliptical shape in a plan view, the width of the lens portion 70 in a cross-section including a minor axis of the elliptical shape (that is, the length WS of the minor axis of the elliptical shape) is no greater than 5 times the width of the light-emitting element 50. In a case in which the lens portion 70 has a circular shape in a plan view, the width of the lens portion 70 in any one cross-section including a diameter of the circular shape (that is, length of the diameter of the circle) is no greater than 5 times the width of the light-emitting element 50. Further, a height from the vertex of each lens portion 70 to an upper surface of the corresponding light-emitting element 50 in the z-axis direction is, for example, about 0.9 mm.

In the present embodiment, at least two of the first light-emitting element 51, the second light-emitting element 52, and the third light-emitting element 53 overlap each other in a lateral side view from one direction of the x-axis direction and the y-axis direction (here, y-axis direction). In a lateral side view from the x-axis direction orthogonal to the y-axis direction, the maximum width of each lens portion 70 may be no greater than 5 times the maximum width of the corresponding light-emitting element 50. Further, when the light-emitting device 1000 is viewed in a plan view, the maximum width of each lens portion 70 in the direction (here, y-axis direction) in which the at least two light-emitting elements 50 overlap in a lateral side view may be no greater than 5 times the maximum width of the corresponding light-emitting element 50. With such a configuration, the light-emitting device 1000 can be further miniaturized.

Note that "plan view" refers to a plan view as viewed in the +z-axis direction. "Top view" refers to a top view as viewed in the +z-axis direction. "Lateral side view" refers to a lateral side view as viewed in a direction orthogonal to any lateral surface of the external shape of the light-emitting device in a plan view. "At least two light-emitting elements overlapping in a lateral side view" can include not only a case in which these light-emitting elements fully overlap, but also a case in which the light-emitting elements partially overlap. For example, such overlapping includes a case in which a center of a certain light-emitting element overlaps another light-emitting element in a lateral side view. Note that the sizes and the shapes of the light-emitting elements in a lateral side view may all be the same, or may be different from one another.

In the example illustrated, the three light-emitting elements 50 overlap one another in a lateral side view from the y-axis direction. Each lens portion 70 has an elliptical planar shape with a major axis in the x-axis direction and a minor axis in the y-axis direction, and thus the maximum width of each lens portion 70 in a lateral side view from the x-axis direction is the length WS of the minor axis of the elliptical shape. Each light-emitting element 50 has a rectangular planar shape with sides parallel to the x-axis and the y-axis, and thus the maximum width of each light-emitting element 50 in a lateral side view from the x-axis direction is the length w1 of the sides of the rectangular shape parallel to the y-axis. In this case, the length WS of the minor axis in the lens portion 70 may be no greater than 5 times the length w1 of the side of the light-emitting element 50.

Each of the components will be described in detail below.

Resin Package 100

In the present embodiment, the resin package 100 is a surface-mounted package.

Figure 2F:
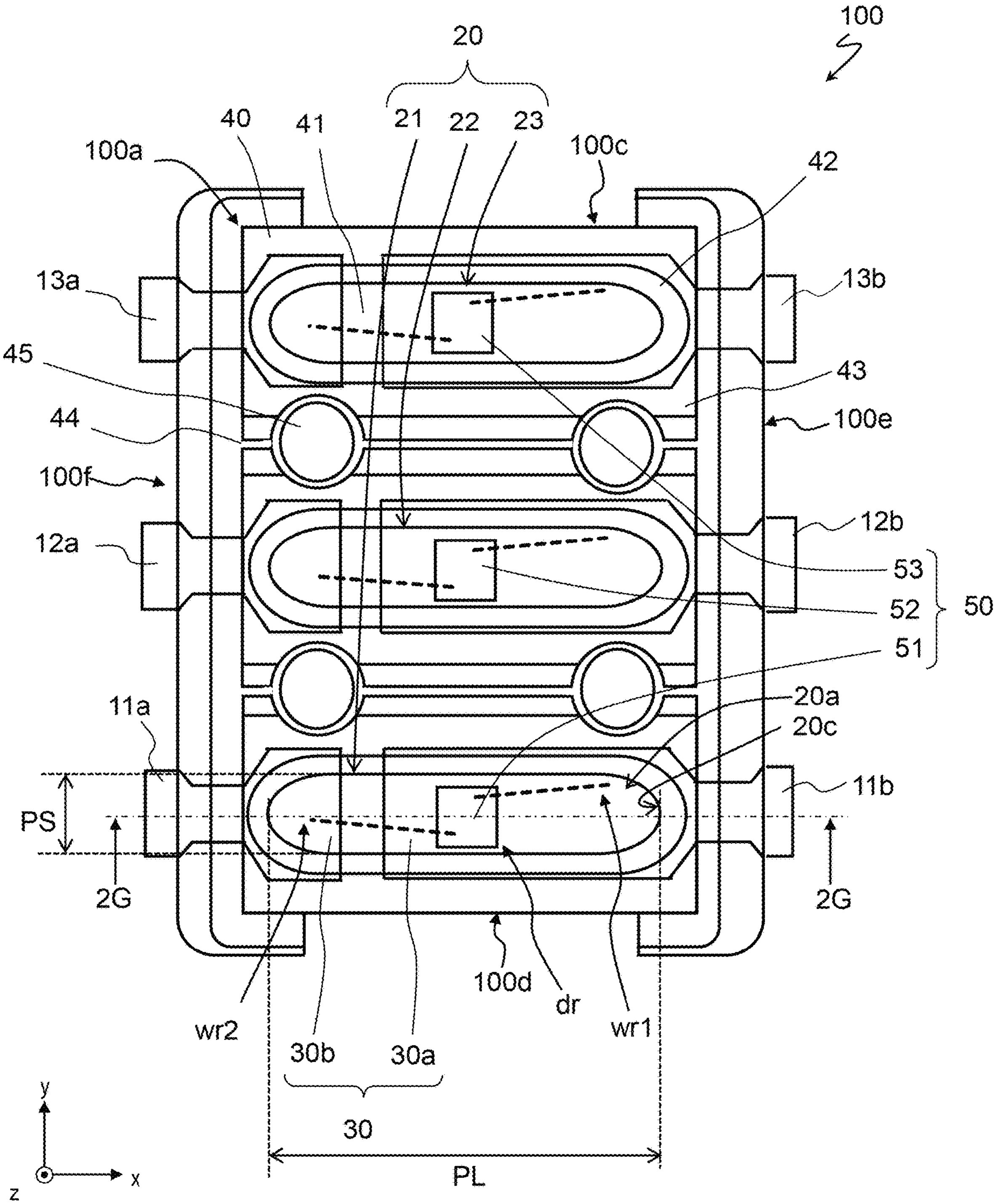
FIG. 2F is a schematic top transparent view illustrating a resin package 100 on which light-emitting elements 50 are formed.
Figure 2G:
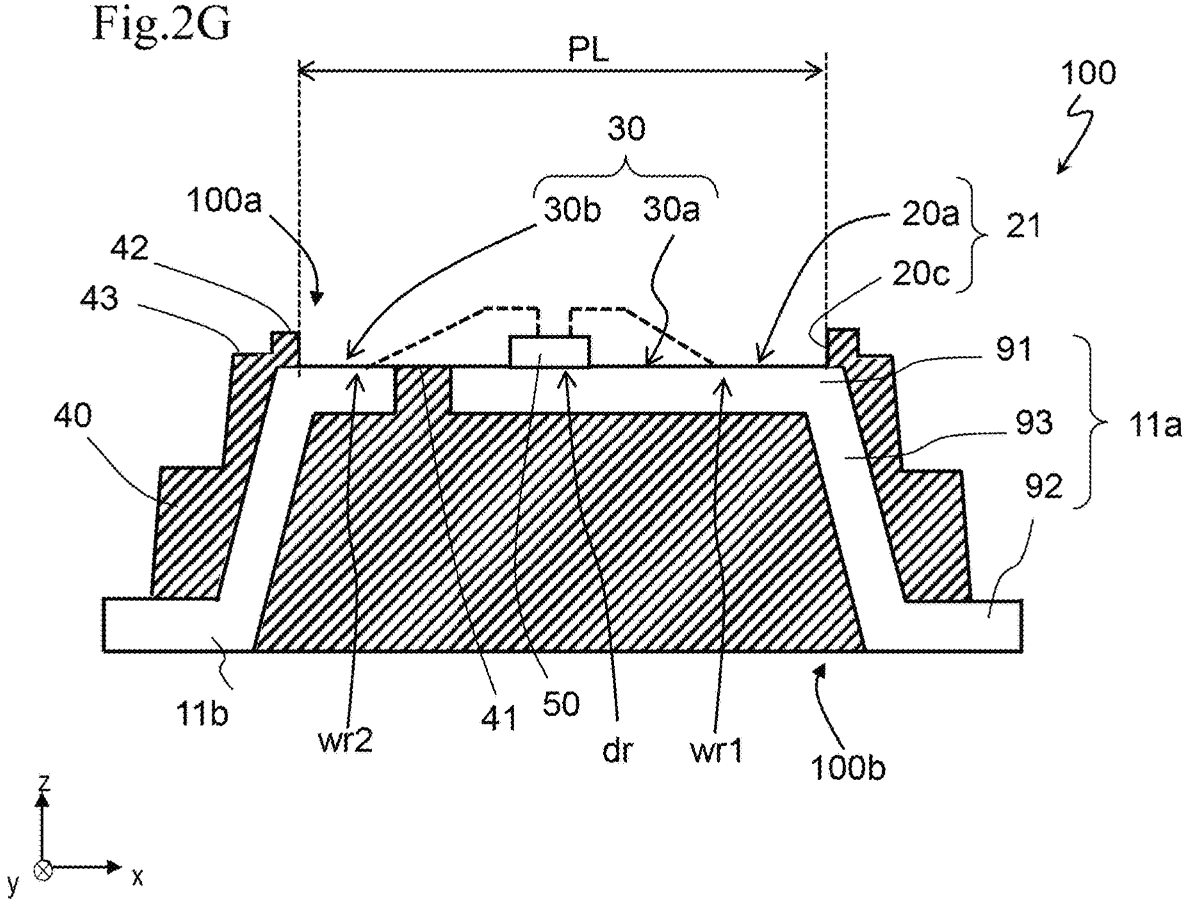
FIG. 2G is a schematic cross-sectional view taken along line 2G-2G illustrated in FIG. 2F.

FIG. 2F is a schematic top view illustrating the resin package 100 in which the light-emitting elements 50 are formed, and illustrates a structure in which the mold resin portion 60 and the reflective members 150 are removed from the light-emitting device 1000. FIG. 2G is a schematic cross-sectional view taken along line 2G-2G illustrated in FIG. 2F.

As illustrated in FIGS. 2F and 2G, the resin package 100 includes the primary surface 100*a*, a back surface 100*b* opposite to the primary surface 100*a*, and side portions 100*c* to 100*f* each positioned between the primary surface 100*a* and the back surface 100*b*. The side portions 100*c*, 100*d*, 100*e*, and 100*f* are positioned on the +y side, the −y side, the +x side, and the −x side, respectively. The back surface 100*b* of the resin package 100 includes a mounting surface of each of the leads 11*a* to 13*b*. The mounting surface is used when fixing the light-emitting device 1000 to a mounting substrate. The back surface 100*b* is parallel to the xy plane. The mounting surface of the leads 11*a* to 13*b* may be parallel to the xy plane.

The resin package 100 includes the plurality of leads 11*a* to 13*b* and the first dark-colored resin member 40 that fixes at least a part of the plurality of leads 11*a* to 13*b*. The first dark-colored resin member 40 is integrally formed with the plurality of leads 11*a* to 13*b*.

In the illustrated configuration, a shape of the primary surface 100*a* of the resin package 100 is quadrangular in a top view. Each side of a quadrangular shape of the primary surface 100*a* is parallel to the x-axis or the y-axis. Note that the shape of the primary surface 100*a* in a top view may be a shape other than the quadrangular shape, and may be, for example, a substantially triangular shape, a substantially quadrangular shape, a substantially pentagonal shape, a substantially hexagonal shape, another polygonal shape, or a shape including a curved line such as a circular shape or an elliptical shape.

Recessed Portion 20

As illustrated in FIGS. 2F and 2G, each of the plurality of recessed portions 20 is demarcated by an inner upper surface 20*a* and an inner lateral surface 20*c* surrounding the inner upper surface 20*a*. The inner upper surface 20*a* of the recessed portion 20 is an upward facing surface (surface facing the +z side). The inner upper surface 20*a* is, for example, a bottom surface (inner upper surface) of the recessed portion 20. The inner upper surface 20*a* of each recessed portion 20 is surrounded by a surface or a ridge line positioned above the inner upper surface 20*a* in a plan view and formed of the first dark-colored resin member 40. In this example, in a plan view, the inner upper surface 20*a* of each recessed portion 20 is surrounded by an upper surface of a second resin portion 42 to be described below.

A part of any one of the plurality of leads 11*a* to 13*b* and the first dark-colored resin member 40 are exposed at the inner upper surface 20*a* of each recessed portion 20. The inner lateral surface 20*c* of the recessed portion 20 is formed of the first dark-colored resin member 40, for example. The inner lateral surface 21*c* (here, lateral surfaces s1 and s2) of the first recessed portion 21 may be perpendicular to the inner upper surface 21*a* of the first recessed portion 21 or may be inclined relative to a vertical plane of the inner upper surface 21*a*.

As illustrated in FIG. 2G, the inner upper surface 20*a* of each recessed portion 20 includes an element placement region dr in which the corresponding light-emitting element 50 is to be disposed. The inner upper surface 20*a* of each recessed portion 20 may further include connection regions wr1 and wr2 in which wires for electrically connecting the light-emitting element 50 and any one of the leads 11*a* to 13*b* are bonded.

As illustrated in FIG. 2F, in the present embodiment, the plurality of recessed portions 20 include the first recessed portion 21, the second recessed portion 22, and the third recessed portion 23. In the illustrated example, the first recessed portion 21 to the third recessed portion 23 are arrayed in one direction (y-axis direction in this example) in a plan view. A planar shape of each recessed portion 20 is an oval long in the x-axis direction. Note that the arrangement, the planar shape, and the like of each recessed portion 20 are not limited to those in the example illustrated. The recessed portion 20 may have, for example, an elliptical shape or a block shape such as a rectangle.

The inner upper surface 20*a* of each recessed portion 20 preferably has a shape that is longer in one direction than in another direction. A width PL of each inner upper surface 20*a* in a longer direction (x-axis direction in this example) may be greater than or equal to 1.5 times a width PS in a shorter direction (y-axis direction in this example). Note that, in a case in which the planar shape of the inner upper surface 20*a* is oval or elliptical, the width PL in the longer direction is the maximum width of the inner upper surface 20*a*. The width of the inner upper surface 20*a* of each of the first recessed portion 21 to the third recessed portion 23 in the longer direction is greater than the maximum width of each of the first lens portion 71 to the third lens portion 73 in the longer direction of each inner upper surface 20*a*, and the width of the inner upper surface 20*a* of each of the first recessed portion 21 to the third recessed portion 23 in the shorter direction is less than the maximum width of each of the first lens portion 71 to the third lens portion 73 in the shorter direction of each inner upper surface 20*a*. Here, the width PL in the longer direction is the longest width of straight lines passing through a center of the inner upper surface 20*a*, which has an oval shape, of the recessed portion 20 and parallel to the x-axis. Further, the width PS in the shorter direction is the longest width of straight lines passing through the center of the inner upper surface 20*a* of the recessed portion 20 and parallel to the y-axis.

By lengthening the shape of the inner upper surface 20*a* of the recessed portion 20 in one direction (here, x-axis direction), it is possible to reduce lifting of the light-emitting element 50 while ensuring the connection regions wr1 and wr2, and a nozzle arrangement region on the +x side and the −x side of the light-emitting element 50. By lengthening the shape of the inner upper surface 20*a* of the recessed portion 20 in one direction (here, x-axis direction), it is possible to ensure the region for arranging nozzles used to apply the reflective member 150 in the recessed portion 20 ("nozzle arrangement region" to be described below). Further, it is possible to arrange the connection regions wr1 and wr2 for wire bonding in the recessed portion 20. Furthermore, by suppressing the width PS of the inner upper surface 20*a* of the recessed portion 20 in the shorter direction to a smaller size, it is possible to reduce a volume (application area) of the reflective member 150. When the volume of the reflective member 150 is large, stress applied to the light-emitting element 50 increases in a curing step when the mold resin portion 60 is formed, and the light-emitting element 50 may lift from the lead surface. Therefore, by making the width PS of the recessed portion 20 in the shorter direction (here, y-axis direction) small relative to the width of the recessed portion 20 in the longer direction (here, x-axis direction), it is possible to reduce a volume of a portion of the reflective member 150 positioned on the +y side and the −y side of the light-emitting element 50, and thus reduce the stress applied to the light-emitting element 50 from the reflective member 150 when forming the mold resin portion 60.

In a plan view, the width PL of the inner upper surface 20*a* of each recessed portion 20 in the longer direction may be greater than or equal to 3 times, for example, the maximum width of the light-emitting element 50 along the longer direction of this recessed portion 20. This makes it possible to more easily connect the wire in the recessed portion 20, and apply the reflective member 150. From the perspective of miniaturization of the light-emitting device 1000, the width PL of the inner upper surface 20*a* of each recessed portion 20 in the longer direction (x-axis direction in this example) may be no greater than 10 times, for example, the maximum width of the light-emitting element 50. On the other hand, the maximum width of the inner upper surface 20*a* of the recessed portion 20 in the shorter direction (here, y-axis direction) may be in a range from 1.3 times to 2 times, for example, the maximum width of light-emitting element 50 along the shorter direction of the recessed portion 20. When it is 1.3 times or greater, the reflective member 150 can be disposed with a predetermined thickness on the +y side and the −y side of the light-emitting element 50 as well. When it is no greater than 2 times, the lifting of the light-emitting element 50 caused by the reflective member 150 as described above can be more effectively reduced.

A depth of each recessed portion 20 is not particularly limited, but is preferably greater than a thickness of the light-emitting element 50. The depth of each recessed portion 20 is a distance from a surface of the lead exposed at the inner upper surface 20*a* of the recessed portion 20 to an uppermost portion of the inner lateral surface 20*c* of the recessed portion 20 along the z-axis direction. The depth of the recessed portion 20 may be, for example, in a range from 0.1 mm to 0.25 mm (in a range from 1 times to 2.5 times the thickness of the light-emitting element 50).

Leads 11*a* to 13*b*

Each of the plurality of leads 11*a* to 13*b* is conductive and functions as an electrode for supplying power to the corresponding light-emitting element 50.

In a configuration exemplified in FIG. 2G, each of the plurality of leads 11*a* and 11*b* is bent so as to include a portion 91 positioned on the primary surface 100*a* of the resin package 100, a portion 92 positioned on the back surface 100*b* of the resin package 100, and a portion 93 positioned between these portions 91 and 92, and extending along the side portions (here, side portions 100*e* and 100*f*) of the resin package 100. At least a part of the portion 92 of each of the leads 11*a* and 11*b* is exposed at the back surface 100*b* of the resin package 100 and forms the mounting surface used when fixing the light-emitting device 1000 to the mounting substrate. The mounting surfaces of the leads 11*a* and 11*b* may be flush with a lowermost surface of the first dark-colored resin member 40. This is because, by being flush, it is possible to suppress an inclination of the light-emitting device when the light-emitting device is mounted on a mounting substrate. Note that the other leads 12*a*, 12*b*, 13*a*, and 13*b* can also have structures similar to that of the leads 11*a* and 11*b* illustrated in FIG. 2G.

As illustrated in FIG. 2F, in the present embodiment, the lead 11*a* and the lead 11*b* constitute a first lead pair, the lead 12*a* and the lead 12*b* constitute a second lead pair, and the lead 13*a* and the lead 13*b* constitute a third lead pair.

In the primary surface 100*a* of the resin package 100, the first lead pair, the second lead pair, and the third lead pair are arrayed in the y-axis direction. In the primary surface 100*a*, end portions of the two leads constituting each of the lead pairs are spaced apart from each other and disposed facing each other.

The light-emitting elements 50 are respectively disposed at the one leads 11*a*, 12*a*, and 13*a* of the first lead pair, the second lead pair, and the third lead pair, respectively. In the primary surface 100*a* of the resin package 100, the leads 11*a*, 12*a*, and 13*a* may be longer than the other leads 11*b*, 12*b*, and 13*b*. With this structure, in a case in which the primary surface 100*a* of the resin package 100 has a polygonal (for example, quadrangular) planar shape, for example, the light-emitting element 50 can be disposed on (or near) a straight line connecting a center point of one side of the polygon in a plan view and a point positioned at a substantially center of the primary surface 100*a* in a plan view. In this example, the planar shape of the primary surface 100*a* is rectangular and, in a plan view, the light-emitting element 50 is disposed on a straight line passing through the respective center points of two sides parallel to the x-axis of the rectangle.

The one lead 11*a* of the first lead pair includes an exposed region 30*a* at the inner upper surface 20*a* of the first recessed portion 21. The one lead 12*a* of the second lead pair includes an exposed region 30*a* at the inner upper surface 20*a* of the second recessed portion 22. The one lead 13*a* of the third lead pair includes an exposed region 30*a* at the inner upper surface 20*a* of the third recessed portion 23. Each exposed region 30*a* includes the element placement region dr in which the corresponding light-emitting element 50 is disposed and the first connection region wr1. The other lead 11*b* of the first lead pair includes an exposed region 30*b* at the inner upper surface 20*a* of the first recessed portion 21. The other lead 12*b* of the second lead pair includes an exposed region 30*b* at the inner upper surface 20*a* of the second recessed portion 22. The other lead 13*b* of the third lead pair includes an exposed region 30*b* at the inner upper surface 20*a* of the third recessed portion 23. Each exposed region 30*b* includes the second connection region wr2. The first connection region wr1 and the second connection region wr2 are each a region in which the corresponding light-emitting element 50 is electrically connected to a positive or negative electrode by a wire. In each recessed portion 20, the element placement region dr may be positioned between the first connection region wr1 and the second connection region wr2 in a plan view.

The leads 11*a* to 13*b* may be composed of a base material and a metal layer covering a surface of the base material. Examples of the base material include metals such as copper, aluminum, gold, silver, iron, nickel, alloys thereof, phosphor bronze, or ferrous copper. These base materials may have a single-layer structure or a layered structure (a clad material, for example). Copper may be used for the base material. The metal layer is, for example, the plating layer. Examples of the metal layer include silver, aluminum, nickel, palladium, rhodium, gold, copper, or alloys thereof. With the leads 11*a* to 13*b* including such a metal layer, light reflectivity and/or bonding properties with metal wires (described below) and the like of the leads 11*a* to 13*b* can be improved. For example, a lead including a silver-plated layer on a surface of a copper alloy that serves as the base material may be used.

First Dark-Colored Resin Member 40

The first dark-colored resin member 40 has insulating properties for electrically isolating the light-emitting element 50 from the outside. Preferably, at least a portion of the first dark-colored resin member 40 positioned proximate to the primary surface 100*a* of the resin package 100, that is, proximate to a light emission observation surface, is a dark color such as black or gray. The first dark-colored resin member 40 may be colored to the dark color, for example. Alternatively, the first dark-colored resin member 40 may be obtained by printing dark-colored ink on a white-colored resin. Alternatively, the first dark-colored resin member 40 may be formed in two colors of a dark-colored resin and a white-colored resin. With this structure, it is possible to make external light or the like less likely to reflect on the primary surface 100*a* of the resin package 100. Thus, a contrast of the light-emitting device 1000 can be improved. Note that, in this description, "dark color" refers to a color having a color value of 4.0 or less in the Munsell color system (20 hues). The hue is not particularly limited, and the chroma may be freely determined as necessary. Preferably, the color value is 4.0 or less and the chroma is 4.0 or less.

In the example illustrated in FIGS. 2F and 2G, in the primary surface 100*a*, the first dark-colored resin member 40 includes a first resin portion 41 exposed at the inner upper surface of each recessed portion 20, and the second resin portion 42 surrounding the inner upper surface of each recessed portion 20. An upper surface of the second resin portion 42 is positioned above (+z direction) an upper surface of the first resin portion 41. The second resin portion 42 is a wall surrounding the recessed portion 20, and an inner wall of the wall formed of the second resin portion 42 may be the inner lateral surface 20*c* of the recessed portion 20. In the primary surface 100*a*, the first dark-colored resin member 40 may further include a third resin portion 43 positioned outward of the second resin portion 42. An upper surface of the third resin portion 43 is positioned below (−z direction) the second resin portion 42. The third resin portion 43 may include a groove 44 positioned between two adjacent recessed portions 20. The groove 44 extends in the x-axis direction from the side portion 100*e* to the side portion 100*f* of the resin package 100. A portion of the upper surface of the third resin portion 43 other than the groove 44 may be positioned above the first resin portion 41, and an inner upper surface of the groove 44 may be positioned below the first resin portion 41. An adhesion between the mold resin portion 60 and the first dark-colored resin member 40 can be enhanced by the groove 44.

The first dark-colored resin member 40 may include a hole 45 positioned between two adjacent recessed portions 20 and passing through the resin package 100 in the z-axis direction. In this example, two holes 45 are disposed between the first recessed portion 21 and the second recessed portion 22, and two holes 45 are disposed between the second recessed portion 22 and the third recessed portion 23, in a plan view. A planar shape of the hole 45 is circular in this example, but may be elliptical or rectangular.

In the side portion of the resin package 100, the first dark-colored resin member 40 may include a step facing upward (that is, facing the +z direction). The step of the first dark-colored resin member 40 can support a mold that is used during formation of the mold resin portion 60 (refer to FIG. 12F). By including a step, it is possible to reduce defects such as resin leakage that occur due to a gap formed between the mold and the resin package 100. In this example, the resin package 100 includes a step surface st1 extending from +x side end portion of the side portion 100*c* through the side portion 100*e* and to +x side end portion of the side portion 100*d*, and a step surface st2 extending from −x side end portion of the side portion 100*c* through the side portion 100*f* and to −x side end portion of the side portion 100*d*. In this description, in an outer lateral surface having a stepped shape in a cross-sectional view, a surface corresponding to a tread of a step is referred to as a "step surface". A step surface is not formed in central portions of the side portions 100*c*, 100*d*. Therefore, in a top view, the resin package 100 includes a cutout portion in centers of the side portion 100*c* and the side portion 100*d*.

The first dark-colored resin member 40 has a shape with which the first dark-colored resin member 40 can hold at least a part of the plurality of leads 11*a* to 13*b*, and the shape is not limited to that illustrated in the drawings. Preferably, the first dark-colored resin member 40 integrally fixes the plurality of leads 11*a* to 13*b* (here, three pairs of leads). With the leads 11*a* to 13*b* being firmly fixed by the first dark-colored resin member 40, vibration of the leads 11*a* to 13*b* can be reduced when the mold resin portion 60 is formed by a transfer molding method.

As a material of the first dark-colored resin member 40, a material having a small coefficient of thermal expansion and an excellent adhesion performance with the mold resin portion 60 may be selected. The coefficient of thermal expansion of the first dark-colored resin member 40 may be substantially equal to the coefficient of thermal expansion of the mold resin portion 60 or, taking into account an influence of heat from the light-emitting elements 50, may be smaller than the coefficient of thermal expansion of the mold resin portion 60.

The first dark-colored resin member 40 can be formed by using a thermoplastic resin, for example. As the thermoplastic resin, a thermoplastic resin, such as an aromatic polyamide resin, a polyphthalamide resin (PPA), a sulfone resin, a poly amide-imide resin (PAI), a polyketone resin (PK), a polycarbonate resin, polyphenylene sulfide (PPS), a liquid crystal polymer (LCP), an ABS resin, and a PBT resin, can be used. Note that a thermoplastic resin containing glass fibers may also be used as a thermoplastic material. In this manner, by adding the glass fibers to the thermoplastic resin, it is possible to form a resin package having a high rigidity and a high strength. Note that, in this description, the "thermoplastic resin" refers to a material having a linear polymer structure that softens and then becomes liquid when heated and that solidifies when cooled. Examples of such a thermoplastic resin include styrene-based, acrylic-based, cellulose-based, polyethylene-based, vinyl-based, polyamide-based, and fluorocarbon-based resins.

Alternatively, the first dark-colored resin member 40 may be formed by using a thermosetting resin such as a silicone resin or an epoxy resin, for example.

A colorant that colors the first dark-colored resin member 40 to a dark color may be added to the resin material of the first dark-colored resin member 40. Various dyes and pigments are suitably used as the colorant. Specific examples include $Cr_2O_3$, $MnO_2$, $Fe_2O_3$, and carbon black. An amount of the colorant to be added may be, for example, in a range from 0.3% to 1.5%, and preferably in a range from 0.5% to 1.0% with respect to the resin material that forms the base material. As an example, as the thermoplastic resin material, a thermoplastic resin material in which a small amount of dark-colored particles such as carbon particles is added to the polyphthalamide (PPA) may be used.

Reflective Member 150

As illustrated in FIGS. 2C to 2E, the reflective member 150 includes a first reflective member 151 disposed in the first recessed portion 21, a second reflective member 152 disposed in the second recessed portion 22, and a third reflective member 153 disposed in the third recessed portion 23.

The reflective member 150 surrounds each light-emitting element 50 in the corresponding recessed portion 20. The reflective member 150 reflects light emitted from a lateral surface of the light-emitting element 50 and guides the light to above the light-emitting element 50. Accordingly, the use efficiency of the light emitted from the light-emitting elements 50 can be improved.

In this description, "the reflective member surrounding the light-emitting element" includes a case in which the reflective member 150 is positioned close to the lateral surface of the light-emitting element 50 in a plan view. The reflective member 150 may be in direct contact or may not be in contact with the lateral surface of the light-emitting element 50. Preferably, the reflective member 150 is in contact with the lateral surface of the light-emitting element 50. More preferably, the reflective member 150 surrounds the lateral surface of the light-emitting element 50 in a plan view. It is further preferred that the reflective member 150 is provided in contact with entire lateral surface of the light-emitting element 50. With the reflective member 150 in contact with entire lateral surface of the light-emitting element 50 (all four side portions positioned on the +x, −x, +y, and −y sides in this example), it is possible to more effectively reduce leakage, in the ±x directions and the ±y directions, of the light emitted from the light-emitting element 50.

In the example illustrated in FIGS. 2C to 2E, the reflective member 150 is disposed over the entire region of the inner upper surface 20*a* of the recessed portion 20 other than the region in which the light-emitting element 50 is disposed, in a plan view. For example, in a plan view, the entire arrangement region of the reflective member 150 is positioned outside the corresponding lens portion 70. The reflective member 150 may be in contact with the inner lateral surface 20*c* of the recessed portion 20.

The reflective member 150 can be disposed between the inner upper surface 20*a* of the recessed portion 20 and a lower surface of the light-emitting element 50 as well. For example, the reflective member (resin including a light reflective material, for example) 150 may be applied in advance in the recessed portion 20, and the light-emitting element 50 may then be disposed thereon. This makes it possible to more effectively reduce leakage, in the −z direction, of the light emitted from the light-emitting element 50. Further, a die bond resin is not required to bond the light-emitting element 50 to the primary surface 100*a*.

In the primary surface 100*a* of the resin package 100, the reflective member 150 is preferably not disposed on a region (second resin portion 42 and third resin portion 43, for example) positioned outside the recessed portion 20.

In a plan view, a length t of the reflective member 150 covering a lateral surface of the light-emitting element 50, from a lateral surface of the light-emitting element 50 to a peripheral edge of the reflective member 150, along a normal line direction of the lateral surface of the light-emitting element 50 may be 10 μm or greater such as, for example, about 50 μm, or may be about 100 μm. In a plan view, in a case in which the light-emitting element 50 is rectangular, the lengths t described above of the portions of the reflective member 150 positioned across the two mutually facing sides of the light-emitting element 50 are preferably about the same.

Figure 2H:
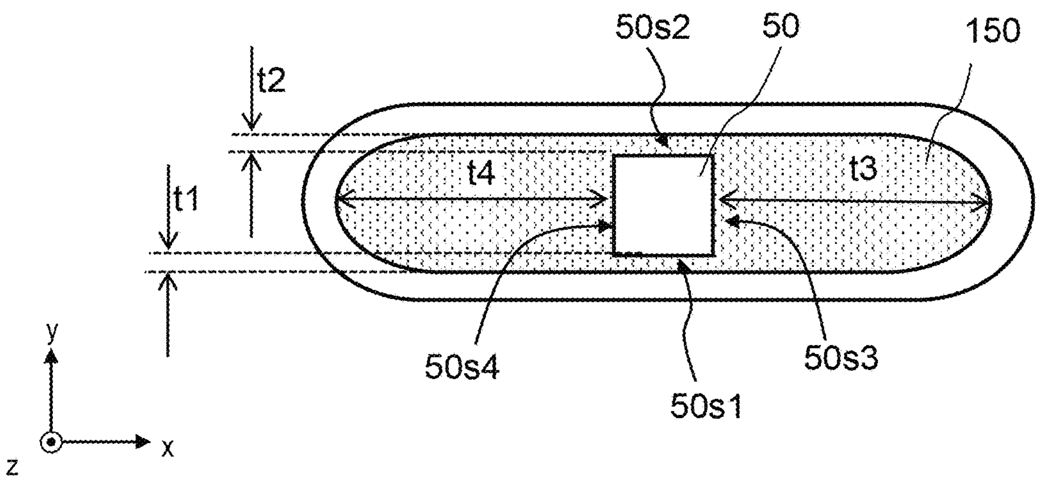
FIG. 2H is an enlarged schematic plan view illustrating a reflective member and a light-emitting element.
Figure 2I:
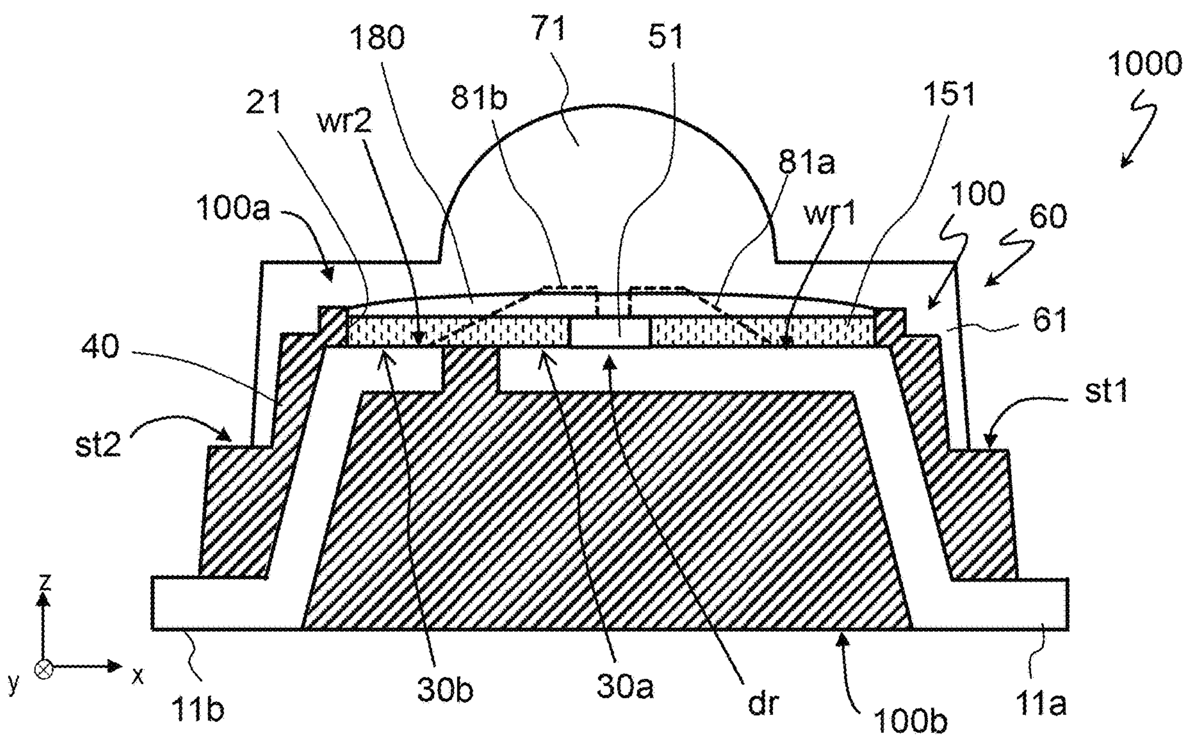
FIG. 2I is a schematic cross-sectional view taken along line 2D-2D illustrated in FIG. 2C, illustrating an example in which a precoating resin is provided to the light-emitting device.

For example, as illustrated in FIG. 2H, in a case in which the light-emitting element 50 includes two lateral surfaces 50*s*1 and 50*s*2 parallel to the x-axis and two lateral surfaces 50*s*3 and 50*s*4 parallel to the y-axis, lengths t1 and t2 of the portions of the reflective member 150 covering the lateral surfaces 50*s*1 and 50*s*2 of the first light-emitting element 51, respectively, may be the same. Similarly, lengths t3 and t4 of the portions of the reflective member 150 covering the lateral surfaces 50*s*3 and 50*s*4 of the light-emitting element 50, respectively, may be the same. When the lengths t3 and t4 are the same, the light leakage from the lateral surface 50*s*3 on the +x side and the lateral surface 50*s*4 on the −x side of the light-emitting element 50 can be suppressed to the same degree by the reflective member 150, and when the lengths t1 and t2 are the same, light leakage from the lateral surface 50*s*1 on the −y side and the lateral surface 50*s*2 on the +y side of the light-emitting element 50 can be suppressed to the same degree. Thus, the influence of the reflective member 150 on light distribution can be suppressed. In a case in which the lengths t1 to t4 are, for example, 50 μm or less, the lengths t1 to t4 can be set as described above, making it possible to reduce the influence on the light distribution more effectively. Further, when the lengths t1, t2 are the same and the lengths t3, t4 are the same, an asymmetry of stress applied to the light-emitting element 50 when the reflective member 150 is heated can be reduced. The "asymmetry of stress" here refers to a large stress being applied to only one of the two lateral surfaces 50*s*3 and 50*s*4 positioned on the +x sides of the light-emitting element 50, or a large stress being applied to only one of the two lateral surfaces 50*s*1 and 50*s*2 positioned on the +y sides of the light-emitting element 50. With this structure of reducing the asymmetry of stress, it is possible to reduce the lifting of the reflective member 150 and the light-emitting element 50 from the leads 11*a*, 12*a*, and 13*a*. For example, in a case in which the lengths t1 to t4 are, for example, 50 μm or greater, the lengths t1 to t4 can be set as described above, and thus the floating of the light-emitting element 50 and the like can be reduced more effectively. As illustrated in FIGS. 2D and 2E, in a cross-sectional view passing through a center line of the light-emitting element 50 and parallel to the xz plane or the yz plane, shapes of the reflective members 150 positioned on both sides of each light-emitting element 50 are preferably generally line symmetrical with respect to the center line of the light-emitting element 50. With the shapes of the reflective members 150 being line symmetrical, a thickness of a precoating resin 180 to be described below can be made uniform.

Figure 3A:
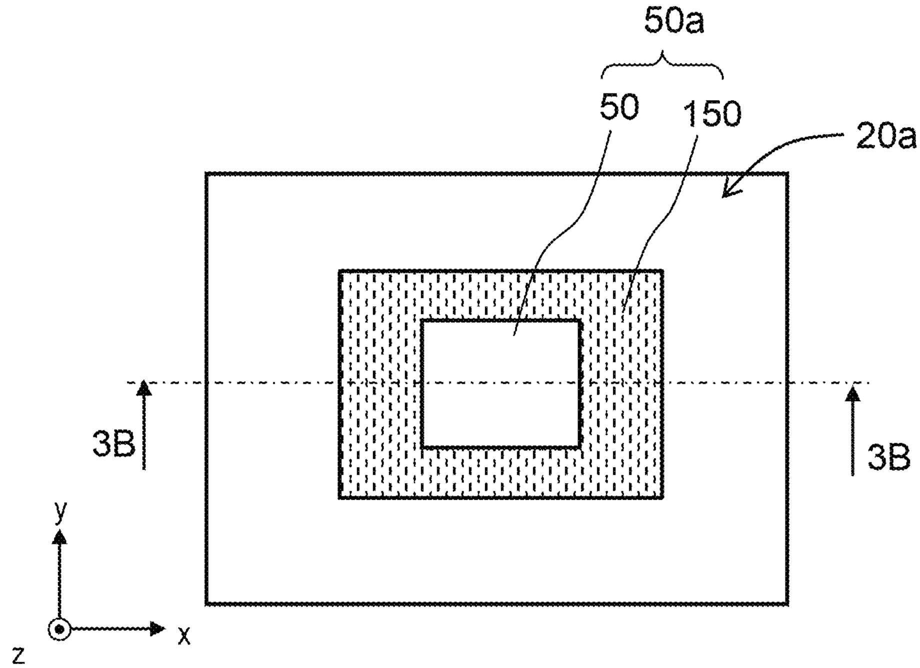
FIG. 3A is a schematic plan view illustrating another example of the light-emitting element.
Figure 3B:
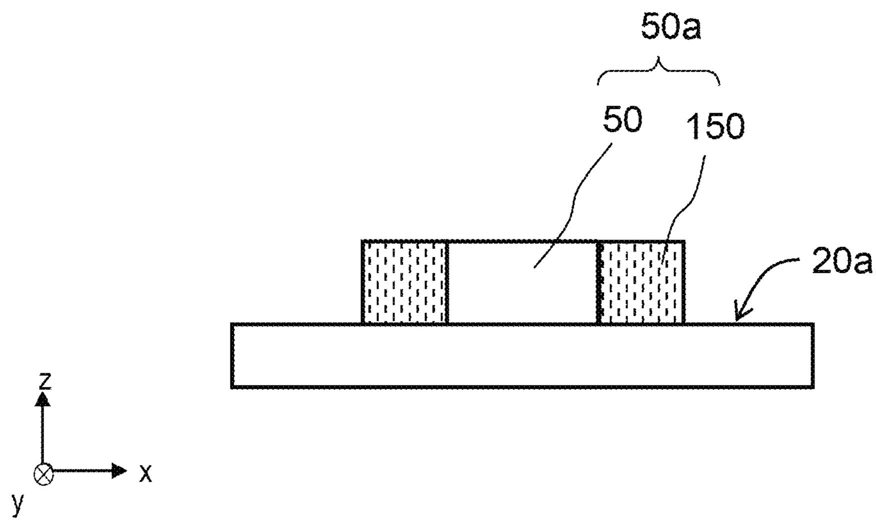
FIG. 3B is a schematic cross-sectional view taken along line 3B-3B illustrated in FIG. 3A.

Note that the reflective member 150 is disposed in close proximity to the lateral surface of the light-emitting element 50, and may not be disposed over the entire inner upper surface of the recessed portion 20. For example, as exemplified in FIGS. 3A and 3B, a light-emitting element 50*a* with the lateral surface covered by the reflective member 150 may be prepared, and the light-emitting element 50*a* may then be disposed on the inner upper surface 20*a* of the recessed portion 20. Alternatively, as will be described below, a resin wall for controlling the position of the reflective member 150 may be provided in the recessed portion 20. With this structure, an area of a region of the inner upper surface 20*a* of the recessed portion 20 in which the reflective member 150 is disposed can be made smaller. For example, the entire arrangement region of each reflective member 150 may be positioned inside the corresponding lens portion 70. Specifically, in a plan view, the first reflective member 151 may be positioned inside the first lens portion 71, the second reflective member 152 may be positioned inside the second lens portion 72, and the third reflective member 153 may be positioned inside the third lens portion 73.

The reflective member 150 may be a reflective resin, for example. The reflective resin includes a resin serving as a base material and a light reflective material dispersed in the resin. As the base material, a light-transmissive material such as an epoxy resin, a silicone resin, a resin obtained by mixing them, glass, or the like can be used. From the perspective of light resistance and ease of formation, a silicone resin is preferably selected as the base material.

As the light reflective material, titanium oxide, silicon oxide, zirconium oxide, yttrium oxide, yttria-stabilized zirconia, potassium titanate, aluminum oxide, aluminum nitride, boron nitride, mullite, and the like can be used. In the present embodiment, for example, titanium oxide is used. A concentration of the light reflective material in the reflective member 150 is preferably in a range from 10 wt. % to 70 wt. %. The reflective member 150 preferably includes titanium oxide as the light reflective material. Further, the reflective member 150 may include a glass filler or the like in order to reduce expansion and contraction caused by heat of the resin of the base material. A concentration of the glass filler is preferably greater than 0 wt. % and less than 30 wt. %. Note that the concentrations of the light reflective material, the glass filler, and the like are not limited thereto.

The reflective member 150 is a member that reflects the light emitted from the light-emitting element 50. The reflective member 150 is preferably formed of a material having a reflectance of 80% or greater with respect to the light emitted from the light-emitting element 50. Note that the reflective member 150 may be a member that blocks the light emitted from the light-emitting element 50. For example, as the reflective member 150, a single layer film or multilayer film made of a metal, or a multilayer film (dielectric multilayer film) formed by layering a plurality of dielectrics of two or more types can be used. As the dielectric multilayer film, a distributed Bragg reflector (DBR) film, for example, may be used.

Light-Emitting Element 50

The light-emitting element 50 is a semiconductor light-emitting element such as a semiconductor laser or a light-emitting diode. An emission wavelength of each of the light-emitting elements 50 can be selected as desired.

A shape of the light-emitting element 50 in a plan view is, for example, rectangular or hexagonal. A size of each light-emitting element 50 is not particularly limited. Vertical and horizontal lengths of the light-emitting element 50 are, for example, in a range from 0.1 mm to 1 mm. For example, each light-emitting element 50 has a square shape with one side being 320 μm in a plan view.

In the present embodiment, the plurality of light-emitting elements 50 include the first light-emitting element 51 that emits first light, the second light-emitting element 52 that emits second light having a wavelength shorter than that of the first light, and the third light-emitting element 53 that emits third light having a wavelength shorter than that of the second light. The emission wavelength of each of the light-emitting elements 50 may be selected so as to obtain white light or mixed-color light of a light bulb color when the plurality of light-emitting elements 50 are illuminated. For example, the first light-emitting element 51 may be a red light-emitting element that emits red light, the second light-emitting element 52 may be a green light-emitting element that emits green light, and the third light-emitting element 53 may be a blue light-emitting element that emits blue light. The combination of the number of light-emitting elements and the emitted light colors is merely an example and is not limited to this example. The three light-emitting elements 50 may emit light having the same wavelength. For example, three blue light-emitting elements may be selected by using phosphors to be described below.

As the blue and green light-emitting elements, light-emitting elements using ZnSe or a nitride-based semiconductor ($In_XAl_YGa_{1-X-Y}N$, $0 \le X$, $0 \le Y$, $X+Y \le 1$) can be used. For example, a light-emitting element in which a semiconductor layer including GaN is formed on a support substrate such as sapphire may be used. As the red light-emitting element, a GaAs-based, AlInGaP-based, or AlGaAs-based semiconductor or the like can be used. For example, a light-emitting element in which a semiconductor layer including AlInGaP is formed on a support substrate such as silicon, aluminum nitride, or sapphire may be used. Furthermore, a semiconductor light-emitting element made from materials other than above can be used. The composition, emitted light color, size, number, and the like of the light-emitting element can be selected as appropriate in accordance with an intended purpose.

Further, by disposing phosphor, which performs wavelength conversion of light emitted from a semiconductor chip, around the semiconductor chip composed of a nitride-based semiconductor or the like, any desired light emission can be obtained. In this description, the "light-emitting element 50" includes not only the semiconductor chip composed of the nitride-based semiconductor or the like, but also an element composed of the semiconductor chip and the phosphor. Specific examples of the phosphor include yttrium-aluminum-garnet activated by cerium, lutetium-aluminum-garnet activated by cerium, nitrogen containing calcium aluminosilicate activated by europium and/or chromium (part of the calcium can be substituted with strontium), sialon activated by europium, silicate activated by europium, strontium aluminate activated by europium, and potassium fluorosilicate activated by manganese. As an example, the first light-emitting element 51, the second light-emitting element 52, and the third light-emitting element 53 may each include a semiconductor chip that emits blue light. In this case, by disposing the phosphor around the semiconductor chip in each of at least two of those light-emitting elements, the emitted light colors of the first light-emitting element 51, the second light-emitting element 52, and the third light-emitting element 53 can be caused to be different from each other.

Each of the first light-emitting element 51, the second light-emitting element 52, and the third light-emitting element 53 can be bonded, using a bonding member such as a resin, solder, or a conductive paste, to the exposed region 30 of any of the plurality of leads 11*a* to 13*b*.

The first light-emitting element 51 to the third light-emitting element 53 may be respectively disposed in the exposed regions 30 of three different leads (here, leads 11*a*, 12*a*, and 13*a*). With this structure, heat dissipation paths of the first light-emitting element 51, the second light-emitting element 52, and the third light-emitting element 53 can be separated from each other, and thus heat generated by each of the light-emitting elements 50 can be efficiently dissipated.

As illustrated in FIG. 2D, positive and negative electrodes of the first light-emitting element 51 are respectively electrically connected to the lead 11*a* and the lead 11*b* of the first lead pair by a pair of wires 81 composed of wires 81*a* and 81*b*. Further, one end of the wire 81*a* is connected to a part (connection region wr1) of the exposed region 30*a* of the lead 11*a*, and the other end is connected to one of the positive and negative electrodes of the first light-emitting element 51. Further, one end of the wire 81*b* is connected to a part (connection region wr2) of the exposed region 30*b* of the lead 11*b*, and the other end is connected to the other of the positive and negative electrodes of the first light-emitting element 51. Similarly, as illustrated in FIG. 2C, positive and negative electrodes of the second light-emitting element 52 and the third light-emitting element 53 are respectively electrically connected to the leads of the second lead pair and the third lead pair by a pair of wires 82, 83.

As the wires 81 to 83, metal wires made of gold, silver, copper, platinum, aluminum, or alloys thereof can be used. Among these, it is preferable to use a gold wire having excellent ductility, or a gold-silver alloy wire having a higher reflectivity than that of the gold wire.

In the configuration illustrated in FIG. 2C, in a lateral side view from the y-axis direction, the first light-emitting element 51 to the third light-emitting element 53 overlap one another as described above. Note that the arrangement of the first light-emitting element 51 to the third light-emitting element 53 is not limited to the illustrated example. For example, as exemplified in FIG. 4, in a plan view, one light-emitting element 52 positioned in a center in the y-axis direction may be shifted from a line connecting the centers of the other two light-emitting elements 51 and 53. In such a configuration, in a lateral side view from the y-axis direction, only the two light-emitting elements 51 and 53 of the three light-emitting elements may overlap each other.

Precoating Resin 180

Figure 2J:
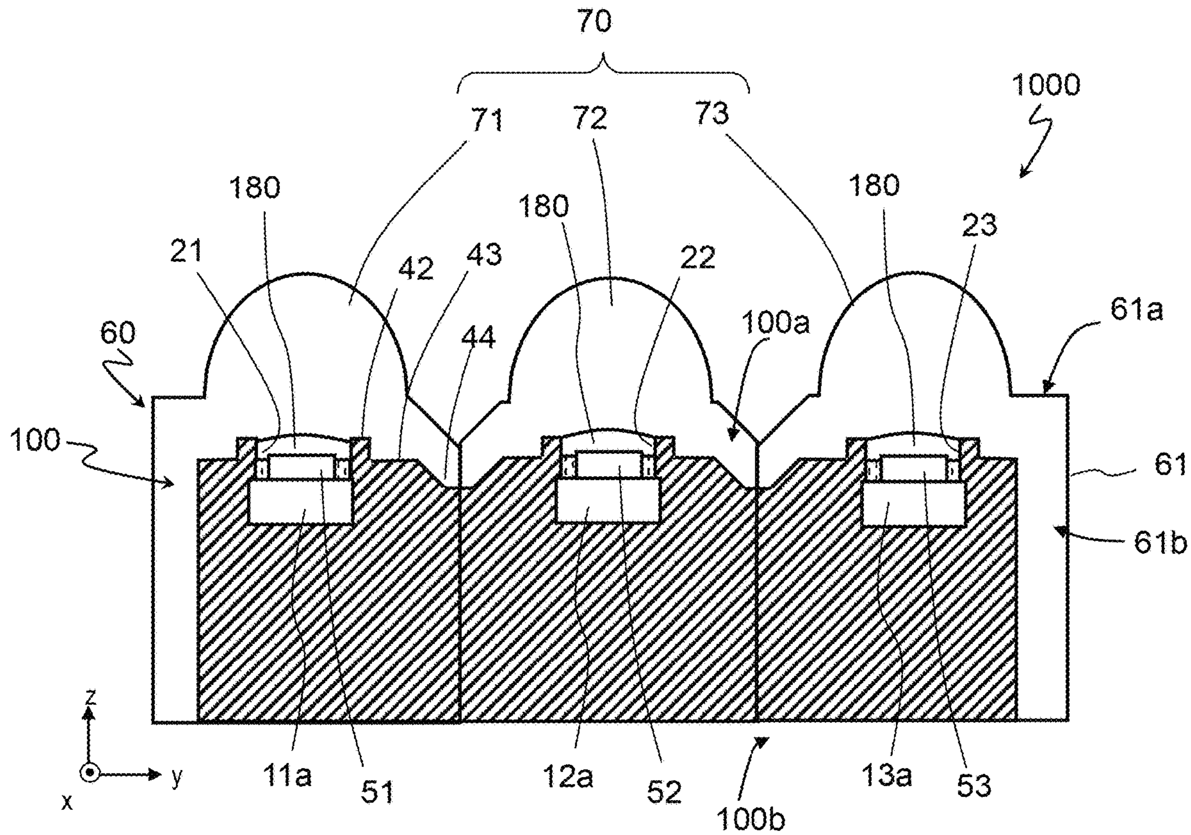
FIG. 2J is a schematic cross-sectional view taken along line 2E-2E illustrated in FIG. 2C, illustrating an example in which the precoating resin is provided to the light-emitting device.
Figure 21:
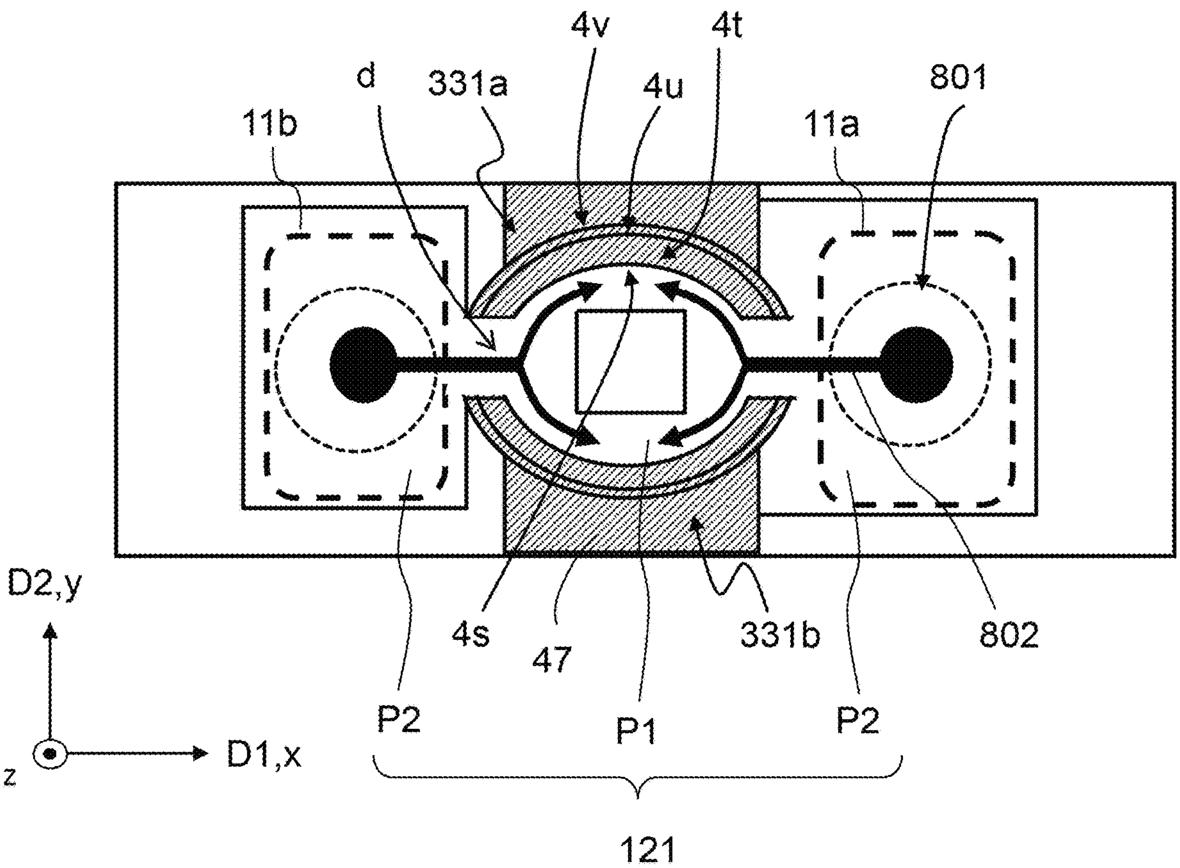
FIG. 21 is an enlarged schematic plan view illustrating a part of the primary surface of the resin package of the light-emitting device illustrated in FIG. 20.

As exemplified in FIGS. 21 and 2J, the light-emitting device 1000 may further include the precoating resin 180 having light transmissivity, between the first reflective member 151 as well as the first light-emitting element 51 and the mold resin portion 60 in the first recessed portion 21. Similarly, the precoating resin 180 may be provided respectively between the second reflective member 152 as well as the second light-emitting element 52 and the mold resin portion 60 in the second recessed portion 22, and between the third reflective member 153 as well as the third light-emitting element 53 and the mold resin portion 60 in the third recessed portion 23. In the present embodiment, the upper surfaces of the second resin portions 42 each surrounding the first recessed portion 21 to the third recessed portion 23 can be respectively used to form the precoating resins 180, having a certain thickness, in the first recessed portion 21 to the third recessed portion 23. The thickness of the precoating resin 180 may be, for example, about 100 μm. The precoating resin 180 preferably has substantially the same thickness on the ±y sides of the light-emitting element 50, and substantially the same thickness on the ±x sides of the light-emitting element 50, in a plan view. More preferably, the thickness is entirely uniform in the first recessed portion 21. With the thickness of the precoating resin 180 being constant, the light distribution can be easily controlled. Further, the upper surface of the precoating resin 180 (interface between the precoating resin 180 and the mold resin portion 60) can be made substantially flat, making it possible to less likely reduce the controllability of the light distribution by the lens portion 70. Further, a thickness from the upper surface of each light-emitting element 50 to the precoating resin is uniform, making it possible to keep the mold resin portion 60 to be described below away from the light and the heat emitted by the light-emitting element 50, and thus further enhance reliability.

The precoating resin can cover the reflective member 150 and the light-emitting element 50, for example. As the precoating resin, a resin having excellent high heat resistance and high weather resistance (epoxy resin, silicone resin, or resin obtained by mixing them, for example) can be used. As will be described below, a resin (colored resin member) containing a colorant may be used as the precoating resin.

Mold Resin Portion

The mold resin portion 60 includes the plurality of lens portions 70 integrally formed. In the present embodiment, the mold resin portion 60 includes the base portion 61 and the plurality of lens portions 70. The base portion 61 and the lens portions 70 are integrally formed. Note that the base portion of the mold resin portion 60 and the lens portions 70 may be separate.

Base Portion 61

As illustrated in FIGS. 2A to 2E, the base portion 61 of the mold resin portion 60 covers the primary surface 100*a* of the resin package 100 and the plurality of light-emitting elements 50. The base portion 61 has functions of sealing the light-emitting elements 50, and of holding the lens portions 70 integrally formed with the base portion 61 in predetermined positions.

In the present embodiment, the base portion 61 includes, for example, the upper surface 61*a* positioned above the primary surface 100*a* of the resin package 100. The upper surface 61*a* may be one size larger than the primary surface 100*a* of the resin package 100.

The base portion 61 includes a lateral surface portion 61*b* covering at least a part of the side portions 100*c* to 100*f* of the resin package 100. In the illustrated example, the lateral surface portion 61*b* of the base portion 61 is in contact with the step surfaces st1 and st2 formed in the side portions 100*c* to 100*f* of the resin package 100. Further, a part of the lateral surface portion 61*b* of the base portion 61 covers a portion of each of the side portions 100*c* and 100*d* where a step surface is not formed and extends downward (−z direction) of the step surfaces st1 and st2. A lowermost end of the base portion 61 may be flush with the back surface 100*b* of the resin package 100.

Apart of the base portion 61 is positioned in interiors of the grooves 44 and the holes 45 of the first dark-colored resin member 40. Accordingly, peeling, shifting, and the like of the lens portion 70 can be reduced, and the lens portion 70 can be held more stably. In a cross-sectional view, a part of the base portion 61 disposed inside the hole 45 is preferably disposed below (−z direction) the step surface st1 or the step surface st2 of the resin package 100, and more preferably disposed down to a position of the back surface 100*b* of the resin package 100. Note that the shape, the light transmittance, and the like of the base portion 61 are not particularly limited.

Lens Portion 70

As illustrated in FIGS. 2A to 2E, each of the plurality of lens portions 70 has a convex shape protruding upwardly (+z direction) from an upper surface of the base portion 61. The lens portion 70 has a light distribution function of controlling a direction and a distribution of the light to be emitted.

The planar shape of each lens portion 70 is, for example, elliptical or circular. In the illustrated example, the planar shape of each lens portion 70 is elliptical, with a major axis of the elliptical shape extending in the x-axis direction and a minor axis of the elliptical shape extending in the y-axis direction. Thus, a light distribution that is wide in the x-axis direction and narrow in the y-axis direction can be obtained. The light-emitting device 1000 having such a light distribution can be particularly suitably used in a display device such as an LED display. Note that, in a lateral side view as viewed in the x-axis direction or the y-axis direction, an outer edge of the lens portion 70 may have a linear portion in addition to a curved portion such as an elliptical arc shape or an arc shape. The linear portion may be positioned between the curved portion and the upper surface 61*a* of the base portion 61. For example, the lens portion 70 may have a shape in which a part of a sphere (hemisphere, for example) is disposed on a circular truncated cone, or a shape in which a part of an ellipsoid is disposed on an elliptical truncated cone.

Each of the plurality of lens portions 70 is disposed correspondingly to one of the light-emitting elements 50 in a one-to-one relationship. An optical axis of each lens portion 70 may coincide with a center of the corresponding light-emitting element 50 (center of the light-emitting surface). With this structure, controllability of the light distribution of the light-emitting device 1000 can be further improved.

The major axis of the elliptical shape of each lens portion 70 may be parallel to the longer direction of the corresponding recessed portion 20, and the minor axis of the elliptical shape of each lens portion 70 may be parallel to the shorter direction of the corresponding recessed portion 20. Further, the minor axis of the elliptical shape of each lens portion 70 may be parallel to the array direction of the lens portions 70 (here, y-axis direction). With this structure, the light-emitting device 1000 can be further miniaturized. Furthermore, in a case in which the light-emitting element 50 has a rectangular shape, the longer direction of the light-emitting element 50 and the major axis of the elliptical shape of the lens portion 70 may be parallel, and the shorter direction of the light-emitting element 50 and the minor axis of the elliptical shape of the lens portion 70 may be parallel.

Note that the shape and arrangement of each of the lens portions 70 in a plan view can be selected as appropriate taking into account light distribution performance, light collection performance, and the like.

In the present embodiment, the first light emitted from the first light-emitting element 51 is transmitted through the first lens portion 71 and exits from an emission surface of the light-emitting device 1000. The direction of emission and the distribution of the first light are controlled by the first lens portion 71. Similarly, the second light emitted from the second light-emitting element 52 is transmitted through the second lens portion 72, and the third light emitted from the third light-emitting element 53 is transmitted through the third lens portion 73. The second lens portion 72 and the third lens portion 73 control the light distribution of the second light and the third light, respectively.

As illustrated in FIG. 2C, in a plan view, the first lens portion 71 may overlap the first light-emitting element 51 and at least a part of the first reflective member 151. Similarly, the second lens portion 72 may overlap the second light-emitting element 52 and at least a part of the second reflective member 152, and the third lens portion 73 may overlap the third light-emitting element 53 and at least a part of the third reflective member 153.

Further, in the present embodiment, in a plan view, the maximum width of each lens portion 70 is smaller than the maximum width of the corresponding recessed portion 20, and thus a part of the inner upper surface 20*a* of each recessed portion 20 can be positioned outside the lens portion 70. As illustrated, in a plan view, a part of the first reflective member 151 in the first recessed portion 21 may be positioned outside the first lens portion 71. Similarly, a part of the second reflective member 152 in the second recessed portion 22 may be positioned outside the second lens portion 72, and a part of the third reflective member 153 in the third recessed portion 23 may be positioned outside the third lens portion 73.

In a case in which each lens portion 70 has an elliptical shape with a major axis and a minor axis in a plan view, the length WL of the major axis of the elliptical shape may be smaller than the width PL of the corresponding recessed portion 20 in the longer direction, and the length WS of the minor axis of the elliptical shape may be smaller than the width PS of the corresponding recessed portion 20 in the shorter direction.

As described above, in the present embodiment, in a lateral side view from the x-axis direction, the maximum width of each lens portion 70 (length WS of the minor axis of the elliptical shape in this example) may be no greater than 5 times the maximum width of the corresponding light-emitting element 50 (here, length w1 of the side of the rectangle). On the other hand, in a lateral side view from the x-axis direction, the maximum width of each lens portion 70 is greater than 1 times, for example, and preferably greater than or equal to 3 times the maximum width of the corresponding light-emitting element 50. This makes it possible to more reliably realize the desired light distribution control.

Further, as described above, among the cross-sections including a line connecting the vertex of each lens portion 70 and the center point of the lens portion 70 in a plan view, in a cross-section in which the width of the lens portion 70 is minimized, the width of the lens portion 70 may be no greater than 5 times the width of the corresponding light-emitting element 50. On the other hand, in the cross-section described above, the width of the lens portion 70 is greater than 1 times, preferably greater than or equal to 3 times, the width of the corresponding light-emitting element 50. This makes it possible to more reliably realize the desired light distribution control.

Figure 4:
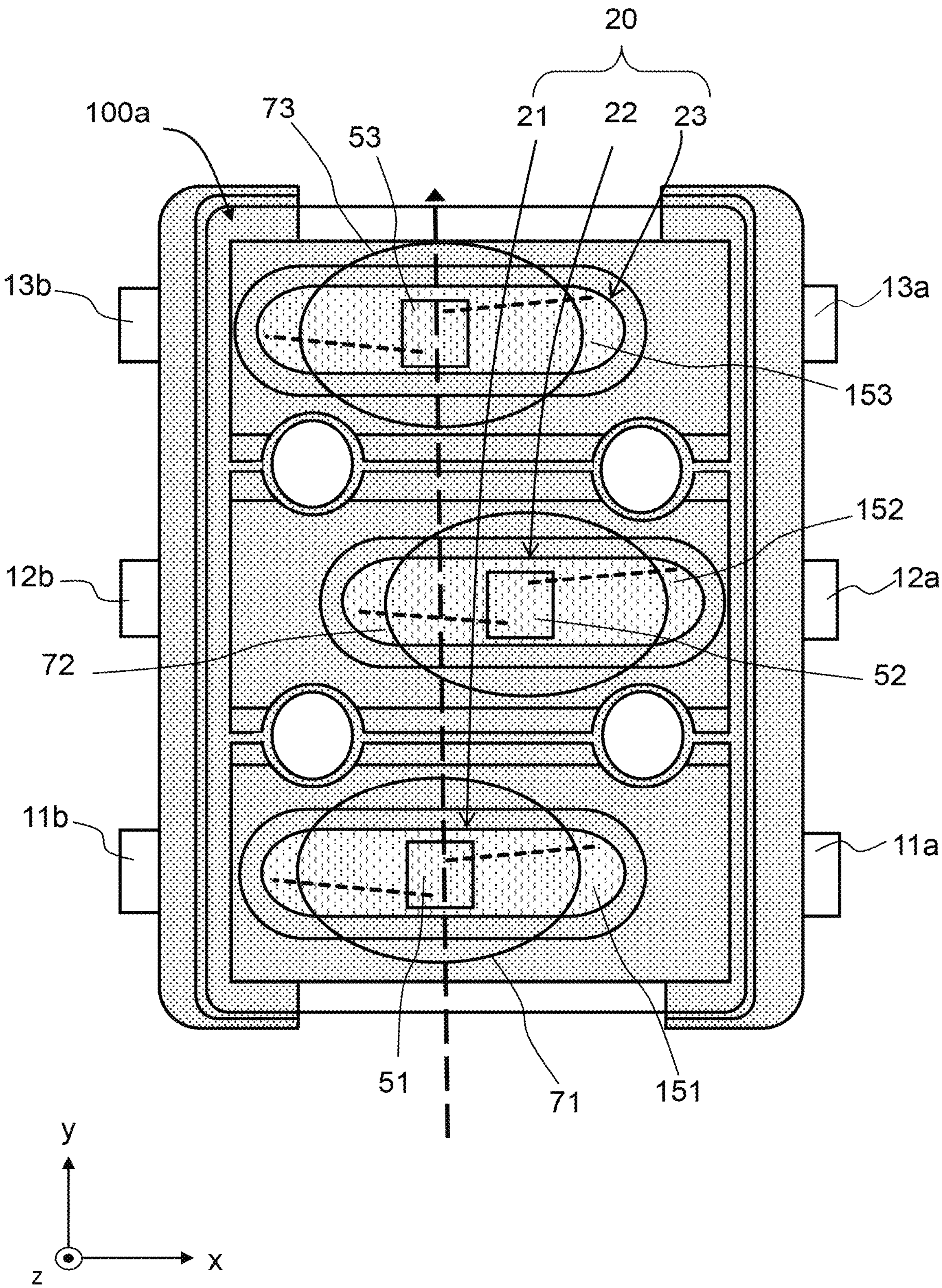
FIG. 4 is a schematic top view of another light-emitting device of the present disclosure.

In the example illustrated in FIG. 2C, in a plan view, the first lens portion 71, the second lens portion 72, and the third lens portion 73 are arrayed in the y-axis direction. In a plan view, centers of the first lens portion 71 to the third lens portion 73 may be positioned on a straight line parallel to the y-axis. Note that the arrangement of the lens portions 70 is not limited to this example. For example, as illustrated in FIG. 4, the center of the lens portion among the first lens portion 71, the second lens portion 72, and the third lens portion 73 that is positioned centrally in the x-axis direction or the y-axis direction may not be positioned on a line connecting the centers of the other two lens portions.

Material of Mold Resin Portion 60

The mold resin portion 60 includes a base material having light transmissivity. The mold resin portion 60 preferably has a light transmittance of 90% or greater at respective peak wavelengths of the plurality of light-emitting elements 50. With this structure, the light extraction efficiency of the light-emitting device 1000 can be further improved.

As the base material of the mold resin portion 60, a thermosetting resin, such as an epoxy resin, a urea resin, a silicone resin, and the like having excellent weather resistance and light transmissivity, glass, and the like is suitably used.

The mold resin portion 60 according to the present embodiment can also contain a light-diffusing material in order to improve a uniformity of the quality of the light of the light-emitting device 1000. With the mold resin portion 60 containing the light-diffusing material, the light emitted from the light-emitting element 50 can be diffused to suppress unevenness in light intensity. As such a light-diffusing material, an inorganic material such as barium oxide, barium titanate, silicon oxide, titanium oxide, and aluminum oxide, or an organic material such as a melamine resin, a CTU guanamine resin, and a benzoguanamine resin is suitably used.

The mold resin portion 60 may contain various fillers. Although a specific material of the filler is similar to the light-diffusing material, the central particle size ($D_{50}$) differs from that of the light-diffusing material. In this description, filler refers to a filler having a central particle size in a range from 5 μm to 100 μm. When the filler having such a particle size is contained in a light-transmissive resin, chromaticity variation of the light-emitting device 1000 can be improved by a light-scattering effect, and further heat shock resistance of the light-transmissive resin can be enhanced, and internal stress of the resin can be alleviated.

A surface roughness of the base portion 61 is not particularly limited, but from the perspective of improving the display contrast, the surface roughness is preferably large. A part or all of the surface of the base portion 61 may be roughened, for example. Of the upper surface 61*a* of the base portion 61, at least the portion that does not overlap the plurality of lens portions 70 in a plan view is preferably roughened. An outer surface of the lateral surface portion 61*b* of the base portion 61 may also be roughened. A surface roughness of the upper surface 61*a* and a surface roughness of the outer surface of the lateral surface portion 61*b* may be the same or may be different. From the perspective of ease of processing, the surface roughness of the upper surface 61*a* and the surface roughness of the outer surface of the lateral surface portion 61*b* are preferably the same. With the surface roughness of the base portion 61 being large, the external light such as sunlight can be scattered on the surface of the base portion 61, and thus the reflection intensity can be suppressed. Accordingly, it is possible to make the light-emitting device 1000 less susceptible to a deterioration in contrast due to the external light reflection.

The surface roughness of the portion, of the upper surface 61*a* of the base portion 61, that does not overlap the plurality of lens portions 70 in a plan view may be greater than the surface roughness of the lens portion 70, for example. Such a structure is obtained by, for example, forming the mold resin portion 60 including the base portion 61 and the lens portions 70, and subsequently performing roughening processing such as blasting on a predetermined region of the surface of the base portion 61. Alternatively, a casting case whose inner surface is partially roughened may be used for forming the mold resin portion 60. As will be described in detail below, for example, by roughening, in advance, a portion of the inner surface of the casting case that forms the upper surface 61*a* of the base portion 61, the surface roughness of a portion of the upper surface 61*a* of the base portion 61 that does not overlap the plurality of lens portions 70 in a plan view can be increased.

An arithmetic mean roughness Ra of the upper surface 61*a* of the base portion 61 is preferably in a range from 0.4 μm to 5 μm. More preferably, Ra is in a range from 0.8 μm to 3 μm. Ra of an outer surface of the lateral surface portion 61*b* of the base portion 61 may also be in the same range as described above. Ra can be measured in accordance with the method for measuring the surface roughness stipulated in JIS B 0601-2001. Specifically, Ra is expressed by the following equation, when a portion of a measurement length L is extracted from a roughness curve in the direction of the center line thereof, the center line of the extracted portion is the x-axis, a direction of the longitudinal magnification is the y-axis, and the roughness curve is y=f(x).

$$Ra = \frac{1}{L}\int_{O}^{L} |f(x)|dx$$

A contact type surface roughness measuring machine, a laser microscope, or the like can be used for measuring Ra. In this description, the laser microscope VK-250 available from Keyence is used.

The base portion 61 preferably has a light transmittance of 90% or greater at respective peak wavelengths of the plurality of light-emitting elements 50. With this structure, the light extraction efficiency of the light-emitting device 1000 can be further improved.

In the present embodiment, the reflective member 150 surrounds each of the light-emitting elements 50, making it possible to reduce the size of the surface that serves as the light source (create a point light source). This makes it possible to reflect light from the lateral surface of each light-emitting element 50 toward the light-emitting element 50 and emit the light from the upper surface of the light-emitting element 50 in the frontward direction (+z direction) of the light-emitting device 1000. Thus, even if the lens portion 70 is miniaturized, light can be extracted with high efficiency from the light-emitting element 50. With the size of each lens portion 70 miniaturized, it is possible to reduce a size of the light-emitting device 1000.

The creation of a point light source will now be described with reference to the drawings.

FIGS. 5A to 5D are each a schematic view for describing a part of light emitted from a light-emitting element and incident on a lens portion in a light-emitting device of a comparative example not including a reflective member. FIG. 5E is a schematic view for describing a part of light emitted from a light-emitting element and incident on a lens portion in a light-emitting device of an example including a reflective member. FIGS. 5A to 5E are each a yz cross-sectional view including a vertex of the lens portion and a center point, in a plan view, of the lens portion.

In the comparative example illustrated in FIGS. 5A to 5D, the light-emitting element 50 is disposed in a recessed portion 620 in which an inner upper surface and a lateral surface are constituted by leads, for example. With such a configuration, a part of the light leaking from the lateral surface of the light-emitting element 50 is reflected by an inner lateral surface and an inner upper surface of the recessed portion 620 and emitted toward a lens portion 670. Therefore, in a top view, the entire inner upper surface of the recessed portion 620 is in a light-emitting state and functions as a light source E1. The size of the light source E1 in the y-axis direction (hereinafter referred to as "light source size") is a size of the inner upper surface of the recessed portion 620.

Figure 5A:
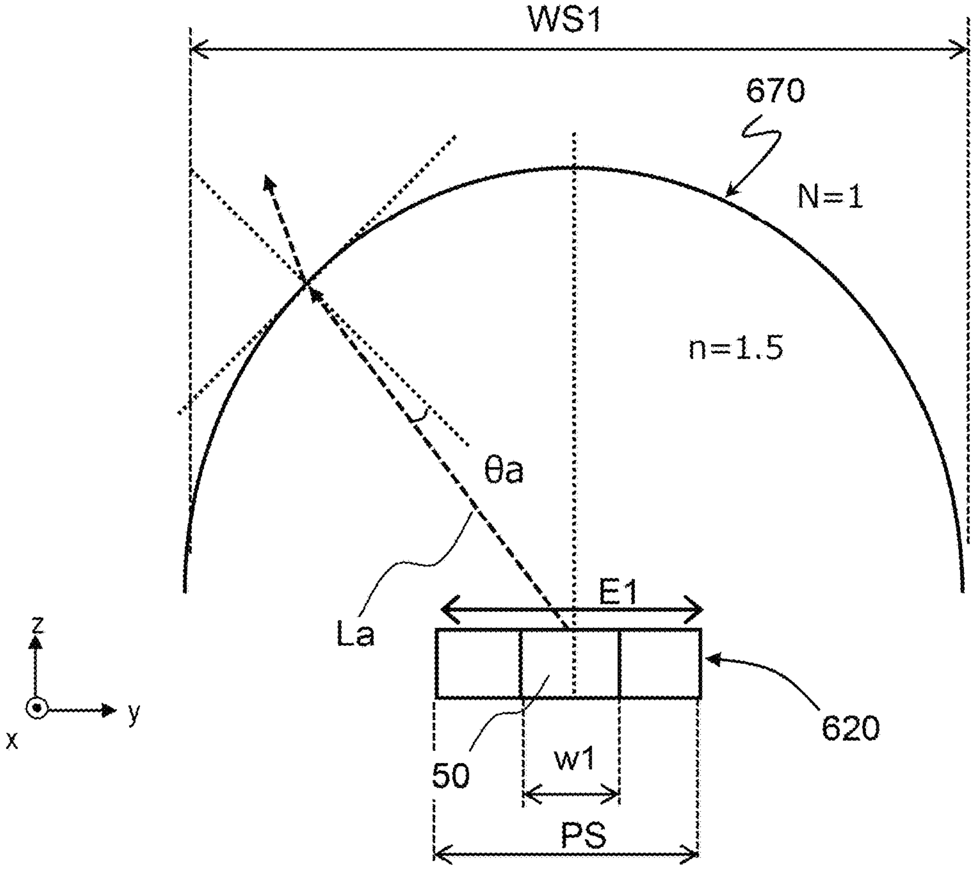
FIG. 5A is a schematic cross-sectional view for describing light incident on a lens portion from the light-emitting element in a light-emitting device of a comparative example.
Figure 5B:
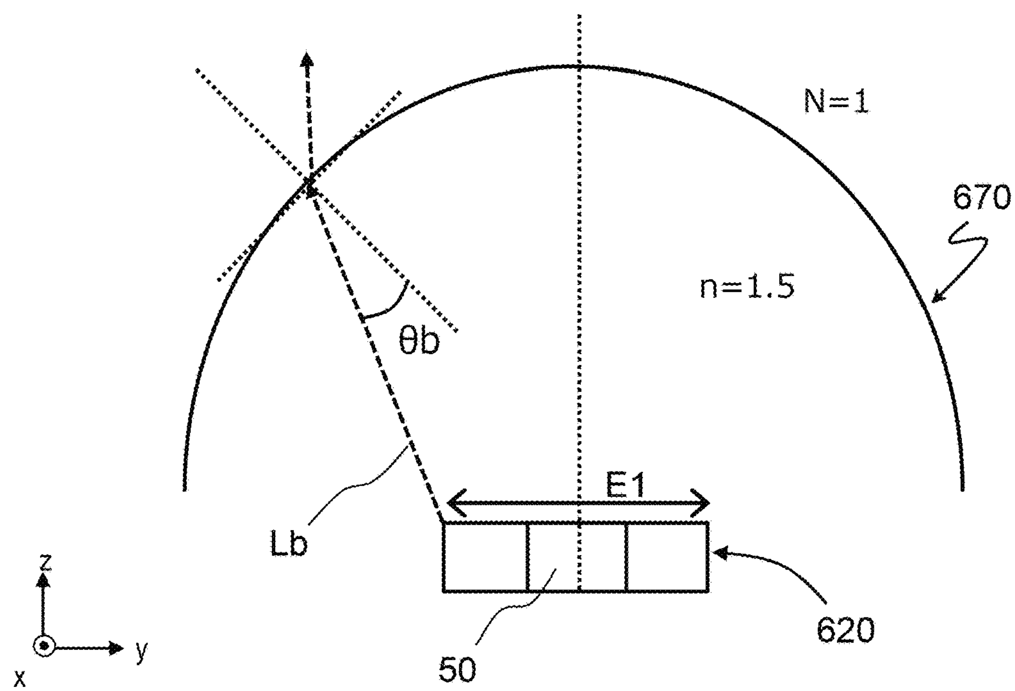
FIG. 5B is a schematic cross-sectional view for describing light incident on the lens portion from the light-emitting element in the light-emitting device of the comparative example.

As illustrated in FIGS. 5A and 5B, when a size of the lens portion 670 (length in the y-axis direction: WS1) is sufficiently large relative to that of the light source E1, light La from a central portion of the light source E1 and light Lb from an end portion of the light source E1 are both incident on an inner surface of the lens portion 70 at angles θa and θb, respectively, that are smaller than a critical angle. The inner surface of the lens portion 70 is a surface on which the light emitted from the light-emitting element 50 is incident from an inner side. The inner surface of the lens portion 70 may be referred to as an outer surface of the light-emitting device 1000. When the lens portion 70 is made of, for example, an epoxy resin (refractive index n: 1.5), the critical angle is approximately 40°. The light beams La and Lb are extracted from the lens portion 670 to the outside at an interface between the lens portion 670 and an external air layer (refractive index N=1).

Figure 5C:
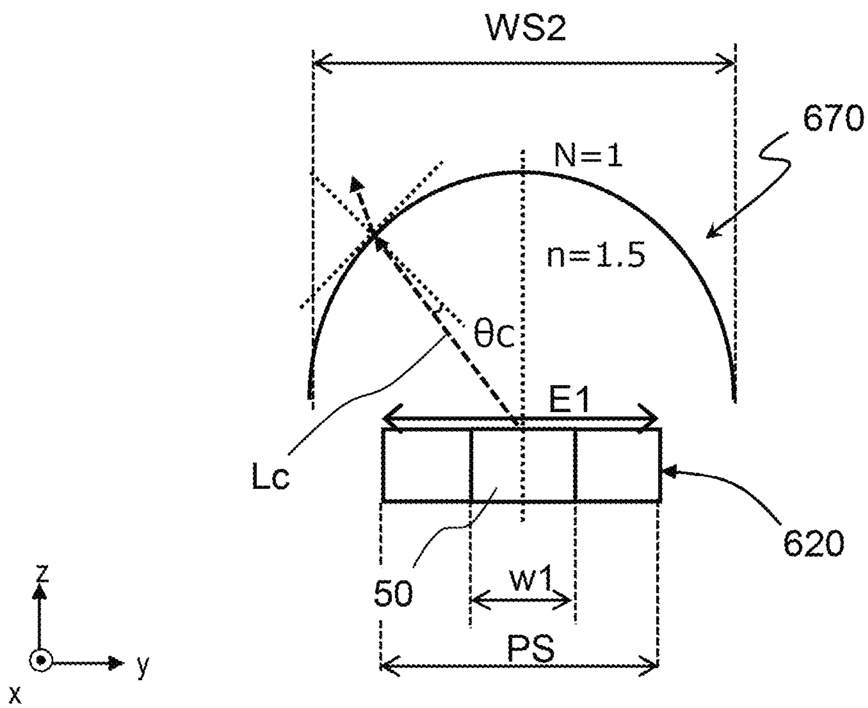
FIG. 5C is a schematic cross-sectional view for describing light incident on the lens portion from the light-emitting element in the light-emitting device of the comparative example.
Figure 5D:
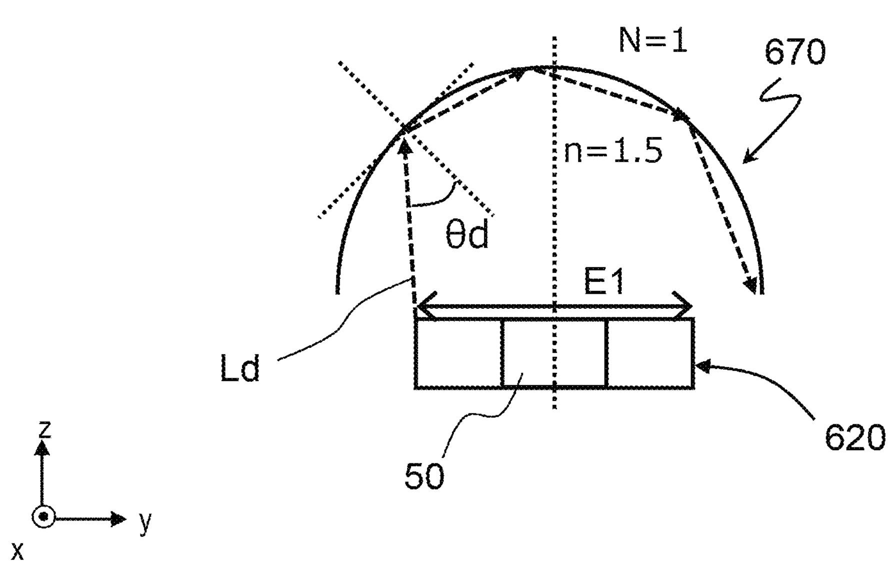
FIG. 5D is a schematic cross-sectional view for describing light incident on the lens portion from the light-emitting element in the light-emitting device of the comparative example.
Figure 5E:
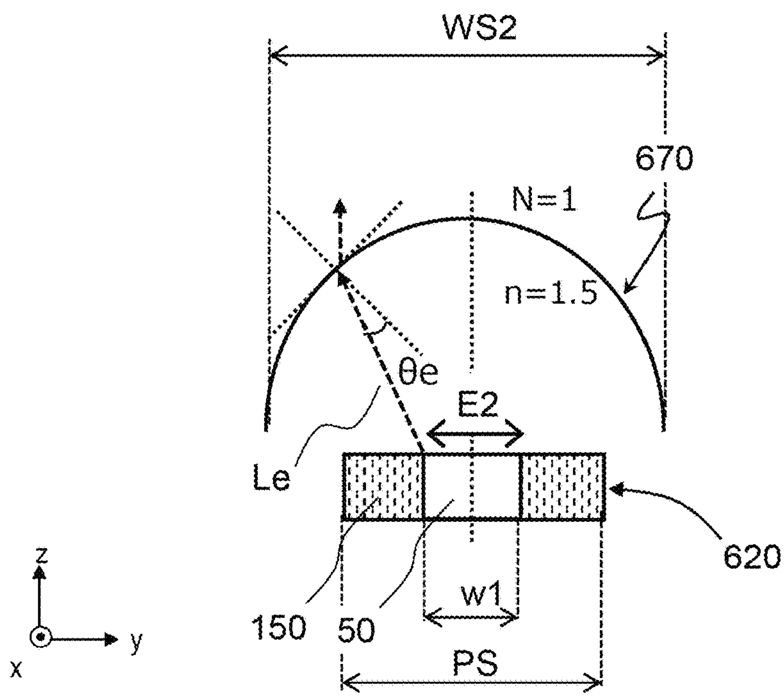
FIG. 5E is a schematic cross-sectional view for describing light incident on the lens portion from the light-emitting element in the light-emitting device of an example.

On the other hand, as illustrated in FIGS. 5C and 5D, when the size of the lens portion 670 is reduced (length in the y-axis direction: WS2, WS2<WS1), light Lc from the central portion of the light source E1 is incident on an inner surface of the lens portion 670 at an angle θc less than 40°, and thus light is extracted to the outside by the lens portion 670. However, a part of the light from the light source E1 such as, for example, light Ld from the end portion of the light source E1, is incident on the inner surface of the lens portion 670 at an angle θd that is greater than the critical angle. The light Ld is totally reflected by the inner surface of lens portion 670. The totally reflected light Ld may not be emitted from above the lens portion 670, such as in FIG. 5D, for example, which can be a loss of luminous flux. Therefore, the smaller size of the lens portion 670 tends to increase the loss of luminous flux due to total reflection, thereby decreasing the light extraction efficiency.

The light-emitting element 50 is disposed in the recessed portion 620 in the comparative example illustrated in FIGS. 5C and 5D, whereas the light-emitting element 50 and the reflective member 150 in contact with the lateral surface of the light-emitting element 50 are disposed in the recessed portion 620 in the example illustrated in FIG. 5E. In the example illustrated in FIG. 5E, the reflective member 150 fully covers the lateral surface of the light-emitting element 50. According to this configuration, a part of light emitted from the lateral surface of the light-emitting element 50 is reflected toward the light-emitting element 50 by the reflective member 150 and is emitted from the upper surface of the light-emitting element 50. Thus, a light source E2 is an upper surface of the light-emitting element 50 in a top view. A size of the light source E2 in the example has the width w1 in the y-axis direction of the light-emitting element 50. Accordingly, for example, when the size of the lens portion 670 is the same (lengths in the y-axis direction: WS2) for the lens portions 670 illustrated in FIGS. 5C and 5D and the lens portion 670 illustrated in FIG. 5E, an incident angle θe of light Le from an end portion of the light source E2 toward the inner surface of the lens portion 670 is less than the critical angle, and an exit direction of the light Le can be controlled by the lens portion 670.

Thus, in the example, the light source size is reduced as compared with the comparative example, and thus an exit range of the light from the light source E2 is limited to a range narrower than that in the comparative example. Accordingly, the luminous flux loss due to total reflection is reduced at the inner surface of the lens portion 670. Thus, the lens size can be reduced while maintaining light extraction. Because the lens size can be reduced, light can be extracted with high efficiency in the frontward direction, and a light-emitting device that can be miniaturized can be obtained.

Further, according to the present embodiment, the light distribution can be controlled by the lens portion 70 provided on the emission side of the light-emitting element 50. For example, in the configuration illustrated in FIG. 2A, in a plan view, each lens portion 70 has an elliptical shape having a major axis in the x-axis direction, and thus a light distribution that is wide in the x-axis direction and narrow in the y-axis direction is obtained. By thus controlling the light distribution, it is possible to further improve the extraction efficiency of the light of the light-emitting device 1000 in the frontward direction. Thus, according to the present embodiment, it is possible to obtain the light-emitting device 1000 having a light distribution suitable for a display device such as an LED display, and a light extraction efficiency further enhanced in the frontward direction. Further, with the light extraction efficiency enhanced and thus the brightness of the light-emitting device 1000 increased, a service life of the light-emitting device can be further improved without applying excessive power to the light-emitting device 1000.

The light-emitting device 1000 of the present embodiment has a structure that is surface mountable by reflow soldering. Thus, a mounting cost and the number of mounting steps can be reduced as compared with those of the lamp-type light-emitting device in the related art mounted by flow soldering.

Study on Size of Lens Portion

The results of a study on the relationship between the size of the lens portion and the size of the light-emitting element will be described below.

Here, examples in which the reflective member 150 is disposed on the lateral surface of the light-emitting element 50 and comparative examples in which the reflective member 150 is not disposed on the lateral surface of the light-emitting element 50 are used. The examples and the comparative examples have the same configuration other than the presence or absence of the reflective member 150. Light-emitting devices A1 to A4 of the examples and light-emitting devices B1 to B4 of the comparative examples, each including the lens portion 670 of a different size, were used, and the total luminous flux of light emitted from each light-emitting device was determined.

In each light-emitting device of the examples and the comparative examples, the light-emitting element is disposed in the recessed portion 620 including the inner upper surface having an elliptical shape, and the lens portion 670 is disposed thereabove. Lengths of the light-emitting element 50, the recessed portion 620, and the lens portion 670 in the x-axis direction and the y-axis direction in a plan view of each of the examples and the comparative examples are shown in Table 1. In this example, the light-emitting element 50 is rectangular in a plan view, and the lengths of the light-emitting element 50 in the x-axis direction and the y-axis direction are the lengths w2 and w1 of the sides of the rectangle (here, square), respectively. The lens portion 670 has an elliptical shape in a plan view, the length of the lens portion 670 in the x-axis direction is the length WL of the major axis of the elliptical shape, and the length of the lens portion 670 in the y-axis direction is the length WS of the minor axis of the elliptical shape.

Further, for each of the examples and the comparative examples, a ratio (hereinafter abbreviated as "size ratio") WS/w1 of the length WS of the lens portion 670 in the y-axis direction (shorter direction of the lens portion) to the length w1 of the light-emitting element in the y-axis direction is also shown in Table 1.

In the light-emitting devices A1 and B1, the total luminous flux was determined by measuring the luminous flux of an upper hemispherical surface of the light-emitting element 50 using an integrating sphere. A 10-inch integrating sphere manufactured by LabSphere Inc. was used as the integrating sphere. The total luminous flux was measured in accordance with the measurement method of JIS C 8152. In the light-emitting devices A2 to A4 and B2 to B4, the total luminous flux was determined using the optical simulation software Light Tools (trade name). Simulations were performed under the same conditions as those of the measurement environment of the integrating sphere.

Given 100% as the total luminous flux of the light emitted from the light-emitting device B1 of the comparative example, a relative value of the total luminous flux (hereinafter referred to as "luminous flux ratio") of each light-emitting device was determined. The results are also shown in Table 1.

TABLE 1

| | | Length of lens portion [mm] | | Width of light-emitting element [mm] | | Width of recessed portion [mm] | | | |
|---|---|---|---|---|---|---|---|---|---|
| | | Length in y-axis direction (Length of minor axis) WS | Length in x-axis direction (Length of major axis) WL | Width w1 in y-axis direction | Width w2 in x-axis direction | Width PS in y-axis direction | Width PL in x-axis direction | WS/w1 [—] | Luminous flux ratio [%] |
| Example | A1 | 1.88 | 3.76 | 0.32 | 0.32 | 1.14 | 1.25 | 8.4 | 89 |
| | A2 | 1.39 | 2.79 | | | | | 6.3 | 89 |
| | A3 | 1.04 | 2.09 | | | | | 4.7 | 88 |
| | A4 | 0.70 | 1.39 | | | | | 3.1 | 84 |
| Comparative example | B1 | 1.88 | 3.76 | 0.32 | 0.32 | 1.14 | 1.25 | 8.4 | 100 |
| | B2 | 1.39 | 2.79 | | | | | 6.3 | 95 |
| | B3 | 1.04 | 2.09 | | | | | 4.7 | 86 |
| | B4 | 0.70 | 1.39 | | | | | 3.1 | 72 |

Figure 6:
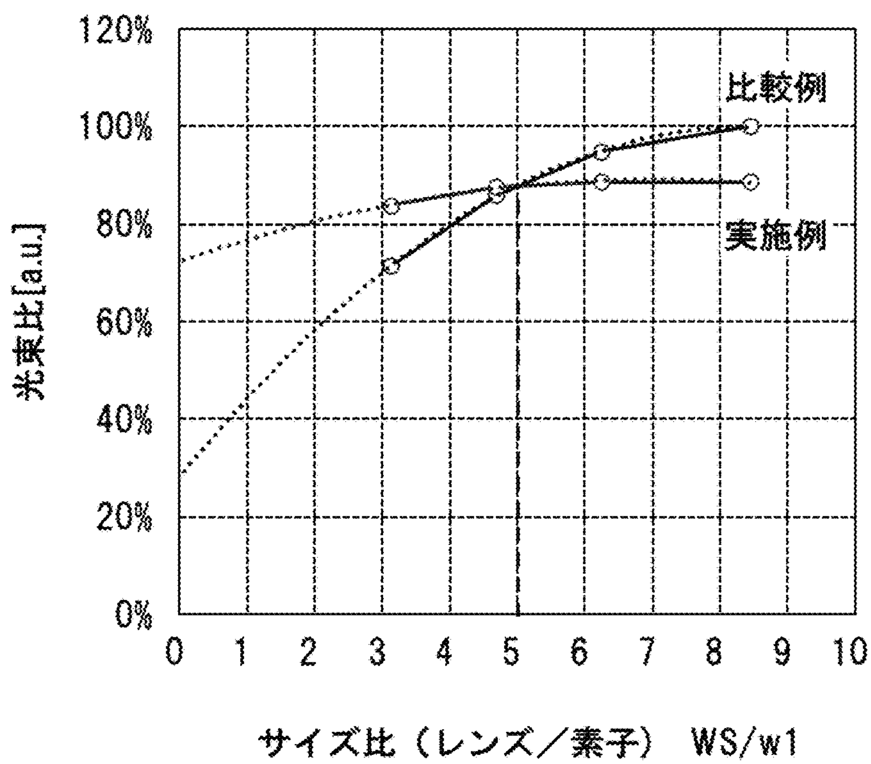
FIG. 6 is a schematic diagram illustrating a relationship between a size ratio WS/w1 of the lens portion to the light-emitting element and a luminous flux ratio.

FIG. 6 is a diagram illustrating a relationship between the size ratios WS/w1 of the lens portion to the light-emitting element and the luminous flux ratios of the examples and the comparative examples.

From FIG. 6, it is understood that, when the size of the lens portion 670 is sufficiently large and the reflective member 150 is disposed, the luminous flux ratio is slightly smaller than that of a case in which the reflective member 150 is absent. For example, the total luminous flux of the light-emitting device A1 of the example is approximately 89% of the total luminous flux of the light-emitting device B1 of the comparative example. This is conceivably because, in this example, a part of the light leaked from the lateral surface of the light-emitting element is absorbed by the reflective member or is transmitted through the reflective member and absorbed by the dark-colored resin member, and thus not emitted toward the lens portion 670, increasing the loss of the luminous flux as compared with the comparative example.

Further, it is understood from FIG. 6 that the luminous flux ratio tends to decrease when the size ratio WS/w1 of the lens portion 670 to the light-emitting element 50 is reduced, regardless of the presence or absence of the reflective member 150. In particular, in the comparative examples in which the reflective member 150 is not disposed, the luminous flux ratio is significantly reduced in association with a reduction in lens size. On the other hand, in the examples including the reflective member 150, a decrease in the luminous flux ratio due to a reduction in lens size is suppressed as compared with the comparative examples. This is conceivably because, as described above with reference to FIGS. 5A to 5E, in the examples, the light source size is reduced by the reflective member 150, resulting in a reduction in the loss of luminous flux caused by miniaturization of the lens portion.

According to the results illustrated in FIG. 6, when the size ratio WS/w1 of the lens to the light-emitting element is no greater than a predetermined value (no greater than 5.0, for example), the luminous flux ratios of the light-emitting devices of the examples are higher than those of the comparative examples. From this, it is understood that, in the light-emitting devices of the examples, when the size ratio WS/w1 of the lens to the light-emitting element is no greater than 5.0, a range of improvement in the luminous flux ratio due to the creation of a point light source exceeds the loss of luminous flux due to the reflective member, and luminous flux ratios higher than those of the comparative examples are obtained.

Further, it is understood that, in the light-emitting devices of the examples, when the size ratio WS/w1 is, for example, 3.0 or greater, a luminous flux ratio of 84% or higher can be obtained.

Note that the examples described above indicate study results obtained using the lens portion 670 having an elliptical planar shape, but the planar shape of the lens portion 70 may not be elliptical. A similar effect can be obtained when a minimum length passing through the center (optical axis) of the lens portion 70 is no greater than 5 times the width of the light-emitting element 50 along a direction parallel to the minimum length, in a plan view. When the lens portion 70 is circular, it is sufficient that the diameter of the lens portion 70 be no greater than 5 times the maximum width of the light-emitting element 50.

Further, the study described above was conducted using a light-emitting device in which the light-emitting element and the reflective member 150 were disposed in the recessed portion 620, but the same effect can be obtained even in a light-emitting device in which the light-emitting element and the reflective member are not disposed in the recessed portion 620. That is, as long as the reflective member 150 is disposed near the lateral surface of the light-emitting element, regardless of the presence or absence of the recessed portion 620, the light source size can be reduced (a point light source can be created). Accordingly, as with the study results shown in FIG. 6, as long as the size ratio WS/w1 is no greater than 5.0, it is possible to more effectively improve the light extraction efficiency.

Various modified examples can be conceived with respect to the light-emitting device. For example, the structure and the arrangement of the light-emitting elements, the structure and the form of the resin package, and the configuration of the mold resin portion are not limited to those modes described in the above-described embodiment. Modes other than those described in the above-described embodiment can be suitably used in the light-emitting device of the present disclosure.

Modified examples of the light-emitting device of the present disclosure will be described below. In the following, points different from those of the light-emitting device 1000 will be mainly described, and a description of structures similar to those of the light-emitting device 1000 will be omitted.

First Modified Example

Figure 7A:
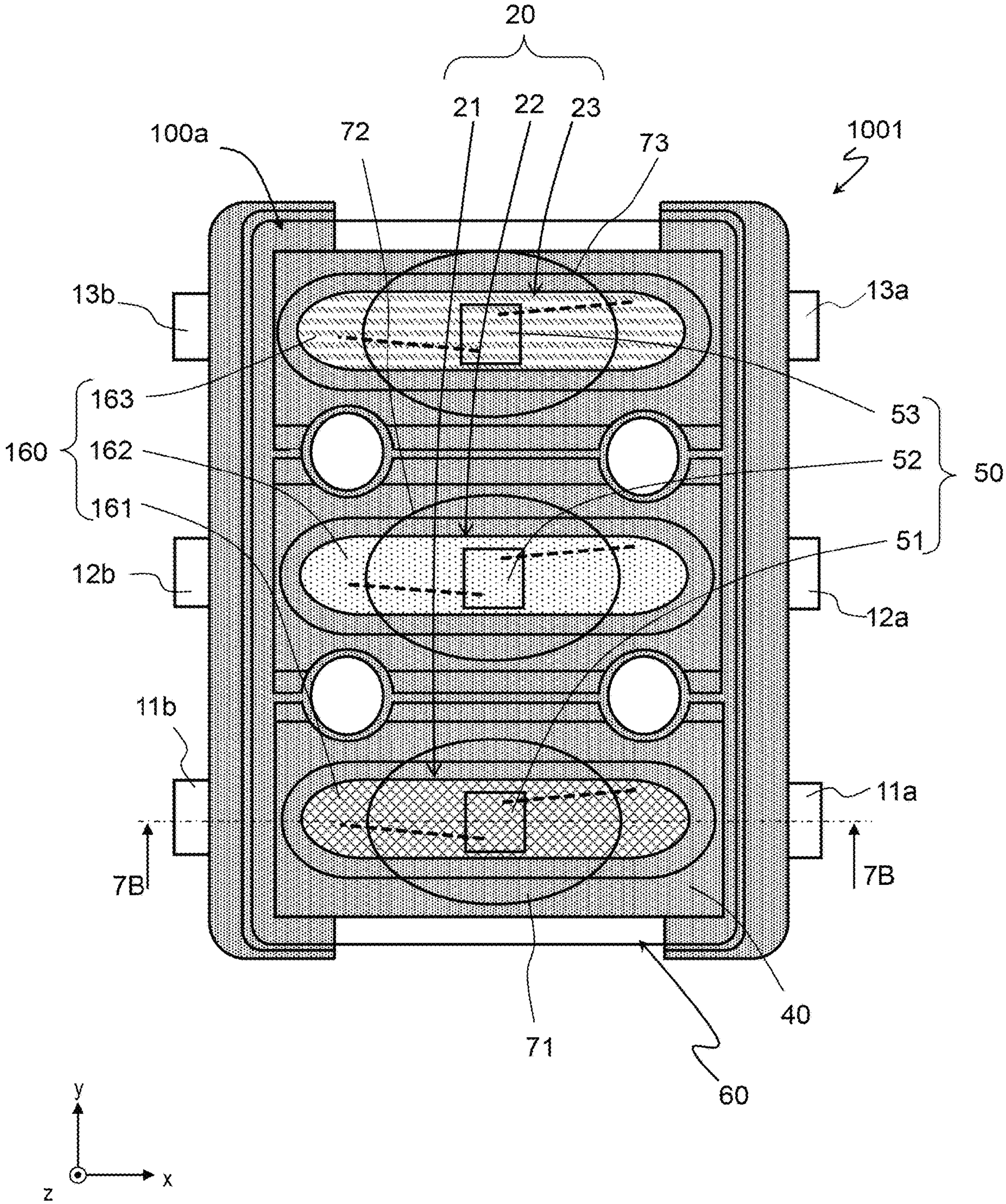
FIG. 7A is a schematic top view of a light-emitting device according to a first modified example.
Figure 7B:
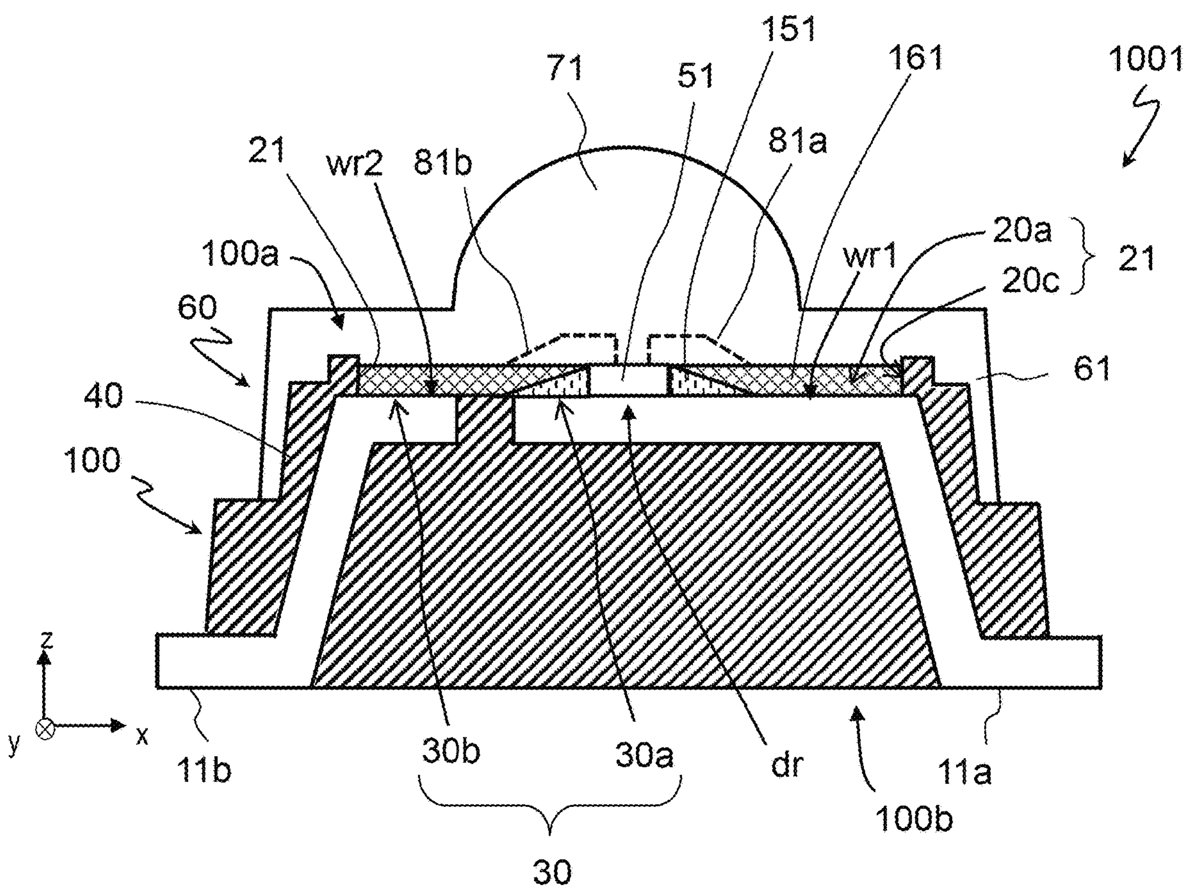
FIG. 7B is a schematic cross-sectional view taken along line 7B-7B illustrated in FIG. 7A.

FIG. 7A is a schematic top view of another light-emitting device 1001 according to a first modified example. FIG. 7B is a schematic cross-sectional view of the light-emitting device 1001 taken along line 7B-7B illustrated in FIG. 7A.

The light-emitting device 1001 of the first modified example differs from the light-emitting device 1000 in that the light-emitting device 1001 further includes a plurality of colored resin members 160.

In the present modified example, the colored resin members 160 include a first colored resin member 161 disposed in the first recessed portion 21, a second colored resin member 162 disposed in the second recessed portion 22, and a third colored resin member 163 disposed in the third recessed portion 23. In a plan view, the first lens portion 71 to the third lens portion 73 overlap at least a part of the first colored resin member 161 to the third colored resin member 163, respectively. The position of each colored resin member 160 may be defined by the inner lateral surface 20*c* of the recessed portion 20.

In the present modified example, the first light-emitting element 51 to the third light-emitting element 53 emit light having different wavelengths from one another. The first colored resin member 161 is colored to the same type of color as first light emitted from the first light-emitting element 51. The second colored resin member 162 is colored to the same type of color as second light emitted from the second light-emitting element 52. The third colored resin member 163 is colored to the same type of color as third light emitted from the third light-emitting element 53.

In this description, "the same type of color" means that, in the Munsell color system (20 hues), the hue is within three ranges in the hue circle, the color value is within three ranges, and the chroma is within three ranges. That is, in the constant hue planes of the Munsell color system (20 hues), colors up to both sides of the hue, the color value, and the chroma are the same type of color.

With the colored resin members 160 thus disposed, it is possible to reduce the reflection of external light by the inner upper surface of each recessed portion 20 (exposed regions 30 of the leads 11*a* to 13*b* and surface of the reflective member 150, for example) when the light-emitting element 50 is turned off. Thus, the display contrast of the light-emitting device 1001 can be improved. Further, when the first light-emitting element 51, the second light-emitting element 52, and the third light-emitting element 53 are all turned off, each of the colored resin members 160 appears darker than the color with which it is colored, that is, as a color of a lower color value than that of the color with which it is colored, due to subtractive color mixing of the colors of the three colored resin members 160. Such an effect is referred to as a "dark color effect". Because a light emission surface of the light-emitting device 1001 appears darker due to the dark color effect, display contrast can be further improved.

Within each recessed portion 20, the colored resin member 160 may be disposed on the reflective member 150. That is, at least a part of the first colored resin member 161 may be positioned on the first reflective member 151, at least a part of the second colored resin member 162 may be positioned on the second reflective member 152, and at least a part of the third colored resin member 163 may be positioned on the third reflective member 153.

The reflective member 150 may be disposed only in a part of the inner upper surface 20*a* of each recessed portion 20 in a cross-sectional view. For example, the reflective member 150 may only be disposed in a region near the lateral surface of the light-emitting element 50. In this case, the colored resin member 160 preferably covers at least a portion of the exposed region 30 of the lead in each recessed portion 20 that is not covered by the reflective member 150.

In the example illustrated, the reflective member 150 comes into contact with the lateral surface of the light-emitting element 50. An upper surface of the reflective member 150 is inclined so as to become lower as a distance from the lateral surface of the light-emitting element 50 increases. The colored resin member 160 is disposed on the upper surface of the reflective member 150 and on a portion of the inner upper surface 20*a* of the recessed portion 20 exposed from the reflective member 150.

In a plan view, the colored resin member 160 may be disposed over the entire inner upper surface 20*a* of each recessed portion 20. The colored resin member 160 may be in contact with the inner lateral surface 20*c* of the recessed portion 20. The colored resin member 160 may cover a part or all of the upper surface of the corresponding light-emitting element 50. Note that the colored resin member 160 may not be disposed on the primary surface 100*a* of the resin package 100, between two adjacent recessed portions 20.

When the light-emitting device is used in a large display device used outdoors such as a billboard and the light-emitting elements are turned off, the external light or the like incident on the light-emitting device may be reflected by the areas surrounding the light-emitting elements, reducing the display contrast. In the present modified example, the display contrast can be further improved. The reasons will be described below.

In the present embodiment, the light-emitting element 50 and the colored resin member 160 colored to the same type of color as the emitted light color of the light-emitting element 50 are disposed in each of the recessed portions 20. With this structure, the emitted light color is not obstructed when the light-emitting element 50 is turned on, and external light reflection in the recessed portion 20 when the light-emitting element 50 is turned off can be reduced. Thus, the display contrast can be improved.

Furthermore, when the first light-emitting element 51, the second light-emitting element 52, and the third light-emitting element 53 are turned off, due to the subtractive color mixing of the first colored resin member 161, the second colored resin member 162, and the third colored resin member 163, the first colored resin member 161, the second colored resin member 162, and the third colored resin member 163 each appear darker than the color with which it is colored, that is, appear as a color of a lower color value than that of the color with which it is colored. For example, when the light-emitting device 1001 is mounted on a display device or the like and a viewer looks at the display device, the first colored resin member 161, the second colored resin member 162, and the third colored resin member 163 appear to be disposed in close proximity to each other, and thus subtractive color mixing occurs. Because the light emission surface of the light-emitting device 1001 appears darker, the display contrast can be further increased.

In the light-emitting device 1001, when the first light-emitting element 51, the second light-emitting element 52, and the third light-emitting element 53 are turned on, mixed light of the light beams transmitted through the first lens portion 71, the second lens portion 72, and the third lens portion 73 is, for example, white. On the other hand, when the first light-emitting element 51, the second light-emitting element 52, and the third light-emitting element 53 are turned off, the first colored resin member 161, the second colored resin member 162, and the third colored resin member 163 may each appear as a dark color, such as gray or black, for example, that is a color of a lower color value than that of the color with which it is colored.

Colored Resin Member 160

The colored resin member 160 includes a resin material as a base material and a colorant. As the base material of the colored resin member 160, a thermosetting resin or the like having excellent weather resistance and light transmissivity, such as an epoxy resin, a urea resin, or a silicone resin, is used, for example. Note that the thermosetting resin in this description refers to a plastic that cures when heated under pressure. Once cured, a thermosetting resin cannot be re-melted or re-shaped without losing initial properties. Examples of such a thermosetting resin include epoxy-based, melamine-based, phenol-based, and urea-based resins.

Various dyes, pigments, and the like can be used as the colorant contained in the resin material. The colorant may be an inorganic member or may be an organic member. Specific examples include perylene red, condensed azo red, quinacridone red, copper phthalocyanine blue, copper phthalocyanine green, curcumin, and coal tar dye. With the resin material containing a colorant, a dark color effect such as described above can be achieved. Note that, when the content of the colorant is increased, the light extraction efficiency may be reduced. Therefore, the content of the colorant is preferably selected so as to achieve a high display contrast due to the dark color effect while ensuring the light extraction efficiency.

Second Modified Example

Figure 8A:
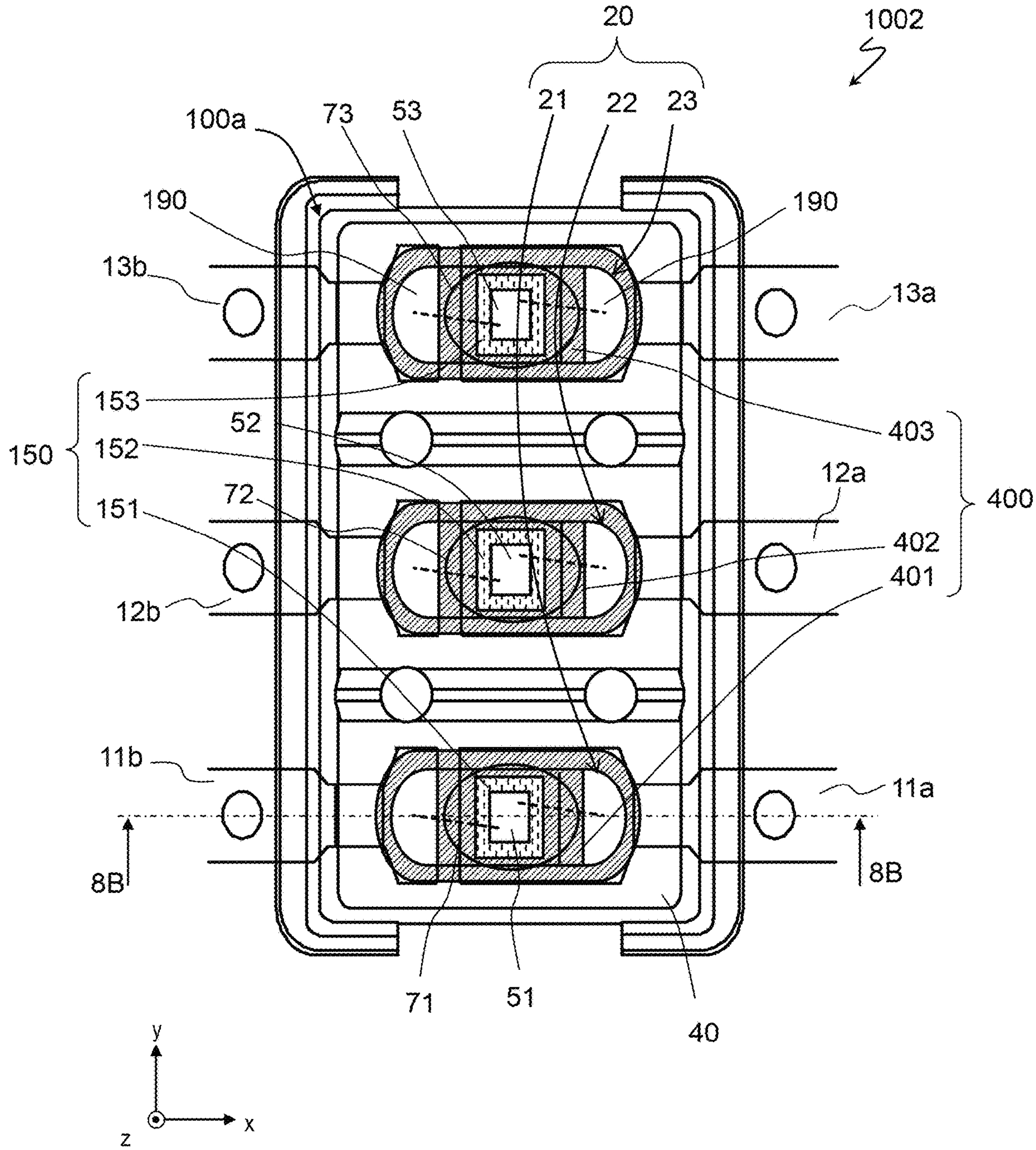
FIG. 8A is a schematic top transparent view of a light-emitting device according to a second modified example.
Figure 8B:
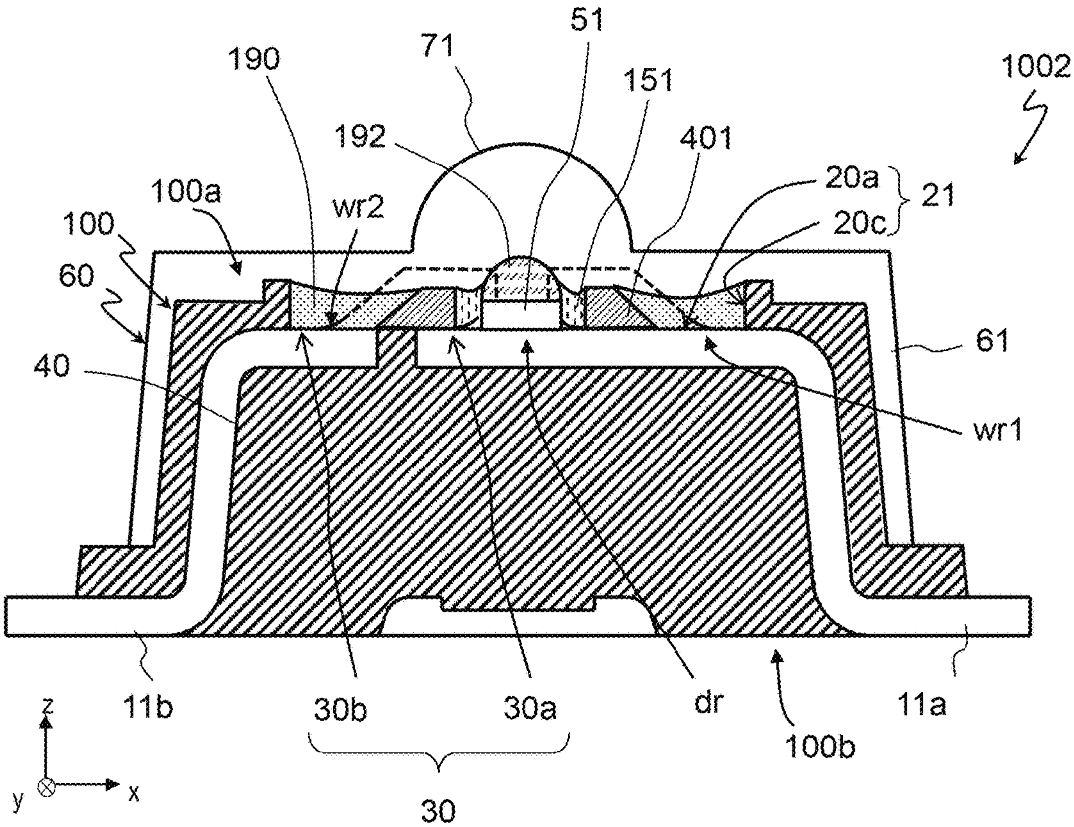
FIG. 8B is a schematic cross-sectional view taken along line 8B-8B illustrated in FIG. 8A.
Figure 8C:
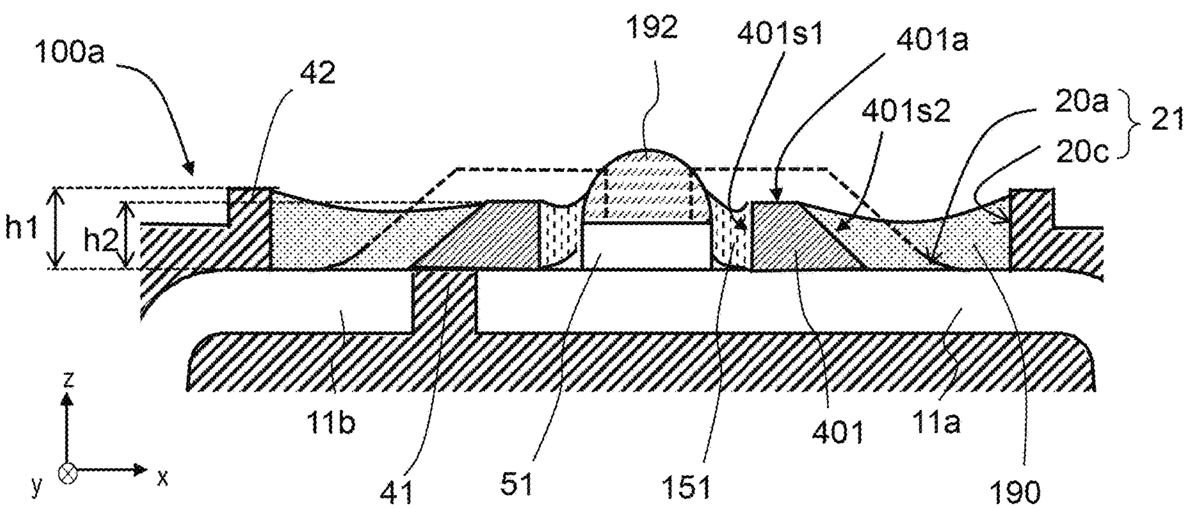
FIG. 8C is an enlarged schematic cross-sectional view illustrating a part of the cross-section illustrated in FIG. 8B.

FIG. 8A is a schematic top transparent view of a light-emitting device 1002 according to a second modified example. FIG. 8B is a schematic cross-sectional view taken along line 8B-8B illustrated in FIG. 8A. FIG. 8C is an enlarged schematic cross-sectional view illustrating a part of FIG. 8B.

The light-emitting device 1002 according to the second modified example differs from the light-emitting device 1000 in that each recessed portion 20 includes, in an interior thereof, a resin wall 400 formed of the first dark-colored resin member 40. In a plan view, the resin wall 400 is positioned between the light-emitting element 50 and at least one of the first connection region wr1 and the second connection region wr2. In each recessed portion 20, at least a part of the reflective member 150 is positioned between the resin wall 400 and the light-emitting element 50.

Resin Wall 400

In the present modified example, the resin wall 400 includes a first resin wall 401 to a third resin wall 403 respectively positioned in the interior of the first recessed portion 21 to the third recessed portion 23. Hereinafter, a structure including the resin wall 400 will be described using the first recessed portion 21 of the three recessed portions 20 as an example. The second recessed portion 22 and the third recessed portion 23 also have similar structures, and thus description thereof will be omitted to avoid repeated descriptions.

The first recessed portion 21 includes, in the interior thereof, at least one first resin wall 401 formed of the first dark-colored resin member 40. In this example, in the interior of the first recessed portion 21, two first resin walls 401 facing each other across the light-emitting element 50 in a plan view are disposed. The two first resin walls 401 are respectively positioned between the first light-emitting element 51 and the first connection region wr1 as well as the second connection region wr2 in a plan view. A lateral surface of the first resin wall 401 proximate to the first light-emitting element 51 may be parallel to any one lateral surface of the first light-emitting element 51. At least a part of the first reflective member 151 is positioned between each first resin wall 401 and the lateral surface of the first light-emitting element 51. The lateral surface of the first light-emitting element 51 may be in contact with the first reflective member 151. The lateral surface of each first resin wall 401 proximate to the first light-emitting element 51 may be in contact with the first reflective member 151. With the first resin wall 401 provided, a region on which the first reflective member 151 is applied can be controlled to a predetermined range, making it possible to reduce the volume of the first reflective member 151 while maintaining the effect of the creation of a point light source by the first reflective member 151.

Each first resin wall 401 may be separated from the inner lateral surface of the first recessed portion 21, or a part of the first resin wall 401 may be in contact with the inner lateral surface of the first recessed portion 21. In the illustrated example, in a plan view, each first resin wall 401 extends in the shorter direction of the first recessed portion 21 (here, y-axis direction), and both ends of the first resin wall 401 are in contact with the inner lateral surface of the first recessed portion 21. With this structure, the application range of the first reflective member 151 can be reliably reduced.

In the configuration illustrated in FIG. 8C, each first resin wall 401 includes a lateral surface 401*s*1 positioned proximate to the first light-emitting element 51, a lateral surface 401*s*2 positioned opposite to the first light-emitting element 51, and an upper surface 401*a* positioned between the lateral surfaces 401*s*1 and 401*s*2. The lateral surface 401*s*1 is substantially perpendicular to the xy plane, and the lateral surface 401*s*2 may be a tapered surface (forwardly tapered) inclined so as to become lower as a distance from the light-emitting element 50 increases. Each first resin wall 401 is not limited to this form, and may be, for example, a form composed of only the lateral surface 401*s*1 and the lateral surface 401*s*2, without the upper surface 401*a*.

A portion of each first resin wall 401 positioned on the +z-most side (upper surface 401*a* in this example) may be positioned above the upper surface of the first light-emitting element 51. A maximum height h2 of the first resin wall 401 may be smaller than a height h1 of the upper surface of the second resin portion 42. The height h2 of the first resin wall 401 is a distance from the exposed region 30 of the leads 11*a* and 11*b* in the first recessed portion 21 to an uppermost surface or an uppermost portion of the first resin wall 401 along the z-axis direction and is, for example, in a range from 0.15 mm to 0.2 mm.

In the first recessed portion 21, a second dark-colored resin member 190 may be disposed outward of the upper surface 401*a* of the first resin wall 401. The second dark-colored resin member 190 preferably covers a connection portion of the wires and the leads 11*a* and 11*b*. Further, when the first reflective member 151 is formed in a process to be described below, a part of the first reflective member 151 may be positioned outward of the upper surface 401*a* of the first resin wall 401. In this case, the second dark-colored resin member 190 may cover a portion of the first reflective member 151 positioned outward of the upper surface 401*a*. In this case, "a portion of the first reflective member 151 positioned outward of the upper surface 401*a*" refers to, for example, a portion positioned in a region surrounded by the lateral surface 401*s*2 of the first resin wall 401, the inner lateral surface 20*c* of the first recessed portion 21, and the inner upper surface 20*a* of the first recessed portion 21. The second dark-colored resin member 190 may be in contact with the lateral surface 401*s*2 of the first resin wall 401 and the inner lateral surface 20*c* of the first recessed portion 21, for example.

The second dark-colored resin member 190 may be formed by using a resin material and a colorant similar to those of the first dark-colored resin member 40. As the second dark-colored resin member 190, a silicone resin material to which carbon black has been added can be used, for example.

Further, a high-viscosity resin 192 may be disposed on the upper surface of each light-emitting element 50. The high-viscosity resin 192 is a resin having a viscosity that is at least higher than that of the reflective member 150, and may be, for example, a high-viscosity polycarbonate resin. The high-viscosity resin 192 may be formed by using a resin material similar to that of reflective member 150. Further, the viscosity of the resin material of the high-viscosity resin 192 may be raised by using an additive ($SiO_2$ filler, for example). By raising the viscosity, it is possible to keep the high-viscosity resin 192 on the upper surface of the light-emitting element 50 and heighten a top portion of the high-viscosity resin 192.

The first reflective member 151 can be formed, for example, as follows. First, the high-viscosity resin 192 is disposed on the upper surface of the first light-emitting element 51. Subsequently, a resin material serving as the reflective member is disposed between the first light-emitting element 51 and the first resin wall 401. The amount of the resin material can be set so that a volume of the resin material is larger than that of a space positioned between the first light-emitting element 51 and the first resin wall 401. Subsequently, a height of the resin material is controlled by utilizing centrifugal sedimentation or the like. Accordingly, the space between the first light-emitting element 51 and the first resin wall 401 is filled with the resin material up to a position higher than the upper surface of the first light-emitting element 51, and excess resin material flows outwardly from the upper surface 401*a* of the first resin wall 401 along the lateral surface 401*s*2, which is the tapered surface. At this time, because the upper surface of the first light-emitting element 51 is covered by the high-viscosity resin 192, a part of the resin material being disposed on the upper surface of the first light-emitting element 51 is reduced. Then, the resin material is cured and thus the first reflective member 151 is obtained. Subsequently, the second dark-colored resin member 190 may be disposed on a portion of the first reflective member 151 positioned outward of the upper surface 401$a$ of the first resin wall 401.

In the present modified example as well, the reflective member 150 surrounding each light-emitting element 50 make it possible to miniaturize the lens portion 70. For example, as described above with reference to FIG. 6, the size ratio of the lens portion to the light-emitting element may be no greater than 5.0. Note that, in the present modified example, when both ends of each resin wall 400 are in contact with the inner lateral surface 20$c$ of the recessed portion 20, the recessed portion demarcated by a lateral surface of each resin wall 400 proximate to the light-emitting element 50, a part of the inner lateral surface 20$c$ of each recessed portion 20, and the inner upper surface surrounded by them corresponds to each of the first recessed portion to the third recessed portion of the light-emitting device 1002. In this case, a maximum width of the recessed portion constituted by the lateral surface of each resin wall 400 proximate to the light-emitting element 50 and the inner lateral surface 20$c$ may be less than or equal to the maximum width of the lens portion 70.

Third Modified Example

Figure 9:
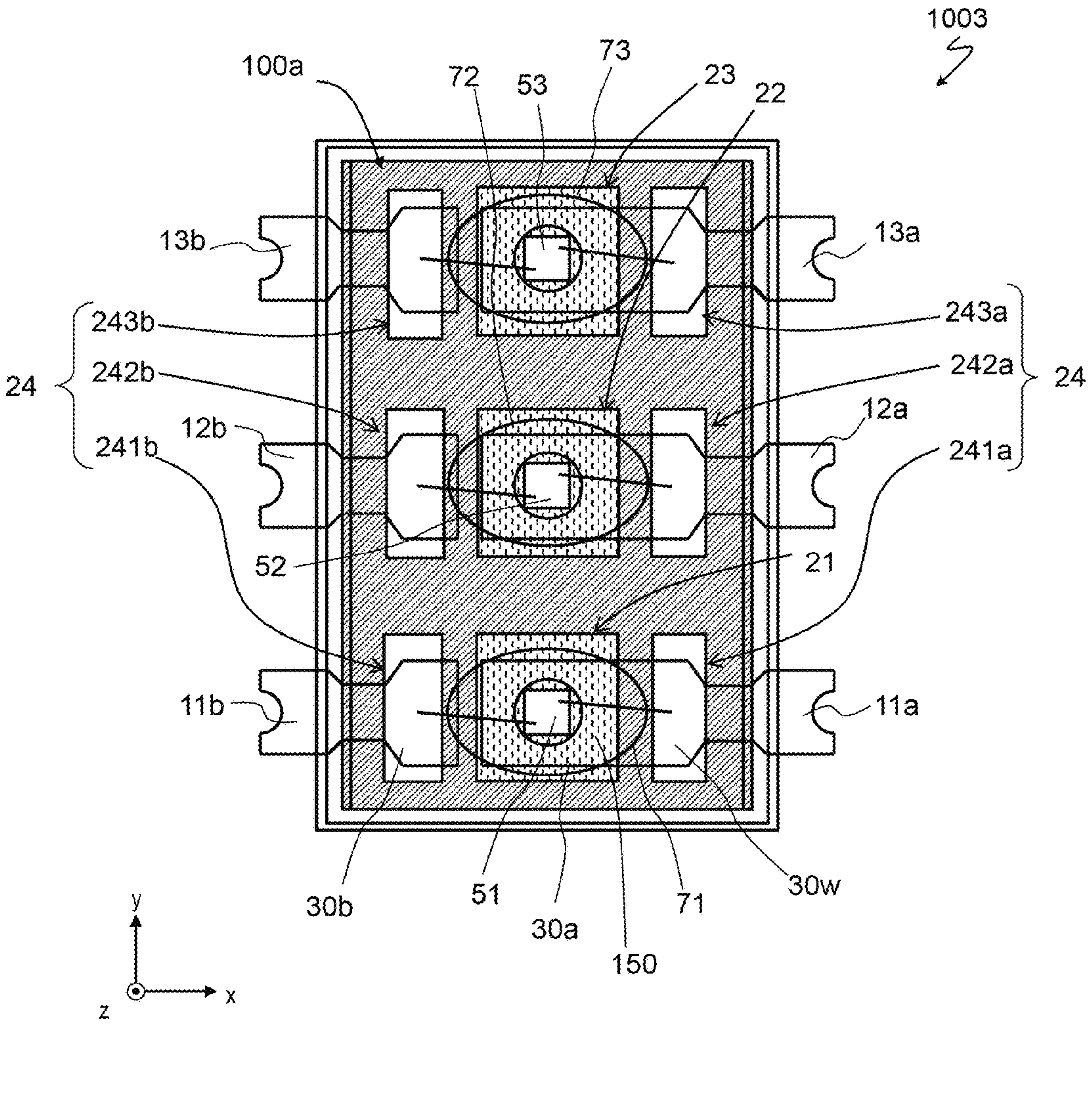
FIG. 9 is a schematic top transparent view of a light-emitting device according to a third modified example.

FIG. 9 is a schematic top transparent view of a light-emitting device 1003 according to a third modified example.

The light-emitting device 1003 of the third modified example differs from the light-emitting device 1000 illustrated in FIG. 2C and the like in that each light-emitting element 50 and the connection region for wire bonding are disposed in different recessed portions.

In the third modified example, the plurality of recessed portions 20 further include at least one fourth recessed portion 24 positioned in a region different from those of the first recessed portion 21 to the third recessed portion 23 in the primary surface 100$a$ of the resin package 100. A plurality of the fourth recessed portions 24 separated from each other in a plan view may be provided. The region where any one of the leads is exposed in the inner upper surface of each fourth recessed portion 24 includes a connection region used for wire bonding. At least one light-emitting element of the first light-emitting element 51 to the third light-emitting element 53 is electrically connected to the connection region of the fourth recessed portion 24 by a wire.

In the illustrated example, the plurality of recessed portions 20 include the first recessed portion 21 to the third recessed portion 23, fourth recessed portions 241$a$ and 241$b$ respectively positioned on both sides (±x sides) of the first recessed portion 21, fourth recessed portions 242$a$ and 242$b$ respectively positioned on both sides of the second recessed portion 22, and fourth recessed portions 243$a$ and 243$b$ respectively positioned on both sides of the third recessed portion 23.

The one lead 11$a$ of the first lead pair includes the exposed region 30$a$ exposed at the inner upper surface of the recessed portion 20 and an exposed region 30$w$ exposed at the fourth recessed portion 241$a$. The one lead 12$a$ of the second lead pair includes the exposed region 30$a$ exposed at the inner upper surface of the recessed portion 20 and an exposed region 30$w$ exposed at the fourth recessed portion 242$a$. The one lead 13$a$ of the third lead pair includes the exposed region 30$a$ exposed at the inner upper surface of the recessed portion 20 and an exposed region 30$w$ exposed at the fourth recessed portion 243$a$. The other leads 11$b$, 12$b$, and 13$b$ includes the exposed regions 30$b$ exposed at the fourth recessed portions 241$b$, 242$b$, and 243$b$, respectively. The first light-emitting element 51 to the third light-emitting element 53 are disposed in the first recessed portion 21 to the third recessed portion 23, respectively. One electrode of the first light-emitting element 51 to the third light-emitting element 53 is connected by a wire to the exposed regions 30$w$ of the leads 11$a$ to 13$a$ in the fourth recessed portions 241$a$ to 243$a$, and the other electrodes are connected by wires to the exposed regions 30$b$ of the leads 11$b$ to 13$b$ in the fourth recessed portions 241$b$ to 243$b$, respectively.

The reflective member 150 is disposed in each of the first recessed portion 21 to the third recessed portion 23. In contrast, the reflective member 150 is preferably not disposed in each of the fourth recessed portions 24. For example, the second dark-colored resin member may be disposed in each of the fourth recessed portions 24 so as to cover the connection portion with the wire.

According to the present modified example, the connection region for wire bonding is disposed in a recessed portion separate from the light-emitting element, making it possible to reduce the volume in which the first reflective member 151 is disposed.

Note that the illustrated example illustrates an example in which the fourth recessed portion 24 is disposed on both sides of each light-emitting element 50 in a plan view, but the fourth recessed portion 24 may be disposed only on one side of each light-emitting element 50. For example, for each light-emitting element 50, one recessed portion including the element placement region and the first connection region, and one recessed portion including the second connection region may be formed. Alternatively, when two or more light-emitting elements 50 of the first light-emitting element 51 to the third light-emitting element 53 are connected to a common lead, the first connection region (or the second connection region) of each of the two or more light-emitting elements 50 may be disposed in one fourth recessed portion 24.

In the present modified example as well, the reflective member 150 surrounding each light-emitting element 50 makes it possible to miniaturize the lens portion 70. For example, as described above with reference to FIG. 6, the size ratio of the lens portion to the light-emitting element may be no greater than 5.0. Note that, in present modified example, the maximum width of each lens portion 70 may be greater than or equal to the maximum width of the corresponding recessed portion among the first recessed portion 21 to the third recessed portion 23 each on which the light-emitting element 50 is placed.

Fourth Modified Example

Figure 10A:
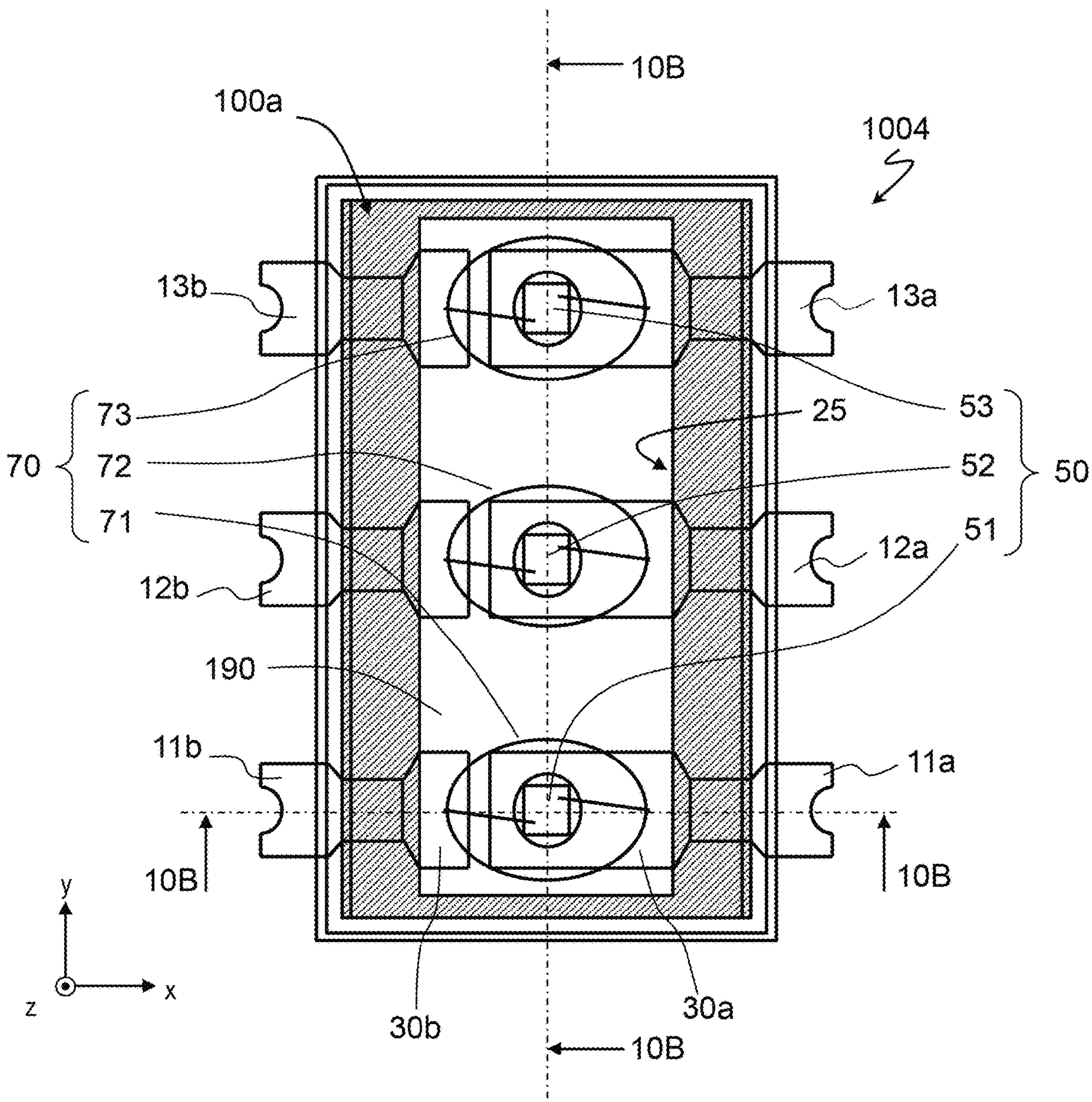
FIG. 10A is a schematic top transparent view of a light-emitting device according to a fourth modified example.
Figure 10B:
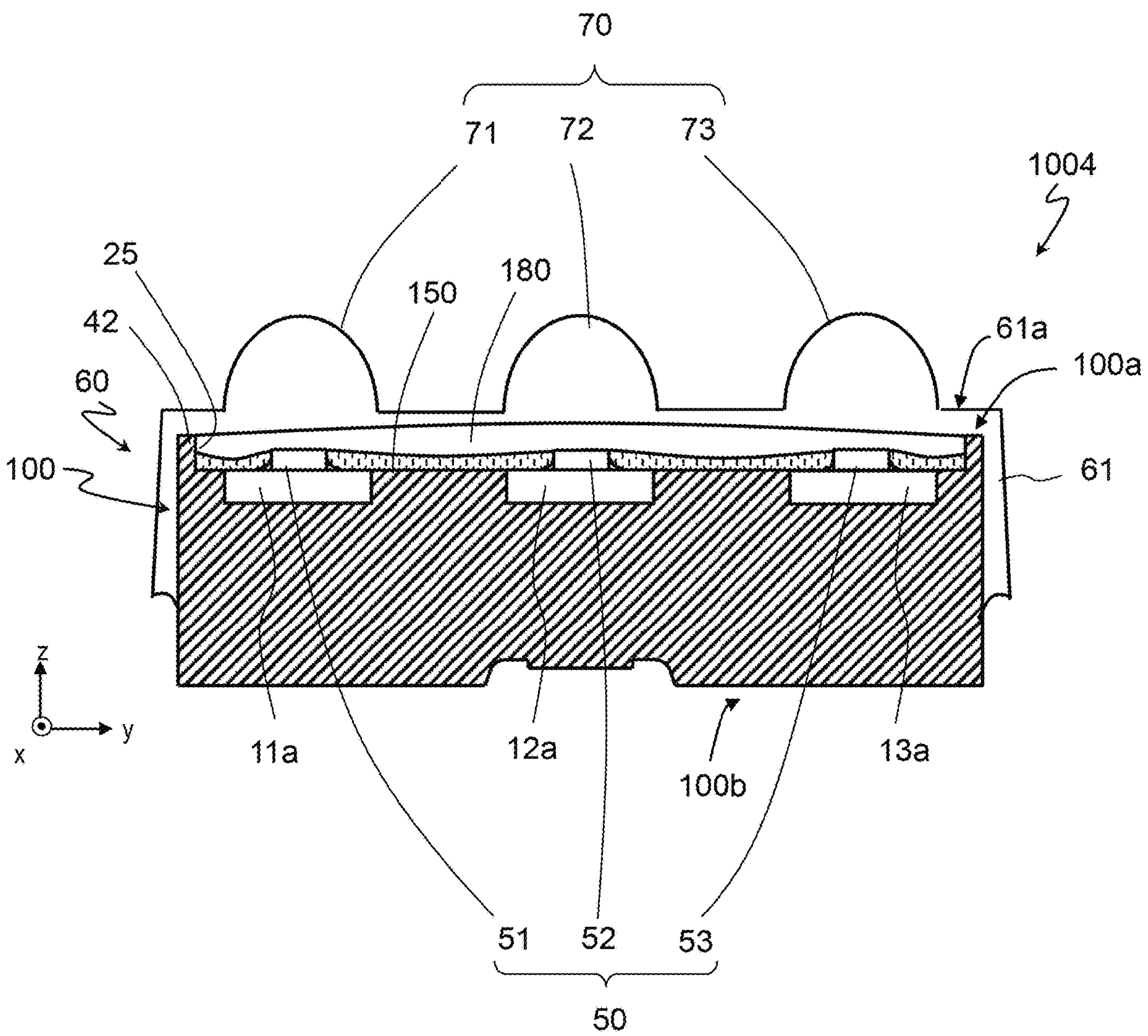
FIG. 10B is a schematic cross-sectional view taken along line 10B-10B illustrated in FIG. 10A.

FIG. 10A is a schematic top transparent view of a light-emitting device 1004 according to a fourth modified example, and FIG. 10B is a schematic cross-sectional view taken along line 10B-10B illustrated in FIG. 10A.

The light-emitting device 1004 of the fourth modified example differs from the light-emitting device 1000 illustrated in FIG. 2C and the like in that two or more of the light-emitting elements 50 among the first light-emitting element 51 to the third light-emitting element 53 are disposed in one recessed portion.

In the light-emitting device 1004, the primary surface 100$a$ of the resin package 100 includes one recessed portion 25 defined by the first dark-colored resin member 40 and the plurality of leads 11$a$ to 13$b$. In the example illustrated, the first light-emitting element 51 to the third light-emitting element 53 are disposed in the exposed regions 30$a$ of the leads 11$a$ to 13$a$ in the recessed portion 25, respectively. The connection region for the wire bonding of each of the leads 11*a* to 13*b* is also disposed in the recessed portion 25.

In the light-emitting device 1004, the reflective member 150 may be disposed over the entire recessed portion 25. Alternatively, as will be described below, a resin wall may be provided in an interior of the recessed portion 25, making it possible to narrow the region where the reflective member 150 is disposed.

As illustrated in FIG. 10B, the precoating resin 180 may be disposed between the reflective member 150 and the mold resin portion 60. In the recessed portion 20, the upper surface of the reflective member 150 may be curved in a concave shape between the light-emitting elements 50, and an upper surface of the precoating resin 180 may be curved in a convex shape. The thickness of the precoating resin 180 positioned on the upper surface of each light-emitting element 50 disposed in the recessed portion 20 is preferably constant. The thickness of the precoating resin 180 positioned between each light-emitting element 50 disposed in the recessed portion 20 is preferably symmetrical starting from a center of a distance between each light-emitting element 50.

Figure 11A:
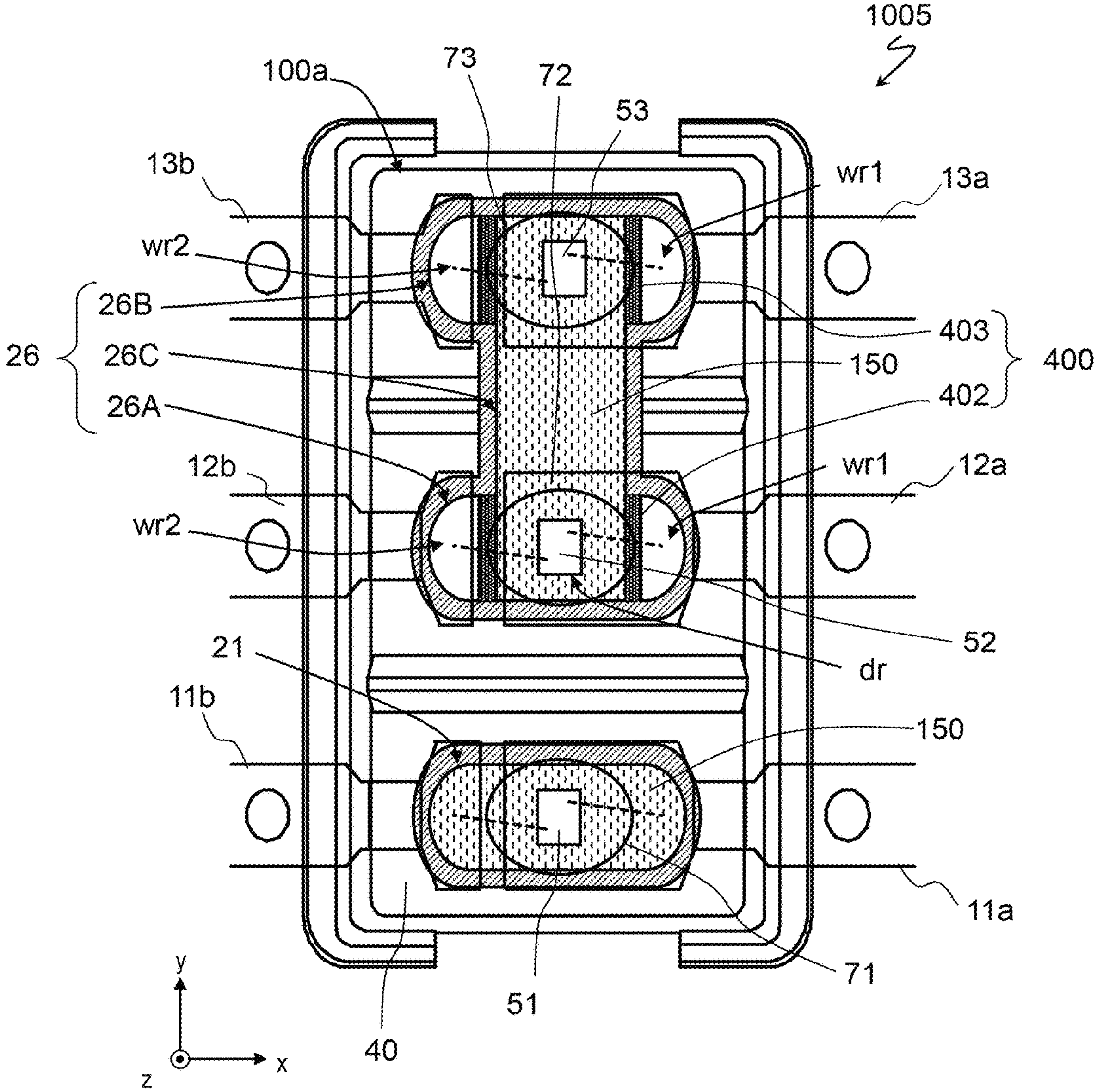
FIG. 11A is a schematic top transparent view of another light-emitting device of the fourth modified example.

FIG. 11A is a schematic top transparent view of another light-emitting device 1005 according to the fourth modified example.

In the light-emitting device 1005, the primary surface 100*a* of the resin package 100 includes two recessed portions 21 and 26 defined by the first dark-colored resin member 40 and the plurality of leads 11*a* to 13*b*. Two light-emitting elements 50 (second light-emitting element 52 and third light-emitting element 53 in FIG. 11A) are disposed on an inner upper surface of the recessed portion 26. The reflective member 150 surrounds the second light-emitting element 52 and the third light-emitting element 53 in the recessed portion 26.

The remaining one light-emitting element 50 (first light-emitting element 51 in FIG. 11A) is disposed on an inner upper surface of the recessed portion 21. The arrangement and the shape of the recessed portion 21, the first light-emitting element 51, and the first reflective member 151 are similar to those of the recessed portion 20 (in FIG. 11A, first recessed portion 21) in the light-emitting device 1000.

The recessed portion 26 has a structure in which two recessed portions 20 (in FIG. 11A, second recessed portion 22 and third recessed portion 23) of the light-emitting device 1000 are connected. In this example, the inner upper surface of the recessed portion 26 includes a region 26A including the element placement region dr on which the second light-emitting element 52 is placed, a region 26B including the element placement region dr on which the third light-emitting element 53 is placed, and an intervening region 26C positioned between the regions 26A and 26B. The region 26A, the intervening region 26C, and the region 26B are arrayed in the y-axis direction. In the example illustrated in FIG. 11A, a width of the intervening region 26C in the x-axis direction is less than widths of the regions 26A and 26B in the x-axis direction. In the example illustrated in FIG. 11A, the widths of the regions 26A and 26B in the x-axis direction are the same. Each of the regions 26A and 26B may further include the first connection region wr1 and the second connection region wr2 for wire bonding.

A plurality of the resin walls 400 formed of the first dark-colored resin member 40 may be disposed in an interior of the recessed portion 26. In this example, the plurality of resin walls 400 include a pair of the resin walls 402, in the region 26A, in which one of the pair of the resin walls 402 is disposed between the element placement region dr and the first connection region wr1 and the other of the pair of the resin walls 402 is disposed between the element placement region dr and the second connection region wr2, and a pair of the resin walls 403, in the region 26B, in which one of the pair of the resin walls 403 is disposed between the element placement region dr and the first connection region wr1 and the other of the pair of the resin walls 403 is disposed between the element placement region dr and the second connection region wr2. The resin walls 402 and 403 may be a rectangular parallelepiped, or may have a shape similar to that of the resin wall 400 described in the second modified example. In the example illustrated in FIG. 11A, the pair of resin walls 402 and the pair of resin walls 403 have a rectangular shape long in the y-axis direction. With the resin walls 400 provided, the arrangement of the reflective member 150 can be controlled.

In the illustrated example, the reflective member 150 is disposed, for example, between the light-emitting element 50 in the region 26A and one of the pair of the resin walls 402, between the light-emitting element 50 in the region 26A and the other of the pair of the resin walls 402, between the light-emitting element 50 in the region 26B and one of the pair of the resin walls 403, between the light-emitting element 50 in the region 26B and the other of the pair of the resin walls 403, and in the intervening region 26C. Note that the reflective member 150 may be disposed over the entire recessed portion 26.

In the present modified example as well, both ends or one end portion of the resin walls 402 and 403 may be in contact with an inner surface of the recessed portion 26 in a plan view. When both ends of the resin walls 402 and 403 are in contact with the inner surface of recessed portion 26, the lateral surface of each resin wall 402 proximate to the second light-emitting element 52, the lateral surface of each resin wall 403 proximate to the third light-emitting element 53, and the inner surface of the recessed portion 26 constitute the inner lateral surface of one recessed portion.

The reflective member 150 may be disposed in the one recessed portion.

Figure 11B:
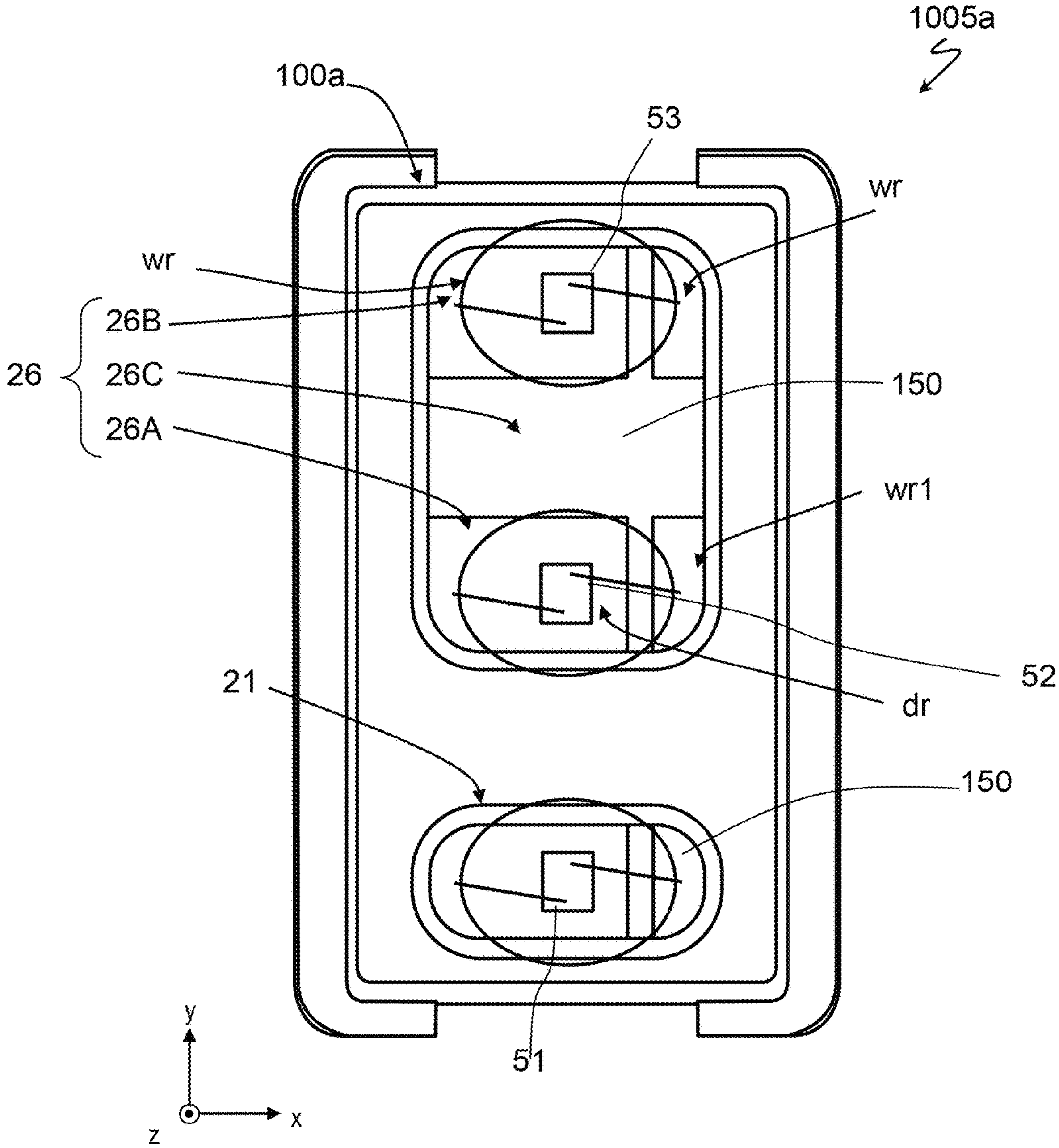
FIG. 11B is a schematic top view of yet another light-emitting device of the fourth modified example.
Figure 11C:
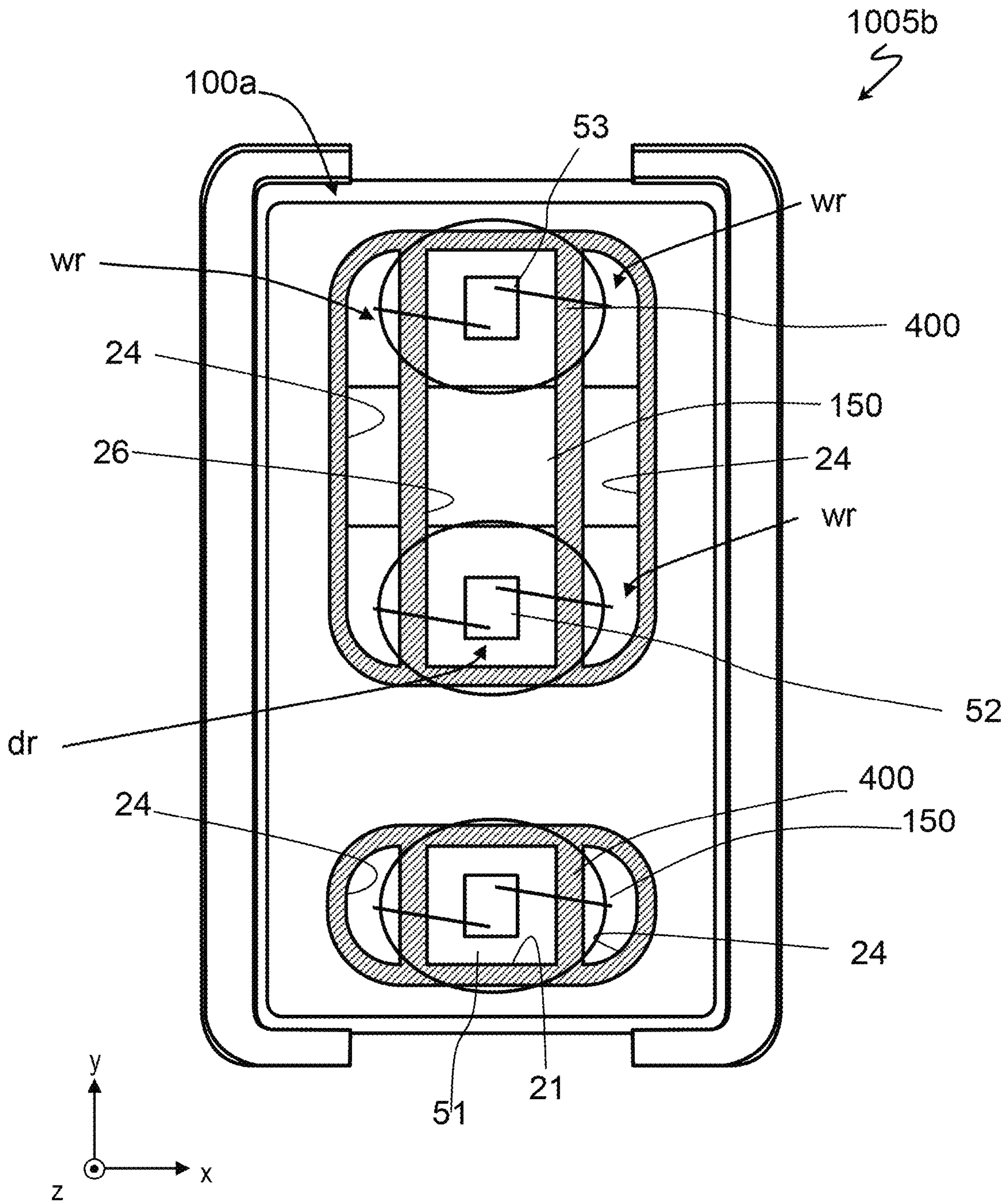
FIG. 11C is a schematic top view of yet another light-emitting device of the fourth modified example.

FIG. 11B is a schematic top view of yet another light-emitting device 1005*a* according to the fourth modified example. The light-emitting device 1005*a* illustrated in FIG. 11B differs from the light-emitting device 1005 illustrated in FIG. 11A in that the widths of the regions 26A and 26B in the x-axis direction and the width of the intervening region 26C in the x-axis direction are the same. Other components are similar to those of the light-emitting device 1005.

FIG. 1C is a schematic top view of yet another light-emitting device 1005*b* according to the fourth modified example. The light-emitting device 1005*b* illustrated in FIG. 1C differs from the light-emitting device 1005 illustrated in FIG. 11A in that the element placement region dr on which the light-emitting element 50 is placed and the connection region wr for wire bonding that connects the light-emitting element 50 and the leads are positioned in recessed portions different from each other. In the example illustrated in FIG. 1C, in a plan view, the fourth recessed portions 24, each including the connection region wr, are respectively disposed on both sides (+x sides) of the recessed portion 26 on which the second light-emitting element 52 and the third light-emitting element 53 are placed. Further, in a plan view, the fourth recessed portion 24, each including the connection region wr, are respectively disposed on both sides of the recessed portion 21 on which the first light-emitting element 51 is placed. The recessed portion 26 and the fourth recessed portion 24 are demarcated by the resin wall 400. An inner lateral surface of the recessed portion 26 extending in the y-axis direction and an inner lateral surface of the fourth recessed portion 24 extending in the y-axis direction are formed by the resin wall 400 common thereto.

Method of Manufacturing Light-Emitting Device 1000

An example of a method of manufacturing the light-emitting device according to the present embodiment will be described below using the light-emitting device 1000 as an example.

FIGS. 12A to 12F are each a step cross-sectional view for describing the method of manufacturing the light-emitting device 1000, each illustrating a cross-section taken along line 2D-2D illustrated in FIG. 2C.

First Step: Preparation of Resin Package 100

Figure 12A:
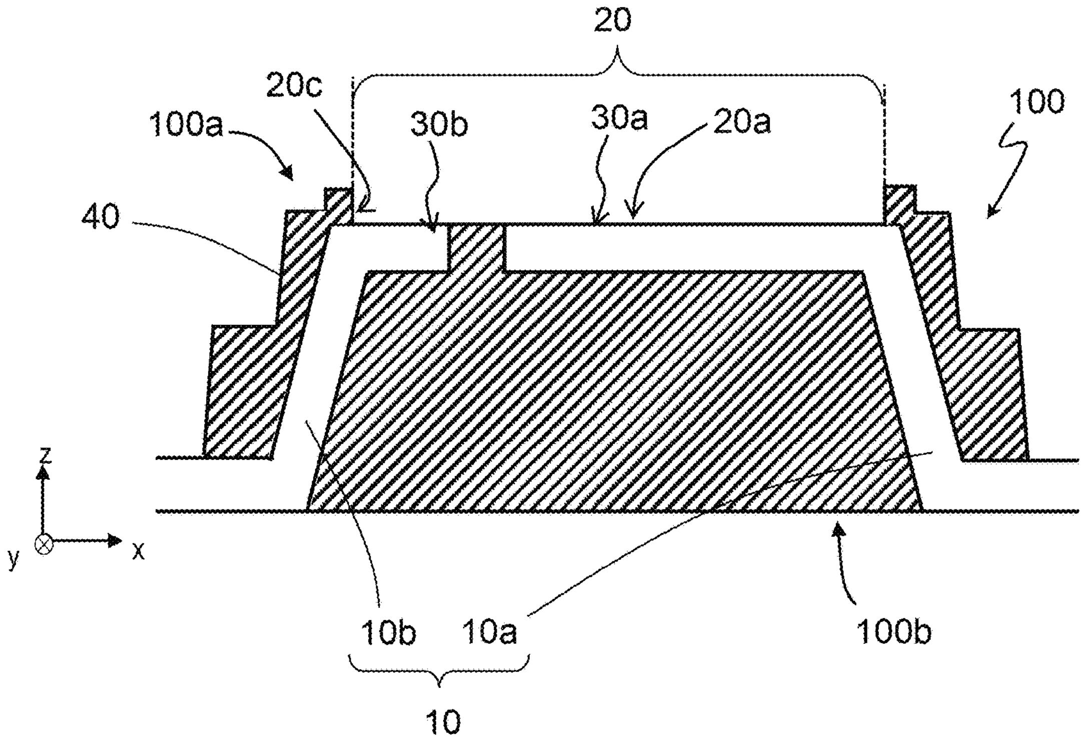
FIG. 12A is a step cross-sectional view illustrating a manufacturing method of the light-emitting device illustrated in FIG. 1.

In a first step, the resin package 100 is prepared that includes the first dark-colored resin member 40 and a plurality of leads 10, as illustrated in FIG. 12A. The resin package 100 can be formed by transfer molding, insert molding, or the like. Here, a method of forming the resin package 100 using a transfer molding method will be described.

First, a lead frame including the plurality of leads 10 is prepared. In this example, the plurality of leads 10 include three pairs of leads per package. Each of the lead pairs includes the leads 10*a* and 10*b* that are spaced apart from each other.

Subsequently, a mold is prepared, and the lead frame is placed in the mold. After this, a thermoplastic resin material colored to a dark color is injected into the mold and solidified by being cooled. Thus, the first dark-colored resin member 40 that holds the plurality of leads 10 is formed. The resin package 100 is obtained.

The primary surface 100*a* of the resin package 100 includes the plurality of recessed portions 20. The leads 10*a* and 10*b* of each lead pair include the exposed regions 30*a* and 30*b*, respectively, at the inner upper surface of the corresponding recessed portion 20. Note that the resin wall disposed in the interior of the recessed portion 20 (second modified example and the like) can be formed by a shape of a mold in this step.

Second Step: Mounting of Light-Emitting Elements 50

Figure 12B:
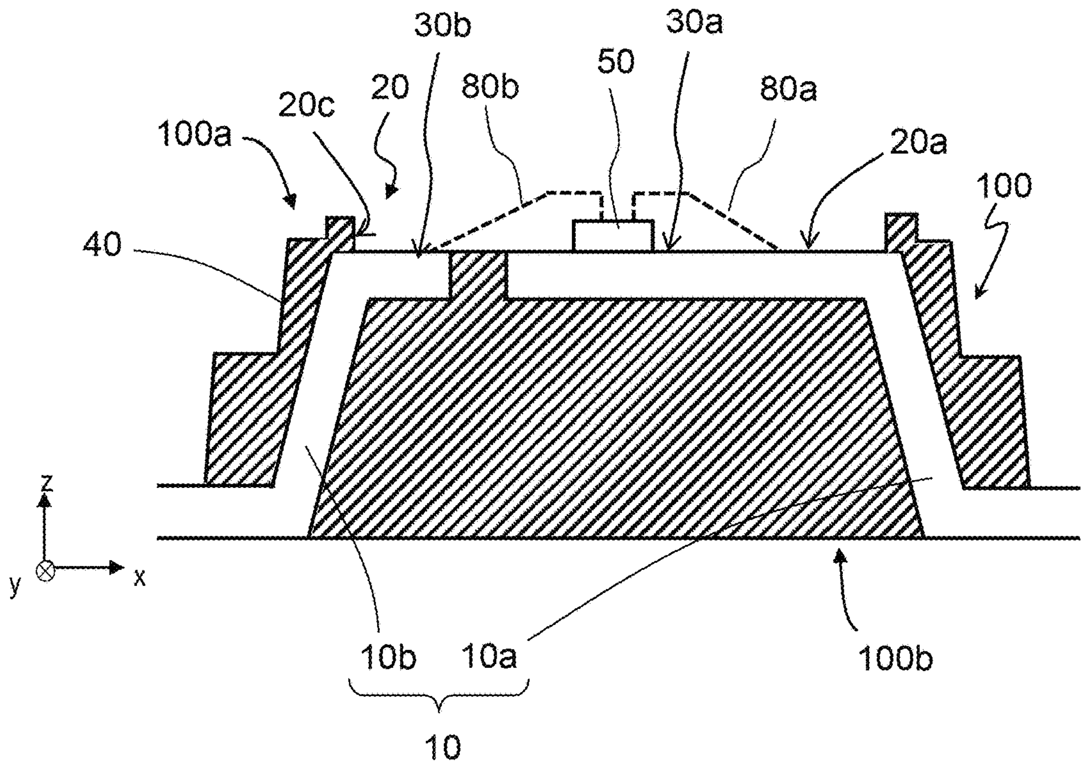
FIG. 12B is a step cross-sectional view illustrating the manufacturing method of the light-emitting device illustrated in FIG. 1.

In a second step, as illustrated in FIG. 12B, the light-emitting element 50 is mounted on the resin package 100. First, in the primary surface 100*a* of the resin package 100, the light-emitting element 50 is bonded to a part of the exposed region 30*a* of one lead 10*a* of each lead pair by using, for example, a non-conductive paste or a conductive paste. Subsequently, the positive and negative electrodes of each light-emitting element 50 are electrically connected to the exposed regions 30*a* and 30*b* of the two leads 10*a* and 10*b* of the lead pair by a pair of wires 80*a* and 80*b*, respectively.

Third Step: Formation of Reflective Member 150

Figure 12C:
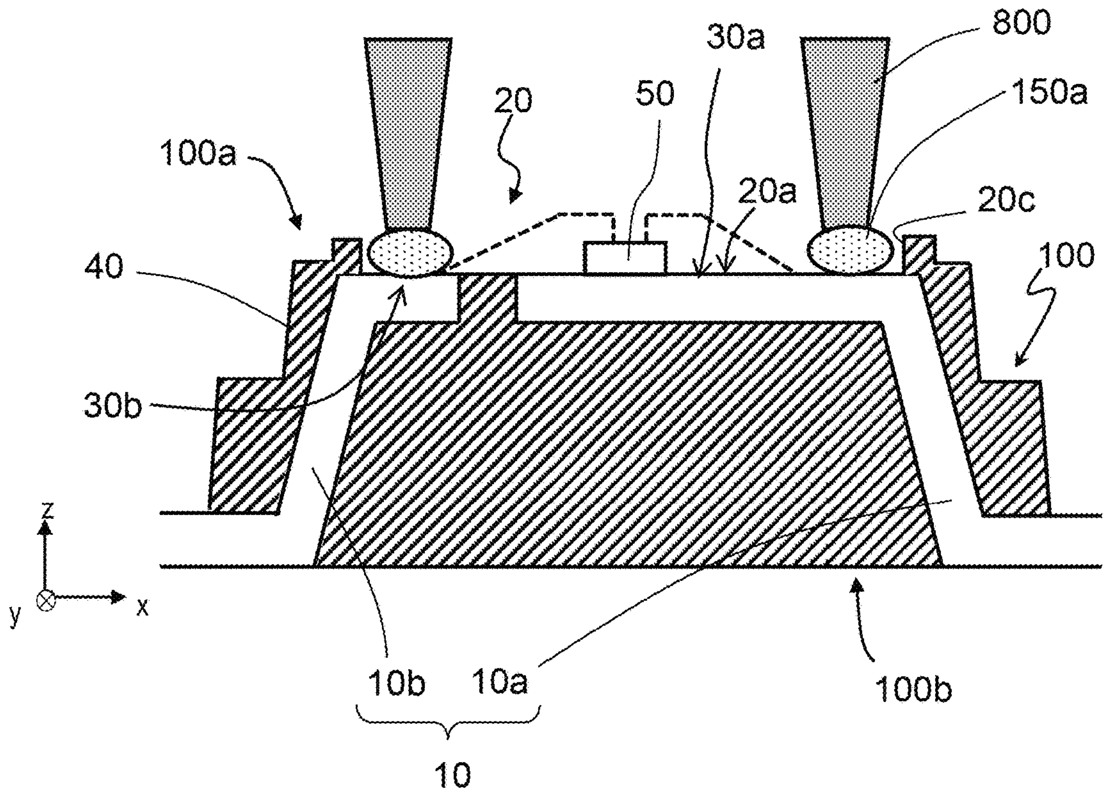
FIG. 12C is a step cross-sectional view illustrating the manufacturing method of the light-emitting device illustrated in FIG. 1.

In a third step, the reflective member 150 is formed around each light-emitting element 50. In this example, as illustrated in FIG. 12C, first resin materials 150*a* are applied around each light-emitting element 50 (in each recessed portion 20 of the resin package 100 in this example) by nozzles 800.

Figure 12D:
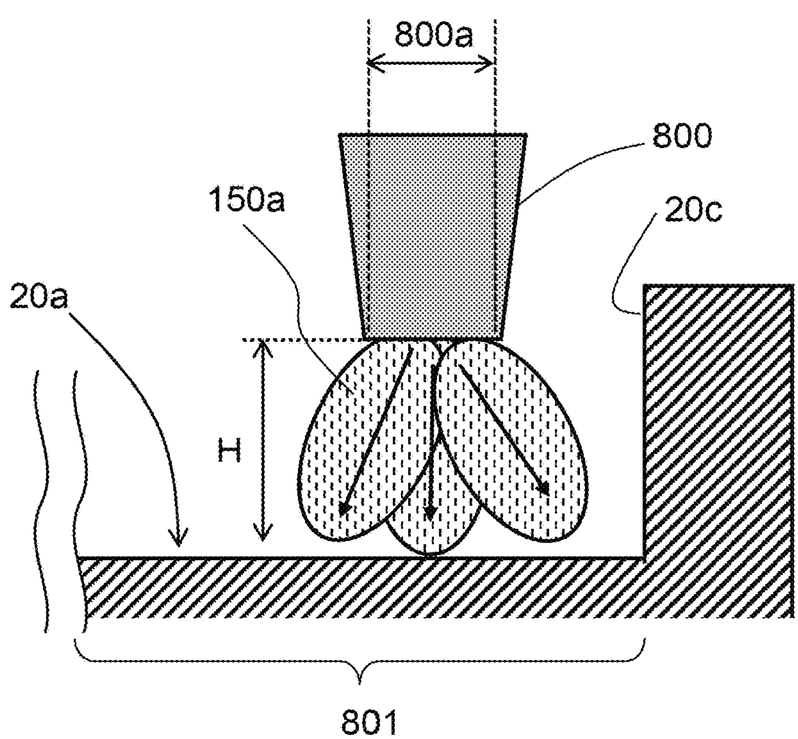
FIG. 12D is an enlarged schematic cross-sectional view for describing the step illustrated in FIG. 12C.

When the first resin material 150*a* is applied to the inner upper surface 20*a* of the recessed portion 20 by using the nozzle 800, preferably the first resin material 150*a* is applied in contact with the inner upper surface 20*a* of the recessed portion 20 as exemplified in FIG. 12D. A distance H from a tip of the nozzle 800 to the inner upper surface 20*a* of the recessed portion 20 can be set in a range from, for example, 200 μm to 300 μm. When the distance H is too long, variation occurs in a direction in which the first resin material 150*a* is ejected from an opening of the nozzle 800, potentially making it difficult to control an application position of the first resin material 150*a*.

In this description, of the inner upper surface 20*a* of the recessed portion 20, a region 801 in which the tip of the nozzle 800 can be brought close is referred to as a "nozzle arrangement region". The nozzle arrangement region 801 is a region where the nozzle is arranged aiming at the region, the "aimed" region so to speak, and is preferably somewhat larger than an actual nozzle diameter. A width of the nozzle arrangement region 801 is set to be, for example, about the same as or larger than an outer diameter 800*a* of the tip of the nozzle 800, and is preferably set to be larger than the outer diameter 800*a* of the nozzle 800. Here, the outer diameter 800*a* of the nozzle 800 is, for example, in a range from 200 μm to 300 μm. Accordingly, the nozzle arrangement region 801 has a size that is larger than a circle having a diameter of, for example, 200 μm or greater, preferably 300 μm or greater.

The inner upper surface 20*a* of the recessed portion 20 preferably includes the nozzle arrangement regions 801, each having a sufficient size, respectively on both sides (±x sides in this example) of the region where the light-emitting element 50 is disposed. Thus, because the first resin material 150*a* can be disposed near the light-emitting element 50 from both sides of the light-emitting element 50, the first resin material 150*a* readily covers the entire lateral surface of the light-emitting element 50.

Figure 12E:
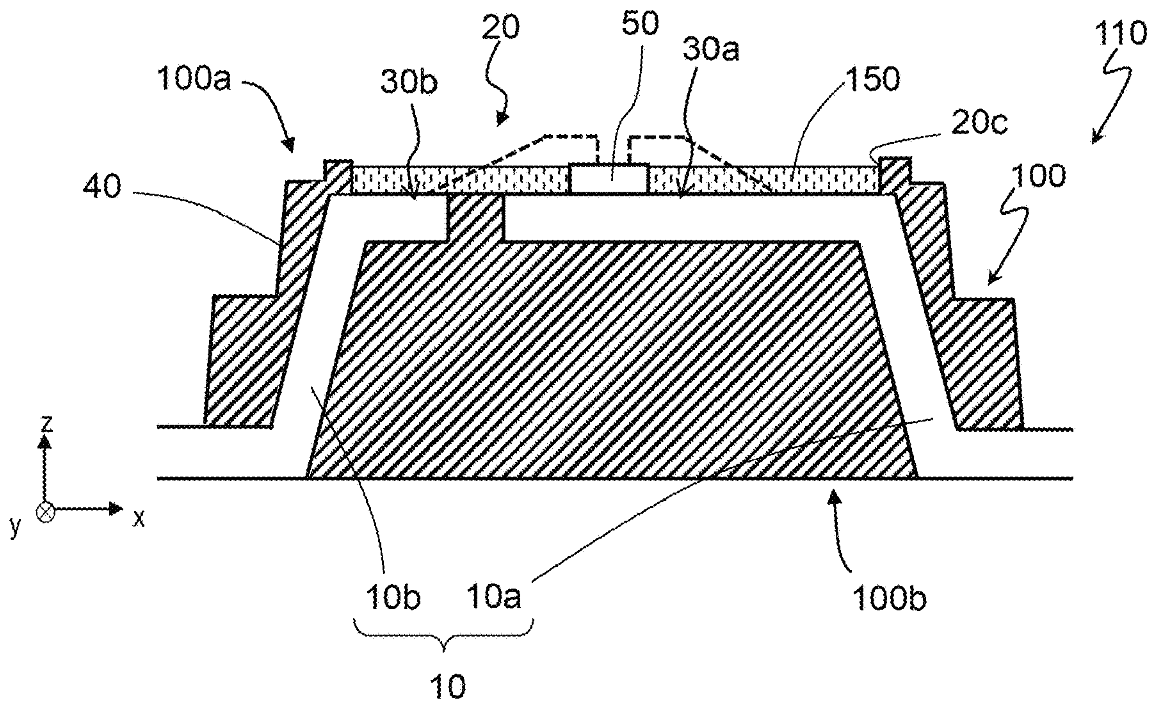
FIG. 12E is a step cross-sectional view illustrating the manufacturing method of the light-emitting device illustrated in FIG. 1.

Subsequently, as illustrated in FIG. 12E, the first resin material 150*a* is cured, and thus the reflective member 150 is obtained. Thereafter, a second resin material may be applied and cured on the reflective member 150, thereby forming the precoating resin (second modified example) or the colored resin member (first modified example). By curing each resin material and then forming the next resin material, it is possible to cure each resin material under optimum conditions.

Note that the first resin material 150*a* may be heated and provisionally cured at a temperature lower than a curing temperature, and then the second resin material may be disposed on the provisionally cured body. Subsequently, the provisionally cured body of the first resin material 150*a* and the second resin material may be heated at a temperature equal to or higher than the curing temperature and fully cured. Alternatively, the mold resin portion may be formed in a state in which the first resin material 150*a* (and second resin material) is provisionally cured. In this case, the first resin material 150*a* (and second resin material) may be fully cured in a curing step for forming the mold resin portion. With formation of a provisionally cured state, the time required for the full curing is shortened, making it possible to reduce a manufacturing time.

Thus, a structure 110 is obtained in which the light-emitting elements 50 and the reflective members 150 are disposed on the primary surface 100*a* of the resin package 100.

Fourth Step: Formation of Mold Resin Portion 60

In a fourth step, the mold resin portion 60 is formed by using, for example, a transfer molding method. The mold resin portion 60 can be formed, for example, by a process as described in JP 2003-332634 A by the present applicant.

Figure 12F:
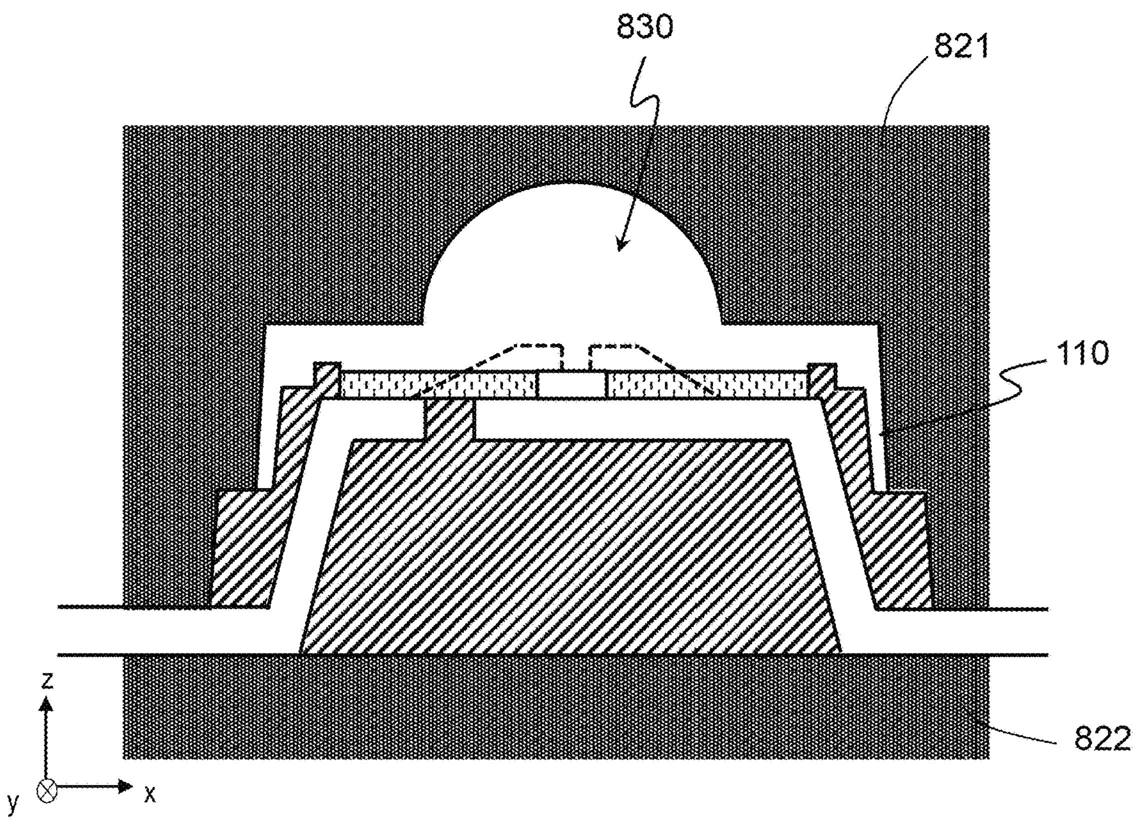
FIG. 12F is a step cross-sectional view illustrating the manufacturing method of the light-emitting device illustrated in FIG. 1.

First, as illustrated in FIG. 12F, the structure 110 is interposed between an upper mold 821 and a lower mold 822 and fixed while pressurizing. The upper mold 821 and the lower mold 822 seal a sealed space 830 that includes the light-emitting elements 50.

Subsequently, a third resin material having a thermosetting resin as a base material is cast into the sealed space 830 in the y-axis direction, thereby sealing off the sealed space 830 with the third resin. Air present in the sealed space 830 is replaced with the third resin and is discharged outside the sealed space 830. The third resin material is also disposed in the interior of the holes 45 (refer to FIG. 2C) provided in the resin package 100.

After the third resin material is injected, a temperature of the molds is maintained at a temperature equal to or higher than a curing temperature of the third resin material (here, 150° C.) for a predetermined time. Accordingly, the third resin material is cured. Subsequently, the molds are removed, and thus a mold resin portion including the plurality of lens portions positioned above the corresponding light-emitting elements 50 is formed.

Fifth Step: Cutting of Leads 10

Subsequently, the leads 10 are cut from the lead frame and separated into individual pieces. The leads 10 thus cut are bent to desired shapes, and thus the light-emitting device 1000 is obtained.

According to the method of manufacturing the present embodiment, the plurality of lens portions and the base portion can be integrally formed by using the same molds. Thus, it is possible to reduce an increase in manufacturing costs and in the number of manufacturing steps. Further, the plurality of lens portions can be stably held in predetermined positions.

The method of manufacturing the light-emitting device according to the present embodiment is not limited to the method described above. For example, the mold resin portion may be formed by using, for example, a casting method.

Figure 13:
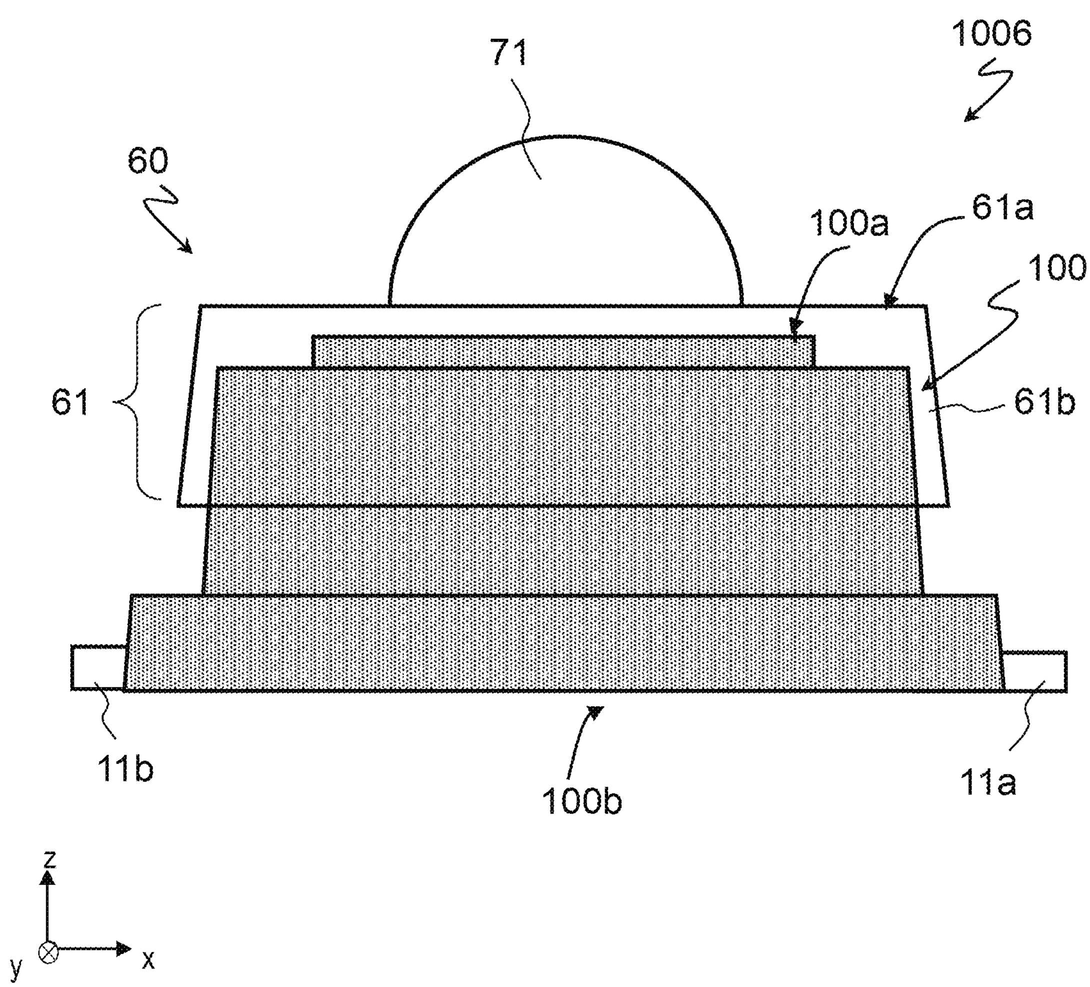
FIG. 13 is a schematic lateral side view of another light-emitting device.

FIG. 13 is a schematic lateral side view illustrating a light-emitting device 1006 in which the mold resin portion 60 is formed by using a casting method. When a casting method is used, in the same steps as described above, after a structure in which the light-emitting elements 50 and the reflective members 150 are disposed on the primary surface 100*a* of the resin package 100 is formed, this structure is impregnated with resin material in a casting case and cured to obtain the mold resin portion 60. When a casting method is used, the mold resin portion 60 providing coverage from the upper surface to a part of the side portion (here, upper side portion) of the resin package 100 is formed.

Second Embodiment

Figure 14:
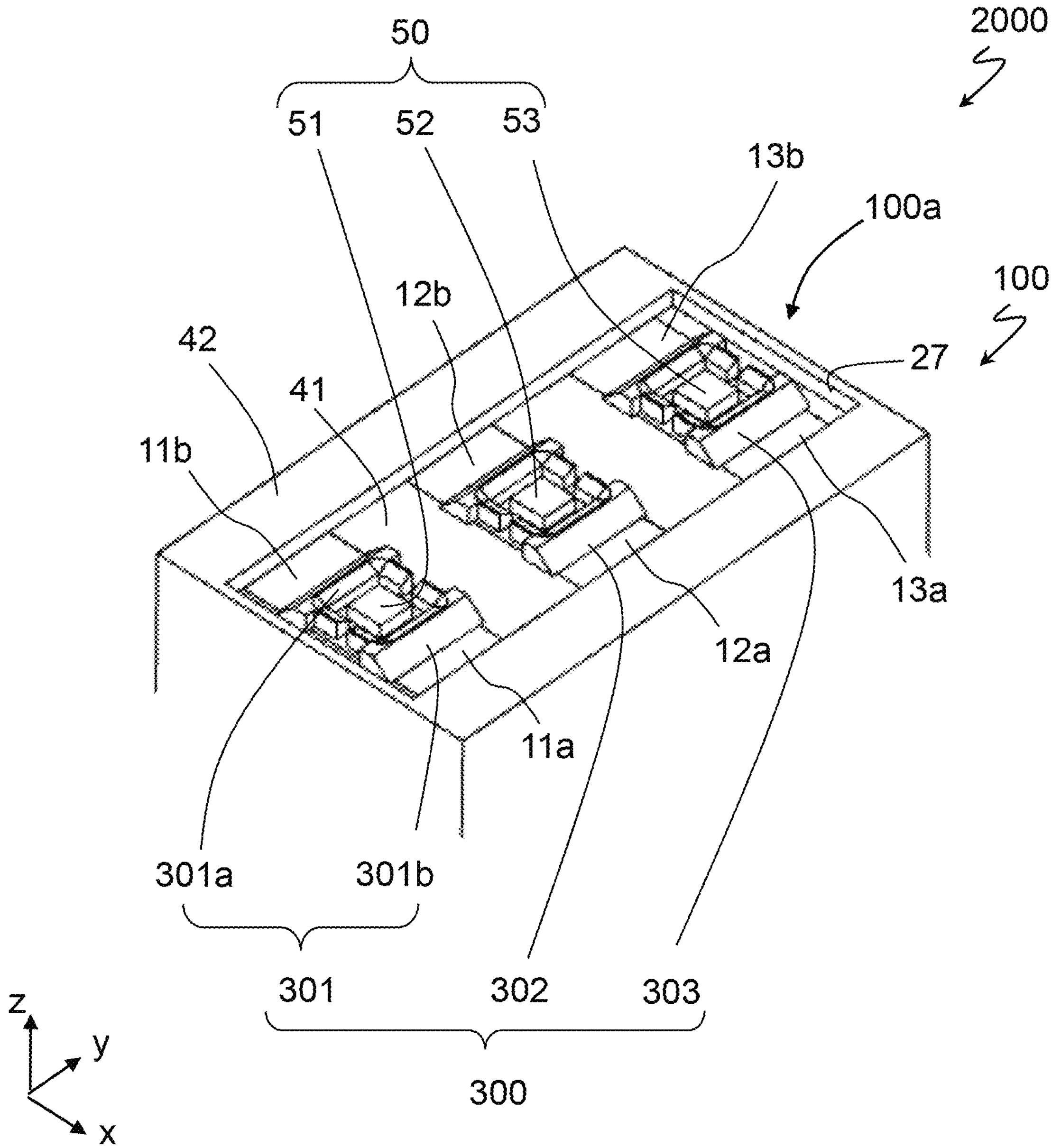
FIG. 14 is a schematic perspective view of a light-emitting device according to another embodiment of the present disclosure, with the mold resin portion removed.
Figure 15A:
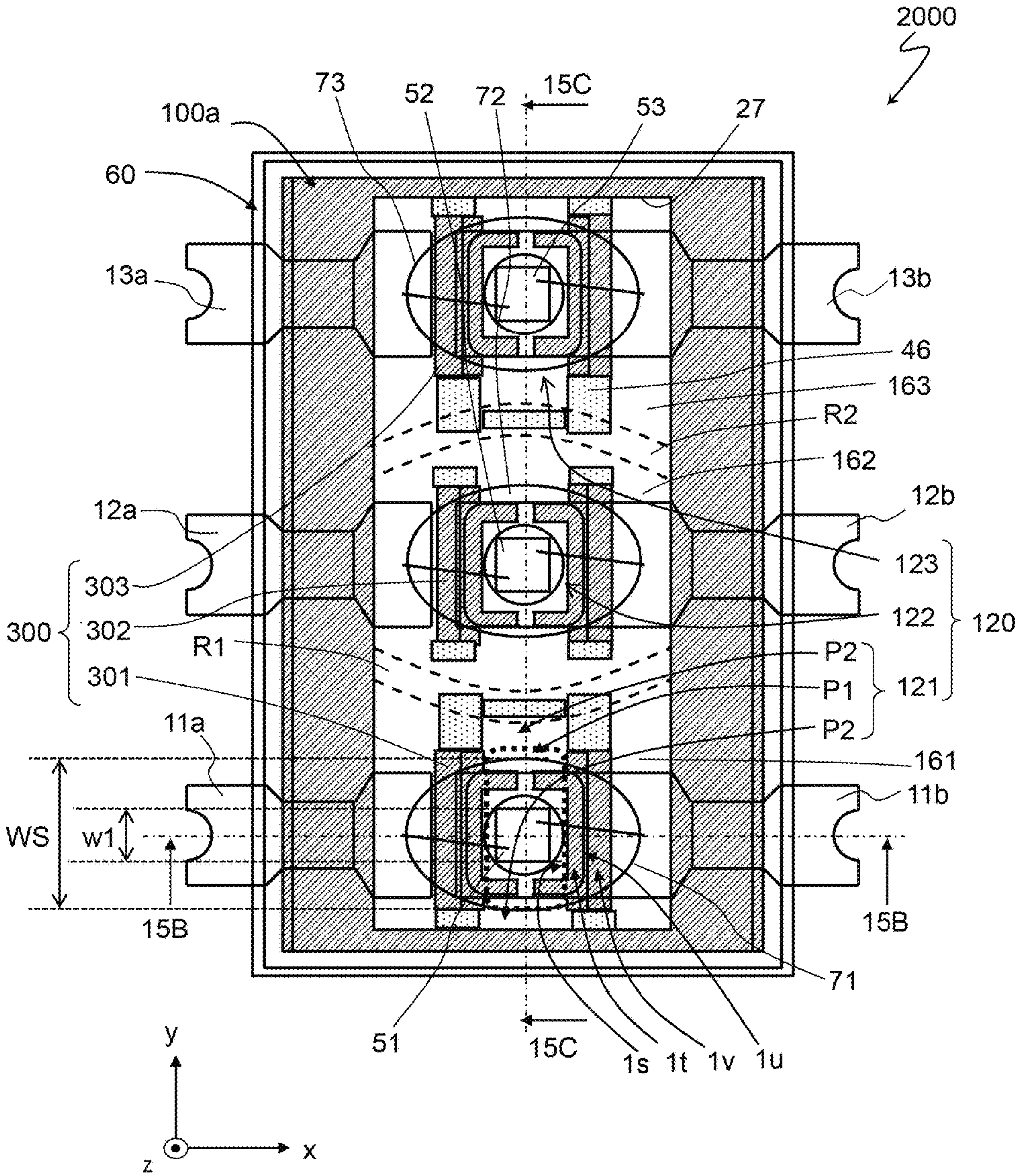
FIG. 15A is a schematic top transparent view of the light-emitting device illustrated in FIG. 14.
Figure 15B:
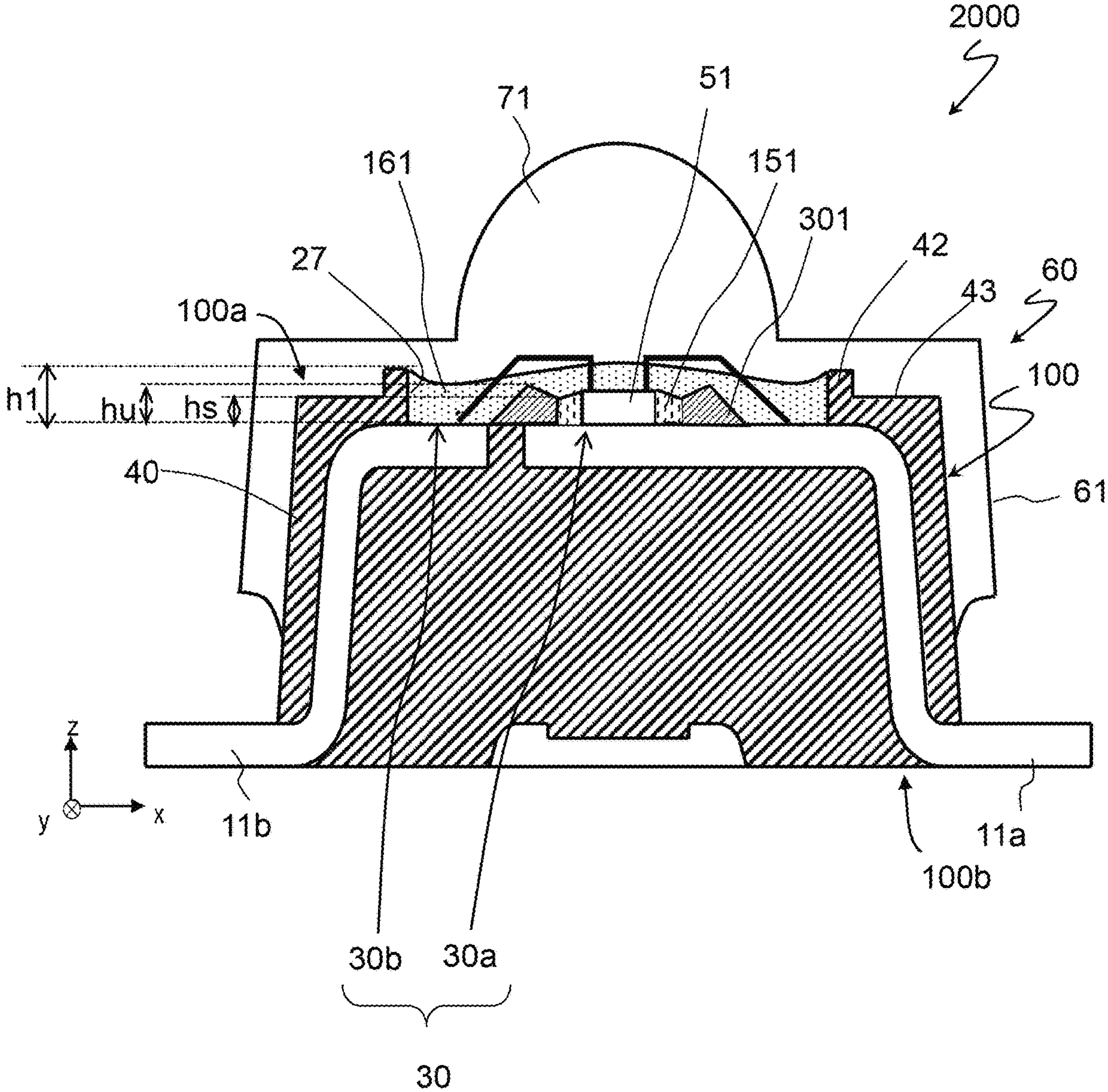
FIG. 15B is a schematic cross-sectional view taken along line 15B-15B illustrated in FIG. 15A.
Figure 15C:
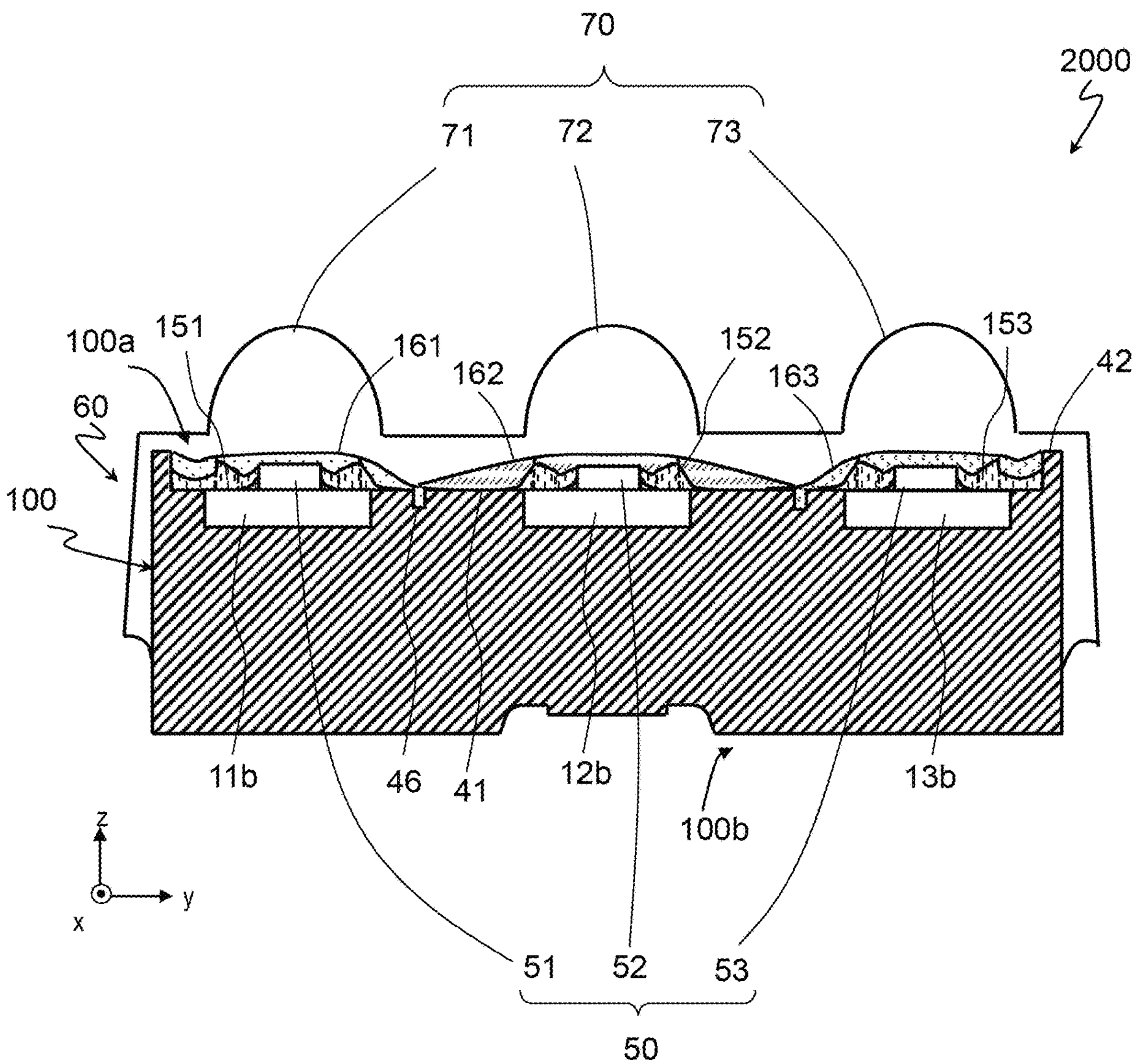
FIG. 15C is a schematic cross-sectional view taken along line 15C-15C illustrated in FIG. 15A.

FIG. 14 is a schematic perspective view of a light-emitting device 2000 of a second embodiment according to the present disclosure, with the mold resin portion 60 and the plurality of reflective members 151 to 153 removed. FIG. 15A is a schematic top transparent view of the light-emitting device 2000. FIGS. 15B and 15C are schematic cross-sectional views respectively taken along lines 15B-15B and 15C-15C illustrated in FIG. 15A. The schematic perspective view of the light-emitting device 2000 is similar to that in FIG. 1.

Below, the light-emitting device of the second embodiment according to the present disclosure will be described with reference to the drawings. The light-emitting device of the present embodiment differs from the light-emitting device 1000 illustrated in FIGS. 2B to 2E and the like in that the primary surface 100*a* of the resin package 100 does not include the recessed portion 20 for each light-emitting element 50.

In the following, points differing from those of the light-emitting device 1000 of the first embodiment will be mainly described, and description of structures similar to those of the light-emitting device 1000 will be omitted.

As illustrated in FIGS. 15A to 15C, the light-emitting device 2000 includes the resin package 100 including the plurality of leads 11*a* to 13*b* and the resin member, the plurality of light-emitting elements 50, the plurality of reflective members 151 to 153, and the mold resin portion 60 including the plurality of lens portions 70.

The resin package 100 includes, on the primary surface 100*a*, a first region 121, a second region 122, and a third region 123 defined by the plurality of leads 11*a* to 13*b* and the first dark-colored resin member 40. The first region 121 to the third region 123 (hereinafter, also collectively referred to as "region 120") are separated from each other. Each region 120 includes the exposed region 30 in which a part of any one of the plurality of leads 11*a* to 13*b* is exposed.

The plurality of light-emitting elements 50 include the first light-emitting element 51 disposed in the first region 121, the second light-emitting element 52 disposed in the second region 122, and the third light-emitting element 53 disposed in the third region 123. Each of the first light-emitting element 51 to the third light-emitting element 53 is disposed in the exposed region 30 of the lead of the corresponding one of the first region 121 to the third region 123.

The plurality of reflective members include the first reflective member 151 to the third reflective member 153 spaced apart from one another. The first reflective member 151 is disposed in the first region 121 and surrounds the first light-emitting element 51 in a plan view. The second reflective member 152 is disposed in the second region 122 and surrounds the second light-emitting element 52 in a plan view. The third reflective member 153 is disposed in the third region 123 and surrounds the third light-emitting element 53 in a plan view.

In the present embodiment as well, similarly to the first embodiment, the lens portion 70 is provided on the emission side of each of the light-emitting elements 50, making it possible to extract light in the frontward direction with high efficiency. Further, the reflective members 151 to 153 surround the corresponding light-emitting elements 50, thereby making it possible to make the light emission of each light-emitting element 50 into a point light source. This makes it possible to reduce the size of the lens portion 70.

In the light-emitting device 2000 of the present embodiment as well, similarly to the light-emitting device of the embodiment described above, in a lateral side view from the y-axis direction, two or more light-emitting elements 50 overlap each other. In a lateral side view from the x-axis direction orthogonal to the y-axis, the maximum width of the first lens portion 71 may be no greater than 5 times the maximum width of the first light-emitting element 51, the maximum width of the second lens portion 72 may be no greater than 5 times the maximum width of the second light-emitting element 52, and the maximum width of the third lens portion 73 may be no greater than 5 times the maximum width of the third light-emitting element 53 (refer to FIG. 6). Accordingly, the light-emitting device 2000 can be further miniaturized.

In the present embodiment, on the primary surface 100*a* of the resin package 100, the first dark-colored resin member 40 may include a plurality of resin walls 300 spaced apart from one another. The plurality of resin walls 300 include at least one first resin wall 301 defining a part of a peripheral edge of the first reflective member 151, at least one second resin wall 302 defining a part of a peripheral edge of the second reflective member 152, and at least one third resin wall 303 defining a part of a peripheral edge of the third reflective member 153. The first resin wall 301 to the third resin wall 303 are respectively disposed near the first region 121 to the third region 123.

The plurality of resin walls 300 may include two or more first resin walls 301 separated from each other, two or more second resin walls 302 separated from each other, and two or more third resin walls 303 separated from each other. In the illustrated example, in a plan view, a pair of the first resin walls 301 are disposed so as to face each other across the first light-emitting element 51, and at least a part of the first reflective member 151 is positioned between the pair of first resin walls 301. Similarly, in a plan view, a pair of the second resin walls 302 facing each other across the second light-emitting element 52, and a pair of the third resin walls 303 facing each other across the third light-emitting element 53 are disposed. At least a part of the second reflective member 152 is positioned between the pair of second resin walls 302, and at least a part of the third reflective member 153 is positioned between the pair of third resin walls 303.

In the present embodiment, in a plan view, each light-emitting element 50 can be disposed in a region defined by two or more resin walls 300. With this structure, it is possible to apply, through the space between two adjacent resin walls 300, the first resin material 150*a* (FIG. 12D and FIG. 30C to be described below) that is to become the reflective members 151 to 153 near the light-emitting elements 50 from outside the region defined by the resin walls 300. Accordingly, the reflective members 151 to 153 can be disposed in a narrower region close to the light-emitting elements 50 while ensuring a sufficient space that can function as the nozzle arrangement region in which the nozzle for applying the first resin material 150*a* can be arranged. Further, the volume of the reflective members 151 to 153 surrounding the corresponding light-emitting elements 50 can be reduced by the resin walls 300. Accordingly, stress applied to the light-emitting elements 50 by the reflective members 151 to 153 during formation of the mold resin portion 60 (during heat treatment for curing) can be more effectively mitigated. Accordingly, the lifting of the light-emitting elements 50 from the leads 11*a* to 13*a* can be more effectively reduced.

In the following, each of the components will be described more specifically.

Region 120

The region 120 is a region in which one light-emitting element 50 and one of the reflective members 151 to 153 surrounding the light-emitting element 50 are disposed.

Hereinafter, a more specific structure of the region 120 will be described by using the first region 121 as an example. Note that, in the various light-emitting devices of the present embodiment, the first region to the third region can have similar structures. Further, the first resin wall to the third resin wall can also have similar structures. In this description, to avoid duplication of description, the first region or the first resin wall may be described as an example, and description of other regions or other resin walls may be omitted. Furthermore, although it is preferable that the first region to the third region all have the structure described by using the first region as an example, it is sufficient if at least one of the first region to the third region have the structure. Similarly, although it is preferable that the first resin wall to the third resin wall all have the structure described by using the first resin wall to the third resin wall as an example, it is sufficient if at least one of the first resin wall to the third resin wall have the structure.

Figure 15D:
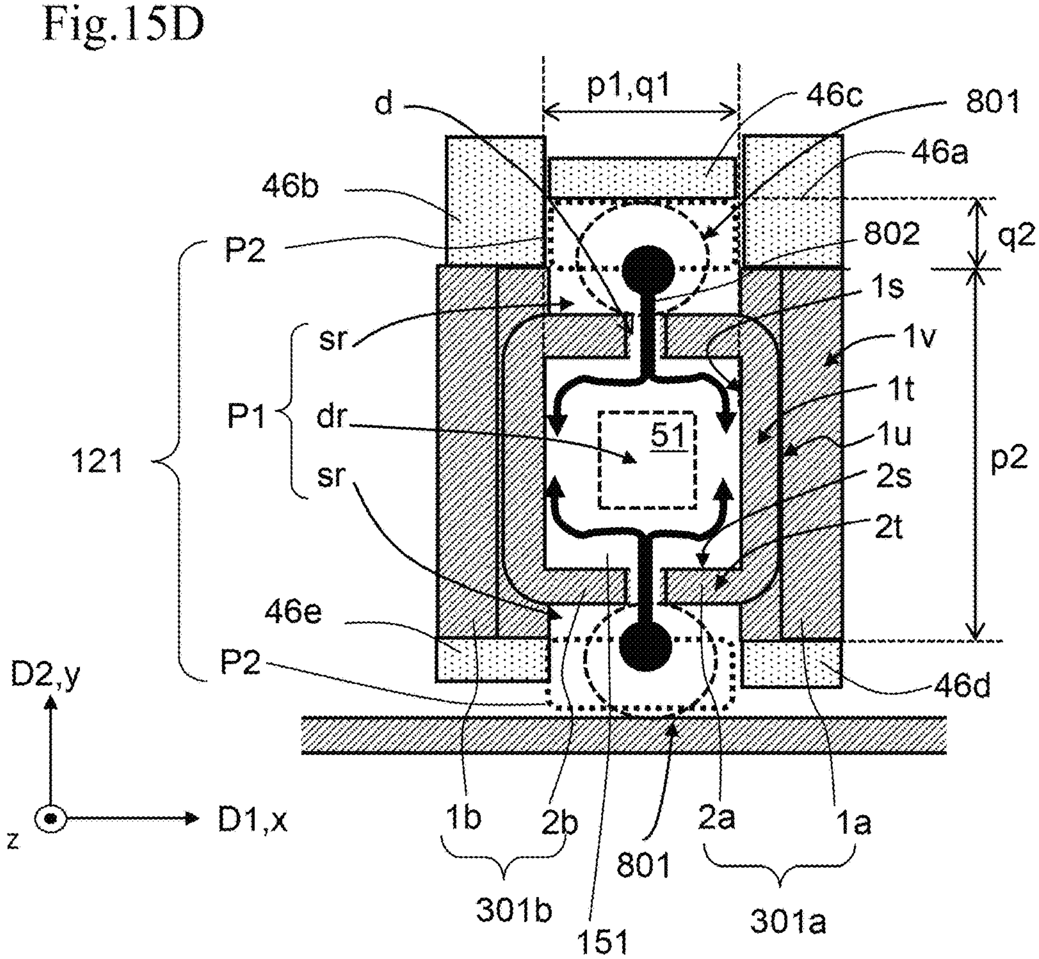
FIG. 15D is an enlarged schematic plan view illustrating a part of a primary surface of a resin package of the light-emitting device illustrated in FIG. 14.

FIG. 15D is an enlarged schematic plan view illustrating the first region 121 of the resin package 100 of the light-emitting device 2000. In FIG. 15D, the first light-emitting element 51 is indicated by a dotted line. The mold resin portion 60 is removed.

The first region 121 includes a first portion P1 defined by two or more resin walls 301 in a plan view. The first portion P1 is, for example, a portion positioned between a pair of resin walls 301*a* and 301*b*. The first portion P1 is connected to a region positioned outside the first portion P1 through the gap between the resin walls 301*a* and 301*b*. The first light-emitting element 51 and at least a part of the reflective member 151 are disposed in the first portion P1.

In the illustrated example, the first region 121 includes the first portion P1 positioned between the pair of first resin walls 301*a* and 301*b*, and a pair of second portions P2 in a plan view. In a plan view, the first resin walls 301*a* and 301*b* face each other across the first light-emitting element 51 in a first direction (x-axis direction in this example) D1. The pair of second portions P2 are positioned across the first portion PT in a second direction (here, y-axis direction) D2 orthogonal to the first direction D1. Each second portion P2 is in contact with the first portion P1. That is, each second portion P2 is connected to the first portion P1.

In the first portion P1, the lead 11*a* is exposed. In this example, the entire first portion P1 is the exposed region 30*a* of the lead 11*a*.

The first portion P1 includes the element placement region dr in which the first light-emitting element 51 is disposed in a plan view. In this example, in a plan view, parts of the first resin walls 301*a* and 301*b* (second wall portions 2*a* and 2*b* to be described below) are positioned between the element placement region dr and each second portion P2.

A first reflective member 151 is disposed on at least a part of the first portion P1. Preferably, the first reflective member 151 surrounds the first light-emitting element 51. The first reflective member 151 may be in contact with the lateral surface of the first light-emitting element 51 and lateral surfaces of the first resin walls 301*a*, 301*b* proximate to the first light-emitting element 51.

A maximum width p1 of the first portion P1 in the first direction D1 may be, for example, in a range from 1.1 times to 2 times a width of the first light-emitting element 51 in the first direction D1. A width p2 of the first portion P1 in the second direction D2 may be, for example, in a range from 2 times to 4 times a width of the first light-emitting element 51 in the second direction D2.

In each second portion of the pair of second portions P2, the first dark-colored resin member 40 may be exposed, or either of the leads 11*a* or 11*b* may be exposed. The second portion P2 and the first portion P1 may be flush with each other. With this structure, the first resin material 150*a* (FIG. 30C to be described below) that is to become the first reflective member 151 readily flows from the second portion P2 to the first portion P1.

A width q1 of each second portion P2 in the first direction D1 may be greater than or equal to the width p1 of the first portion P1 in the first direction D1. In this example, the width q1 of the second portion P2 is the same as the width p1 of the first portion P1. The width q1 of each second portion P2 may be greater than the width p1 of the first portion P1.

According to the configuration described above, the regions 801 each including a region sr, which is a part of the first portion P1, and one of the pair of second portions P2 and having a relatively large area can be formed on both sides of the first light-emitting element 51 in the second direction D2. This region 801 has a size allowing arrangement of the nozzle used when applying the first resin material 150*a* (FIG. 30C to be described below) that is to become the first reflective member 151 and can be used as the "nozzle arrangement region" described above. In this description, the region sr that is a part of the first portion P1 positioned between the pair of resin walls and can constitute the nozzle arrangement region along with the second portion P2 is referred to as a "side region".

Note that a space that can function as the nozzle arrangement region 801 is preferably formed on both sides of the first light-emitting element 51, but may be formed only on one side of the first light-emitting element 51.

Resin Wall 300

As illustrated in FIGS. 15A to 15C, each of the plurality of resin walls 300 is a resin portion having a wall shape or a columnar shape with an upper surface (or upper portion) positioned above the exposed regions 30 of the leads 11*a* to 13*b*.

The resin walls 300 are each positioned near any one of the regions 120 in a plan view and define a part of the peripheral edges of the corresponding one of the reflective members 151 to 153. The resin walls 300 may each have a lateral surface directly in contact with the corresponding one of the reflective members 151 to 153. Each of the resin walls 300 is preferably near the corresponding light-emitting element 50 yet separated from the corresponding light-emitting element 50, and at least a part of the corresponding one of the reflective members 151 to 153 is preferably positioned between the light-emitting element 50 and the resin wall 300.

The plurality of resin walls 300 may include a resin wall positioned between at least one of the first connection region or the second connection region of the two leads connected to each light-emitting element 50, and the light-emitting element 50.

In the present embodiment, positions and heights of the resin walls 300, shapes of the side walls, and the like can be used to control the positions of the reflective members 151 to 153, heights of the upper surfaces of reflective members 151 to 153, and the like. For example, in a plan view, in a case in which the resin wall 300 extends along either lateral surface of the light-emitting element 50, a thickness of portions of the reflective members 151 to 153 covering the lateral surface of the corresponding light-emitting elements 50 can be controlled by a distance between the lateral surface of the resin wall 300 proximate to the light-emitting element 50 and the light-emitting element 50.

Further, by providing the resin wall 300, an arrangement region of each of the reflective members 151 to 153 can be reduced. For example, in a plan view, the first reflective member 151 may be positioned inside the first lens portion 71, the second reflective member 152 may be positioned inside the second lens portion 72, and the third reflective member 153 may be positioned inside the third lens portion 73.

Hereinafter, the shape and the structure of the resin wall 300 and a positional relationship of the resin wall 300 with the light-emitting elements 50 and the reflective members 151 to 153 will be specifically described with reference to FIG. 15D, using the first resin wall 301 as an example.

As described above, the first resin wall 301 includes the pair of first resin walls 301*a* and 301*b* facing each other across the first light-emitting element 51 in the first direction (x-axis direction in this example) D1, in a plan view. The first resin wall 301*a* is positioned on the +x side of the first light-emitting element 51, and the first resin wall 301*b* is positioned on the −x side of the first light-emitting element. In a plan view, the first resin walls 301*a* and 301*b* may face each other with the first light-emitting element 51 interposed therebetween along the two sides of the first light-emitting element 51 that face each other.

In a plan view, the first resin wall 301*a* includes a first wall portion 1*a* extending in the second direction D2, and a pair of the second wall portions 2*a* extending in parallel from the first wall portion 1*a* toward the first resin wall 301*b* in the first direction D1. The first wall portion 1*a* and the second wall portions 2*a* are integrally formed (that is, connected). Similarly, the first resin wall 301*b* includes a first wall portion 1*b* extending in the second direction D2, and a pair of the second wall portions 2*b* extending in parallel from the first wall portion 1*b* toward the first resin wall 301*a* in the first direction D1. The first wall portion 1*b* and the second wall portions 2*b* are integrally formed. In a plan view, a length of the second wall portions 2*a* and 2*b* in the first direction D1 is, for example, less than one half of the width p1 of the first portion PT (here, space between the first wall portions 1*a* and Tb).

The second wall portions 2*a* of the first resin wall 301*a* and the second wall portions 2*b* of the first resin wall 301*b* face each other spaced apart by a space d. The space d is smaller than the width q1 of the second portion P2 and the width p1 of the first portion PT. The space d may be smaller than the width of the first light-emitting element 51 in the first direction D1. When the first resin material 150*a* (FIG. 30C to be described below) is applied by utilizing capillary action as will be described below, the space d may be, for example, in a range from 100 μm to 200 μm.

The first light-emitting element 51 is disposed in an interior of a region defined by the first wall portions 1*a* and 1*b* and the second wall portions 2*a* and 2*b*. A distance between the lateral surface of each of the first wall portions 1*a* and 1*b* and the second wall portions 2*a* and 2*b* proximate to the first light-emitting element 51 and the first light-emitting element 51 is, for example, 300 μm or less, preferably in a range from 100 μm to 200 μm.

Flow of First Resin Material from Nozzle Arrangement Region 801

The flow of the first resin material 150*a* (FIG. 30C to be described below) applied to the nozzle arrangement region 801 will be described with reference to FIG. 15D. The first resin material is a resin material that is cured to form the reflective member.

The nozzle arrangement region 801 is a region in which a nozzle for applying the first resin material can be arranged and is a region aimed when arranging the nozzle. In a case in which a nozzle having the size described above with reference to FIG. 12D is used, the nozzle arrangement region 801 can have a size greater than that of a circle having a diameter of 200 μm or greater, preferably 300 μm or greater, for example.

In the present embodiment, the nozzle arrangement region 801 is positioned outside a region defined by the plurality of resin walls 300 in a plan view. In this example, the region 801 including the side region sr, which is a part of the first portion P1, and the second portion P2 is the "nozzle arrangement region". In the illustrated example, the side region sr is a region of the first portion P1 positioned outward of the second wall portions 2*a* and 2*b* of the first resin walls 301*a* and 301*b*, respectively.

In a plan view, when the nozzle is arranged in the nozzle arrangement region 801 positioned on the +y side of the first portion P1 and the first resin material is ejected, the first resin material flows through the space d between the first resin walls 301*a* and 301*b* and into a region defined by the first wall portions 1*a* and 1*b* and the second wall portions 2*a* and 2*b*, as indicated by an arrow 802, by capillary action. The first resin material is pulled by surface tension to corner portions formed by the exposed region of the leads 11*a* and 11*b* or the first resin portion 41 (FIG. 15B) and the first resin wall 301, causing the first resin material flowing in from the space d to flow around from the +y side to the +x sides of the first light-emitting element 51. In a case in which the nozzle is arranged in the nozzle arrangement region 801 positioned on the −y side of the first portion P1 as well, the same applies and the first resin material passes through the space d by capillary action and flows in and around from the −y side to the +x sides of the first light-emitting element 51. Thus, the first resin material can be brought into contact with entire lateral surface of the first light-emitting element 51. A part of the first resin material may remain in the side regions sr, the second portions P2, or both.

Detailed Structure of First Resin Wall 301

The structure of each of the first resin walls 301*a* and 301*b* will be described in more detail. In the following, description will be made using the first resin wall 301*a* as an example, but the first resin wall 301*b* can also have a similar structure.

Figure 15E:
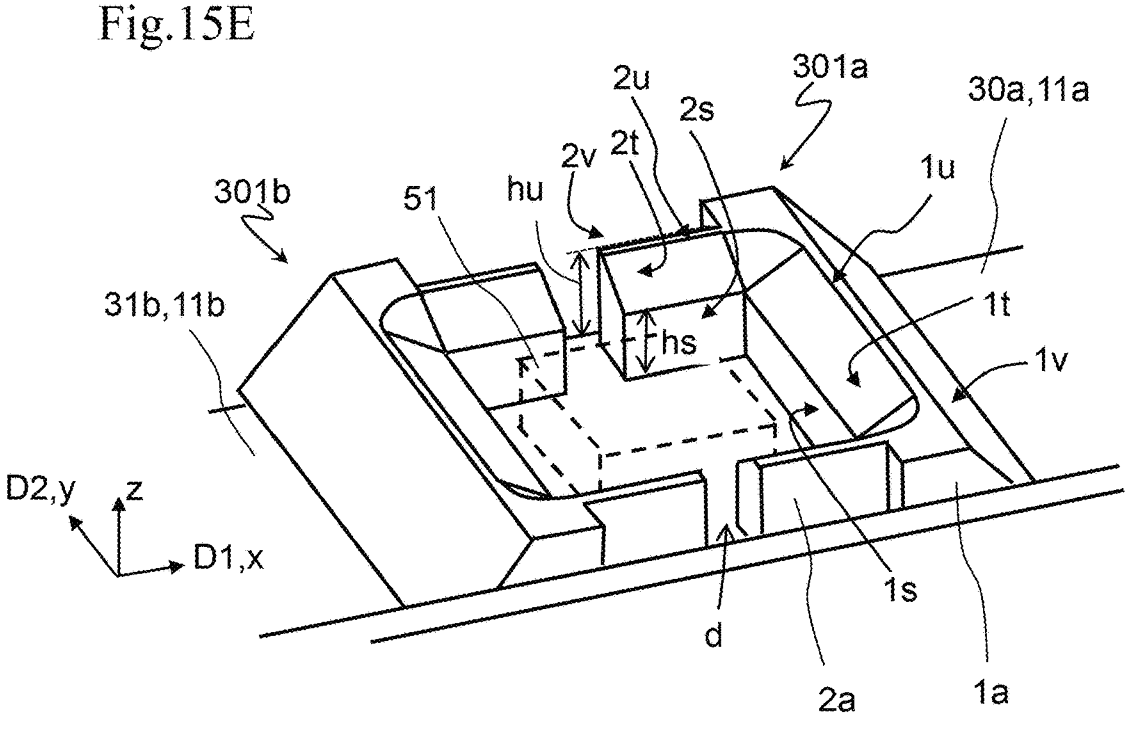
FIG. 15E is an enlarged schematic perspective view illustrating a part of the primary surface of the resin package of the light-emitting device illustrated in FIG. 14.

FIG. 15E is an enlarged schematic perspective view of the pair of first resin walls 301.

As illustrated in FIG. 15E, the first wall portion 1*a* of the first resin wall 301*a* includes a first lateral surface is positioned proximate to the first light-emitting element 51 and in contact with the first reflective member 151, a second lateral surface 1*v*, an upper surface (or upper portion) 1*u* positioned between the first lateral surface is and the second lateral surface 1*v*, and a tapered surface 1*t* positioned between the first lateral surface is and the upper surface 1*u*. The first lateral surface is may be parallel to the lateral surface of the first light-emitting element 51 (lateral surface corresponding to the first wall portion 1*a*). The upper surface 1*u* is positioned above an upper end of the first lateral surface 1*s*. The tapered surface 1*t* is inclined from the upper end of the first lateral surface is toward the upper surface 1*u*. The second lateral surface 1*v* may be a tapered surface inclined so as to become lower from the upper surface 1*u* toward the exposed region 30*a* of the lead 11*a*.

Each second wall portion 2*a* of the first resin wall 301*a* includes a first lateral surface 2*s* positioned proximate to the first light-emitting element 51, a second lateral surface 2*v*, an upper surface (or upper portion) 2*u* positioned between the first lateral surface 2*s* and the second lateral surface 2*v*, and a tapered surface 2*t* positioned between the first lateral surface 2*s* and the upper surface 2*u*. The second lateral surface 2*v* may be a tapered surface, or may be a surface perpendicular to the xy plane.

The upper surface 1*u* of the first wall portion 1*a* and the upper surface 2*u* of each second wall portion 2*a* are connected. The tapered surface 1*t* of the first wall portion 1*a* may include a fan-shaped surface at a corner portion between each second wall portion 2*a* and the first wall portion 1*a* so as to be continuous with the tapered surface 2*t* of each second wall portion 2*a*.

With the first resin wall 301*a* having the configuration described above, it is possible to control the height of the upper surface of the first reflective member 151 by a height hs of the first lateral surfaces 1*s* and 2*s*. A height hs of the first lateral surfaces is and 2*s* may be about the same as a height of the first light-emitting element 51 or may be lower than the height of the first light-emitting element 51. With this structure, the flow of the first reflective member 151 to the upper surface of the first light-emitting element 51 can be reduced.

A height hu of the upper surfaces 1*u* and 2*u* is preferably higher than the height of the first light-emitting element 51. In a case in which a precoating resin such as the colored resin members 161 to 163 is formed on the first reflective member 151, the thickness of the precoating resin (height of an upper surface of the precoating resin) can be controlled by utilizing the upper surfaces 1*u* and 2*u*. The upper surfaces 1*u* and 2*u* may be positioned below the upper surface of the second resin portion 42 (FIG. 15B). By adjusting the height of the upper surfaces 1*u* and 2*u* of each resin wall 300 and the upper surface of the second resin portion 42 (FIG. 15B), it is possible to make the thickness of the precoating resin more uniform and ensure the thickness of the precoating resin to a certain degree or above.

Further, with the first resin wall 301*a* including the tapered surfaces 1*t* and 2*t* with the upper surfaces 1*u* and 2*u* as the uppermost surfaces, respectively, it is possible to reduce the blocking of light from the first light-emitting element 51 by the upper surfaces 1*u* and 2*u* of the first resin wall 301*a* that are higher than the first light-emitting element 51. Furthermore, with the second lateral surface 1*v* of the first wall portion 1*a* having a tapered surface inclined so as to become lower as the distance from the upper surface 1*u* increases, it is possible to reduce, when forming a loop of the wire, contact of the loop of the wire with the first wall portion 1*a*.

Note that, in this description, the height of each component such as the first light-emitting element 51 and the first resin wall 301*a* disposed on the primary surface 100*a* of the resin package 100 (including the heights hs and hu described above) is a distance from the exposed region of the lead exposed at the primary surface 100*a* to the upper surface (or upper portion) of the component in the z-axis direction.

Resin Groove 46

As illustrated in FIG. 15A, the first dark-colored resin member 40 may include at least one resin groove (also referred to as "third portion") 46 positioned outside of each region 120 in a plan view. An upper surface of the resin groove 46 may be positioned below (−z direction) the exposed region 30 of the leads 11*a* to 13*b*, for example. The resin groove 46 may be a groove or a depression formed in the first resin portion 41 of the first dark-colored resin member 40. The resin groove 46 is at least partially in contact with the second portion P2 in a plan view. The upper surface of the resin groove 46 is positioned below surfaces of the first portion P1 and the second portion P2 facing upward.

With the resin groove 46 provided in contact with the second portion P2, it is possible to utilize surface tension, when the first reflective member 151 is formed, to reduce the outflow of the first resin material 150*a* (FIG. 30C), which is ejected into an interior of the nozzle arrangement region 801, from the second portion P2 in a direction different from that of the element placement region dr.

At least one resin groove 46 is disposed for each region 120. A plurality of the resin grooves 46 may be disposed for each region 120. The plurality of resin grooves 46 may include two resin grooves 46 disposed across the second portion P2 in the first direction D1 in a plan view.

A depth of each resin groove 46 is not particularly limited, but may be, for example, in a range from 100 μm to 200 μm. The depth of the resin groove 46 is a distance from the exposed region 30 of the leads 11*a* to 13*b* to a bottom portion of the resin groove 46 in the z-axis direction.

The resin groove 46 preferably defines a part of a peripheral edge of the nozzle arrangement region 801 to be aimed for arranging the nozzle. Accordingly, the first resin material 150*a* (FIG. 30C) applied to the nozzle arrangement region 801 can be more effectively guided to a region near the light-emitting element 50.

In the example illustrated in FIG. 15D, resin grooves 46*a* to 46*e* spaced apart from one another are disposed in the first region 121. In a plan view, one of the second portions P2 is interposed between the resin grooves 46*a* and 46*b* in the first direction D1, and the other of the second portions P2 is interposed between the resin grooves 46*d* and 46*e* in the first direction D1. The width q1 of each second portion P2 in the first direction D1 is defined by these resin grooves 46. The resin groove 46*c* is positioned between the resin groove 46*a* and the resin groove 46*b* in a plan view. This makes it possible to more effectively reduce the outflow of the first reflective member 151 toward other adjacent regions 120 (second region 122 in this example). Further, the number of the resin grooves 46*c* provided may be one less than the number of light-emitting elements. Note that the resin grooves 46*a* to 46*c* may be three separated grooves or may be a U-shaped groove formed integrally.

Recessed Portion 27

As illustrated in FIGS. 15A to 15C, the primary surface 100*a* of the resin package 100 may include a recessed portion 27 defined by the leads 11*a* to 13*b* and the first dark-colored resin member 40. In the illustrated example, an inner upper surface of the recessed portion 27 includes the first region 121 to the third region 123. For example, the recessed portion 27 has a substantially rectangular shape in a plan view. In a plan view, the plurality of resin walls 300 and the plurality of resin grooves 46 formed of the first dark-colored resin member 40 are positioned in an interior of the recessed portion 27. Note that the configuration of the recessed portion 27 is not limited to the above. The inner upper surface of the recessed portion 27 includes at least two regions 120 of the first region 121 to the third region 123 including the first region 121 and at least one first resin wall 301 being positioned inside the recessed portion 27.

The first dark-colored resin member 40 includes the first resin portion 41 exposed at the inner upper surface of the recessed portion 27 and the second resin portion 42 surrounding the inner upper surface of the recessed portion 27. The upper surface of the second resin portion 42 is positioned above (+z direction) the upper surface of the first resin portion 41. The second resin portion 42 may be a wall surrounding the recessed portion 27. The height h1 of the upper surface of the second resin portion 42 may be higher than the height hu of the upper surface (or portion positioned uppermost) of the resin wall 300.

A precoating resin (light-transmissive resin member) having light transmissivity may be disposed in the recessed portion 27 so as to cover at least the first light-emitting element 51 and the first reflective member 151. In this example, the colored resin members 161 to 163 are disposed in the recessed portion 27 as precoating resins.

Colored Resin Members 161 to 163

As illustrated in FIGS. 15A to 15C, the light-emitting device 2000 includes the colored resin members 161 to 163 as precoating resins between the primary surface 100*a* of the resin package 100 and the mold resin portion 60. The material and the effect of the colored resin members 161 to 163 are the same as those of the first modified example described above.

In the present embodiment, the first light emitted from the first light-emitting element 51, the second light emitted from the second light-emitting element 52, and the third light emitted from the third light-emitting element 53 are light beams having wavelengths different from one another. The colored resin member includes the first colored resin member 161 colored to the same type of color as the first light, the second colored resin member 162 colored to the same type of color as the second light, and the third colored resin member 163 colored to the same type of color as the third light.

In a plan view, at least a part of the first colored resin member 161 is positioned in the first region 121, at least a part of the second colored resin member 162 is positioned in the second region 122, and at least a part of the third colored resin member 163 is positioned in the third region 123. At least a part of the first colored resin member 161 may be positioned on the first reflective member 151, at least a part of the second colored resin member 162 may be positioned on the second reflective member 152, and at least a part of the third colored resin member 163 may be positioned on the third reflective member 153. In a plan view, the first colored resin member 161 to the third colored resin member 163 may overlap the first light-emitting element 51 to the third light-emitting element 53, respectively.

In the illustrated example, the first colored resin member 161 to the third colored resin member 163 are disposed in the recessed portion 27. The first colored resin member 161 to the third colored resin member 163 may each be in contact with a part of the inner lateral surface of the recessed portion 27. In a plan view, a region R1 in which the first colored resin member 161 and the second colored resin member 162 overlap may be disposed between the first region 121 and the second region 122. Similarly, a region R2 in which the second colored resin member 162 and the third colored resin member 163 overlap may be disposed between the second region 122 and the third region 123.

Fifth Modified Example

Figure 16:
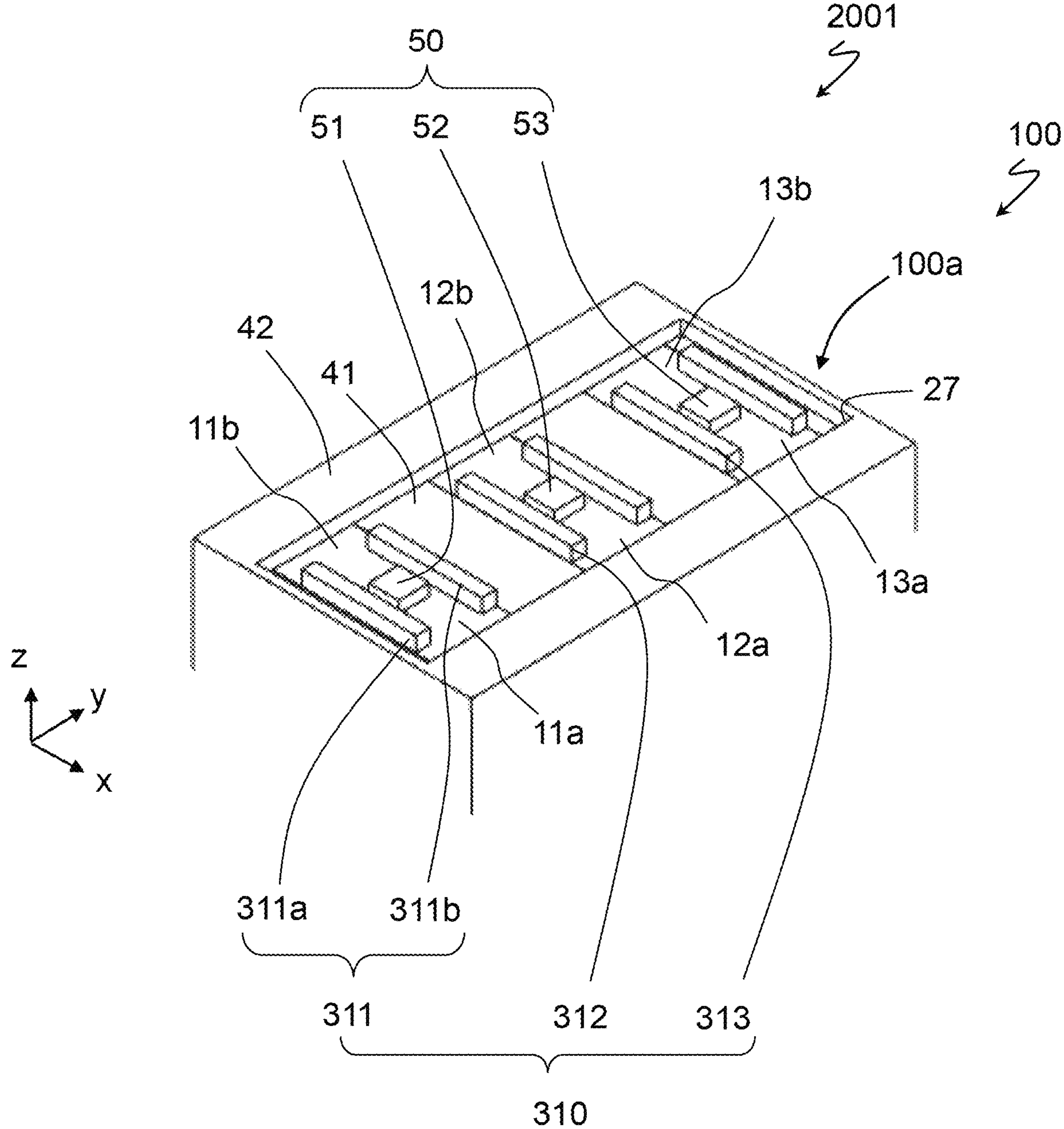
FIG. 16 is a schematic perspective view of a light-emitting device according to an embodiment of a fifth modified example, with the mold resin portion removed.
Figure 17A:
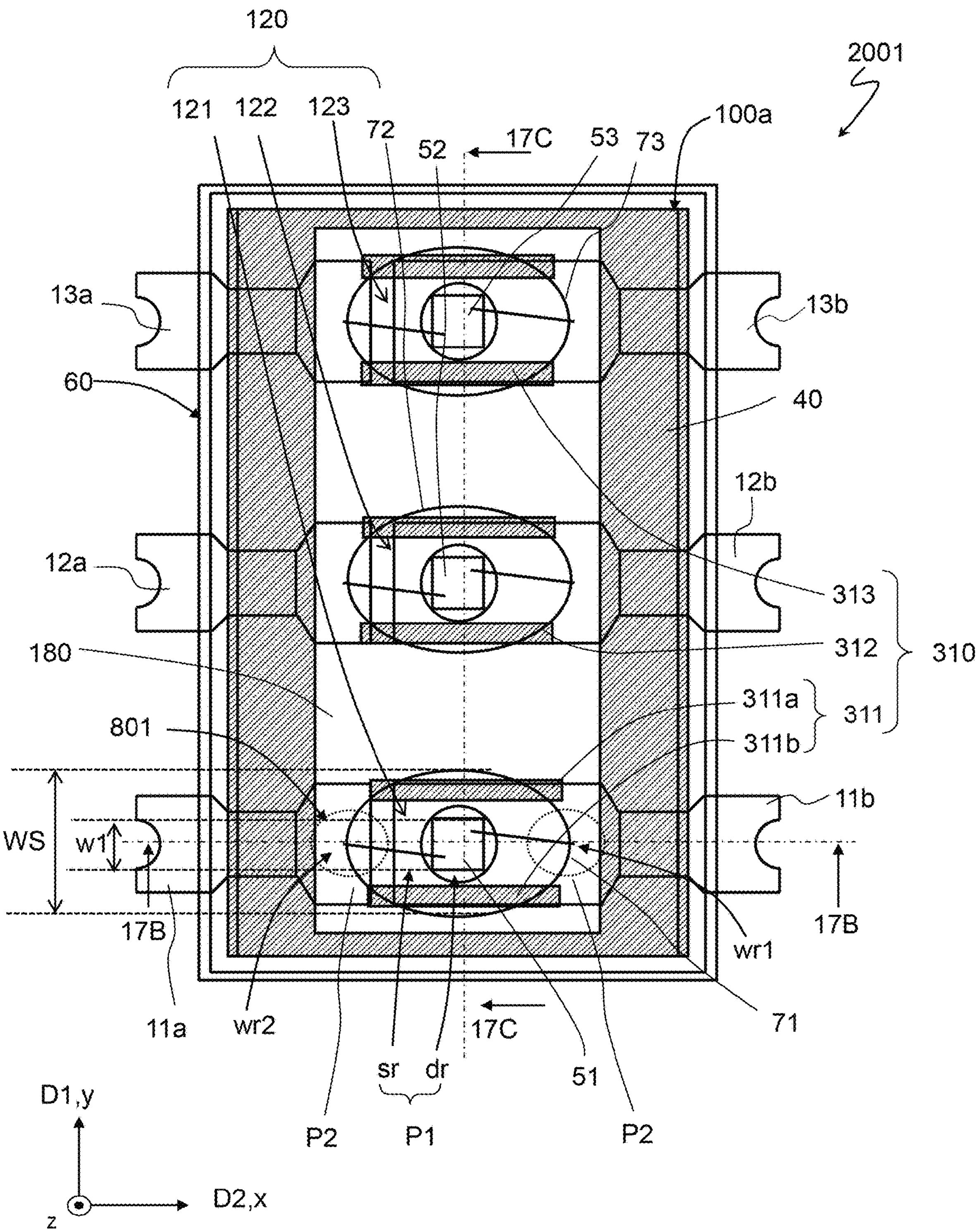
FIG. 17A is a schematic top transparent view of the light-emitting device illustrated in FIG. 16.
Figure 17B:
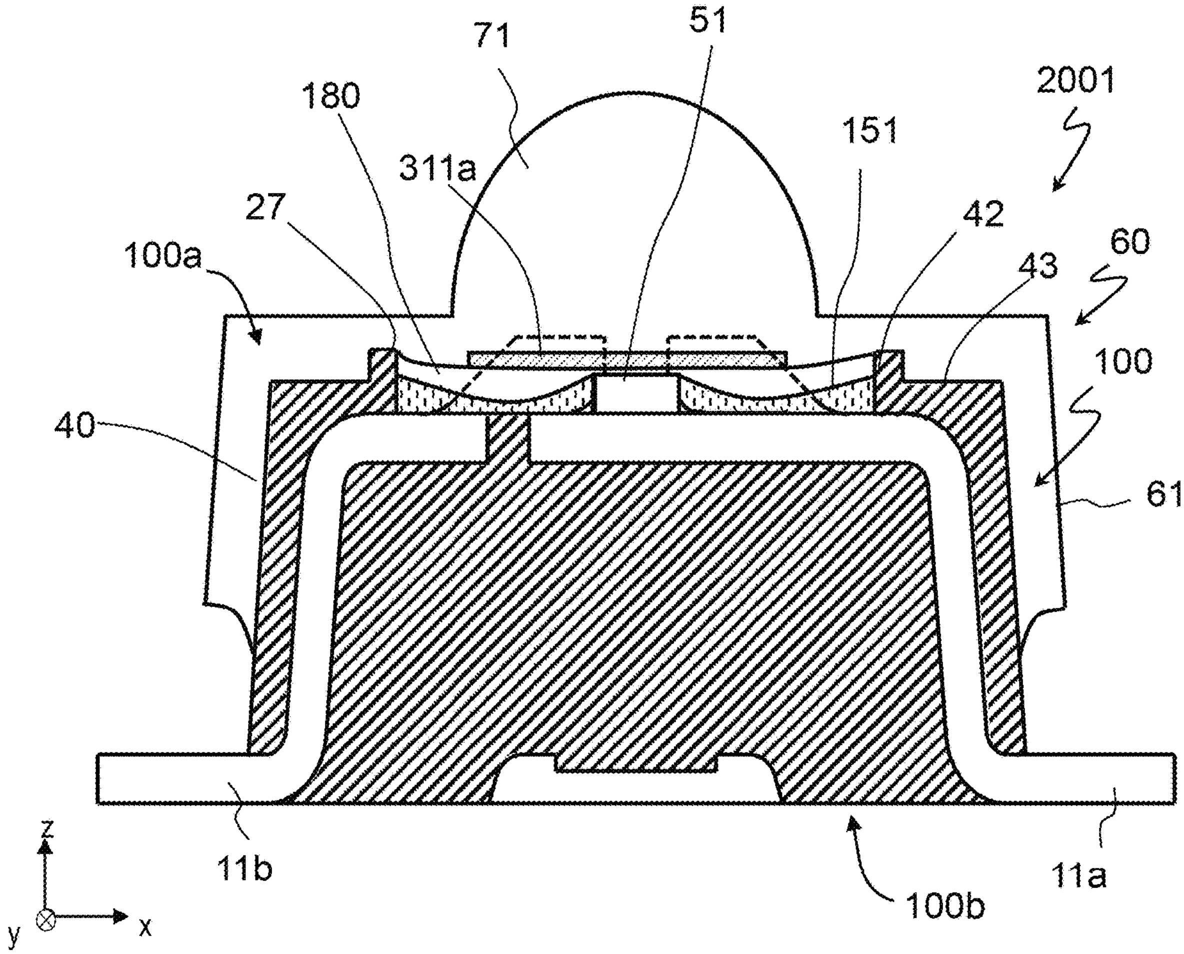
FIG. 17B is a schematic cross-sectional view taken along line 17B-17B illustrated in FIG. 17A.
Figure 17C:
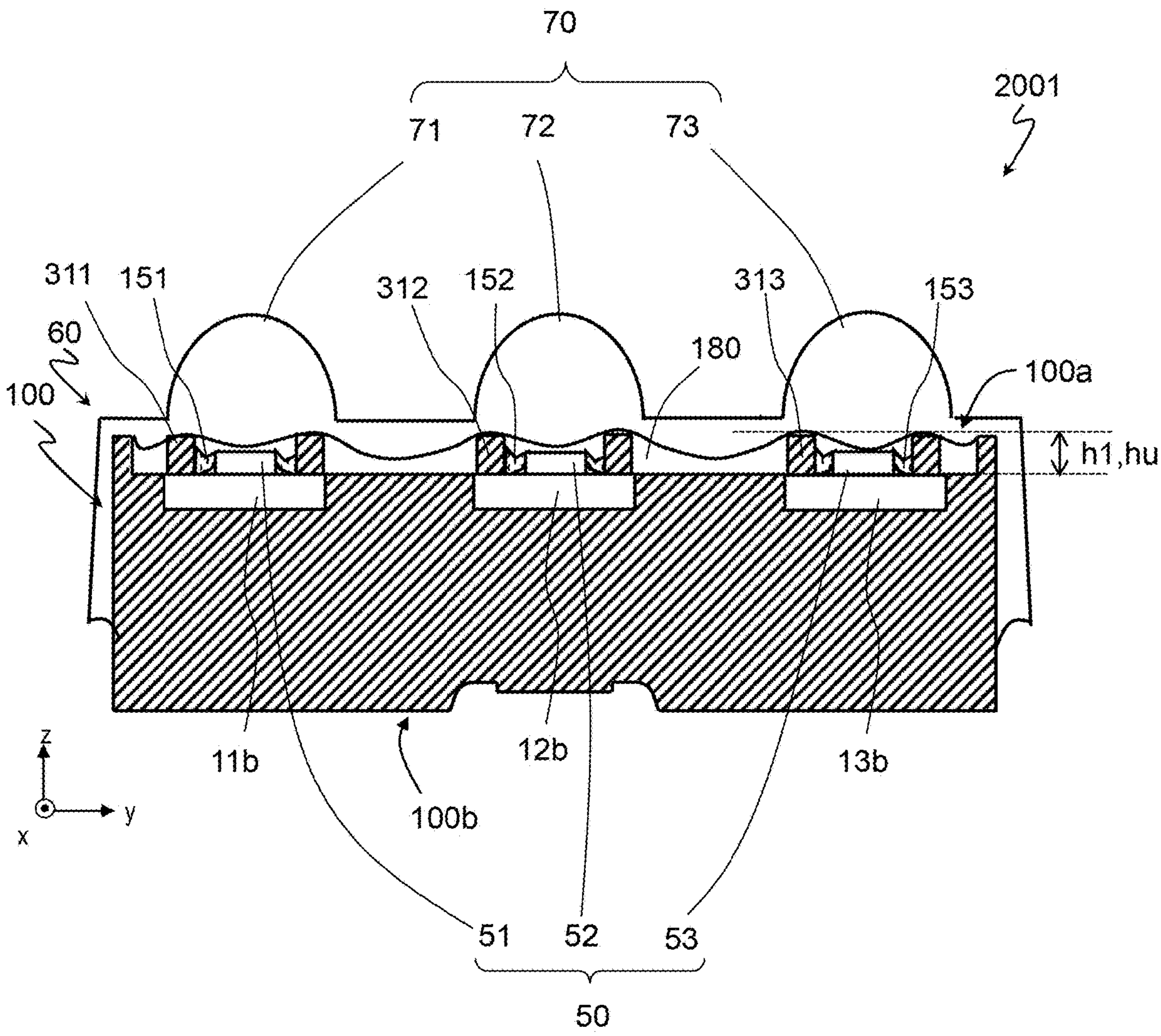
FIG. 17C is a schematic cross-sectional view taken along line 17C-17C illustrated in FIG. 17A.

FIG. 16 is a schematic perspective view of a light-emitting device 2001 according to a fifth modified example, with the mold resin portion 60 and the reflective members 151 to 153 removed. FIG. 17A is a schematic top transparent view of the light-emitting device 2001. FIGS. 17B and 17C are schematic cross-sectional views respectively taken along lines 17B-17B and 17C-17C illustrated in FIG. 17A.

The light-emitting device 2001 according to the present modified example differs from the light-emitting device 2000 described above in that pairs of resin walls 310 are each disposed across the corresponding one of the light-emitting elements 50 in the y-axis direction in a plan view. In the present modified example, the first direction D1 is the y-axis direction.

The plurality of resin walls 310 in the present modified example include a pair of first resin walls 311 defining a part of the peripheral edge of the first reflective member 151, a pair of second resin walls 312 defining a part of the peripheral edge of the second reflective member 152, and a pair of third resin walls 313 defining a part of the peripheral edge of the third reflective member 153. The first resin walls 311 to the third resin walls 313 each have a rectangular planar shape long in the x-axis direction.

A structure of the region 120 in the present modified example will be described with reference to FIG. 17A by using the first region 121 as an example. The first region 121 includes the first portion P1 positioned between a pair of first resin walls 311*a* and 311*b* and the pair of second portions P2 facing each other across the first portion P1 in the second direction D2 (here, x-axis direction).

In a plan view, the first portion P1 includes the element placement region dr in which the first light-emitting element 51 is to be disposed and the side regions sr each positioned between the element placement region dr and the corresponding one of the pair of second portions P2. Each second portion P2 is in contact with the corresponding side region sr of the first portion P1. In the first direction D1, a width of the second portion P2 is greater than a width of the first portion P1. As illustrated, the pair of second portions P2 may respectively include the connection regions wr1 and wr2 for wire bonding.

In the present modified example as well, the nozzle arrangement regions 801 that allow nozzle arrangement and that each include the side region sr, which is a part of the first portion P1, and the second portion P2 can be formed on both sides of the first light-emitting element 51 in the second direction D2.

The first portion P1 may be positioned between the first connection region wr1 of the lead 11*a* and the second connection region wr2 of the lead 11*b* in a plan view. In this case, in a plan view, a pair of wires may respectively extend from the first light-emitting element 51 across the space between the first resin walls 311*a* and 311*b* and to the first connection region wr1 and the second connection region wr2. This makes it possible to easily and stably arrange the wires by utilizing the space between the pair of resin walls 310.

In the illustrated example, a planar shape of each of the first resin walls 311*a* and 311*b* is a rectangular shape extending in the second direction D2 (here, y-axis direction), for example. Each of the first resin walls 311*a* and 311*b* includes the first lateral surface is positioned proximate to the first light-emitting element 51, the second lateral surface 1*v* positioned opposite to the first lateral surface 1*s*, and the upper surface 1*u* positioned between the first lateral surface is and the second lateral surface 1*v*. As illustrated in FIG. 17C, the height hu of the upper surface 1*u* is higher than the height of the upper surface of the first light-emitting element 51. The height hu may be substantially the same as the height h1 of the upper surface of the second resin portion 42, for example.

In the present modified example as well, the first dark-colored resin member 40 may include at least one resin groove 46 around the first region 121.

Figure 17D:
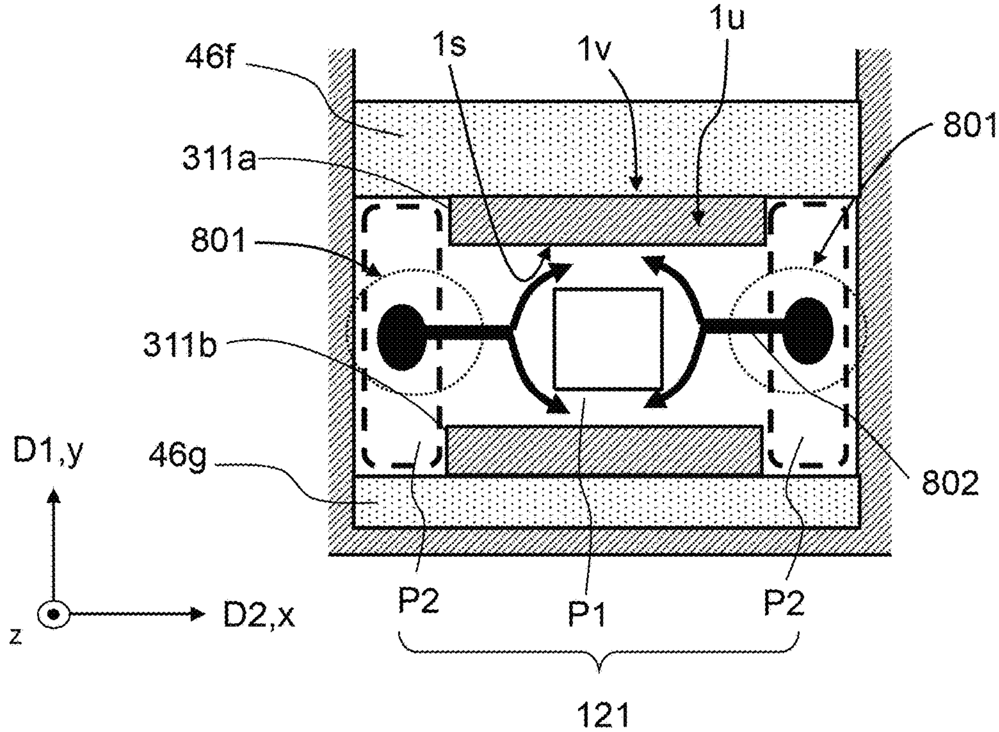
FIG. 17D is an enlarged schematic plan view illustrating a part of the primary surface of the resin package of another light-emitting device of the fifth modified example.
Figure 17E:
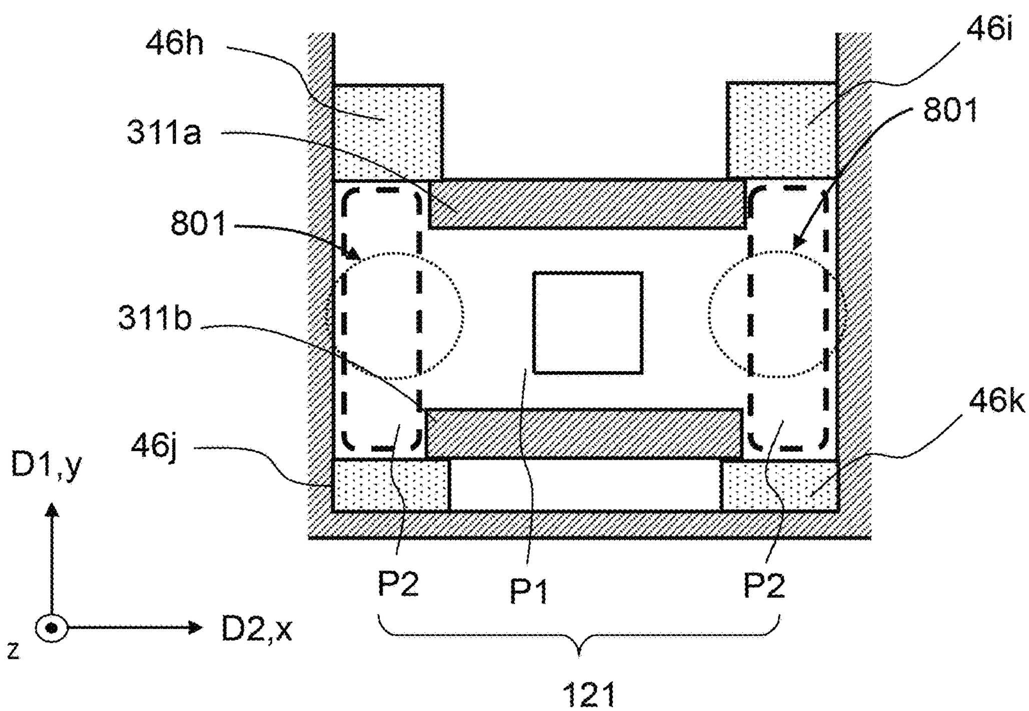
FIG. 17E is an enlarged schematic plan view illustrating a part of the primary surface of the resin package of another light-emitting device of the fifth modified example.

FIGS. 17D and 17E are each an enlarged schematic plan view exemplifying the first region 121 in the resin package 100 of the present modified example. As illustrated in FIG. 17D, in a plan view, a resin groove 46*f* extending in the x-axis direction so as to be in contact with end portions of the two second portions P2 on the +y side, and a resin groove 46*g* extending in the x-axis direction so as to be in contact with end portions of the two second portions P2 on the −y side may be provided. Alternatively, as illustrated in FIG. 17E, two resin grooves 46*h* and 46*i* being in contact with the corresponding end portions of second portions P2 on the +y side, and two resin grooves 46*j* and 46*k* being in contact with the corresponding end portions of second portions P2 on the −y side may be provided spaced apart from each other.

Sixth Modified Example

Figure 18:
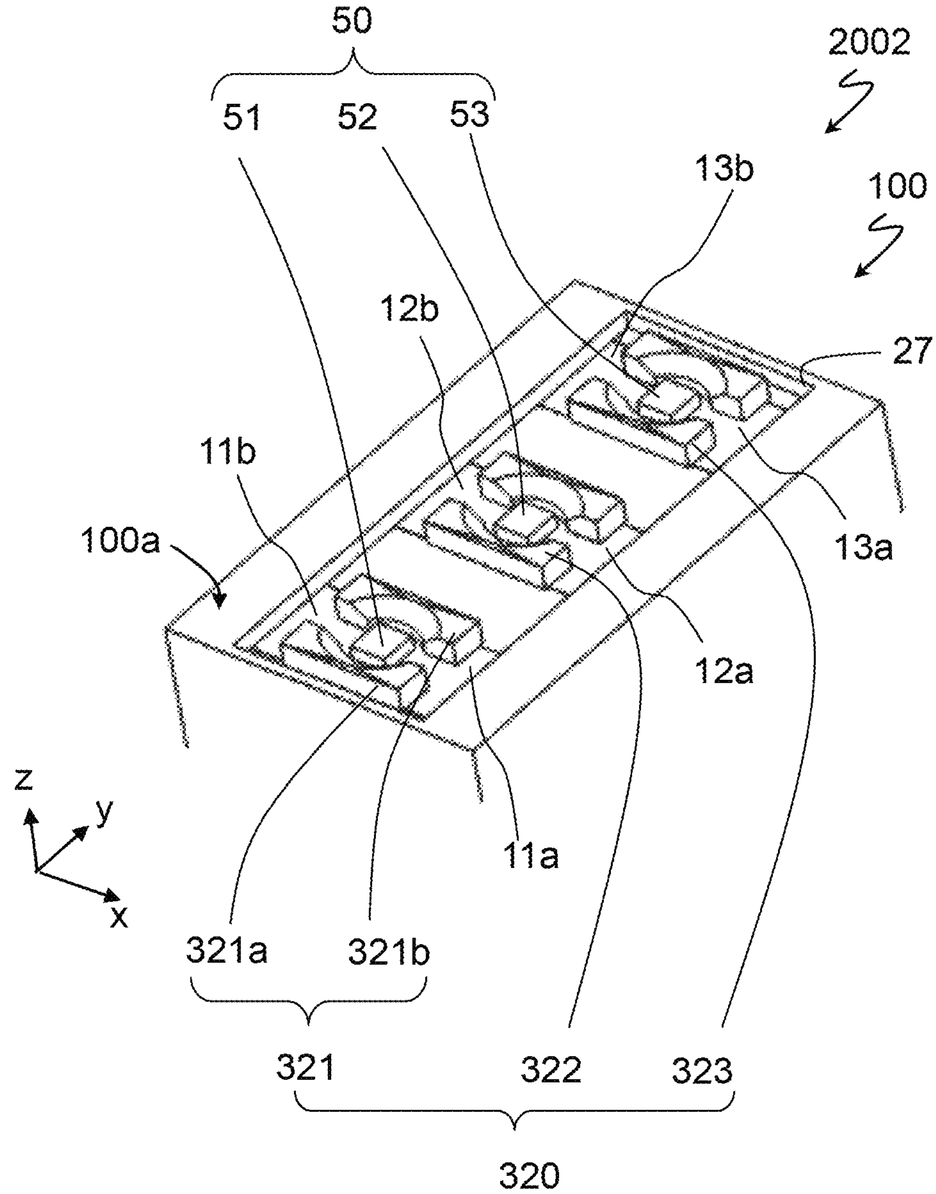
FIG. 18 is a schematic perspective view of a light-emitting device according to an embodiment of a sixth modified example, with the mold resin portion removed.
Figure 19A:
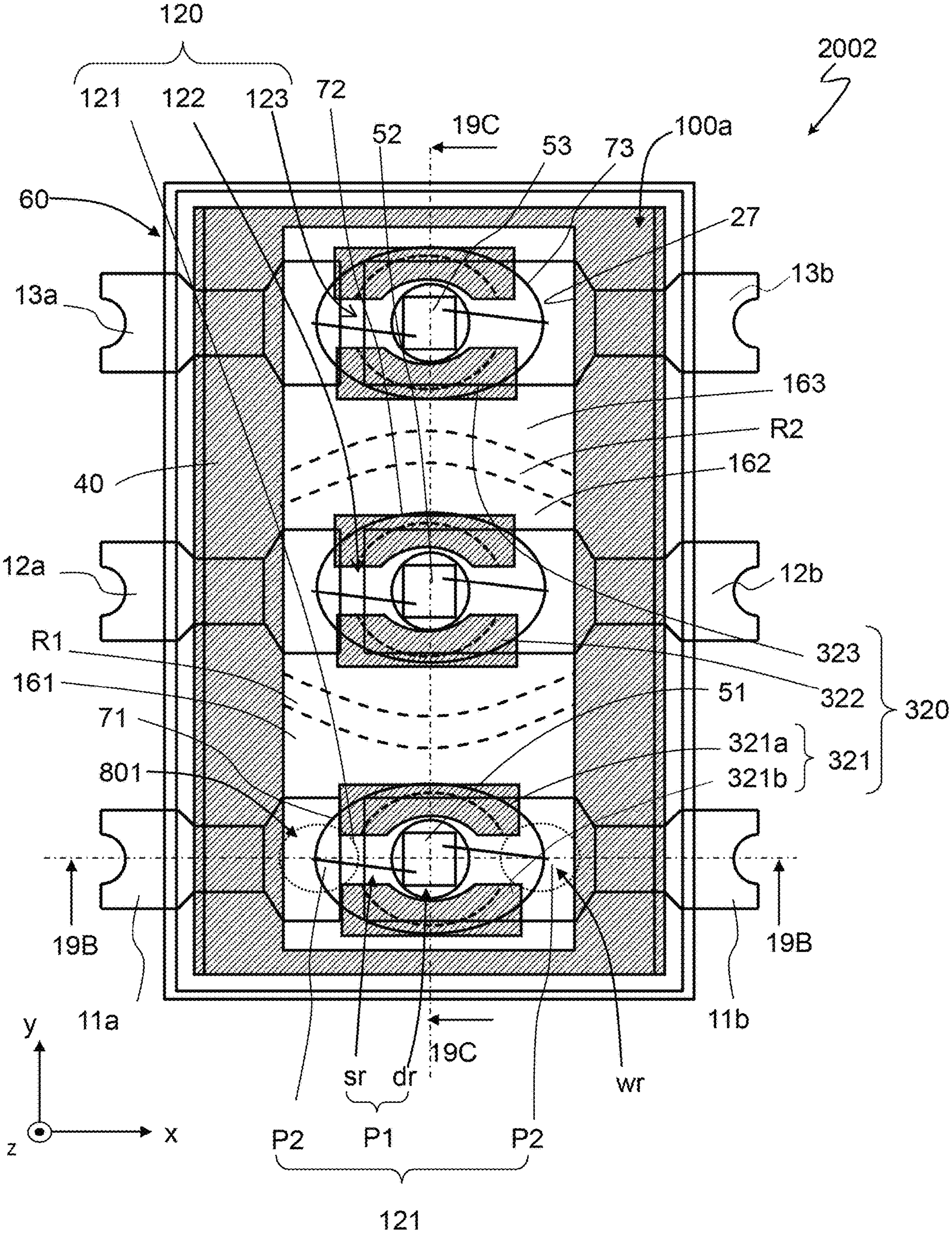
FIG. 19A is a schematic top transparent view of the light-emitting device illustrated in FIG. 18.
Figure 19B:
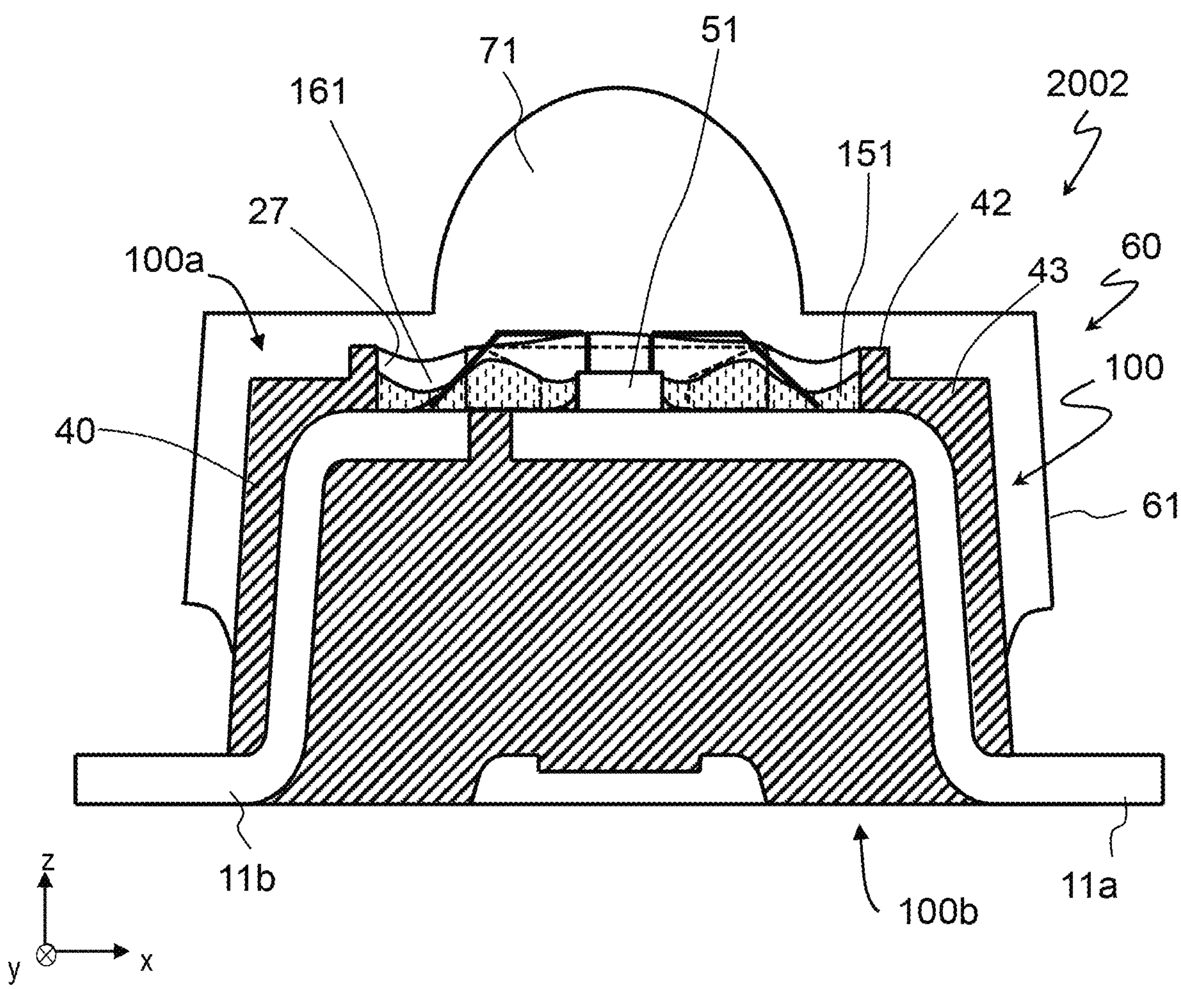
FIG. 19B is a schematic cross-sectional view taken along line 19B-19B illustrated in FIG. 19A.
Figure 19C:
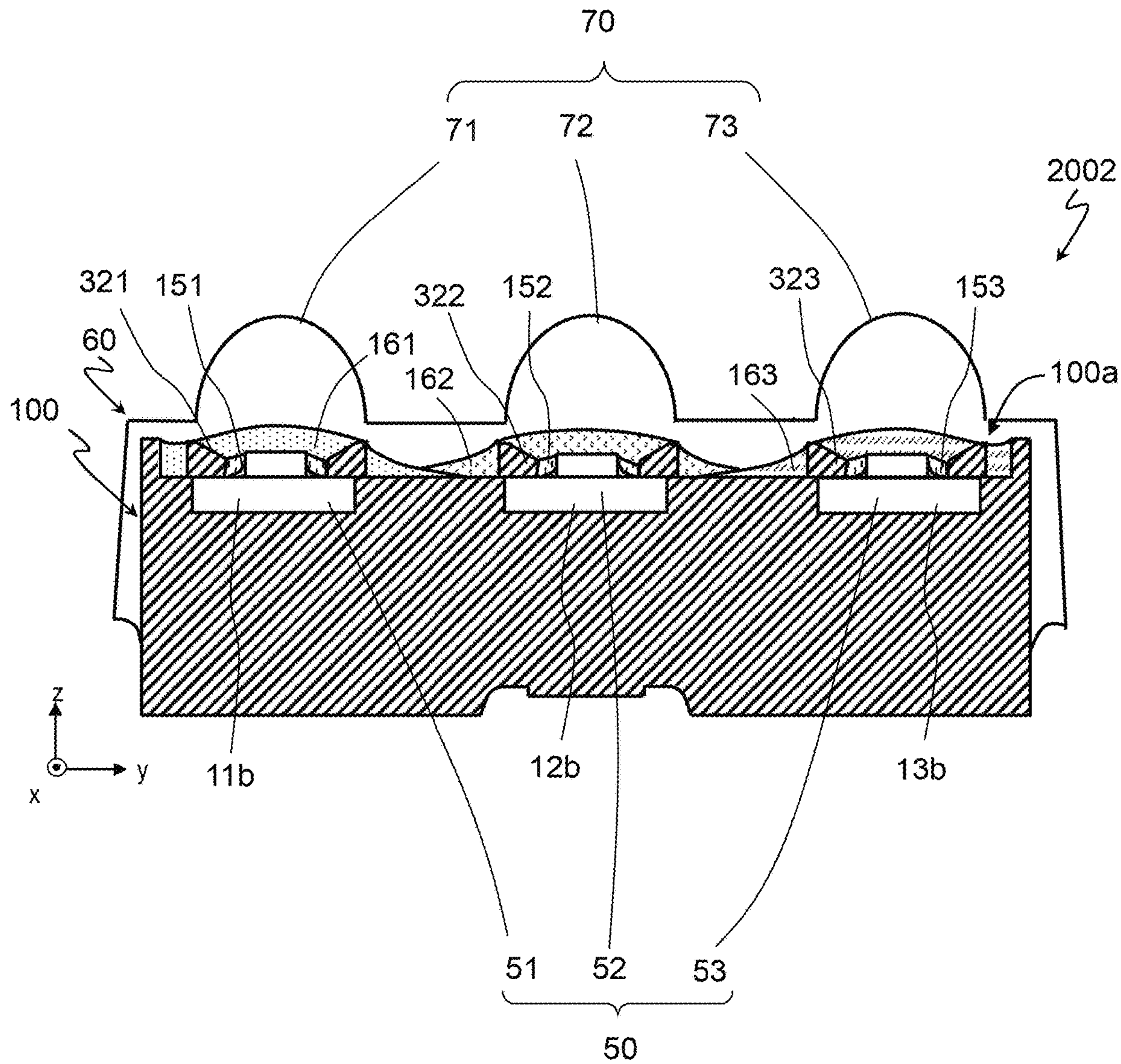
FIG. 19C is a schematic cross-sectional view taken along line 19C-19C illustrated in FIG. 19A.
Figure 19D:
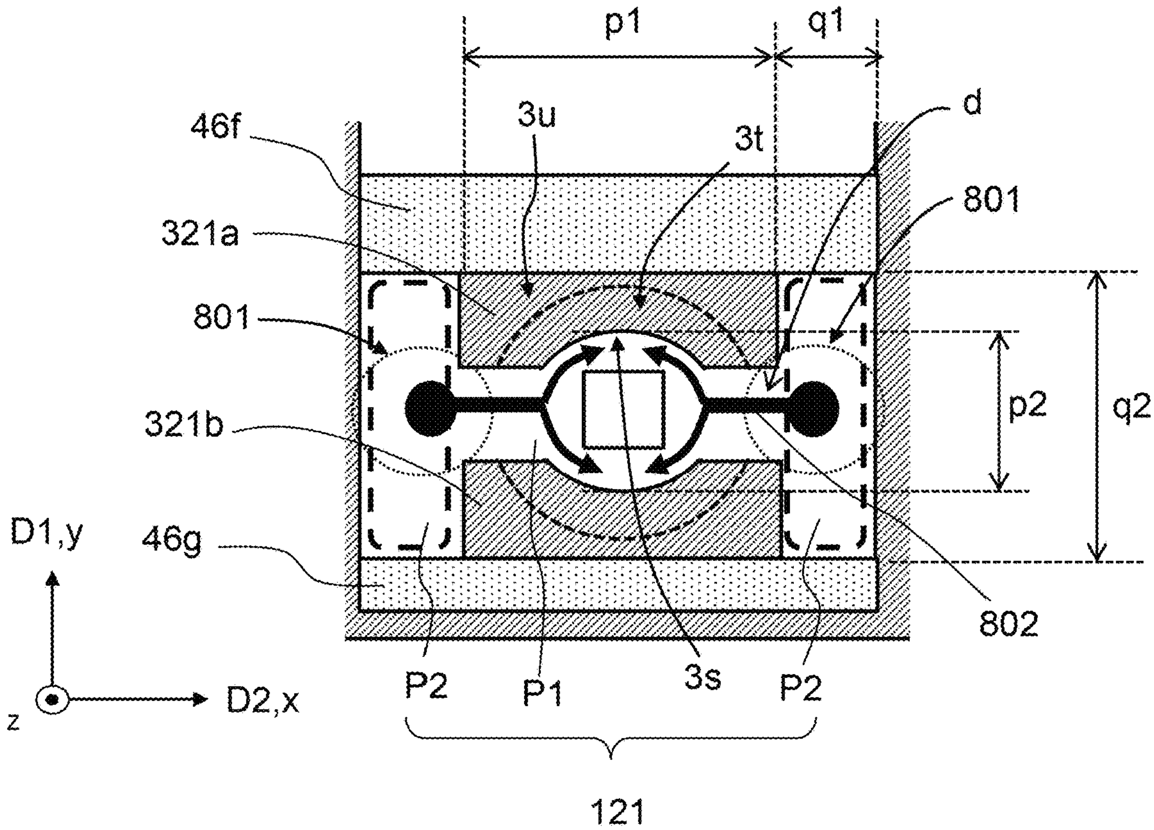
FIG. 19D is an enlarged schematic plan view illustrating a part of the primary surface of the resin package of another light-emitting device of the sixth modified example.

FIG. 18 is a schematic perspective view of a light-emitting device 2002 according to a sixth modified example, with the mold resin portion 60 and the reflective members 151 to 153 removed. FIG. 19A is a schematic top transparent view of the light-emitting device 2002. FIGS. 19B and 19C are schematic cross-sectional views respectively taken along lines 19B-19B and 19C-19C illustrated in FIG. 19A. FIG. 19D is an enlarged schematic plan view illustrating the first region 121 of the resin package 100 of the light-emitting device 2002.

As illustrated in FIGS. 19A and 19D, the plurality of resin walls 320 in the present modified example include, similarly to the fifth modified example, a pair of first resin walls 321 disposed in the y-axis direction across the first light-emitting element 51, a pair of second resin walls 322 disposed in the y-axis direction across the second light-emitting element 52, and a pair of third resin walls 323 disposed in the y-axis direction across the third light-emitting element 53. In the present modified example, the first direction D1 is the y-axis direction.

Although each of the resin walls of the fifth modified example described above has a rectangular planar shape, the planar shape of each of the resin walls 320 in the sixth modified example is formed with a notch portion curved in a concave shape on one side of the rectangular shape (side proximate to the corresponding light-emitting element). Each light-emitting element 50 is positioned between the notch portions of the pair of resin walls 320 in a plan view.

Figure 19E:
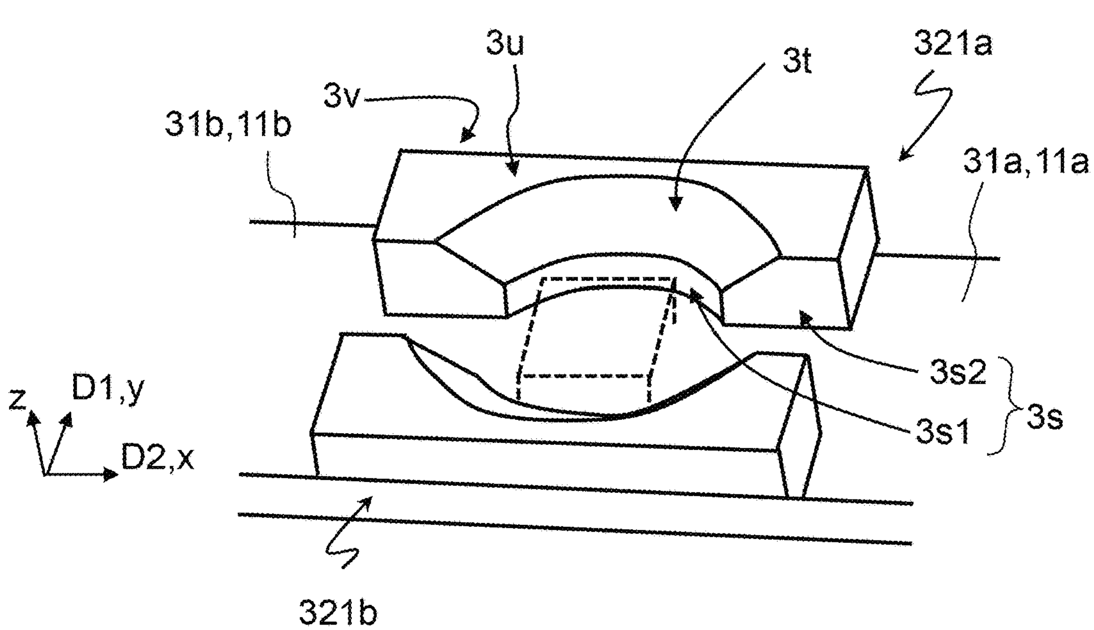
FIG. 19E is an enlarged schematic perspective view illustrating a part of the primary surface of the resin package of another light-emitting device of the sixth modified example.

A structure of the resin wall 320 will be more specifically described by using the first resin wall 321 as an example. FIG. 19E is an enlarged schematic perspective view of the pair of first resin walls 321.

As illustrated in FIG. 19E, first resin walls 321*a* and 321*b* each have a shape of a rectangular parallelepiped with a part cut away. The first resin walls 321*a* and 321*b* each include a first lateral surface 3*s*, a second lateral surface 3*v* positioned opposite to the first lateral surface 3*s*, an upper surface 3*u* positioned between the first lateral surface 3*s* and the second lateral surface 3*v*, and a tapered surface 3*t* positioned between the upper surface 3*u* and the first lateral surface 3*s*.

The first lateral surface 3*s* includes a curved portion 3*s*1 having a surface that curves into a recessed shape relative to the first light-emitting element 51, and planar portions 3*s*2 positioned on both sides of the curved portion 3*s*1 in the second direction D2. In this example, the curved portion 3*s*1 and the planar portions 3*s*2 are all perpendicular to the xy plane. The curved portion 3*s*1 is curved in an arc shape in a top view. The curved portion 3*s*1 is, for example, a recessed arc surface. The tapered surface 3*t* is in contact with the curved portion 3*s*1, the planar portion 3*s*2, and the upper surface 3*u*. The tapered surface 3*t* may have a shape defined by a pair of arc-shaped portions parallel to each other and straight lines parallel to the x-axis direction and positioned at both ends of the pair of arc-shaped portions, in a plan view.

In the present modified example, in a plan view, the curved portion 3*s*1 of the first resin wall 321*a* and the curved portion 3*s*1 of the first resin wall 321*b* face each other and the first light-emitting element 51 is disposed therebetween, making it possible to decrease the area of the first portion P1 positioned between the first resin walls 321*a* and 321*b*. Accordingly, the volume of the first reflective member 151 can be reduced. Further, by forming the tapered surface 3*t*, it is possible to reduce the blocking of light from the first light-emitting element 51 by the upper surfaces 3*u* of the first resin walls 321*a* and 321*b* that are higher than the first light-emitting element 51.

In the present modified example as well, as illustrated in FIG. 19D, the nozzle arrangement regions 801 that allow nozzle arrangement and that each include the side region sr of the first portion P1 and the second portion P2 can be formed on both sides of the first light-emitting element 51 in the second direction D2. In the present modified example, the space d between the first resin walls 321*a* and 321*b* (space between the planar portions 3*s*2 facing each other) can be made smaller in a plan view. Accordingly, when the first resin material 150*a* (FIG. 30C) is applied using the nozzle, the capillary action can be utilized in the same manner as with the light-emitting device 2000 (FIG. 15D).

Figure 19F:
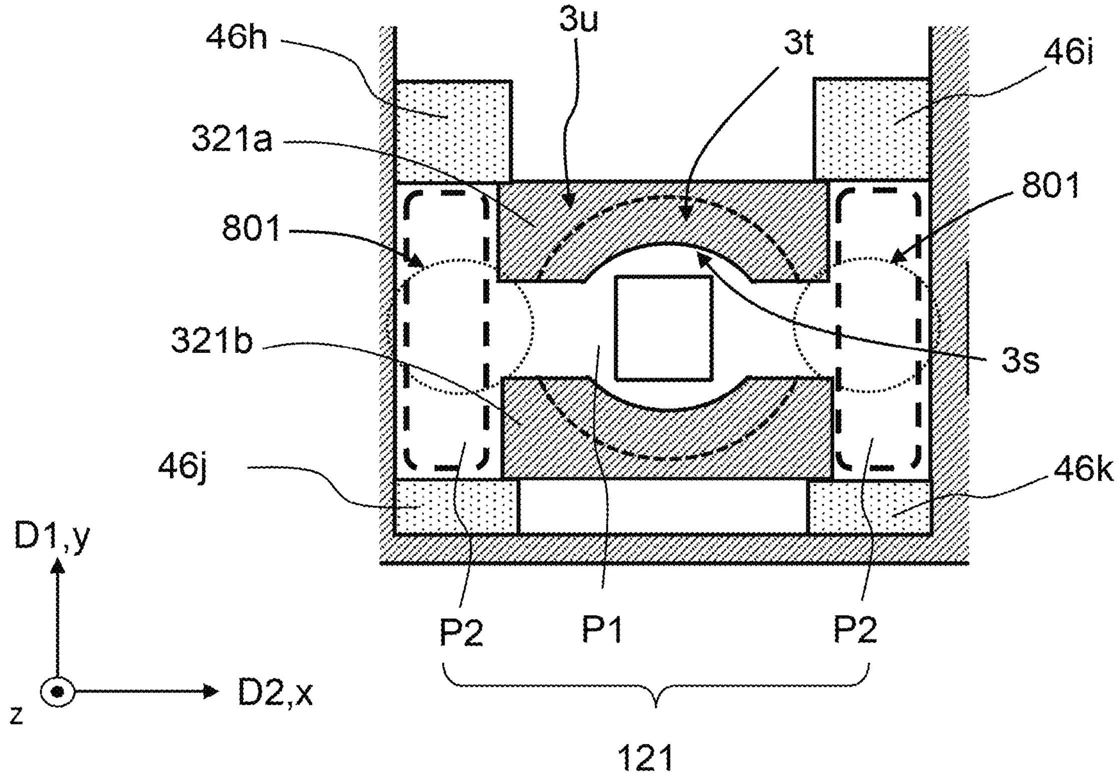
FIG. 19F is an enlarged schematic plan view illustrating a part of the primary surface of the resin package of another light-emitting device of the sixth modified example.

Although, in the example illustrated in FIG. 19D, a pair of resin grooves 46*f* and 46*g* are disposed across the first portion P1 and the second portions P2 in a plan view, four resin grooves 46*h* to 46*k* sandwiching the second portions P2 in the first direction D1 may be formed as illustrated in FIG. 19F.

Seventh Modified Example

Figure 20:
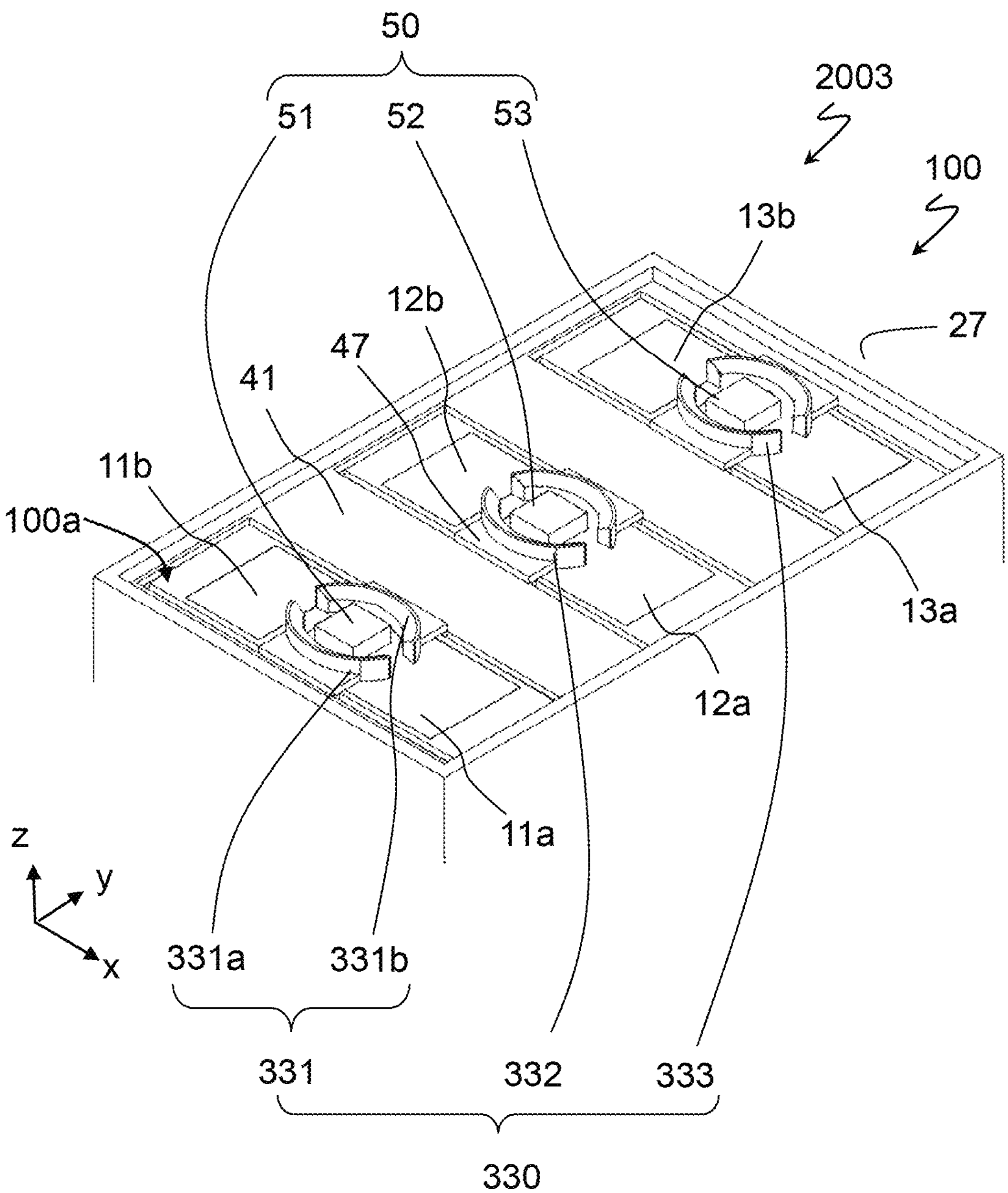
FIG. 20 is a schematic perspective view of a light-emitting device according to an embodiment of a seventh modified example, with the mold resin portion removed.

FIG. 20 is a schematic perspective view of a light-emitting device 2003 according to a seventh modified example, with the mold resin portion 60 and the reflective members 151 to 153 removed. FIG. 21 is an enlarged schematic top view illustrating one of the regions 120 (here, first region 121) of the resin package 100 of the light-emitting device 2003.

As illustrated in FIG. 20, a plurality of resin walls 330 in the present modified example include a pair of first resin walls 331 disposed in the y-axis direction across the first light-emitting element 51, a pair of second resin walls 332 disposed in the y-axis direction across the second light-emitting element 52, and a pair of third resin walls 333 disposed in the y-axis direction across the third light-emitting element 53. In the present modified example, the first direction D1 is the y-axis direction.

As illustrated in FIG. 21, a pair of first resin walls 331*a* and 331*b* in the present modified example each include a first lateral surface 4*s* curved in a recessed shape relative to the corresponding light-emitting element 50, a second lateral surface 4*v* positioned opposite to the first lateral surface 4*s* and parallel to the first lateral surface 4*s*, an upper surface 4*u* positioned between the first lateral surface 4*s* and the second lateral surface 4*v*, and a tapered surface 4*t* positioned between the first lateral surface 4*s* and the second lateral surface 4*v*. The tapered surface 4*t* is inclined so as to become higher from an upper end of the first lateral surface 4*s* toward an upper end of the second lateral surface 4*v*. The first lateral surface 4*s* is, for example, perpendicular to the xy plane. The first lateral surface 4*s* is, for example, a recessed arc surface. A shape of the tapered surface 4*t* is, for example, an annular fan shape.

The curved portion 3*s*1 and the tapered surface 3*t* are formed proximate to the light-emitting element in each of the resin walls 321 in the sixth modified example (refer to FIG. 19E) by cutting away a part of a rectangular parallelepiped. In contrast, in the present modified example, in each resin wall, a part of a hollow cylindrical body (more specifically, a part of a column body obtained by cutting the hollow cylindrical body in a plane perpendicular to the xy plane) is cut away, thereby forming the first side 4*s* that is curved and a part of an inner surface of the hollow cylindrical body, and the tapered surface 4*t* having an annular fan shape.

The first lateral surface 4*s* and the tapered surface 4*t* in the present modified example have shapes corresponding to the curved portion 3*s*1 and the tapered surface 3*t* of the resin wall 321 in the sixth modified example illustrated in FIG. 19E. Thus, the resin wall of the seventh modified example also achieves effects similar to those of the sixth modified example. Specifically, in a plan view, the first light-emitting element 51 is disposed between the first lateral surfaces 4*s*, which are curved, of the first resin walls 331*a* and 331*b*, making it possible to decrease the area of the first portion P1 positioned between the first resin walls 331*a* and 331*b*. Accordingly, the volume of the first reflective member 151 can be reduced. Further, the space d between the first resin walls 331*a* and 331*b* can be made smaller, and thus capillary action can be utilized when applying the first resin material 150*a* using the nozzle. With the first resin walls 331*a* and 331*b* including the tapered surface 4*t*, it is possible to reduce the blocking of light from the light-emitting element 50 by the upper surfaces 4*u* of the first resin walls 331*a* and 331*b* that are higher than the light-emitting element 50.

Note that a fourth resin portion 47 positioned above the first resin portion 41 may be disposed so as to connect the second lateral surface 4*v* of each of the resin walls 331*a* and 331*b* and the first resin portion 41. Further, the resin groove 46 may be included as in the other modified examples.

Eighth Modified Example

A light-emitting device according to an eighth modified example differs from the light-emitting devices described above in that two pairs of resin walls are disposed for each light-emitting element.

Figure 22:
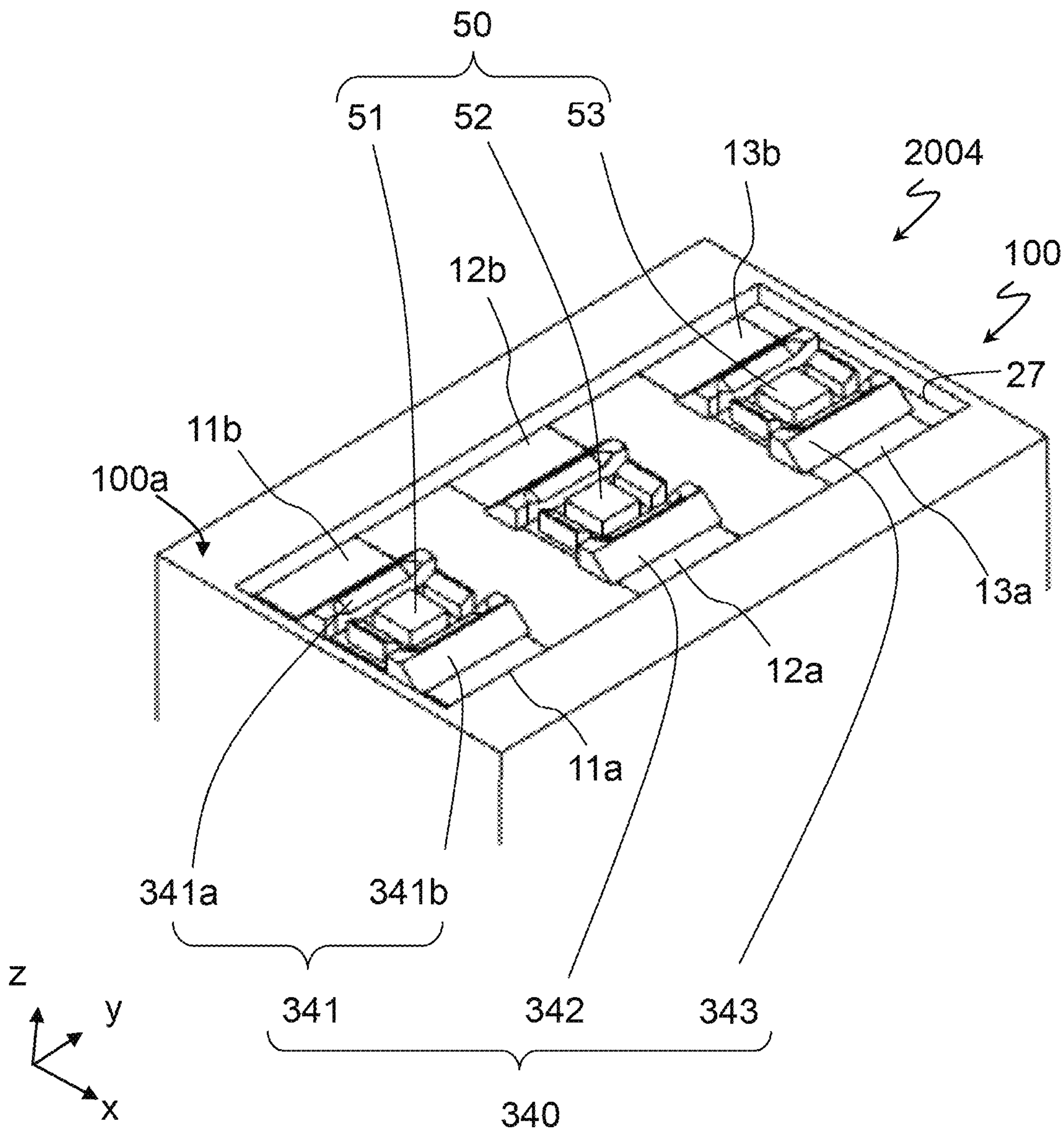
FIG. 22 is a schematic perspective view of a light-emitting device according to an embodiment of an eighth modified example, with the mold resin portion removed.
Figure 23:
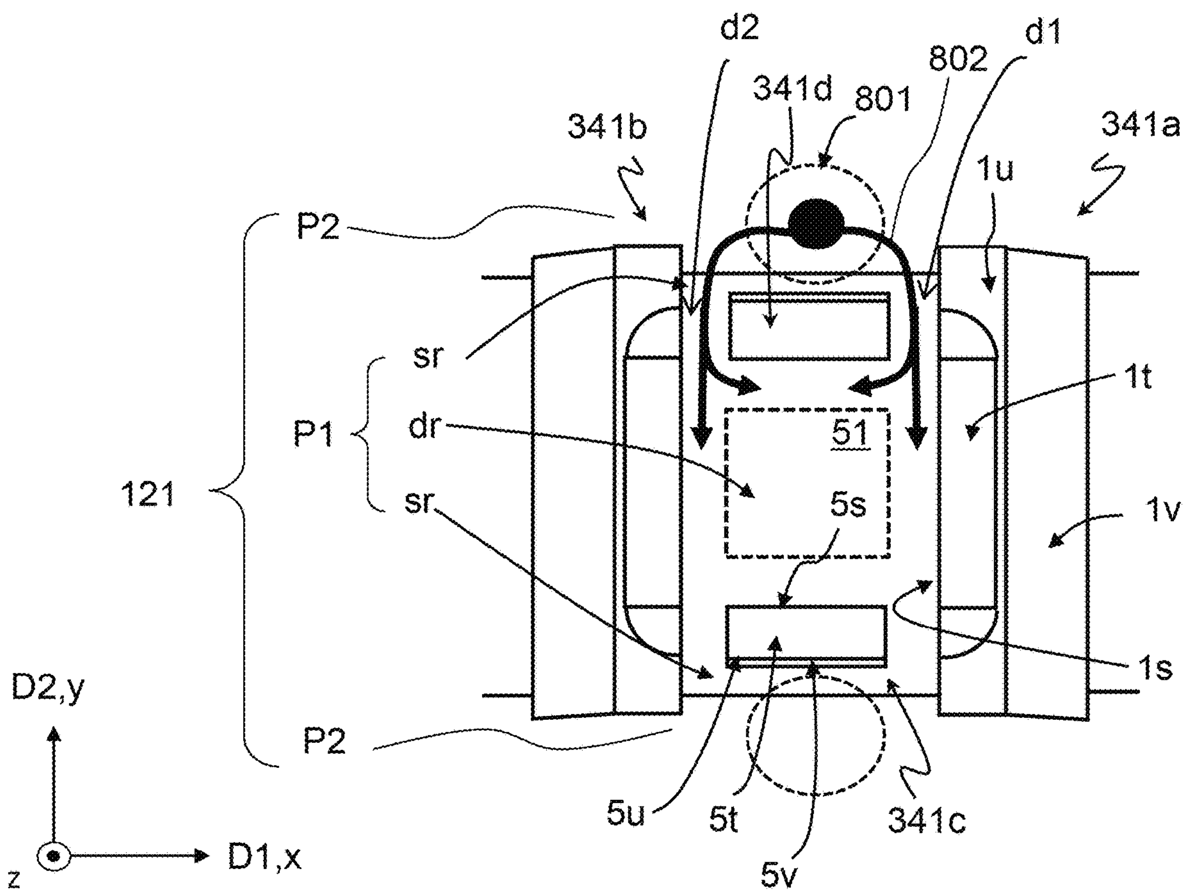
FIG. 23 is an enlarged schematic plan view illustrating a part of the primary surface of the resin package of the light-emitting device illustrated in FIG. 22.

FIG. 22 is a schematic perspective view of a light-emitting device 2004 according to the eighth modified example, with the mold resin portion 60 and the reflective members 151 to 153 removed. FIG. 23 is an enlarged schematic top view illustrating one of the regions 120 (here, first region 121) of the resin package 100 of the light-emitting device 2004.

A plurality of resin walls 340 in the present modified example include two pairs of first resin walls 341, two pairs of second resin walls 342, and two pairs of third resin walls 343. The first light-emitting element 51 to the third light-emitting element 53 each have a quadrangular planar shape. One pair of the two pairs of first resin walls 341 face each other across one set of sides of the quadrangular shape of the first light-emitting element 51 facing each other, in a plan view. The other pair of the two pairs of first resin walls 341 face each other across the other set of sides of the quadrangular shape of the first light-emitting element 51 facing each other, in a plan view. Similarly, one pair of the two pairs of second resin walls 342 face each other across one set of sides of the quadrangular shape of the second light-emitting element 52 facing each other, in a plan view, the other pair of the two pairs of second resin walls 342 face each other across the other set of sides of the quadrangular shape of the second light-emitting element 52 facing each other, in a plan view, one pair of the two pairs of third resin walls 343 face each other across one set of sides of the quadrangular shape of the third light-emitting element 53 facing each other, in a plan view, and the other pair of the two pairs of third resin walls 343 face each other across the other set of sides of the quadrangular shape of the third light-emitting element 53 facing each other, in a plan view.

A structure of the first region 121 and the first resin walls 341 will be described as an example with reference to FIG. 23.

First resin walls 341*a* to 341*d* include one pair of the first resin walls 341*a* and 341*b* disposed across the first light-emitting element 51 in the x-axis direction (first direction D1), and the other pair of the first resin walls 341*c* and 341*d* disposed across the first light-emitting element 51 in the y-axis direction (second direction D2) between the first resin walls 341*a* and 341*b*. In the illustrated example, the first portion P1 of the first region 121 is a portion positioned between the first resin walls 341*a* and 341*b*. The first resin walls 341*c* and 341*d* are disposed in the first portion P1.

The first resin walls 341*a* and 341*b* each have a rectangular planar shape long in the y-axis direction. The first resin walls 341*a* and 341*b* have structures similar to those of the first wall portion 1*a* of the first resin walls 301*a* and 301*b*, respectively, in the light-emitting device 2000 illustrated in FIGS. 14 to 15E. That is, the first resin walls 341*a* and 341*b* differ from the first resin walls 301*a* and 301*b* (FIG. 15E) in the light-emitting device 2000, respectively, in not including the second wall portion 2*a*.

The first resin walls 341*c* and 341*d* each have a rectangular planar shape. Each of the first resin walls 341*c* and 341*d* is spaced apart by a space d1 from the first lateral surface is of the first resin wall 341*a* and spaced apart by a space d2 from the first lateral surface is of the first resin wall 341*b*.

The first resin walls 341*c* and 341*d* have structures similar to those of the second wall portions 2*a* and 2*b* of the first resin walls 301*a* and 301*b* of the light-emitting device 2000, respectively. Specifically, the first resin walls 341*c* and 341*d* each include a first lateral surface 5*s* positioned proximate to the first light-emitting element 51, a second lateral surface 5*v* positioned opposite to the first lateral surface 5*s*, an upper surface 5*u* positioned between the first lateral surface 5*s* and the second lateral surface 5*v*, and a tapered surface 5*t* positioned between the upper surface 5*u* and the first lateral surface 5*s*. In this example, a height of the upper surface 5*u* is the same as the height of the upper surface 1*u* of each of the first resin walls 341*a* and 341*b*. A height of an upper end of the first lateral surface 5*s* is the same as the height of the upper end of the first lateral surface is of each of the first resin walls 341*a* and 341*b*.

In the present modified example, the first light-emitting element 51 is disposed in a region defined by the four first resin walls 341*a* to 341*d*.

The first region 121 includes the first portion P1 including the element placement region dr and the pair of side regions sr, and the pair of second portions P2 positioned across the first portion P1 in the second direction D2. In the illustrated example, the side regions sr are regions of the first portion P1 positioned outward of the corresponding first resin walls 341*c* and 341*d*. The nozzle arrangement regions 801 each including the second portion P2 and the side region sr can be formed on the +y side and the −y side of the first light-emitting element 51.

As illustrated by the arrows 802 in FIG. 23, the first resin material 150*a* (FIG. 30C) ejected from the nozzle arranged in the nozzle arrangement region 801 flows through the space d1 between the first resin walls 341*c* as well as 341*d* and the first resin wall 341*a*, and the space d2 between the first resin walls 341*c* as well as 341*d* and the first resin wall 341*b*, into the region defined by the first resin walls 341*a* to 341*d*, and around the first light-emitting element 51. Accordingly, by curing the first resin material 150*a* arranged in this manner, it is possible to form the first reflective member 151 on each lateral surface of the first light-emitting element 51.

In the present modified example as well, the same effects as those of the light-emitting device 2000 (FIGS. 14 to 15E) are achieved. That is, the thickness of the first reflective member 151 in the z-axis direction can be controlled by the heights of the first lateral surfaces is and 5*s*. Further, the thickness of the precoating resin in the z-axis direction (height of the upper surface of the precoating resin) can be controlled by the heights of the upper surfaces 1*u* and 5*u*. Furthermore, the blocking of light emission from the first light-emitting element 51 by the upper surfaces 1*u* and 5*u* of the first resin wall 341 can be reduced by the tapered surfaces 1*t* and 5*t*.

Ninth Modified Example

Figure 24:
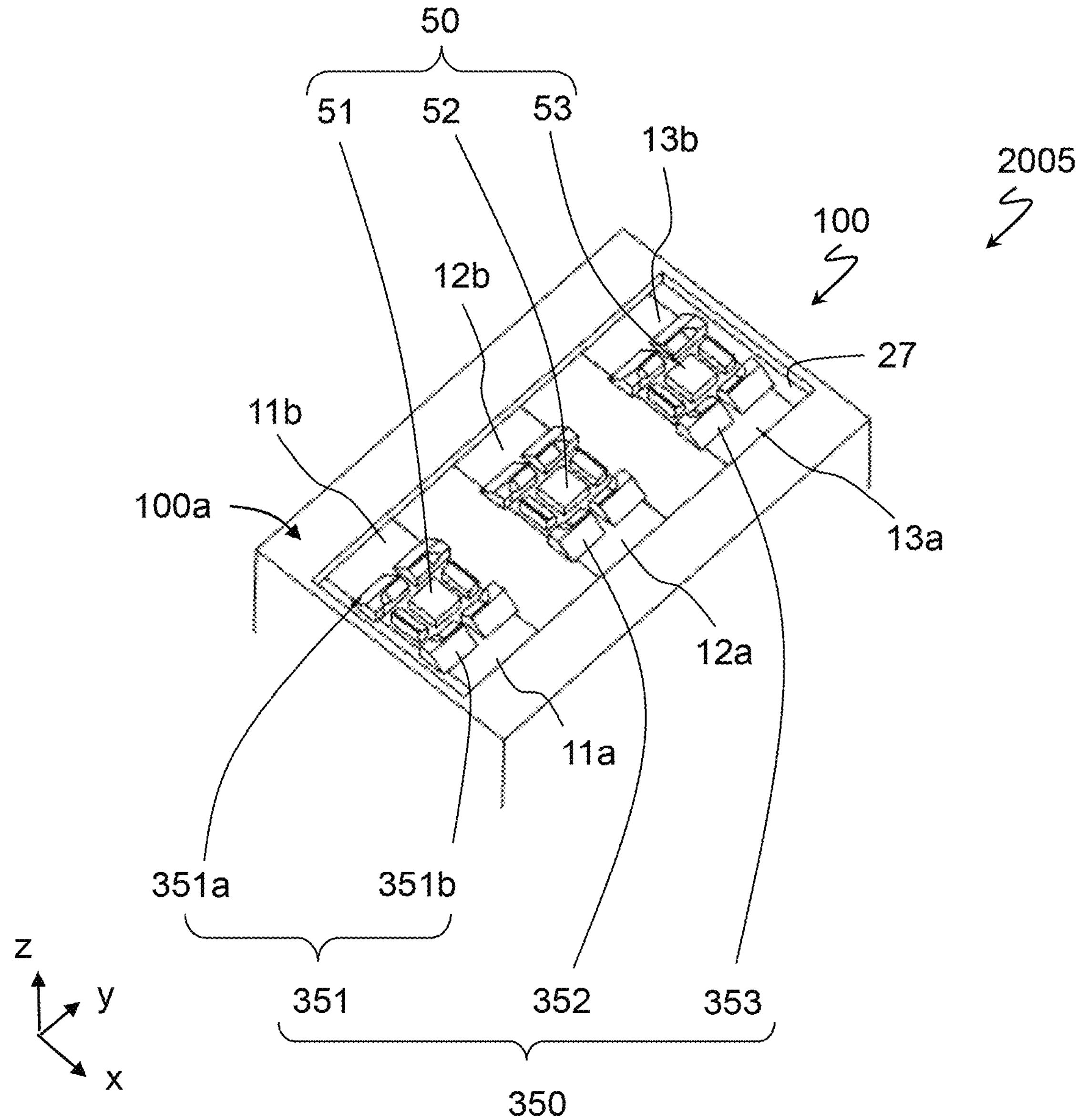
FIG. 24 is a schematic perspective view of a light-emitting device according to an embodiment of a ninth modified example, with the mold resin portion removed.
Figure 25:
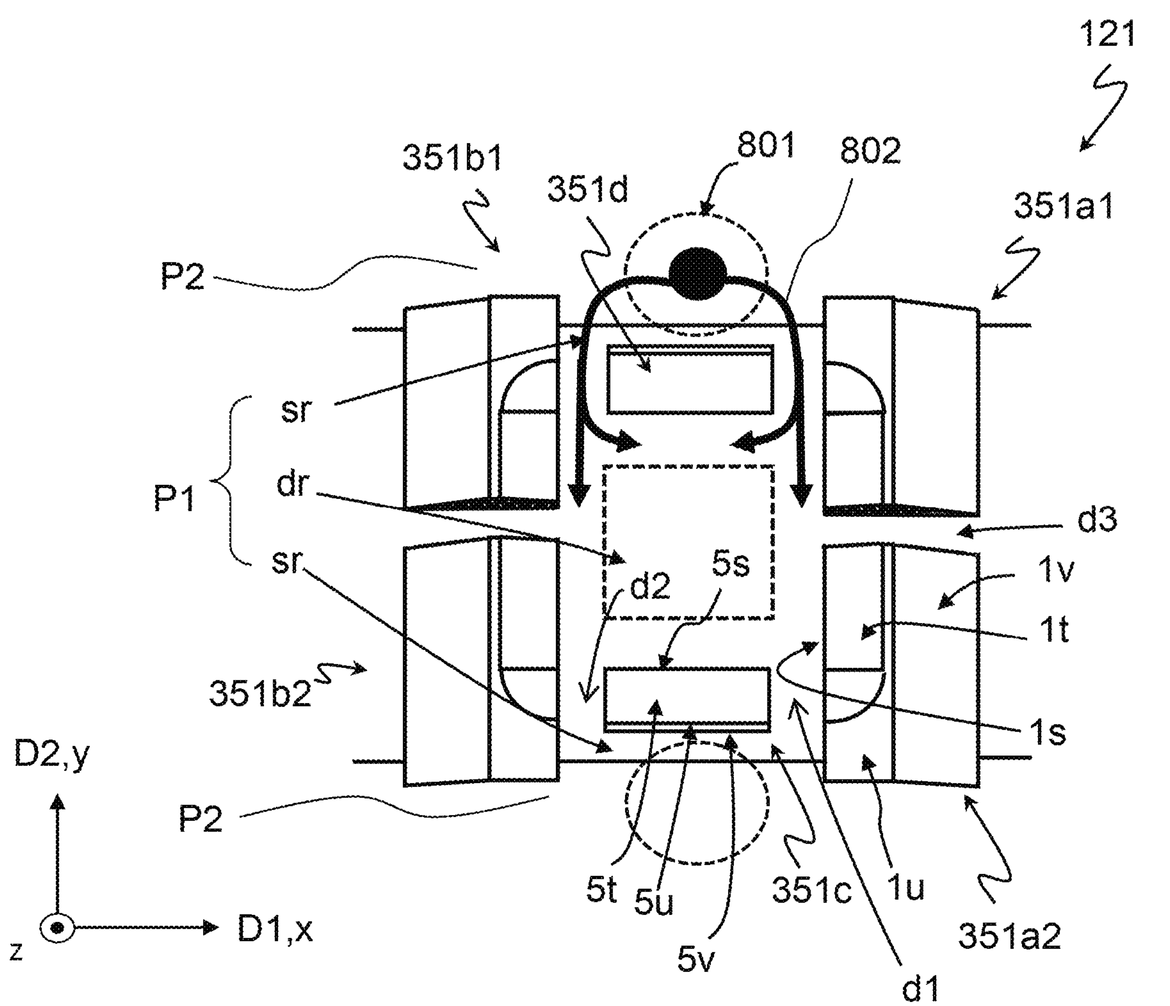
FIG. 25 is an enlarged schematic view illustrating a part of the primary surface of the resin package of the light-emitting device illustrated in FIG. 24.

FIG. 24 is a schematic perspective view of a light-emitting device 2005 according to a ninth modified example, with the mold resin portion 60 and the reflective members 151 to 153 removed. FIG. 25 is an enlarged schematic plan view illustrating the first region 121 of the resin package 100 of the light-emitting device 2005.

A plurality of resin walls 350 in the present modified example include six first resin walls 351, six second resin walls 352, and six third resin walls 353.

Structures of the first region 121 and the first resin walls 351 will be described as examples with reference to FIG. 25.

The six first resin walls 351 include first resin walls 351*a*1 and 351*a*2 disposed on the +x side of the first light-emitting element 51 with a space d3 therebetween in the y-axis direction, first resin walls 351*b*1 and 351*b*2 disposed on the −x side of the first light-emitting element 51 with the space d3 therebetween in the y-axis direction, and first resin walls 351*c* and 351*d* respectively disposed on the −y side and the +y side of the first light-emitting element 51.

The first resin walls 351*a*1 and 351*a*2 have shapes obtained by separating the first resin wall 341*a* (FIG. 23) of the eighth modified example into two with a space provided in a central portion thereof in the y-axis direction. Similarly, the first resin walls 351*b*1 and 351*b*2 have shapes obtained by separating the first resin wall 341*b* (FIG. 23) of the eighth modified example into two with a space provided in a central portion thereof in the y-axis direction.

The present modified example achieves effects similar to those of the light-emitting device 2004 according to the eighth modified example. Further, in the present modified example, a gap (space d3) of the resin walls 350 is positioned between the light-emitting element 50 and the connection region for wire bonding. Therefore, similarly to the fifth modified example, the wires for connecting the light-emitting element 50 and any one of the leads 11*a* to 13*b* can be easily and stably disposed by utilizing the space d3 between the resin walls 350.

Tenth Modified Example

Figure 26:
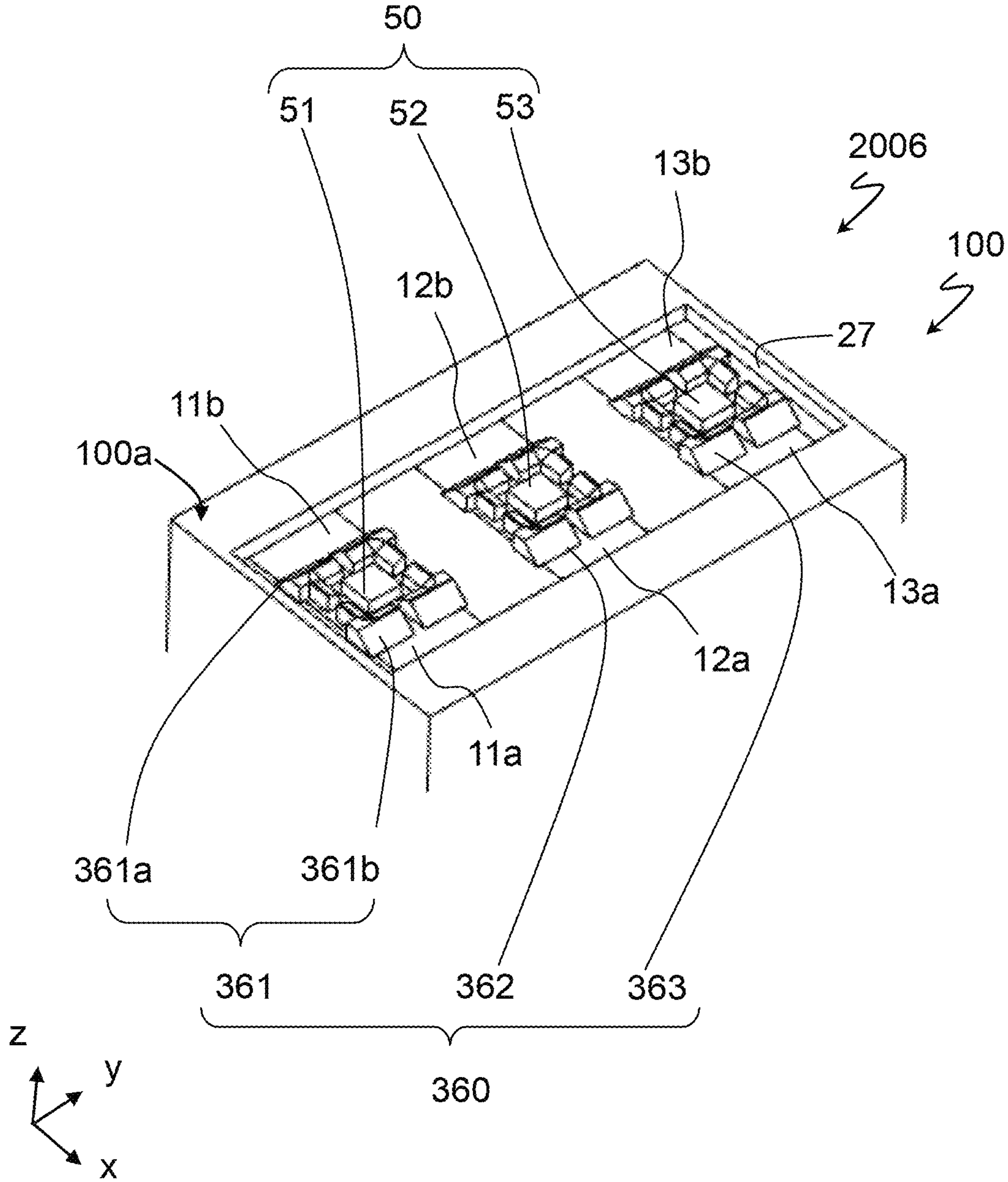
FIG. 26 is a schematic perspective view of a light-emitting device according to an embodiment of a tenth modified example, with the mold resin portion removed.
Figure 27:
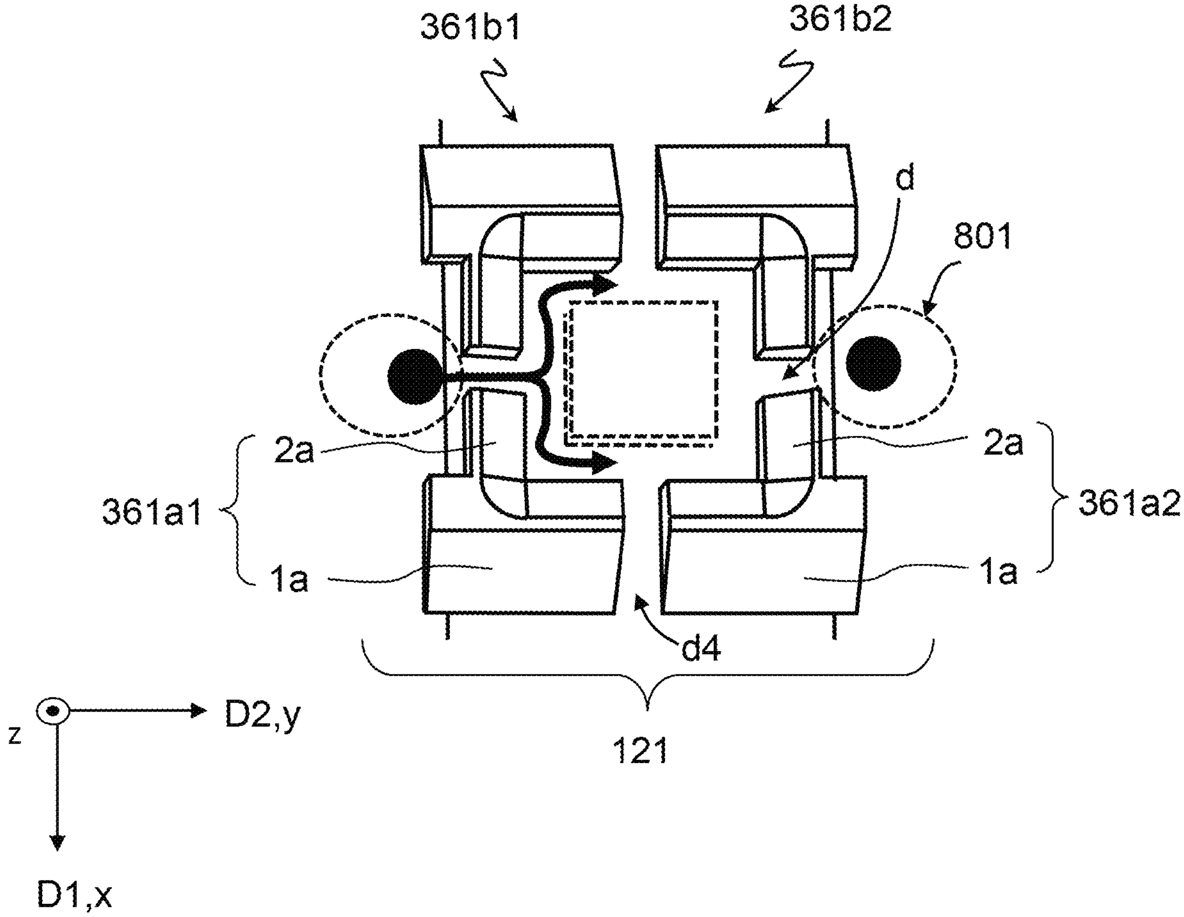
FIG. 27 is an enlarged schematic view illustrating a part of the primary surface of the resin package of the light-emitting device illustrated in FIG. 26.

FIG. 26 is a schematic perspective view of a light-emitting device 2006 according to a tenth modified example, with the mold resin portion 60 and the reflective members 151 to 153 removed. FIG. 27 is an enlarged schematic plan view illustrating the first region 121 of the resin package 100 of the light-emitting device 2006.

A plurality of resin walls 360 in the present modified example include four first resin walls 361, four second resin walls 362, and four third resin walls 363. The first light-emitting element 51 to the third light-emitting element 53 each have a quadrangular planar shape, and the four first resin walls 361 respectively face four corner portions of the quadrangular shape of the first light-emitting element 51 in a plan view. In this example, each first resin wall 361 includes lateral surfaces facing a part of the corresponding two sides constituting one corner portion of the quadrangular shape. Each second resin wall 362 and each third resin wall 363 are also similarly disposed facing the corresponding corner portion of the quadrangular shape of the corresponding light-emitting element 50 in a plan view.

A structure of the first region 121 and the first resin walls 361 will be described as examples with reference to FIG. 27.

The four first resin walls 361 include first resin walls 361*a*1 and 361*a*2 disposed on the +x side of the first light-emitting element 51 with a space d4 therebetween in the y-axis direction, and first resin walls 361*b*1 and 361*b*2 disposed on the −x side of the first light-emitting element 51 with the space d4 therebetween in the y-axis direction.

The first resin walls 361*a*1 and 361*a*2 have shapes obtained by separating the first wall portion 1*a* of the first resin wall 301*a* (FIGS. 15D and 15E) of the light-emitting device 2000 into two with a space provided in a central portion thereof in the y-axis direction. Similarly, the first resin walls 361*b*1 and 361*b*2 have shapes obtained by separating the first wall portion 1*b* of the first resin wall 301*b* (FIGS. 15D and 15E) of the light-emitting device 2000 into two with a space provided in a central portion thereof in the y-axis direction.

In the present modified example as well, effects similar to those of the light-emitting device 2000 are achieved. Further, in the present modified example, a gap (space d) of the resin walls 360 is positioned between the light-emitting element 50 and the connection region for wire bonding. Therefore, similarly to the fifth modified example, the wires for connecting the light-emitting element 50 and any one of the leads 11*a* to 13*b* can be easily and stably disposed by utilizing this space d4.

Eleventh Modified Example

Figure 28:
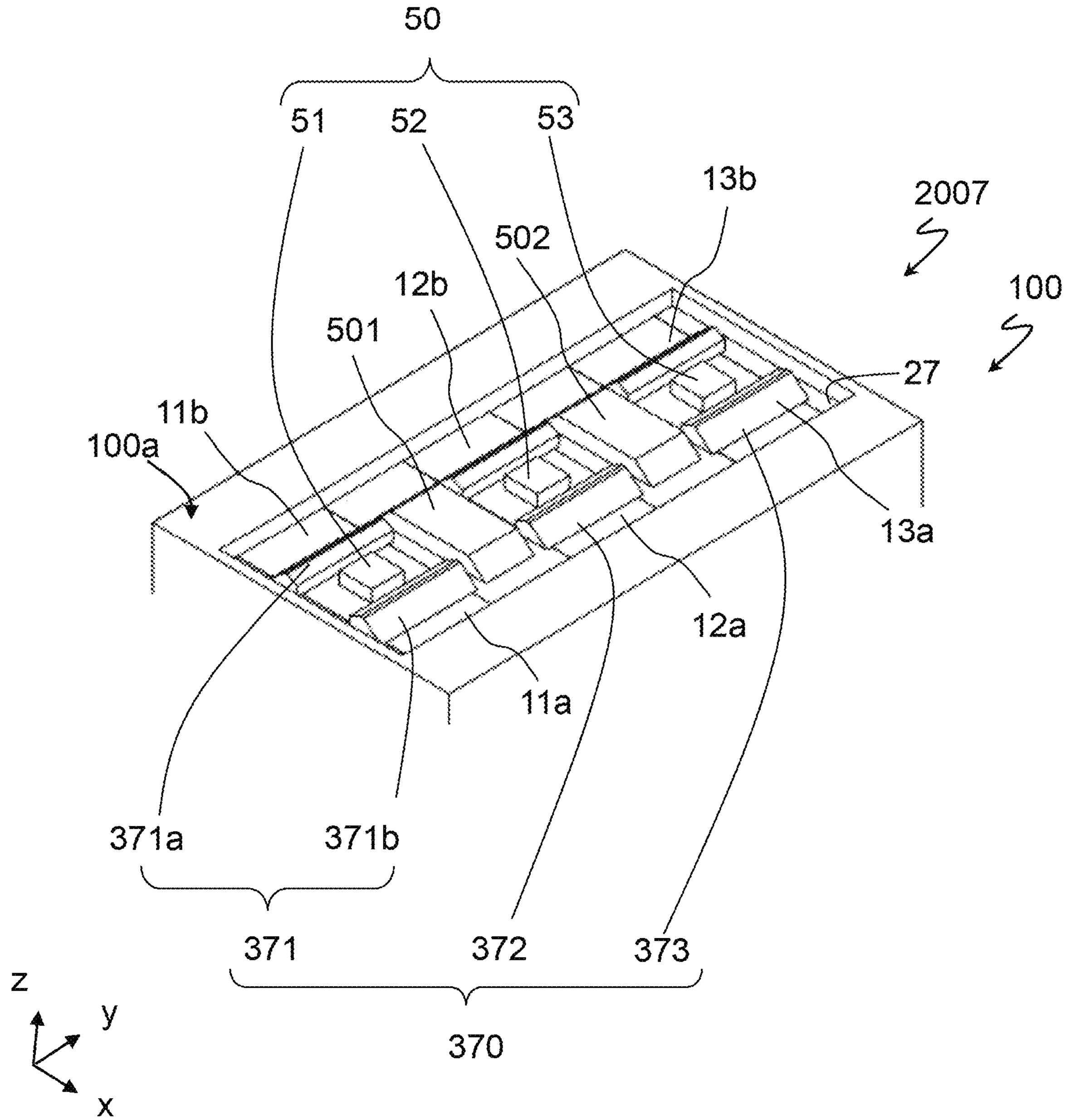
FIG. 28 is a schematic perspective view of a light-emitting device according to an embodiment of an eleventh modified example, with the mold resin portion removed.
Figure 29A:
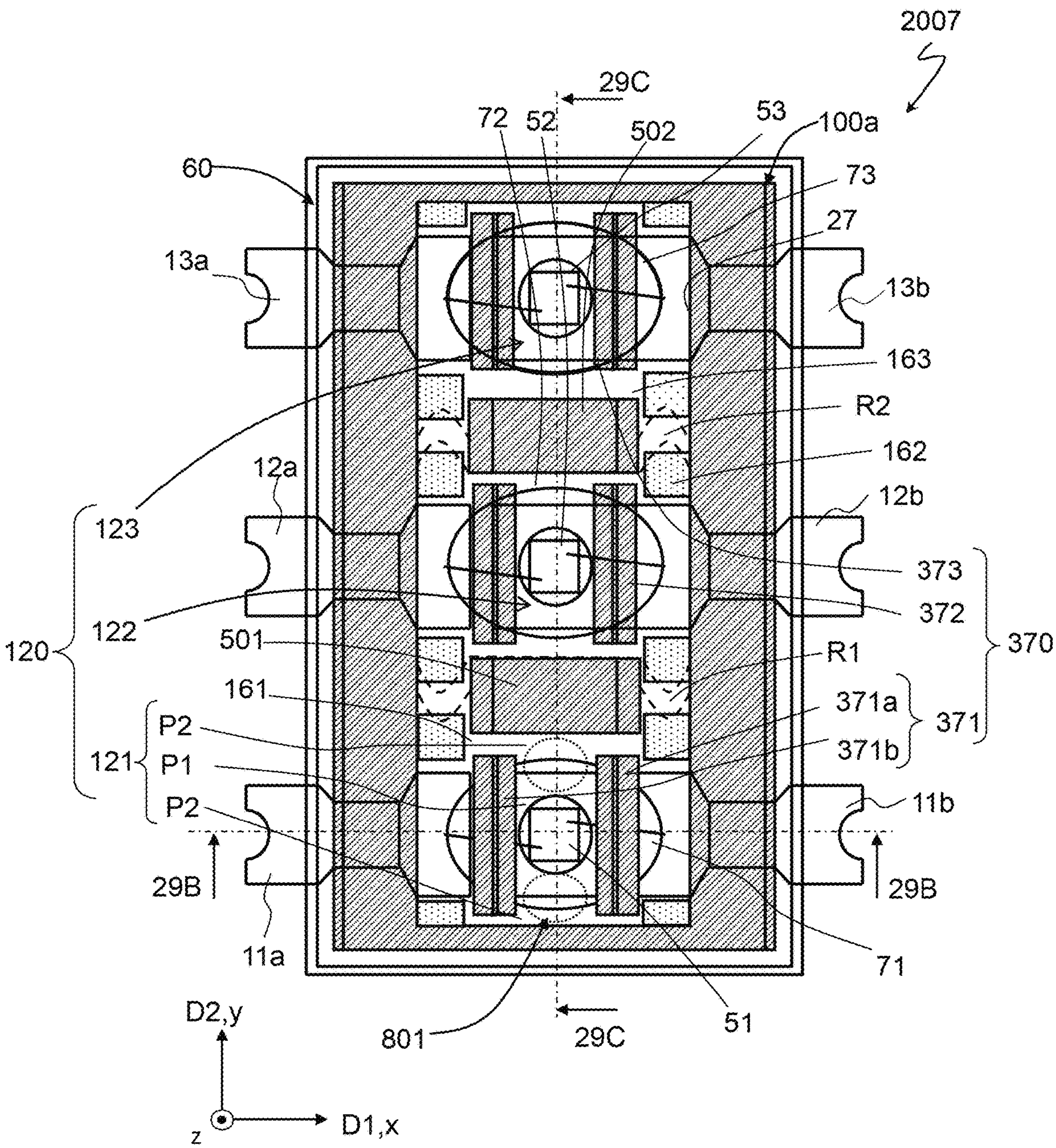
FIG. 29A is a schematic top transparent view of the light-emitting device illustrated in FIG. 28.
Figure 29B:
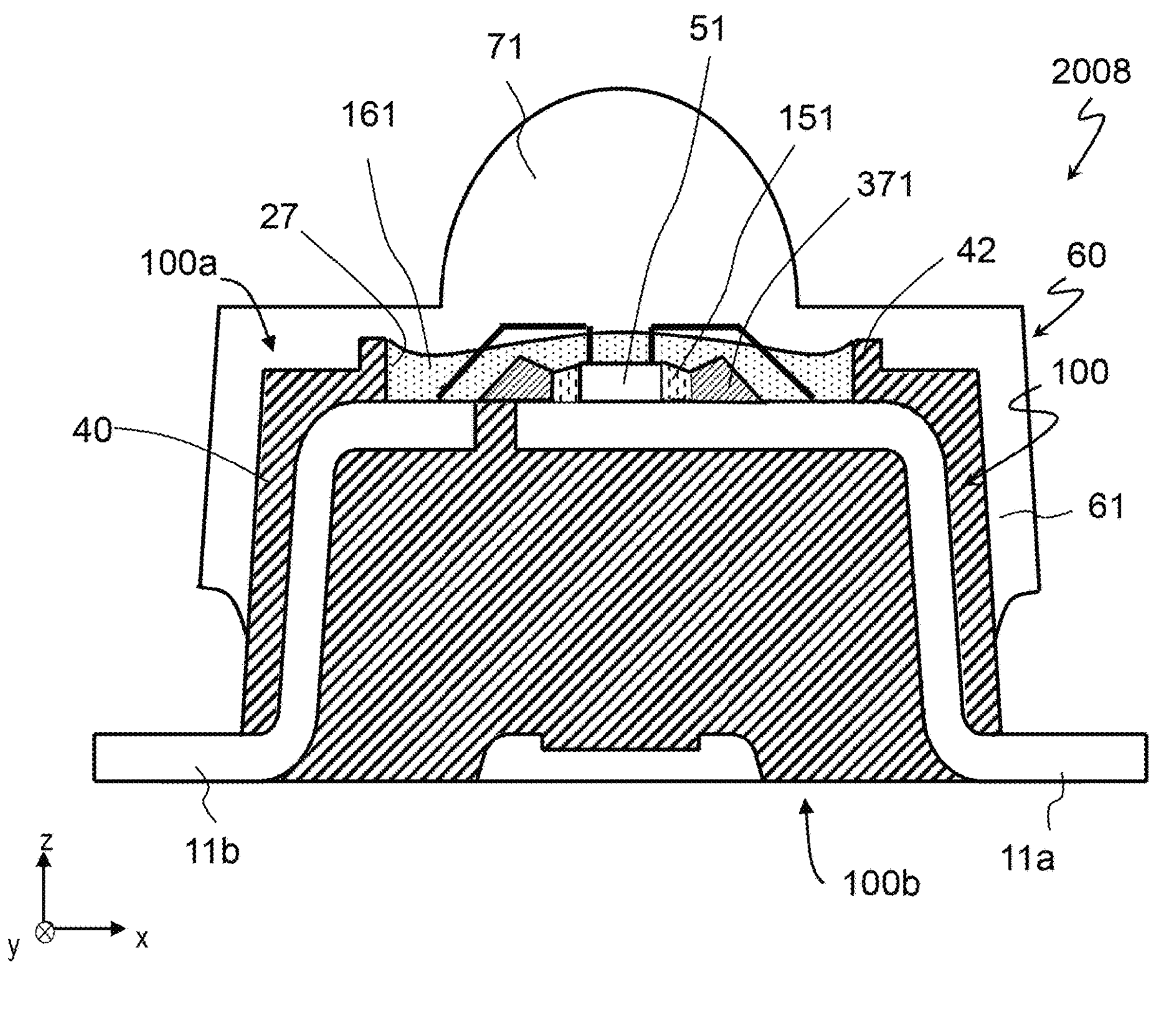
FIG. 29B is a schematic cross-sectional view taken along line 29B-29B illustrated in FIG. 29A.
Figure 29C:
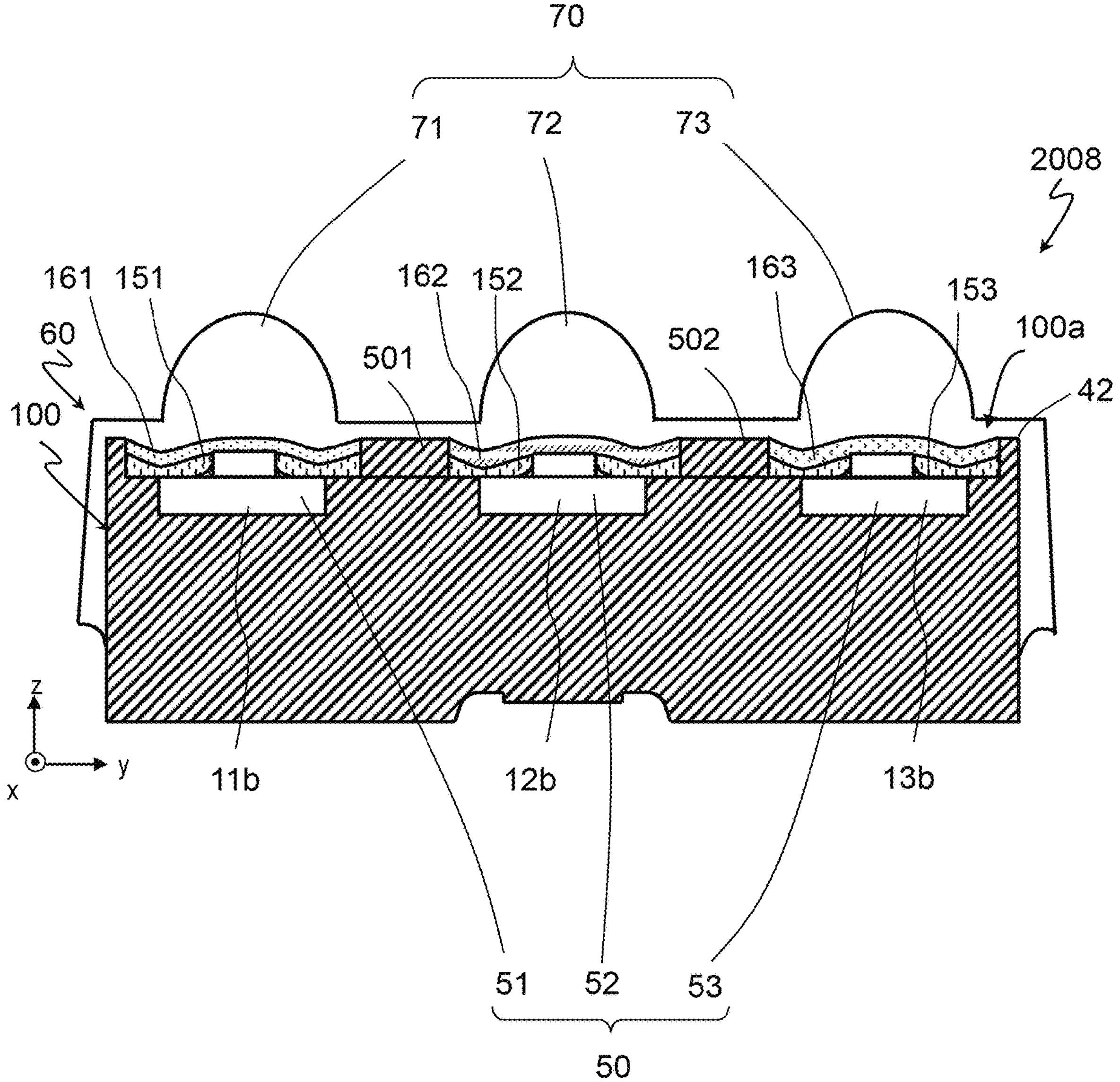
FIG. 29C is a schematic cross-sectional view taken along line 29C-29C illustrated in FIG. 29A.

FIG. 28 is a schematic perspective view of a light-emitting device 2007 according to an eleventh modified example, with the mold resin portion 60 and the reflective members 151 to 153 removed. FIG. 29A is a schematic top transparent view of the light-emitting device 2007. FIGS. 29B and 29C are schematic cross-sectional views respectively taken along lines 29B-29B and 29C-29C illustrated in FIG. 29A.

The light-emitting device 2007 according to the present modified example differs from the light-emitting devices described above in that, in a plan view, fourth resin walls (hereinafter referred to as "resin blocks") 501 and 502 are provided between the first region 121 and the second region 122 and between the second region 122 and the third region 123, respectively.

A plurality of resin walls 370 in the present modified example include a pair of first resin walls 371 disposed in the x-axis direction across the first light-emitting element 51, a pair of second resin walls 372 disposed in the x-axis direction across the second light-emitting element 52, and a pair of third resin walls 373 disposed in the x-axis direction across the third light-emitting element 53. In the present modified example, the first direction D1 is the x-axis direction.

Each of the resin blocks 501 and 502 is positioned between two adjacent regions 120 and defines a part of the peripheral edge of a precoating resin, such as the colored resin members 161 to 163. That is, a range in which the precoating resin is applied can be controlled by the resin blocks 501 and 502.

In the illustrated example, the resin blocks 501 and 502 each have a rectangular planar shape. In a plan view, a maximum width of each of the resin blocks 501 and 502 in the x-axis direction is smaller than the width of the inner upper surface of the recessed portion 27 and is, for example, the same as the width of the second portion P2 adjacent thereto. The resin blocks 501 and 502 are spaced apart from an inner surface of the recessed portion 27. Further, the resin blocks 501 and 502 are spaced apart from any of the resin walls 370 defining the peripheral edge of the reflective members 151 to 153.

The resin block 501 will be described below as an example, but the resin block 502 can have a similar structure.

Figure 29D:
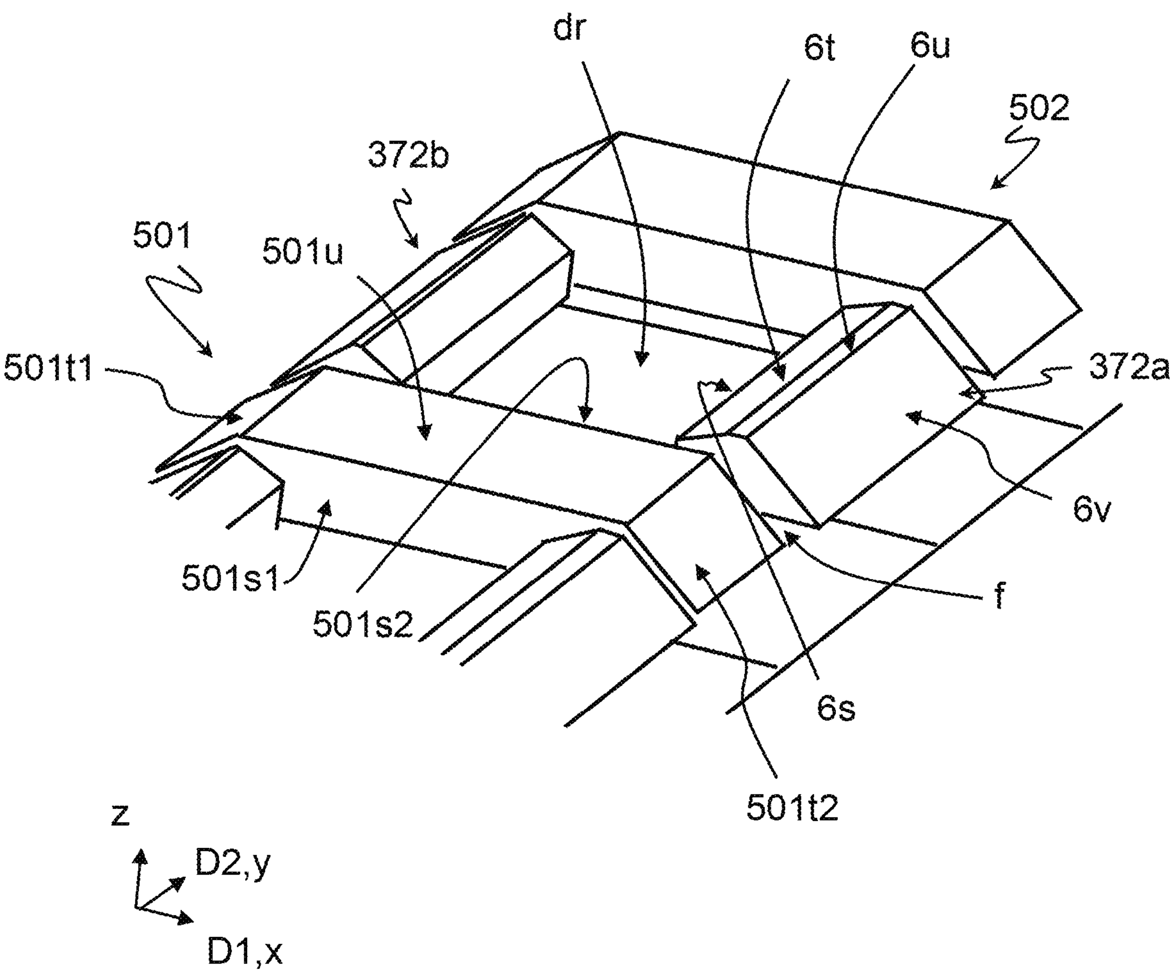
FIG. 29D is an enlarged schematic perspective view illustrating a part of the primary surface of the resin package of the light-emitting device illustrated in FIG. 28.

FIG. 29D is a schematic perspective view illustrating the resin block 501 and second resin walls 372*a* and 372*b*.

In the present modified example, the resin block 501 includes an upper surface 501*u*, lateral surfaces 501*s*1 and 501*s*2 positioned on the −y side and +y side, respectively, and lateral surfaces 501*t*1 and 501*t*2 positioned on the −x side and the +x side, respectively. The lateral surfaces 501*t*1 and 501*t*2 are tapered surfaces.

The lateral surfaces 501*t*1 and 501*t*2, which are both ends of the resin block 501 in the x-axis direction, are each spaced apart from the second resin portion 42 (FIG. 29C), which is the inner surface of the recessed portion 27. The lateral surfaces 501*s*1 and 501*s*2 of the resin block 501 are each spaced apart at a space f from the resin wall that is closest.

As illustrated in FIG. 29D, the upper surface 501*u* of the resin block 501 may be positioned above an upper surface of each of the resin walls 370, for example. As illustrated in FIG. 29C, the upper surface of the resin block 501 may be the same as the height of the upper surface of the second resin portion 42.

As illustrated in FIG. 29C, with the resin blocks 501 and 502 provided, thicknesses and positions of the colored resin members 161 to 163 can be controlled. In the present modified example, the first colored resin member 161 is disposed on the first reflective member 151 and the first light-emitting element 51. A peripheral edge of the first colored resin member 161 is defined by the second resin portion 42 and the resin block 501. The second colored resin member 162 is disposed on the second reflective member 152 and the second light-emitting element 52. A peripheral edge of the second colored resin member 162 is defined by the second resin portion 42 and the resin blocks 501 and 502. The third colored resin member 163 is disposed on the third reflective member 153 and the third light-emitting element 53. A peripheral edge of the third colored resin member 163 is defined by the second resin portion 42 and the resin block 502.

As illustrated in FIG. 29A, in a plan view, the regions R1 and R2 in which two colored resin members overlap each other may be formed in spaces between the resin blocks 501 as well as 502 and the second resin portion 42.

A structure of the pair of resin walls 370 in the present modified example is not particularly limited, and any one of the structures described above can be applied.

The structure of the resin wall 370 in the present modified example will be described with reference to FIG. 29D by using the second resin wall 372 as an example.

In the illustrated example, the second resin walls 372*a* and 372*b* each have a rectangular planar shape. The second resin walls 372*a* and 372*b* each include a first lateral surface 6*s* positioned proximate to the second light-emitting element, a second lateral surface 6*v* positioned opposite to the first lateral surface 6*s*, an upper surface 6*u*, and a tapered surface 6*t* positioned between the upper surface 6*u* and the first lateral surface 6*s*. For example, the first lateral surface 6*s* may be perpendicular to the xy plane. The second lateral surface 6*v* may be a tapered surface. The upper surface 6*u* is positioned above the upper surface of the second light-emitting element. The upper surface 6$u$ may be positioned below or may be the same height as the upper surface 501$u$ of the resin block 501.

As illustrated in FIG. 29A, in the present modified example as well, the pair of resin grooves 46 may be formed on both sides of the second portion P2 of each region 120 in the first direction D1 in a plan view. Thus, a peripheral edge of each second portion P2 is defined by the resin wall 370, the resin blocks 501 and 502, the resin groove 46, and the second resin portion 42.

In the present modified example as well, the region 801 including the second portion P2 described above and the side region of the first portion P1 can function as a nozzle arrangement region for applying the first resin material 150$a$ (FIG. 30C) that is to become the reflective members 151 to 153.

Method of Manufacturing Light-Emitting Device 2000

An example of a method of manufacturing the light-emitting device according to the present embodiment will be described below by using the light-emitting device 2000 as an example. The light-emitting device 2000 can be manufactured by a method similar to that of the light-emitting device 1000 described above. Differences from the method of manufacturing the light-emitting device 1000 will be described below. The other light-emitting devices 2001 to 2008 of the present embodiment differ in the number, the positions, and the shapes of the resin walls and the resin grooves, the presence or absence of the resin blocks, and the like, but can be manufactured using a method similar to that of the light-emitting device 2000.

FIG. 30A to 30E are step cross-sectional views for describing the method of manufacturing the light-emitting device 2000. Note that FIGS. 30A, 30B, 30D, and 30E illustrate an xy cross-section, and FIG. 30C only illustrates a yz cross-section including regions where the nozzles are disposed.

Figure 30A:
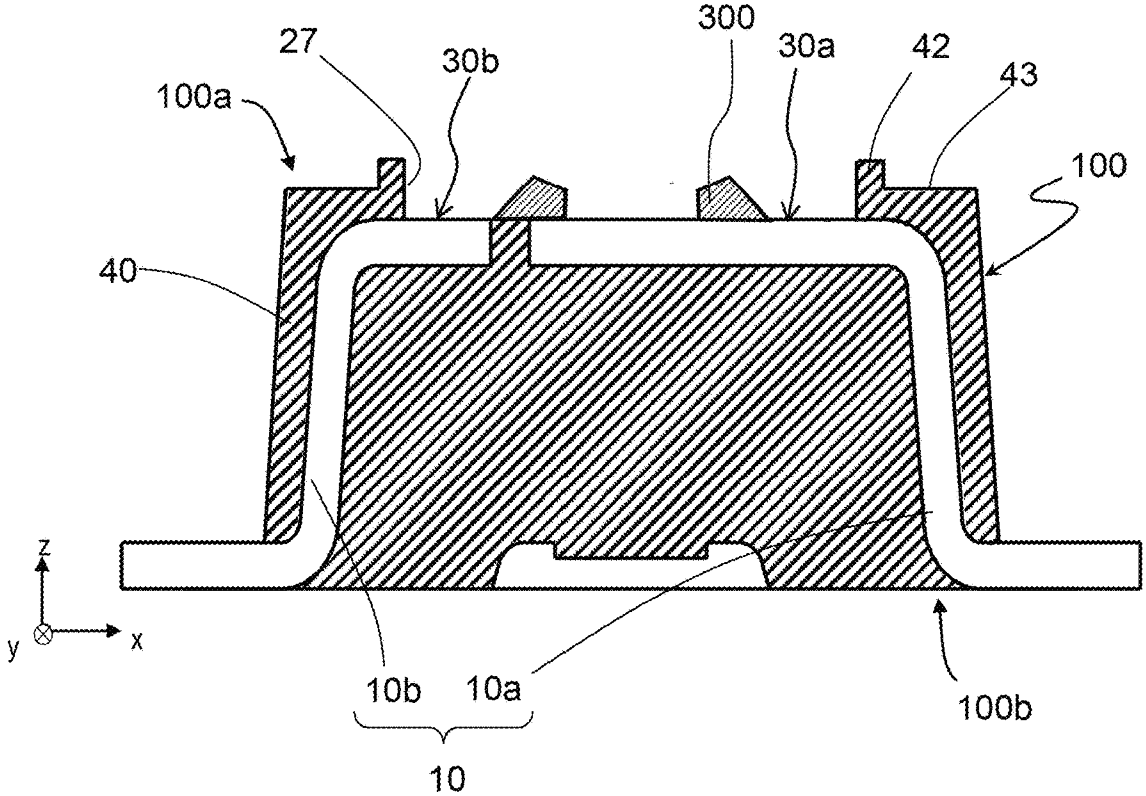
FIG. 30A is a step cross-sectional view illustrating a manufacturing method of the light-emitting device illustrated in FIG. 14.

First, as illustrated in FIG. 30A, the resin package 100 that includes the first dark-colored resin member 40 and the plurality of leads 10 is prepared by a transfer molding method, for example. The plurality of leads 10 include the pair of leads 10$a$, 10$b$. Each of the resin walls 300 and the resin groove 46 can be formed by a shape of a mold used when forming the first dark-colored resin member 40. Here, a plurality of resin walls 300 formed of the first dark-colored resin members 40 are formed on the primary surface 100$a$ of the resin package. Note that the resin blocks 501 and 502 (FIG. 29A) can be similarly formed by a shape of a mold.

Figure 30B:
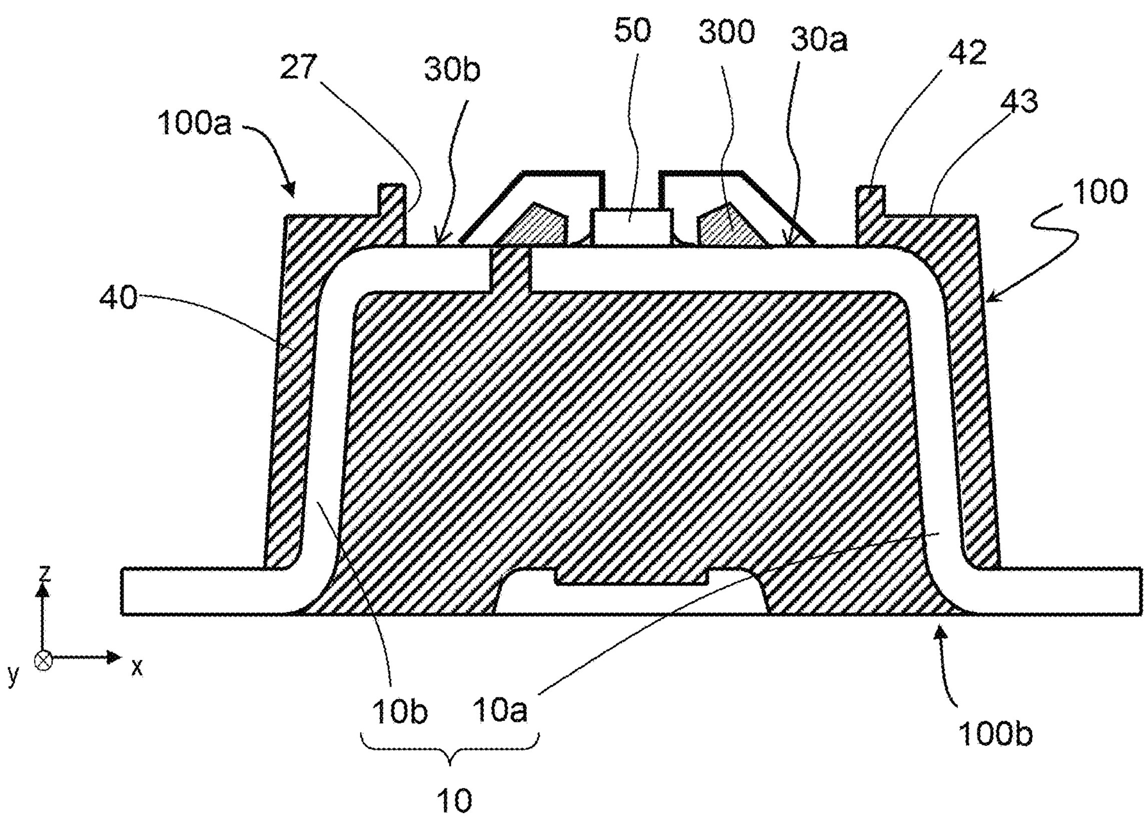
FIG. 30B is a step cross-sectional view illustrating the manufacturing method of the light-emitting device illustrated in FIG. 14.

Subsequently, as illustrated in FIG. 30B, the light-emitting elements 50 are mounted on the primary surface 100$a$ of the resin package. In the present embodiment, each light-emitting element 50 is disposed in an interior of a region defined by the plurality of resin walls 300. That is, in a plan view, the plurality of resin walls 300 spaced apart from each other surround each of the light-emitting elements 50 on the primary surface 100$a$ of the resin package.

Figure 30C:
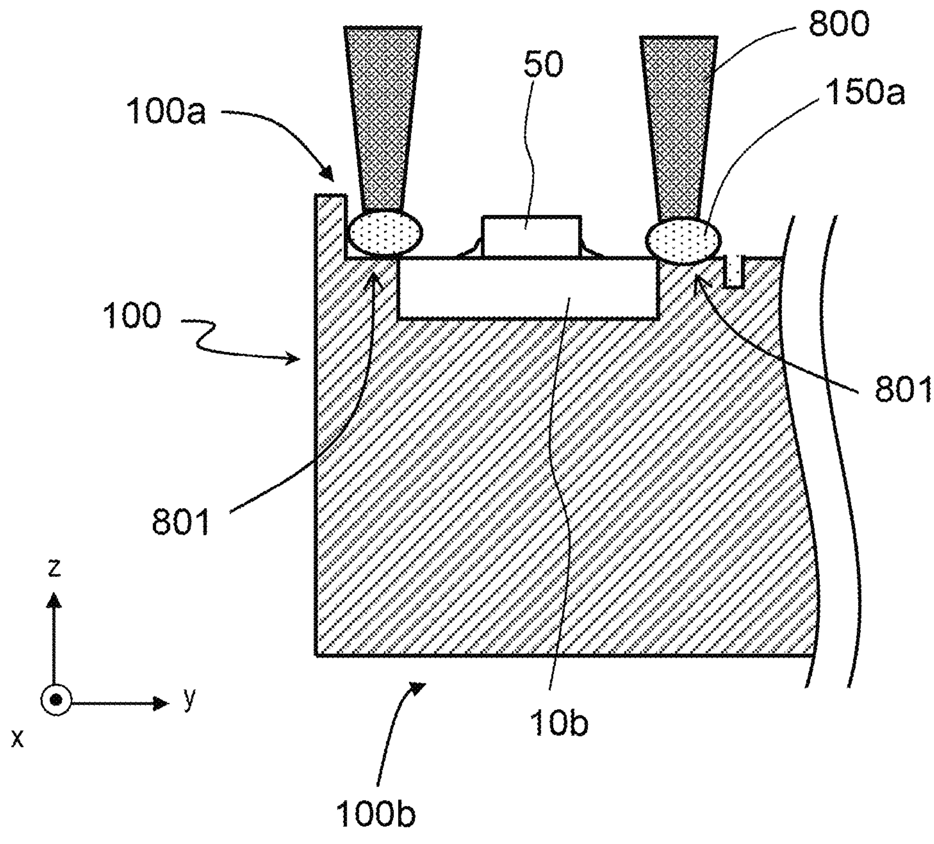
FIG. 30C is a step cross-sectional view illustrating the manufacturing method of the light-emitting device illustrated in FIG. 14.
Figure 30D:
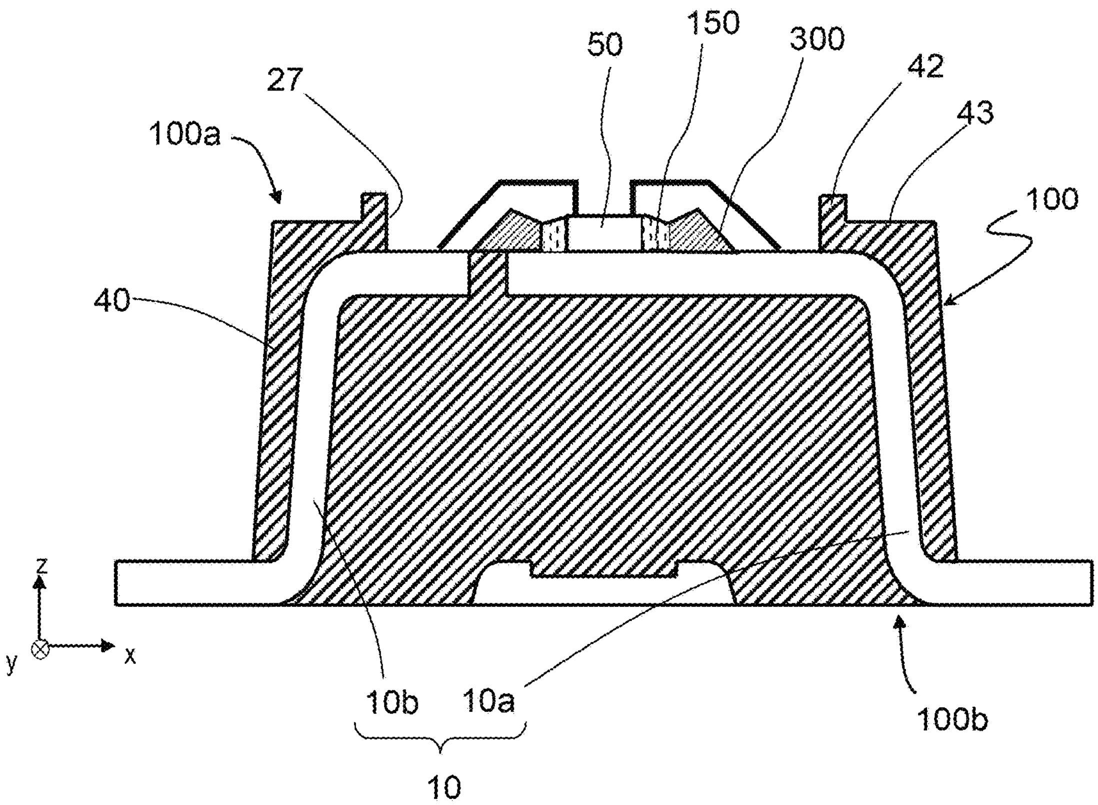
FIG. 30D is a step cross-sectional view illustrating the manufacturing method of the light-emitting device illustrated in FIG. 14.

Subsequently, as illustrated in FIG. 30C, by arranging the nozzles in the nozzle arrangement regions 801 (refer to FIG. 15D and the like) of the primary surface 100$a$ of the resin package, the first resin material 150$a$ that is to become the reflective members is applied around the light-emitting element 50 disposed in the interior of the region defined by the resin walls 300 (FIG. 30B). As described above, the nozzles may be disposed outside the region defined by the plurality of resin walls 300 (FIG. 30B), and the first resin material 150$a$ may be passed through the spaces between the resin walls 300 and made to surround each of the light-emitting elements 50. Subsequently, the first resin material 150$a$ is cured. Thus, as illustrated in FIG. 30D, the reflective members 150 are formed.

Figure 30E:
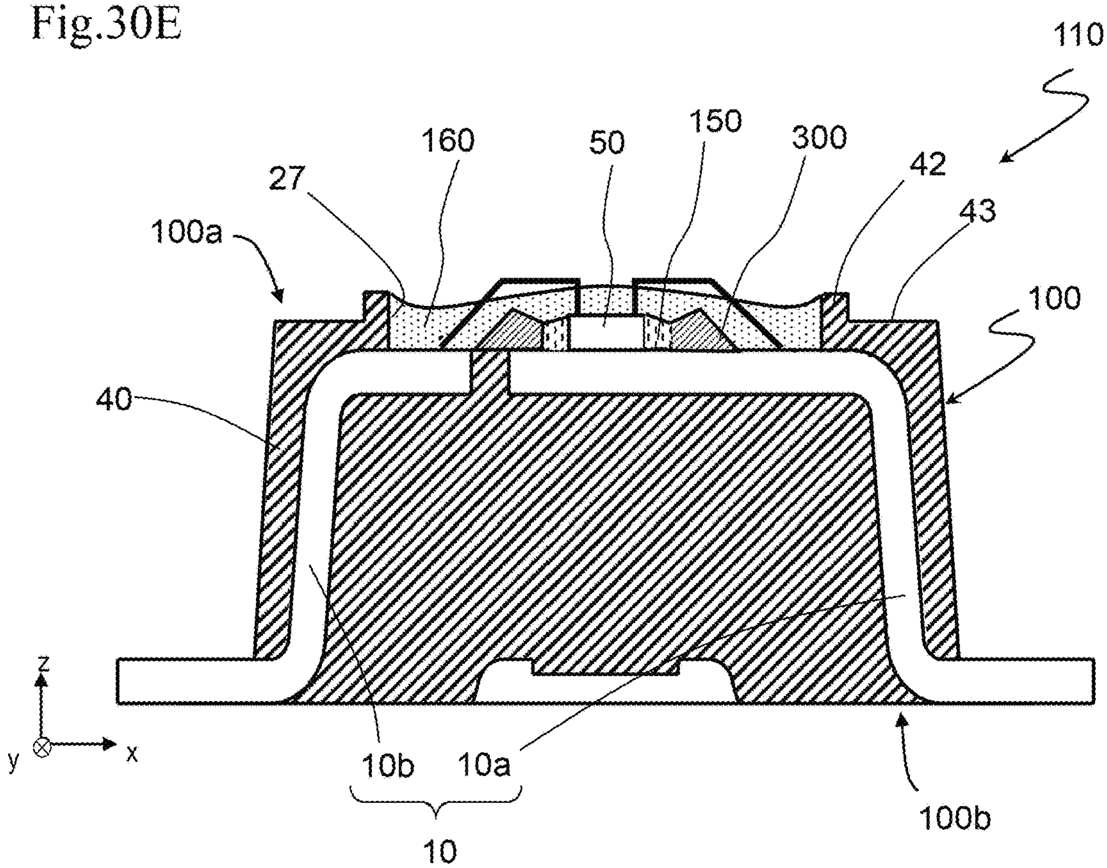
FIG. 30E is a step cross-sectional view illustrating the manufacturing method of the light-emitting device illustrated in FIG. 14.

Subsequently, as illustrated in FIG. 30E, a colored resin material including a colorant is applied on the reflective members 150 and cured, thereby forming the colored resin member 160. Thus, the structure 110 is obtained in which the light-emitting elements 50, the reflective members 150, and the colored resin members 160 are disposed on the primary surface 100$a$ of the resin package.

As illustrated in FIG. 15C, in a case in which the colored resin members 161 to 163 colored to different colors are formed, the colored resin members 161 to 163 can be formed by the following method, for example. First, a first colored resin material and a third colored resin material containing different colorants are applied to predetermined regions and cured to form the first colored resin member 161 and the third colored resin member 163. Subsequently, a second colored resin material including a colorant different from those described above is applied between the first colored resin member 161 and the third colored resin member 163. At this time, the second colored resin material may be applied so as to partially overlap the first colored resin member 161 and the third colored resin member 163. Subsequently, the second colored resin member 162 is obtained by curing the second colored resin material.

Subsequently, the mold resin portion 60 that seals the light-emitting elements 50 in the structure 110 thus obtained is formed. The mold resin portion 60 can be manufactured using a method similar to that of the light-emitting device 1000 by using, for example, a transfer molding method. Subsequently, the leads of the lead frame are cut and separated into individual pieces, and thus the light-emitting device 2000 illustrated in FIG. 15C is manufactured. Note that the mold resin portion may be formed using a casting method.

Twelfth Modified Example

Figure 31A:
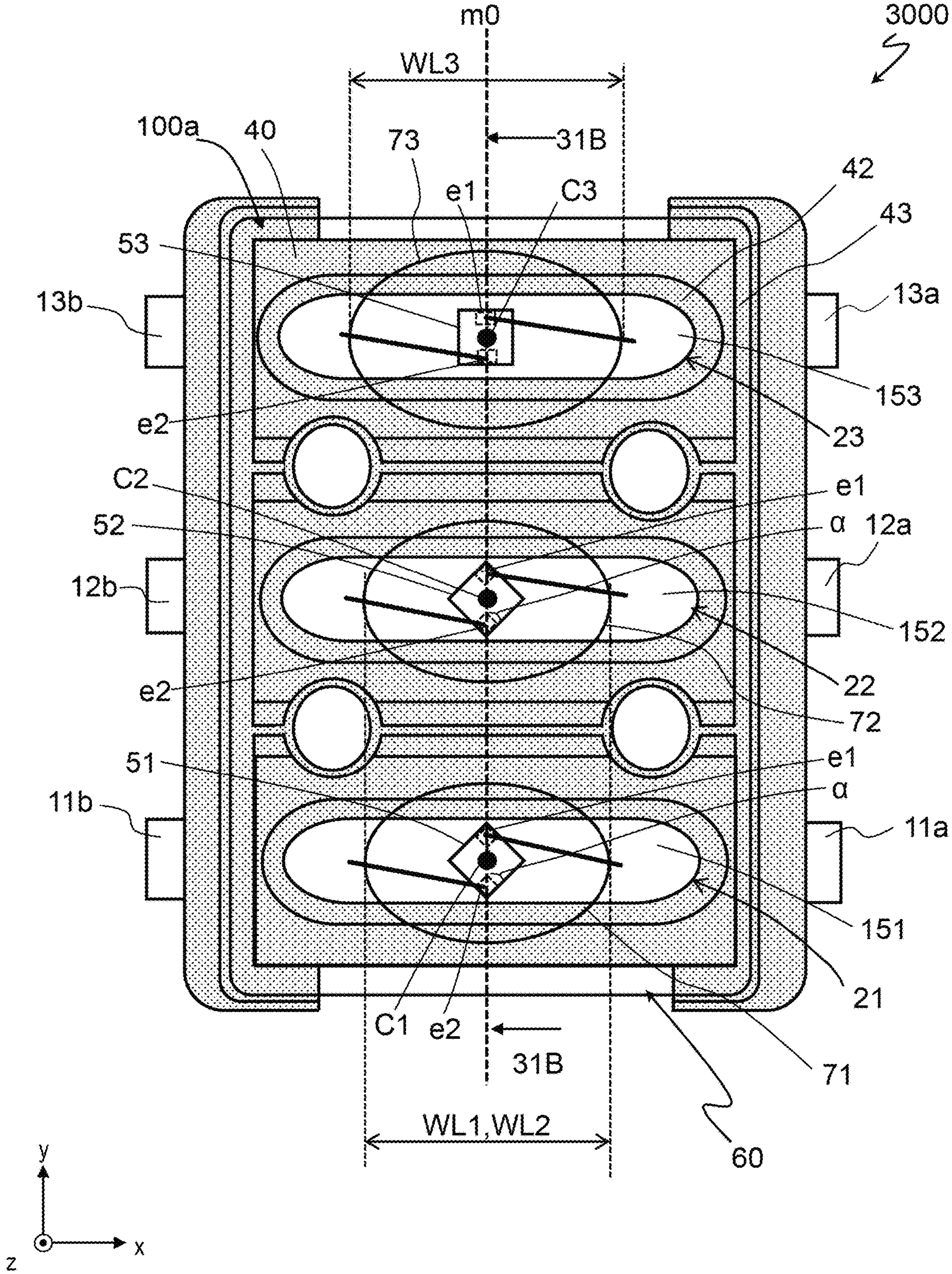
FIG. 31A is a schematic top transparent view of a light-emitting device according to a twelfth modified example.
Figure 31B:
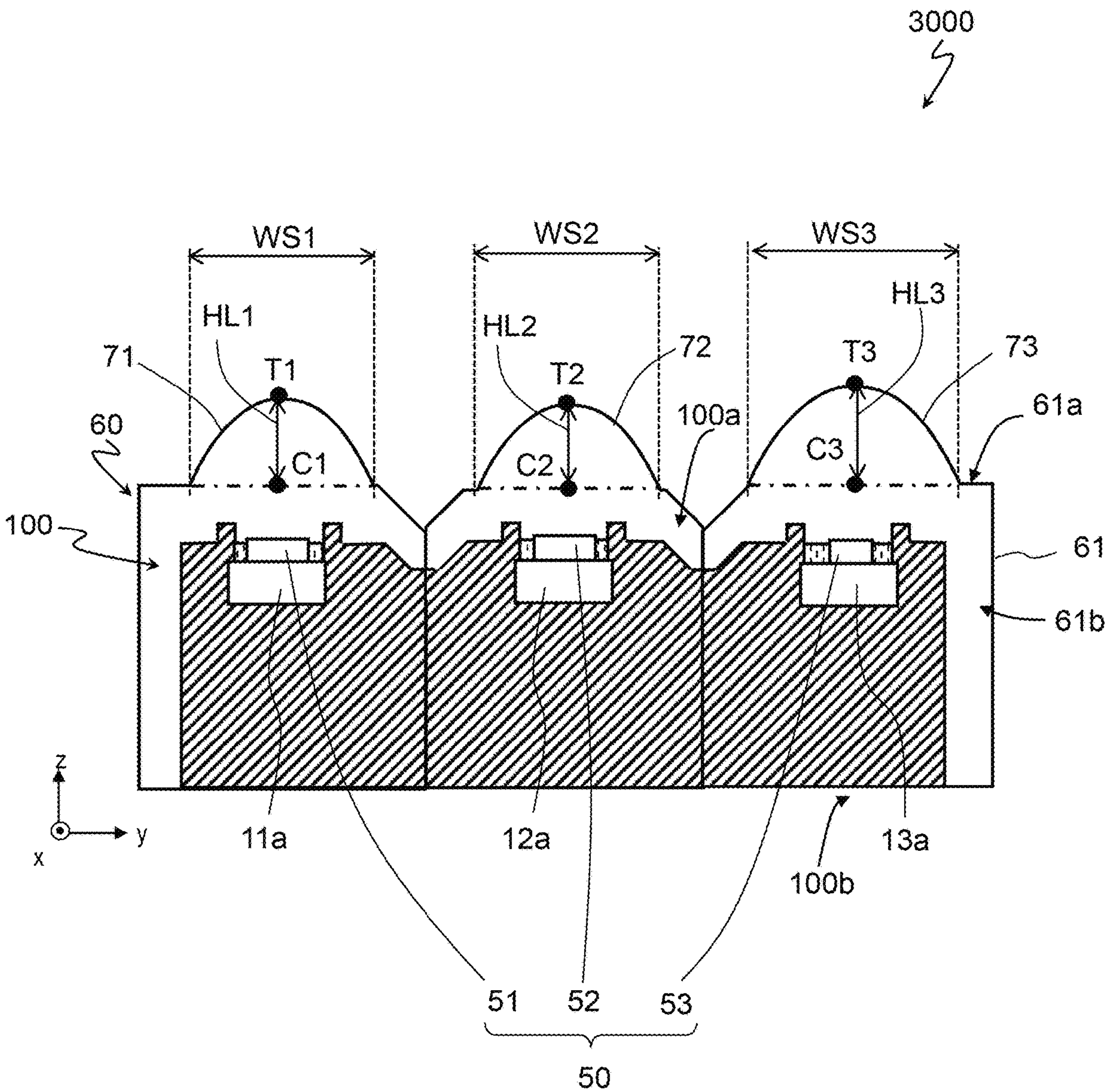
FIG. 31B is a schematic cross-sectional view taken along line 31B-31B illustrated in FIG. 31A.

FIG. 31A is a schematic top transparent view of a light-emitting device 3000 according to a twelfth modified example, and FIG. 31B is a schematic cross-sectional view taken along line 31B-31B illustrated in FIG. 31A.

The light-emitting device 3000 according to the twelfth modified example differs from the light-emitting device 1000 illustrated in FIGS. 2A to 2E in that at least one light-emitting element of the plurality of light-emitting elements 50 is disposed non-parallel to the other light-emitting elements in a plan view, and a height of a vertex of at least one lens portion of the plurality of lens portions 70 differs from a height of vertices of the other lens portions.

In the present modified example, the first light-emitting element 51, the second light-emitting element 52, and the third light-emitting element 53 each have a rectangular planar shape. In a plan view, each side of the rectangular shape of at least one light-emitting element (here, the third light-emitting element 53) of the first light-emitting element 51, the second light-emitting element 52, and the third light-emitting element 53 is non-parallel to each side of the rectangular shapes of the other light-emitting elements (here, the first light-emitting element 51 and the second light-emitting element 52).

This makes it possible to improve the light distribution controllability of the light-emitting device 3000 and achieve the desired light distribution, as described in detail below.

Structure and Arrangement of Light-Emitting Elements

The first light-emitting element 51 to the third light-emitting element 53 each include a first surface positioned proximate to the plurality of leads 11*a* to 13*b*, a second surface positioned opposite to the first surface (that is, proximate to the lens portion), and two electrodes positioned on the second surface. Note that, in each of the first light-emitting element 51 to the third light-emitting element 53, both the positive and negative electrodes will be described as being positioned on the second surface, but one may be positioned on the first surface and the other may be positioned on the second surface.

In the example illustrated in FIG. 31A, two electrodes (positive and negative electrodes) e1 and e2 are positioned on the second surface of each of the first light-emitting element 51 to the third light-emitting element 53. The two electrodes e1 and e2 of, among the first light-emitting element 51 to the third light-emitting element 53, each of the first light-emitting element 51 and second light-emitting element 52 are disposed at two mutually facing corner portions (that is, at opposing corner portions) on the second surface having a rectangular shape. In contrast, the two electrodes e1 and e2 of the third light-emitting element 53 are respectively disposed near centers of two sides facing each other on the second surface having a rectangular shape. Although the emitted light colors of the first light-emitting element 51 to the third light-emitting element 53 are not particularly limited, in the present modified example, the first light-emitting element 51 may be a red light-emitting element that emits red light, the second light-emitting element 52 may be a blue light-emitting element that emits blue light, and the third light-emitting element 53 may be a green light-emitting element that emits green light.

In the example illustrated in FIG. 31A, the first light-emitting element 51 to the third light-emitting element 53 are disposed in a single row on a line m0 that is virtual. Here, the line m0 is a line connecting center points C1 to C3 of the first lens portion 71 to the third lens portion 73, respectively, in a plan view. The four sides constituting each rectangular planar shape of the first light-emitting element 51 and the second light-emitting element 52 (here, four sides constituting outer edges of each rectangular shape of the second surface) are non-parallel to the line m0. In a plan view, the first light-emitting element 51 and the second light-emitting element 52 may each be disposed so that one pair of opposing sides of the outer edges of the rectangular shape of the second surface forms angles of 45° with the line m0. On the other hand, one pair of opposing sides of the rectangular planar shape of the third light-emitting element 53 (here, one pair of opposing sides of the outer edges of the rectangular shape of the second surface) is parallel to the line m0.

In this description, the smallest angle $\alpha$ of the angles formed by each side of the outer edges of the rectangular shape of the light-emitting element and the line m0 in a plan view is referred to as an "inclination angle relative to the line m0". In the illustrated example, the inclination angle $\alpha$ of each of the first light-emitting element 51 and the second light-emitting element 52 relative to the line m0 is 45°.

In a light-emitting device having a light-emitting element and a lens positioned above the light-emitting element and covering the light-emitting element, as the size of the lens decreases, the light distribution of the light-emitting device is more susceptible to being affected by light distribution characteristics of a near field of the light-emitting element. Accordingly, light distribution control of the light-emitting device by adjusting the curvature of the lens may be difficult. The light distribution characteristics of the near field of the light-emitting element can be changed by, for example, the structure, such as the positions of the electrodes in the light-emitting element or the electrode size.

In contrast, in the present modified example, it is possible to achieve the light-emitting device 3000 having a desired light distribution (directional properties) by disposing the first light-emitting element 51 to the third light-emitting element 53 in the resin package 100 taking into consideration the positions of the electrodes of the first light-emitting element 51 to the third light-emitting element 53 and, more specifically, taking into consideration the light emission luminance distribution reflecting the positions and the like of electrodes on the second surface of these light-emitting elements.

Below, a relationship between the light emission luminance distribution of the light-emitting elements and the arrangement of the light-emitting elements in a plan view will be specifically described.

Figure 32A:
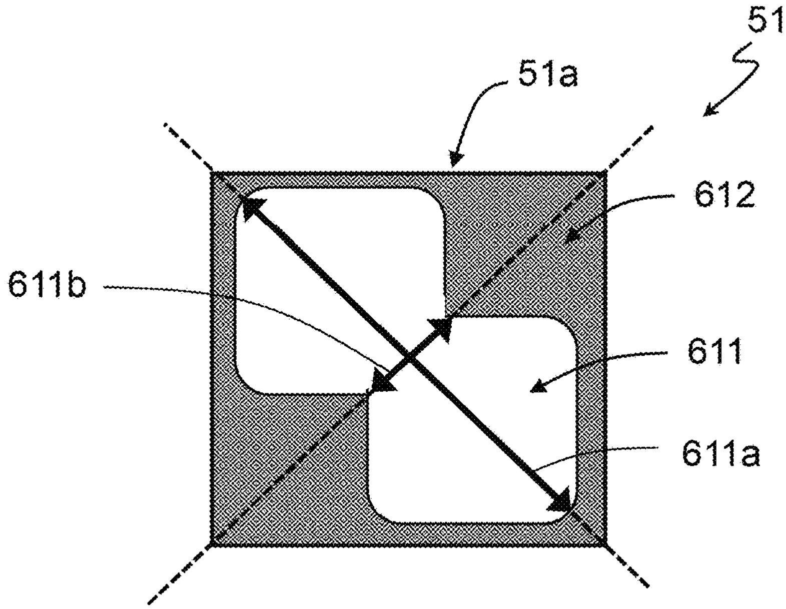
FIG. 32A is a schematic plan view exemplifying a light emission luminance distribution of a first light-emitting element 51.
Figure 32B:
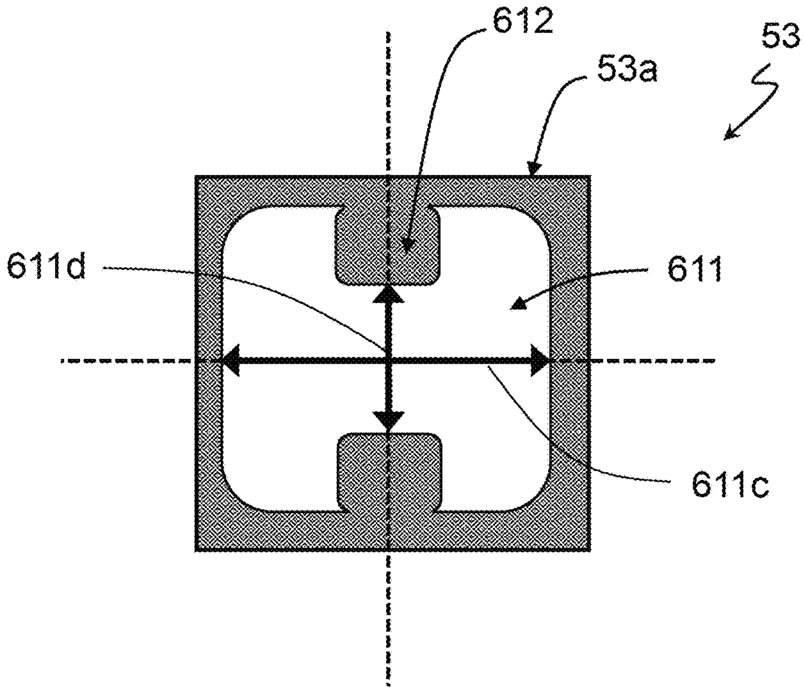
FIG. 32B is a schematic plan view exemplifying a light emission luminance distribution of a third light-emitting element 53.

FIGS. 32A and 32B are schematic plan views exemplifying the light emission luminance distribution of second surfaces 51*a* and 53*a* of the first light-emitting element 51 and the third light-emitting element 53, respectively. In FIGS. 32A and 32B, a region having high light emission luminance is indicated in white, and a region having a light emission luminance lower than that of the region indicated in white is illustrated in black. In the following description, a region of the second surfaces 51*a* and 53*a* having high light emission luminance indicated in white is referred to as a "light-emitting portion", and a region having low light emission luminance indicated in black is referred to as a "non-light-emitting portion". The electrodes of each of the first light-emitting element 51 and the third light-emitting element 53 are connected to the leads by a wire.

As illustrated in FIG. 32A, the light emission luminance distribution of the second surface 51*a* of the first light-emitting element 51 includes a light-emitting portion 611 and a non-light-emitting portion 612 having brightness lower than that of the light-emitting portion 611. The non-light-emitting portion 612 is positioned at two corner portions facing each other. The position of the non-light-emitting portion 612 corresponds to the positions of the electrodes e1 and e2 (FIG. 31A). In this description, "non-light-emitting portion" includes not only the region of the second surface that does not emit light, but also regions where light is not emitted due to formation of the electrodes and regions that appear dark due to shadows of the wires. Given 100% as the maximum brightness of the second surface 51*a*, the brightness of the light-emitting portion 611 is in a range from 40% to 100%, and the brightness of the non-light-emitting portion 612 is in a range from 0% to less than 40%. In this example, a width 611*a* of the light-emitting portion 611 on a diagonal line connecting two corner portions of the second surface 51*a* where the electrodes are not formed is greater than a width 611*b* on a diagonal line connecting two corner portions where the electrodes are formed. Note that "the width of the light-emitting portion on a diagonal line" refers to a length of the light-emitting portion cut by the diagonal line, that is, a length of a portion of the light-emitting portion that overlaps the diagonal line in a plan view.

The second light-emitting element 52 includes the electrodes at positions similar to those of the first light-emitting element 51. Accordingly, in the light emission luminance distribution of the second light-emitting element 52 as well, similarly to the first light-emitting element 51, a width of the light-emitting portion on a diagonal line connecting two corner portions of the second surface where the electrodes are not formed can be greater than a width of the light-emitting portion on a diagonal line connecting two corner portions where the electrodes are formed.

As illustrated in FIG. 32B, the light emission luminance distribution of the second surface 53*a* of the third light-emitting element 53 includes the light-emitting portion 611 and the non-light-emitting portion 612 positioned near centers of two sides facing each other and having brightness lower than that of the light-emitting portion 611. In FIG. 32B, the position of the non-light-emitting portion 612 of the third light-emitting element 53 corresponds to the positions of the electrodes e1 and e2 in FIG. 31A. A width 611*c* of the light-emitting portion 611 on a line connecting central portions of two sides of the second surface 53*a* where the electrodes are not formed is greater than a width 611*d* of the light-emitting portion 611 on a line connecting central portions of two sides where the electrodes are formed. Note that "the width of the light-emitting portion on a line connecting central portions" refers to a length of the light-emitting portion cut by the line connecting the central portions of the two sides, that is, a length of a portion of the light-emitting portion that overlaps the line connecting the central portions of the two sides in a plan view.

In the present modified example, the first light-emitting element 51 to the third light-emitting element 53 are preferably disposed on the line m0 connecting the center points C1 to C3 of the first lens portion 71 to the third lens portion 73, respectively, in a plan view. In a plan view, a center of the second surface of each of the first light-emitting element 51 to the third light-emitting element 53 may be disposed on the line m0.

Figure 33:
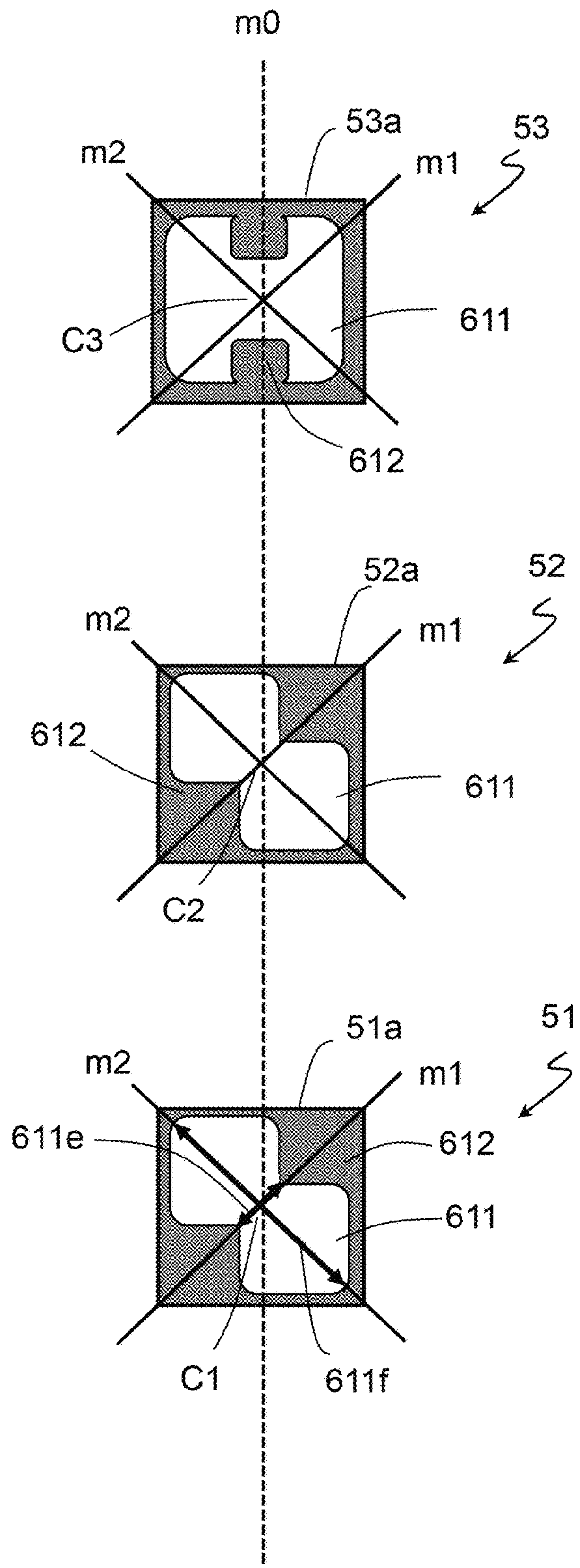
FIG. 33 is a schematic plan view illustrating an arrangement of the first light-emitting element 51 to the third light-emitting element 53 in a reference example.
Figure 34:
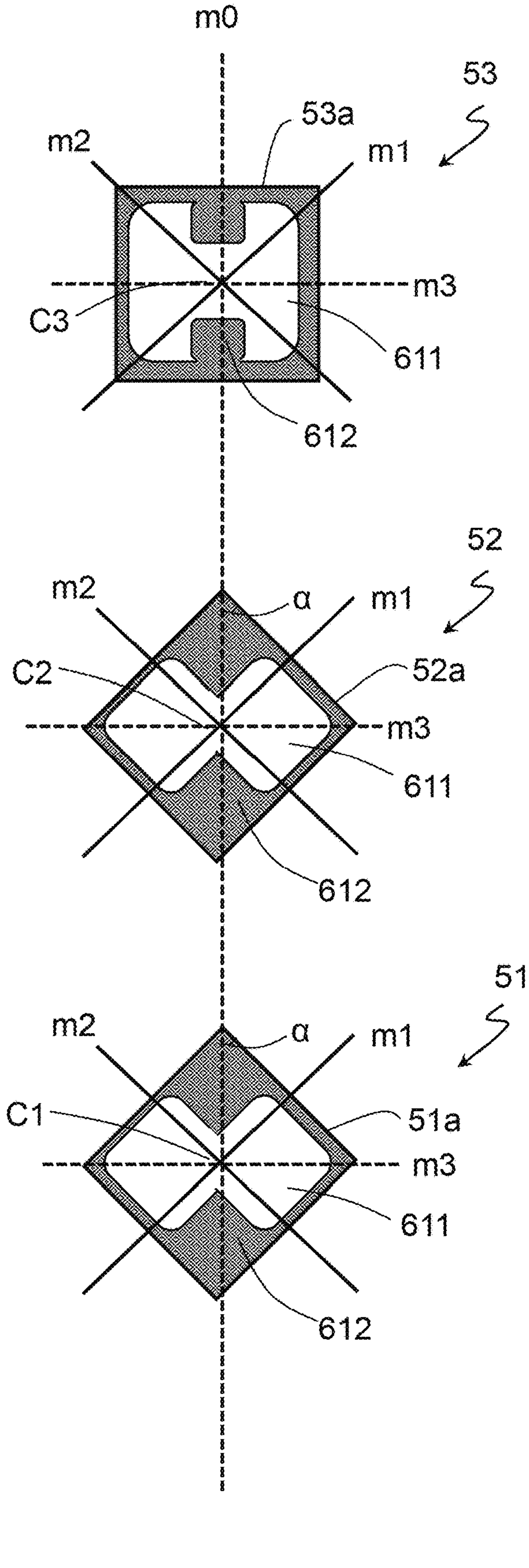
FIG. 34 is a schematic plan view illustrating an arrangement of the first light-emitting element 51 to the third light-emitting element 53 in the light-emitting device illustrated in FIG. 31A.

FIG. 33 is a schematic plan view illustrating an arrangement of a reference example of the first light-emitting element 51 to the third light-emitting element 53 having the light emission luminance distributions described with reference to FIGS. 32A and 32B. FIG. 34 is a schematic plan view illustrating the arrangement of the first light-emitting element 51 to the third light-emitting element 53 in the light-emitting device 3000 of the present modified example illustrated in FIGS. 31A and 31B. In FIGS. 33 and 34, only the second surfaces 51*a* to 53*a* of the first light-emitting element 51 to the third light-emitting element 53 and the light emission luminance distributions of the first light-emitting element 51 to the third light-emitting element 53, respectively, are illustrated. Other components such as the lens portions are omitted. Further, these drawings also illustrate, in each of the first light-emitting element 51 to the third light-emitting element 53, a line m1 virtually passing through the center of the second surface and forming a 45° angle clockwise from the line m0, and a line m2 virtually passing through the center of the second surface and forming a 1350 angle clockwise from the line m0. Further, FIG. 34 illustrates, in each of the first light-emitting element 51 to the third light-emitting element 53, a line m3 virtually passing through the second surface and orthogonal to the line m0 with a dashed line. In the example illustrated in FIGS. 33 and 34, the centers of the second surfaces of the first light-emitting element 51 to the third light-emitting element 53 match the center points C1 to C3 of the first lens portion to the third lens portion, respectively.

In the reference example illustrated in FIG. 33, in a plan view, the two sides (one set of opposing sides) of the second surface, having a rectangular shape, in each of the first light-emitting element 51 to the third light-emitting element 53 are parallel to the line m0. In the reference example illustrated in FIG. 33, in each of the first light-emitting element 51 and the second light-emitting element 52, a width of the light-emitting portion 611 on the line m1 is smaller than a width of the light-emitting portion 611 on the line m2. In this description, "the width of the light-emitting portion on the line m1 (or line m2)" refers to a length of the light-emitting portion cut by the line m1 (or line m2) in a plan view, that is, a length of a portion of the light-emitting portion that overlaps the line m1 (or line m2) in a plan view. For example, in the first light-emitting element 51 illustrated in FIG. 33, the width of the light-emitting portion 611 on the line m1 is a length 611*e* of the light-emitting portion 611 cut by the line m1, and the width of the light-emitting portion 611 on the line m2 is a length 611*f* of the light-emitting portion 611 cut by the line m2. Thus, in the first light-emitting element 51 and the second light-emitting element 52, the light emission distribution on the line m1 (light emission distribution of a cross-section perpendicular to the second surface and including the line m1) and the light emission distribution on the line m2 (light emission distribution of a cross-section perpendicular to the second surface and including the line m2) can be different. A half-value angle (directivity angle) of the first light-emitting element 51 on the line m1 can be smaller than a half-value angle of the first light-emitting element 51 on the line m2 by, for example, approximately 6.6° (for example, a difference between the half-value angle (directivity angle) on the line m1 and the half-value angle (directivity angle) on the line m2 of the third light-emitting element 53 is, for example, approximately 1.60). In this description, the difference in light distribution indicated by the half-value angles (directivity angles) on the line m1 and on the line m2 is sometimes abbreviated as "light distribution difference". Note that, in the third light-emitting element 53, the width of the light-emitting portion 611 on the line m1 and the width of the light-emitting portion 611 on the line m2 are substantially the same. Therefore, the light distribution difference of the third light-emitting element 53 is suppressed to be smaller than those of the first light-emitting element 51 and the second light-emitting element 52.

When a light-emitting device arranged as in the present reference example is applied to a display device, display characteristics such as image color, video, and the like may be affected by the light distribution difference of the first and second light-emitting elements 51 and 52. For example, because the light distribution on the line m1 in the first light-emitting element 51 (red light-emitting element, for example) is narrow (half-value angle is small), when a display device that uses the light-emitting device is viewed from the direction of the line m1, image distortion such as a weak red color may occur.

In contrast, in the light-emitting device 3000 according to the present modified example, as illustrated in FIG. 34, the first light-emitting element 51 and the second light-emitting element 52 are each disposed so that the two sides (one set of opposing sides) of the respective second surfaces 51*a* and 52*a* having a rectangular shape form 45° angles relative to the line m0, in a plan view. That is, the inclination angles α, relative to the line m0, of the first light-emitting element 51 and the second light-emitting element 52 are 45°. With this structure, in each of the first light-emitting element 51 and the second light-emitting element 52, the difference between the width of the light-emitting portion 611 on the line m1 and the width of the light-emitting portion 611 on the line m2 can be made smaller than that of the reference example. In this example, the width of the light-emitting portion 611 on the line m1 and the width of the light-emitting portion 611 on the line m2 can be made substantially the same. With this structure, the difference between the light distribution on the line m1 and the light distribution on the line m2 can be reduced. Accordingly, influence of the light distribution characteristics of the near field of each of the first light-emitting element 51 and the second light-emitting element 52 on the light distribution of the light-emitting device 3000 can be further suppressed to be smaller, making it possible to further enhance the light distribution controllability.

In the present modified example, each of the first light-emitting element 51 to the third light-emitting element 53 is disposed so as to achieve a reduction in the difference between the width of the light-emitting portion 611 on the line m1 and the width of the light-emitting portion 611 on the line m2. For example, each of the first light-emitting element 51 to the third light-emitting element 53 may be disposed so that the electrodes do not overlap the line m1 and the line m2 in a plan view (that is, so that the electrodes are offset from the lines m1, m2). Alternatively, each of the first light-emitting element 51 to the third light-emitting element 53 may be disposed so that the shape of the light-emitting portion 611 in a plan view is substantially symmetric (line-symmetric) relative to the line m0 and/or the line m3.

By using the light-emitting device 3000 of the present modified example, it is possible to achieve a display device in which distortion of image color and video caused by a light distribution difference is further reduced.

As illustrated in FIGS. 31A and 34, in a plan view, the electrodes e1 and e2 of each of the first light-emitting element 51 to the third light-emitting element 53 are preferably disposed on the line m0. This makes it possible, in a plan view, to make a direction in which the electrodes e1 and e2 of each of the first light-emitting element 51 to the third light-emitting element 53 are connected, that is, a direction in which the width of the light-emitting portion in the light emission luminance distribution of each of the first light-emitting element 51 to the third light-emitting element 53 becomes relatively small, match the minor axis of the corresponding lens portion, and to make a direction in which the width of the light-emitting portion in the light emission luminance distribution of each of the first light-emitting element 51 to the third light-emitting element 53 becomes relatively large match the major axis of the corresponding lens portion. Accordingly, the extraction efficiency of light from each of the light-emitting elements to the corresponding lens can be improved, making it possible to improve the light extraction efficiency.

Figure 35:
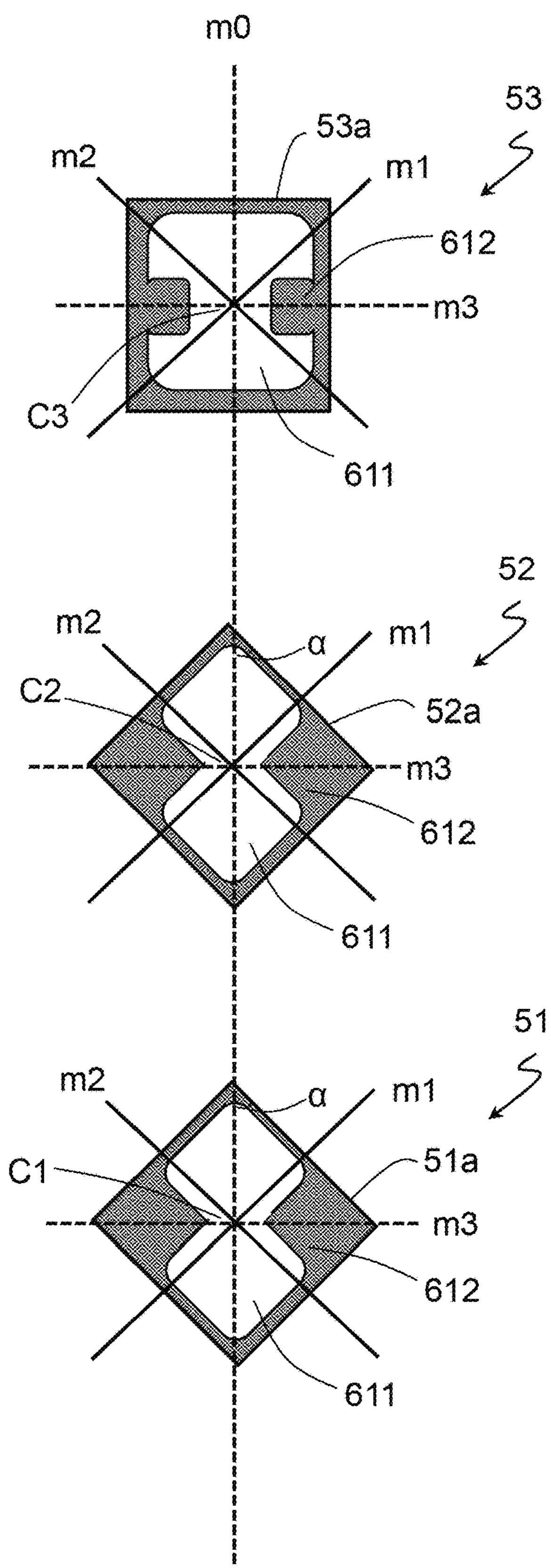
FIG. 35 is a schematic plan view illustrating another arrangement example of the first light-emitting element 51 to the third light-emitting element 53.

FIG. 35 is a schematic plan view illustrating another example of an arrangement of the first light-emitting element 51 to the third light-emitting element 53. The example illustrated in FIG. 35 differs from the example illustrated in FIG. 34 in the positions of the electrodes of the first light-emitting element 51 to the third light-emitting element 53. In the example illustrated in FIG. 35, in a plan view, electrodes of each of the first light-emitting element 51 to the third light-emitting element 53 are disposed on the line m3 that passes through the center of the second surface of each light-emitting element having a rectangular shape, and forms a 900 angle clockwise from the line m0. In a plan view, the direction in which the electrodes of each of the first light-emitting element 51 to the third light-emitting element 53 are connected may coincide with the major axis of the corresponding lens portion. In this case as well, the difference generated between the light distribution on the line m1 and the light distribution on the line m2 in each of the first light-emitting element 51 to the third light-emitting element 53 can be reduced.

A shape of each of the first light-emitting element 51 to the third light-emitting element 53 in a plan view may be square. In this case, by disposing the first light-emitting element 51 to the third light-emitting element 53 as exemplified in FIG. 34 or 35, the difference between the light distribution on the line m1 and the light distribution on the line m2 in each of the light-emitting elements can be further reduced.

Note that the inclination angle $\alpha$ of each of the first light-emitting element 51 to the third light-emitting element 53 relative to the line m0 in a plan view can be set in accordance with the positions of the electrodes and the like in the light-emitting element, regardless of a wavelength of the light emitted from the light-emitting element. The inclination angle $\alpha$ of each of the first light-emitting element 51 to the third light-emitting element 53 relative to the line m0 can be selected in a range from 0° to 45° according to the planar shape of the light-emitting element, the position of the electrode, the electrode shape, and the like. In a case in which the planar shape of the light-emitting element is rectangular and includes the electrodes in two corner portions facing each other, the inclination angle $\alpha$ of the light-emitting element relative to the line m0 may be greater than 0° and less than 45°.

Size and Shape of Lens Portion

In the present modified example, the height of the vertex of at least one lens portion of the first lens portion 71, the second lens portion 72, and the third lens portion 73 differs from the heights of the vertices of the other lens portions.

In the example illustrated in FIG. 31B, a height HL3 of a vertex T3 of the third lens portion 73 is higher than a height HL1 of a vertex T1 of the first lens portion 71 and a height HL2 of a vertex T2 of the second lens portion 72. The height HL1 of the vertex T1 of the first lens portion 71 and the height HL2 of the vertex T2 of the second lens portion 72 may be the same or may be different from each other. Note that the heights HL1 to HL3 of the vertices T1 to T3 of the first lens portion 71 to the third lens portion 73, respectively, refer to the height of each vertex T1 to T3 from the upper surface 61*a* of the base portion 61, that is, the shortest distance between each of the vertices T1 to T3 and the upper surface 61*a* of the base portion 61. In the illustrated example, the heights HL1 to HL3 of the vertices T1 to T3 are the shortest distances between the vertices and the bottom surfaces of the convex shapes of the lens portions 71 to 73.

Further, in a plan view, sizes of the first lens portion 71 to the third lens portion 73 (widths WS1 to WS3 in the minor axis direction, widths WL1 to WL3 in the major axis direction) may be different from each other. Here, the width WS3 of the third lens portion 73 in the minor axis direction is larger than the widths WS1 and WS2 of the first lens portion 71 and the second lens portion 72, respectively, in the minor axis direction, and the width WL3 of the third lens portion 73 in the major axis direction is larger than the widths WL1 and WL2 of the first lens portion 71 and the second lens portion 72, respectively, in the major axis direction. The sizes of the first lens portion 71 and the second lens portion 72 in a plan view may be the same or may be different from each other.

In the example illustrated in FIG. 31B, the size of each of the lens portions 71 to 73 may be adjusted so that light emitted from the lens portion has a desired light distribution. For example, the half-value angle of the lens portion on the major axis may be in a range from 100° to 120°, and the half-value angle on the minor axis may be in a range from 50° to 70°. The heights HL1, HL2 of the vertices T1, T2 of the first and second lens portions 71, 72, respectively, are in a range from 0.3 mm to 0.5 mm and are, for example, 0.40 mm, and the height HL3 of the vertex T3 of the third lens portion 73 is in a range from 0.4 mm to 0.6 mm and is, for example, 0.50 mm. Further, the width WS1 of the first lens portion 71 in the minor axis direction is in a range from 0.6 mm to 1.0 mm and is, for example 0.8 mm, and the width WL1 of the first lens portion 71 in the major axis direction is in a range from 1.0 mm to 1.4 mm and is, for example 1.2 mm. The width WS2 of the second lens portion 72 in the minor axis direction is in a range from 0.6 mm to 1.0 mm and is, for example, 0.8 mm, and the width WL2 of the second lens portion 72 in the major axis direction is in a range from 1.0 mm to 1.4 mm and is, for example, 1.2 mm. The width WS3 of the third lens portion 73 in the minor axis direction is in a range from 0.8 mm to 1.2 mm and is, for example, 1.0 mm, and the width WL3 of the third lens portion 73 in the major axis direction is in a range from 1.4 mm to 1.8 mm and is, for example, 1.6 mm.

As described above, in a lateral side view as viewed in the x-axis direction and/or the y-axis direction, the outer edge of each of the first lens portion 71 to the third lens portion 73 may include a linear portion in addition to a curved portion. As an example, in a lateral side view as viewed in the y-axis direction, each of the lens portions 71 to 73 may include a linear portion, and in a lateral side view as viewed in the x-axis direction, each of the lens portions 71 to 73 may not include a linear portion. Further, shapes of the outer edges of the first lens portion 71 to the third lens portion 73, in a lateral side view, may be different from each other. For example, in a lateral side view as viewed in the y-axis direction, the outer edge of at least one lens portion of the first lens portion 71 to the third lens portion 73 may include a linear portion, and the outer edges of the other lens portions may not include linear portions.

A curvature of at least one lens portion of the first lens portion 71 to the third lens portion 73 may be different from the curvatures of the other lens portions. The curvatures of the first lens portion 71 to the third lens portion 73 may be different from each other. Alternatively, the first lens portion 71 to the third lens portion 73 may have the same curvature. In this description, "the curvature of the lens portion" refers to the curvature of a curved portion that, in a cross-section along the major axis direction or the minor axis direction of the lens portion including the vertex of the lens portion, includes the vertex of the outer edge of the lens portion.

According to the present modified example, the light distribution controllability of the light that passes through each the lens portions 71 to 73 and is emitted from each of the first light-emitting element 51 to the third light-emitting element 53 can be enhanced by adjusting the size (for example, the heights HL1 to HL3 of the vertices T1 to T3, the widths WS1 to WS3 in the minor axis direction, and the widths WL1 to WL3 in the major axis direction), the curvature, and the like of the corresponding lens portion 70 in accordance with the respective light emission luminance distributions of the first light-emitting element 51 to the third light-emitting element 53. Further, the light distribution controllability and the light extraction efficiency of the light-emitting device 3000 can be improved by combining a configuration, described above, that makes the direction in which the width of the light-emitting portion in the light emission luminance distribution of each of the first light-emitting element 51 to the third light-emitting element 53 becomes relatively small match the minor axis of the corresponding lens portion and makes the direction in which the width of the light-emitting portion in the light emission luminance distribution of each of the first light-emitting element 51 to the third light-emitting element 53 becomes relatively large match the major axis of the corresponding lens portion, and a configuration that makes the size of the corresponding lens portion 70 increase in accordance with the light emission luminance distribution of each of the first light-emitting element 51 to the third light-emitting element 53.

For example, when the distribution of light emitted from a certain light-emitting element through the lens portion is to be narrowed, first the curvature of the lens portion is adjusted. When the light distribution is not sufficiently narrowed by the adjustment of the curvature alone, the size of the lens portion may be made larger than those of the other lens portions. Alternatively, the size of the lens portion may be made larger without changing the curvature of the lens portion.

In a case in which the light distribution of a certain light-emitting element (here, third light-emitting element 53) is wider than the light distribution of the other light-emitting elements, the distribution of the light (here, green light) emitted through the third lens portion 73 can be narrowed by making the size of the third lens portion 73 corresponding to the third light-emitting element 53 (for example, the height HL3 of the vertex of the lens portion 73) higher than those of the other lens portions 71 and 72. For example, as illustrated in FIG. 34, in a case in which the light distribution of the third light-emitting element 53 on the line m0 is wider than the light distributions of the first and second light-emitting elements 51 and 52 on the line m0, the height HL3 of the vertex of the third lens portion 73 corresponding to the third light-emitting element 53 may be made higher than those of the other lens portions 71 and 72.

Note that, in the present modified example, the size of the third lens portion 73 is larger than those of the first lens portion 71 and the second lens portion 72, but a size relationship between the first lens portion 71 to the third lens portion 73 is not particularly limited. The sizes of these lens portions 71 to 73 can be set in accordance with the light emission luminance distribution caused by the electrode positions and the like of each of the light-emitting elements.

Of the first lens portion 71 to the third lens portion 73, the lens portion having the highest vertex (hereinafter referred to as the "highest lens portion") is preferably disposed at one end of a row in which the first lens portion 71 to the third lens portion 73 are arrayed in one direction (hereinafter, "lens row"), in a plan view. In the example illustrated in FIG. 31A, the third lens portion 73, which is the highest lens portion, is disposed at one end (here, the end on the +y-most side) of the lens row composed of the first lens portion 71 to the third lens portion 73. This makes it possible to reduce the proportion of light emitted from the other lens portions that is blocked by the highest lens portion (light from the other lens portions incident on the highest lens portion and changed in emission direction). Note that, in a case in which the heights of the vertices of the first lens portion 71 to the third lens portion 73 differ from each other, the highest lens portion may be disposed on one end of the lens row, and the lens portion having the lowest vertex height (hereinafter, referred to as "lowest lens portion") may be disposed on the other end of the lens row.

Figure 36A:
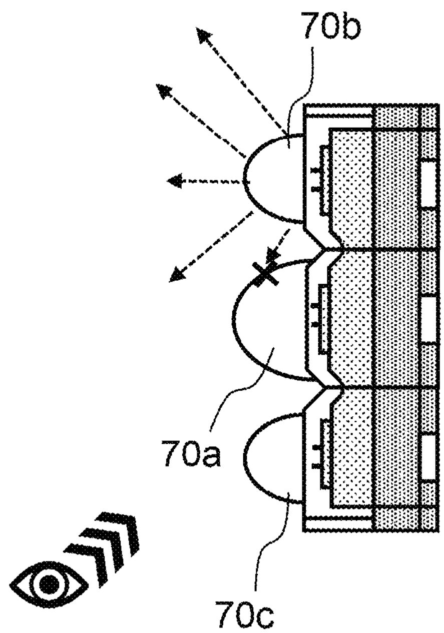
FIG. 36A is a schematic lateral side view exemplifying an array of lens portions.
Figure 36B:
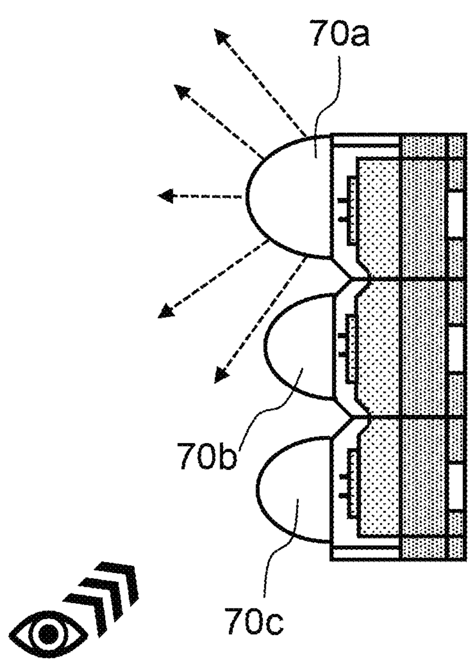
FIG. 36B is a schematic lateral side view illustrating another example of the array of the lens portions.

When the light-emitting device according to the present modified example is used in a display device such as an outdoor display, for example, three lens portions 70*a* to 70*c* of the light-emitting device may be disposed in a vertical direction of a display surface (surface from which light is emitted) of the display device. When such a display surface is viewed from below and the highest lens portion 70*a* is positioned in a center of the lens row as exemplified in FIG. 36A, a part of the light directed downward (toward a direction of an observer) from the lens portion 70*b* positioned at an upper end of the lens row is incident on the highest lens portion 70*a* and less likely to exit to the direction of the observer. In contrast, as illustrated in FIG. 36B, when the highest lens portion 70*a* is disposed at the upper end of the lens row, of the light directed downward from the lens portion (highest lens portion) 70*a* at the upper end of the lens row, the proportion of light incident on the other lens portions 70*b* and 70*c* can be reduced compared to that in the example illustrated in FIG. 36A. Accordingly, the light directed downward from each of the three lens portions 70*a* to 70*c* can be more efficiently emitted to the direction of the observer.

Figure 36C:
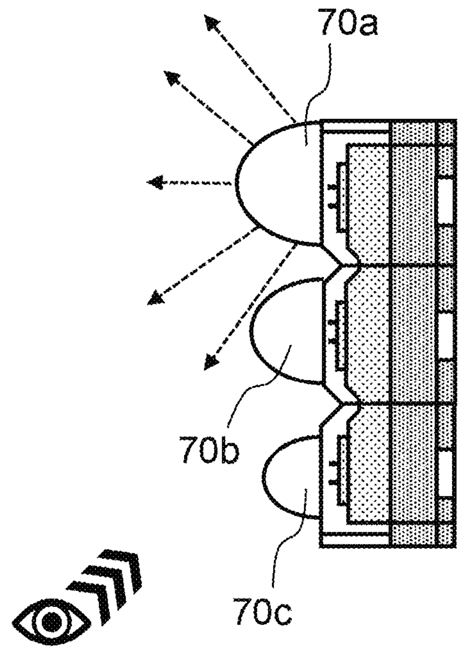
FIG. 36C is a schematic lateral side view illustrating yet another example of the array of the lens portions.

When the heights of the vertices of the three lens portions 70*a* to 70*c* are different from each other, the highest lens portion 70*a* is preferably disposed at the upper end of the lens row and the lowest lens portion 70*c* is preferably disposed at the lower end of the lens row as illustrated in FIG. 36C. This makes it possible to reduce, of the light directed downward from the lens portion (highest lens portion) 70*a* at the upper end of the lens row and the lens portion 70*b* positioned at the center, the proportion of light blocked by another lens portion.

Figure 37:
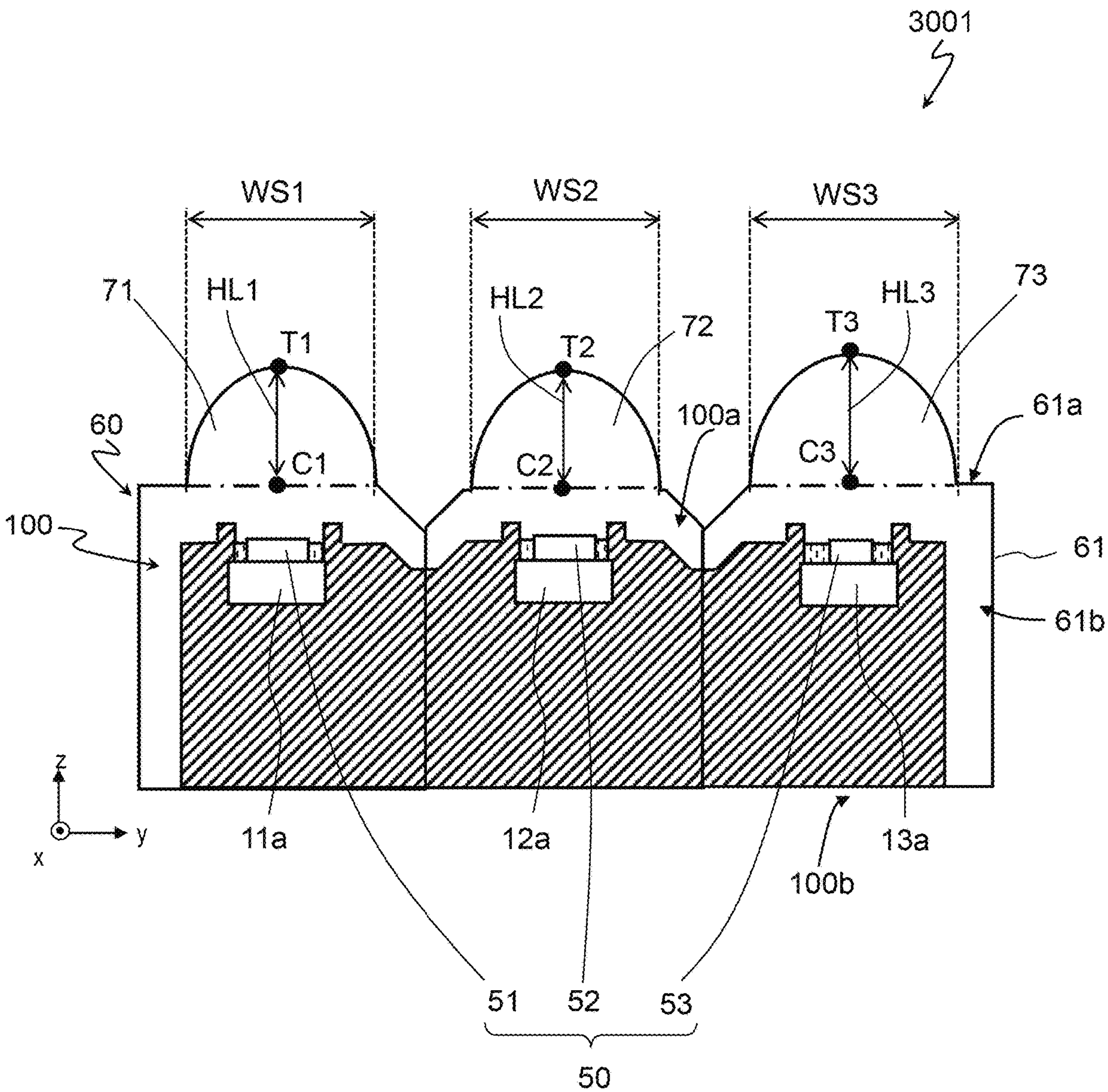
FIG. 37 is a schematic cross-sectional view of another light-emitting device of the twelfth modified example.

FIG. 37 is a schematic cross-sectional view of another light-emitting device 3001 according to the present modified example, illustrating a cross-section that includes the line m0 and is parallel to the yz plane.

The light-emitting device 3001 and the light-emitting device 3000 illustrated in FIGS. 31A and 31B differ in the shapes and the sizes of the first lens portion 71 to the third lens portion 73. The shapes, sizes, and the like of the first lens portion 71 to the third lens portion 73 are adjusted so that the light-emitting device 3001 has a light distribution that is narrower (that is, has a higher directivity) than that of the light-emitting device 3000. In this example, the sizes (heights HL1 to HL3 of the vertices, widths WS1 to WS3 in the minor axis direction, and widths WL1 to WL3 in the major axis direction) of the first lens portion 71 to the third lens portion 73 of the light-emitting device 3001 are larger than those of the light-emitting device 3000. Further, the curvatures of the first lens portion 71 to the third lens portion 73 of the light-emitting device 3001 are smaller than the curvatures of the first lens portion 71 to the third lens portion 73 of the light-emitting device 3000.

In the example illustrated in FIG. 37, the size of each lens portion 71 to 73 may be adjusted so that the light emitted from the lens portion has a desired light distribution. For example, the half-value angle on the major axis of the lens portion may be in a range from 800 to less than 100°, and the half-value angle on the minor axis may be in a range from 350 to less than 50°. The heights HL1 and HL2 of the vertices T1 and T2 of the first and second lens portions 71 and 72, respectively, are in a range from 0.6 mm to 0.8 mm and are, for example, 0.7 mm, and the height HL3 of the vertex T3 of the third lens portion 73 is in a range from 0.8 mm to 1.0 mm and is, for example, 0.9 mm. Further, the width WS1 of the first lens portion 71 in the minor axis direction is in a range from 0.8 mm to 1.2 mm and is, for example, 1.0 mm, and the width WL1 of the first lens portion 71 in the major axis direction is in a range from 1.2 mm to 1.6 mm and is, for example, 1.4 mm. The width WS2 of the second lens portion 72 in the minor axis direction is in a range from 0.8 mm to 1.2 mm and is, for example 1.0 mm, and the width WL2 of the second lens portion 72 in the major axis direction is in a range from 1.3 mm to 1.7 mm and is, for example, 1.5 mm. The width WS3 of the third lens portion 73 in the minor axis direction is in a range from 1.0 mm to 1.4 mm and is, for example, 1.2 mm, and the width WL3 of the third lens portion 73 in the major axis direction is in a range from 1.6 mm to 2.0 mm and is, for example, 1.8 mm.

Note that, in the present modified example, the arrangement (inclination angle α relative to the line m0) of at least one light-emitting element of the first light-emitting element 51 to the third light-emitting element 53 is made to differ from those of the other light-emitting elements in accordance with the light emission luminance distribution of the first light-emitting element 51 to the third light-emitting element 53, and the sizes of the first lens portion 71 to the third lens portion 73 may be the same. Alternatively, the sizes of at least one lens portion of the first lens portion 71 to the third lens portion 73 is made to differ from those of the other lens portions in accordance with the light emission luminance distribution of the first light-emitting element 51 to the third light-emitting element 53, and the inclination angles α relative to the line m0 of the first light-emitting element 51 to the third light-emitting element 53 may be the same.

Figure 38:
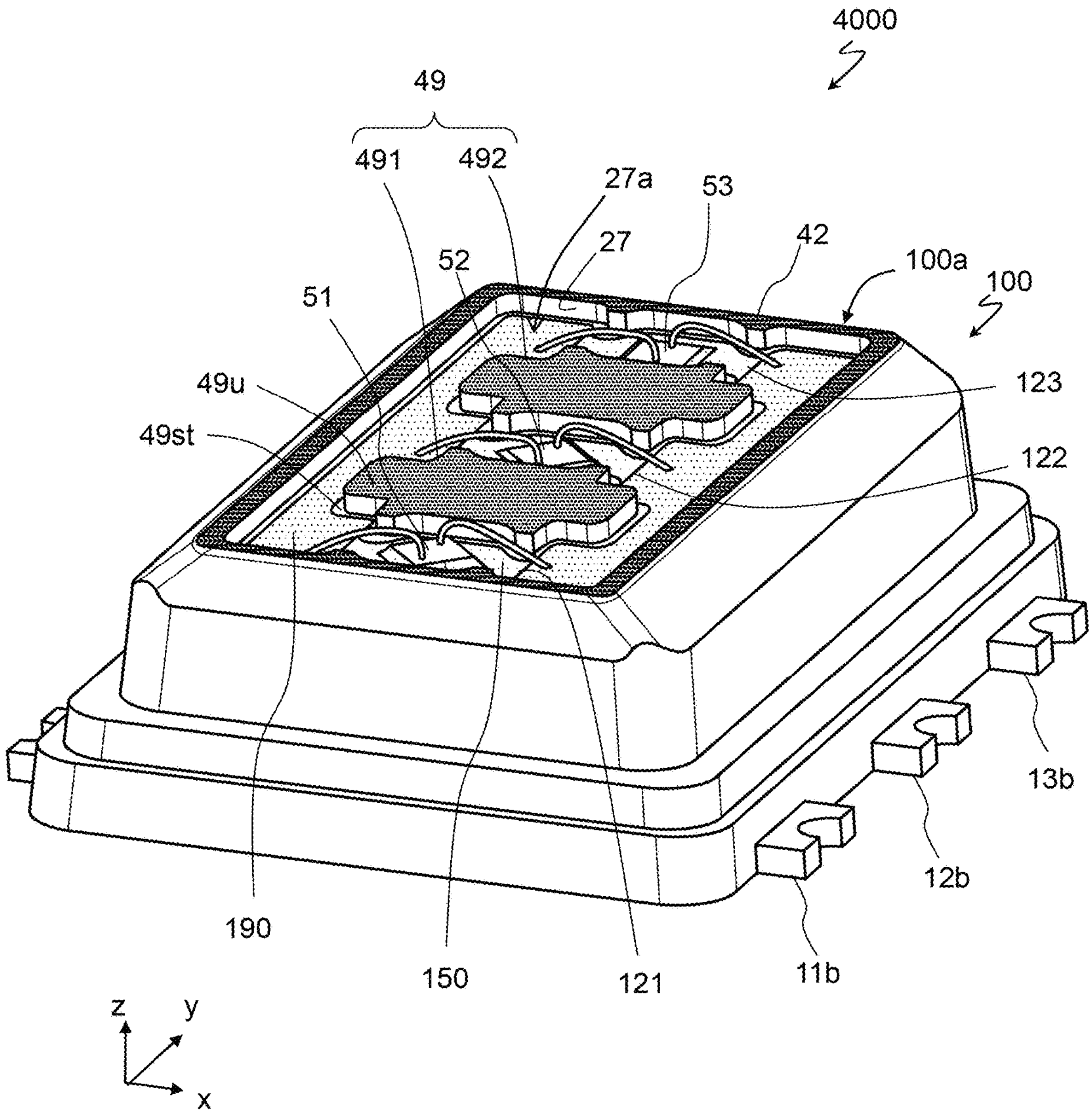
FIG. 38 is a schematic perspective view of a light-emitting device according to a thirteenth modified example, with the mold resin portion removed.
Figure 39A:
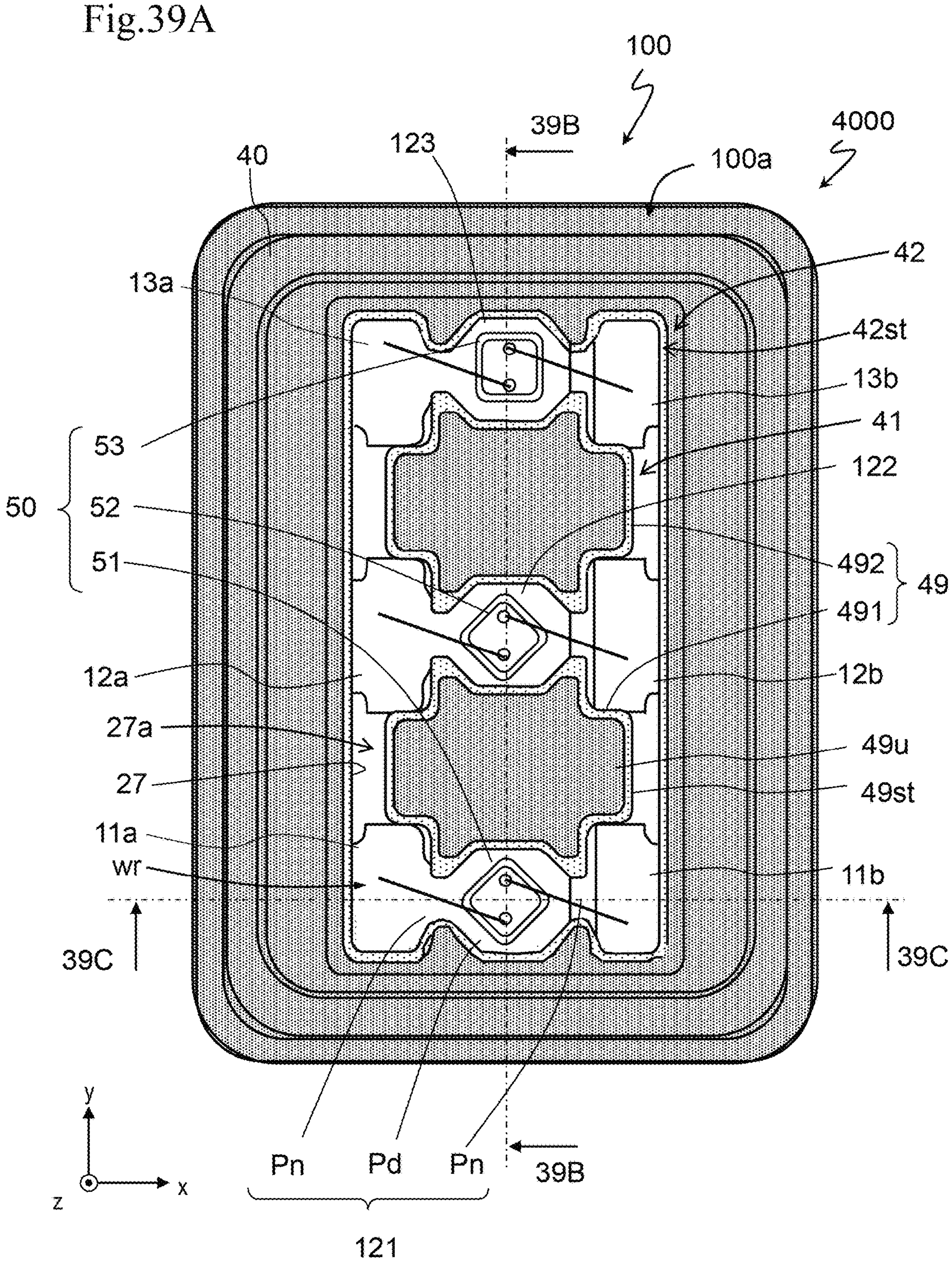
FIG. 39A is a schematic top view of the light-emitting device illustrated in FIG. 38.
Figure 39B:
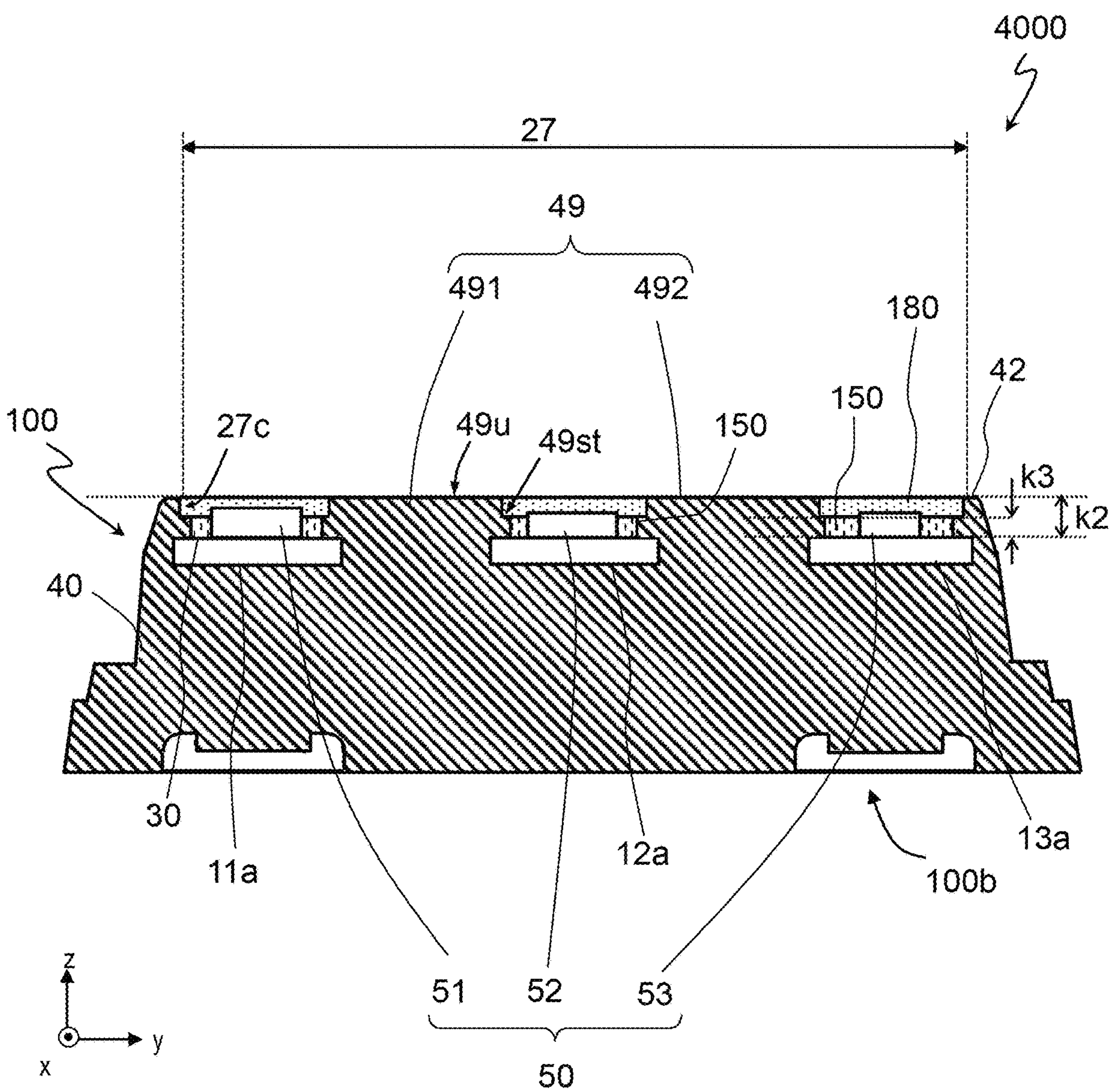
FIG. 39B is a schematic cross-sectional view taken along line 39B-39B illustrated in FIG. 39A.
Figure 39C:
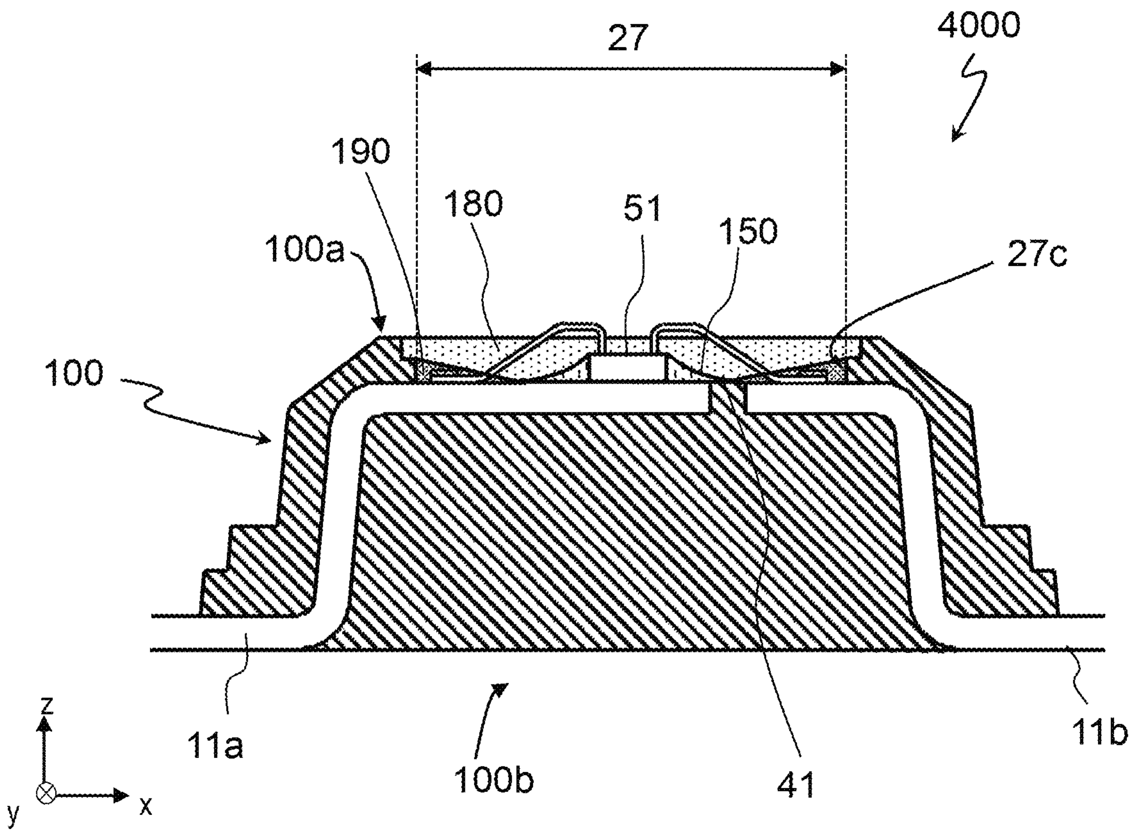
FIG. 39C is a schematic cross-sectional view taken along line 39C-39C illustrated in FIG. 39A.

FIG. 38 is a schematic perspective view of a light-emitting device 4000 according to a thirteenth modified example, with the mold resin portion removed. FIG. 39A is a schematic top view of the light-emitting device illustrated in FIG. 38. FIG. 39B is a schematic cross-sectional view taken along line 39B-39B illustrated in FIG. 39A. FIG. 39C is a schematic cross-sectional view taken along line 39C-39C illustrated in FIG. 39A.

The light-emitting device 4000 differs from the light-emitting devices 2000 to 2008 described above in that, on the primary surface 100*a* of the resin package 100, the first resin portion 41 positioned on an inner upper surface 27*a* of the recessed portion 27 includes at least one protruding portion 49. For example, in a plan view, the protruding portion 49 is spaced apart from the inner lateral surface 27*c* of the recessed portion 27.

In the example illustrated in FIG. 39A, in the recessed portion 27, the first resin portion 41 includes a plurality of (here, two) protruding portions 49 spaced apart from each other. A part or all of the plurality of protruding portions 49 may be positioned between two adjacent light-emitting elements of the plurality of light-emitting elements 50. An upper surface 49*u* of each protruding portion 49 is positioned above the exposed regions 30 of the leads. A portion of the first resin portion 41 other than the protruding portions 49 may be, for example, substantially flush with the exposed regions 30 of the leads. Substantially flush means that errors due to dimensional tolerances, manufacturing tolerances, and material tolerances are included within a permissible range. At least a part of a lateral surface of each protruding portion 49 may be in contact with the reflective member 150. The lateral surface of the protruding portion 49 may be exposed from the reflective member 150.

In the example illustrated in FIG. 38, a height of an upper surface 49*u* of the protruding portion 49 is the same as the height of the upper surface of the second resin portion 42 surrounding the inner upper surface 27*a* of the recessed portion 27. With the upper surface 49*u* of the protruding portion 49 positioned above the upper surfaces of the light-emitting elements 50 (here, at the same height as the upper surface of the second resin portion 42), the region in which the reflective member 150 is disposed in the recessed portion 27 is easily controlled. The "height of the upper surface 49*u* of the protruding portion 49" and the "height of the upper surface of the second resin portion 42" can be defined by, for example, a distance from the back surface

100*b* of the resin package 100 to the upper surface in the z-axis direction. The upper surface 49*u* of the at least one protruding portion 49 is positioned above the upper surface of the light-emitting element 50.

In the example illustrated in FIG. 39A, a plurality of (here, two) protruding portions 49 are disposed in the recessed portion 27. The two protruding portions 49 include, in a plan view, a protruding portion 491 positioned between the first region 121 and the second region 122 and a protruding portion 492 positioned between the second region 122 and the third region 123. Each of the protruding portions 491 and 492 is spaced apart from the second resin portion 42, which is a sidewall of the recessed portion 27.

The reflective member 150 is disposed in each of the first region 121 to the third region 123. The reflective member 150 disposed in each of the first region 121 to the third region 123 may be spaced apart from each other by the protruding portions 49. For example, the reflective member 150 may not be disposed between the inner lateral surface 27*c* of the recessed portion 27 in the y-axis direction and the lateral surface of the protruding portion 49 in the y-axis direction. Note that the reflective member 150 may be disposed continuously in the recessed portion 27.

According to the present modified example, in a plan view, the reflective member 150 is disposed in a region of the inner upper surface 27*a* of the recessed portion 27 excluding regions in which the protruding portions 49 are formed. With this structure, the volume of the reflective member 150 can be reduced. Thus, it is possible to reduce a stress on the light-emitting elements 50 that occurs during the manufacturing step and reduce the lifting of the light-emitting elements 50 from the leads 11. Further, with the first resin portion 41 including the protruding portions 49 in the inner upper surface 27*a* of the recessed portion 27, the reflective members 150 can include holes or grooves corresponding to the protruding portions 49 and can be arranged in two or more regions spaced apart from each other with the protruding portions 49 interposed therebetween. Therefore, during the manufacture or mounting of the light-emitting device 4000, defects caused by the stress that occurs between the reflective member 150 and the light-emitting elements 50 can be reduced.

In the example illustrated in FIG. 38, at least the upper surface 49*u* of the protruding portion 49 is exposed from the reflective member 150. Accordingly, in a plan view, an area of the reflective member 150 occupying the inner upper surface 27*a* of the recessed portion 27 can be reduced, and thus the display contrast can be further improved. In a case in which the light-transmissive resin member 180 is disposed on the reflective member 150 in the recessed portion 27, at least a part of the upper surface of the protruding portion 49 may be exposed from the light-transmissive resin member 180. The exposed portion of the protruding portion 49 may be in contact with the mold resin portion.

In a plan view of the primary surface 100*a* of the resin package 100, each protruding portion 49 may include a portion positioned between two adjacent leads of the plurality of leads and a portion that overlaps each of the two adjacent leads. In the example illustrated in FIG. 39A, the protruding portion 491 includes a portion overlapping each of the leads 11*a*, 11*b*, 12*a*, and 12*b*, and a portion positioned between these leads, in a plan view. Further, the protruding portion 492 includes a portion overlapping each of the leads 12*a*, 12*b*, 13*a*, and 13*b*, and a portion positioned between these leads, in a plan view. This makes it possible to reduce the lifting of the lead frame from the first dark-colored resin member 40 by the protruding portions 491 and 492 during the manufacture of the resin package 100.

Below, a planar shape of the protruding portion 49 will be described with reference to FIG. 39A. The protruding portion 49 includes a first width portion, second width portions, and third width portions, each having a different width in the y-axis direction. The first width portion faces the light-emitting element 50. The second width portions are positioned on the +x side and the −x side of the light-emitting element 50 and sandwich the light-emitting element 50 therebetween in a plan view. The third width portions are positioned at the very end in the x-axis direction in a plan view. The first width portion has a shorter width in the y-axis direction than the second width portion. The second width portions have longer widths in the y-axis direction than the third width portions. The first width portion has a longer width in the y-axis direction than the third width portions. This makes it possible to dispose the first width portion and the light-emitting element 50 close to each other in a plan view, and reduce the volume of the reflective member 150 disposed between the first width portion and the light-emitting element 50. Thus, it is possible to reduce the stress on the light-emitting elements 50 that occurs during the manufacturing step and reduce the lifting of the light-emitting elements 50 from the leads 11. Further, in a plan view, a distance from each third width portion to the second resin portion 42 in the y-axis direction can be made longer. This makes it possible to enlarge the region of the connection region wr. Thus, the connection region and the wire can be easily bonded. Note that the first width portion and each third width portion may have the same width in the y-axis direction. Furthermore, in the lateral surface of each protruding portion 49, the first resin portion 41 may include a step surface 49*st* oriented in the same direction as the primary surface 100*a*. In a cross-sectional view, each protruding portion 49 includes a lateral surface having a stepped shape, and the step surface 49*st* is an upward facing surface corresponding to a tread of a step. The upper surface of the light-emitting element 50 may be positioned above the step surface 49*st*. By providing the step surface 49*st* that is lower than the upper surface of the light-emitting element 50, it is possible to reduce the rise of the reflective member 150 to the upper surface of the light-emitting element 50. As an example, a distance k2 between the upper surface 49*u* of the protruding portion 49 and the exposed region 30 in the z-axis direction is 0.2 mm, and a distance k3 between the step surface 49*st* of the protruding portion 49 and the exposed region 30 in the z-axis direction is 0.1 mm. For example, the step surface 49*st* surrounds the upper surface 49*u* of the protruding portion 49, in a plan view. For example, in a plan view, a shape of an outer edge of the step surface 49*st* of the protruding portion 49 is similar to a shape of an outer edge of the upper surface 49*u* of the protruding portion 49.

The second resin portion 42 may include a step surface 42*st* oriented in the same direction as the primary surface 100*a*, between the second resin portion 42 and the inner upper surface 27*a* in a plan view. A height of the step surface 42*st* may be the same as the height of the step surface 49*st* of the protruding portion 49.

In the example illustrated in FIG. 39A, the first region 121 is defined by a lateral surface (lateral surface in the x-axis direction) of the second resin portion 42 and a lateral surface of the protruding portion 491, the second region 122 is defined by lateral surfaces (lateral surfaces in the x-axis direction) of the protruding portions 491 and 492, and the third region 123 is defined by the lateral surface (lateral surface in the x-axis direction) of the second resin portion 42 and the lateral surface of the protruding portion 492. In a plan view, each of the first region 121 to the third region 123 may include a portion Pd where the corresponding light-emitting element 50 is positioned, and two constricted portions Pn positioned on the +x side and the −x side of the portion Pd. A width of each constricted portion Pn in the y-axis direction is smaller than a width of the portion Pd in the y-axis direction. This makes it easy to utilize capillary action to dispose, via the constricted portions Pn, the first resin material that is to become the reflective member 150 in a region close to each of the light-emitting elements 50. A planar shape of the second resin portion 42 will now be described. The second resin portion 42 extending in the x-axis direction includes a narrow portion facing the light-emitting element 50 and a wide portion having a width wider than the narrow portion in the y-axis direction. Here, an example is illustrated in which a portion extending in the +y direction is included as the wide portion of the second resin portion 42. However, the wide portion of the second resin portion 42 may include a portion extending in the −y direction. The wide portion of the second resin portion 42 faces the second width portion of the protruding portion 49. Thus, the constricted portions Pn and the portion Pd are defined. For example, the wide portions of the two second resin portions 42 sandwich the light-emitting element 50 therebetween.

Figure 39D:
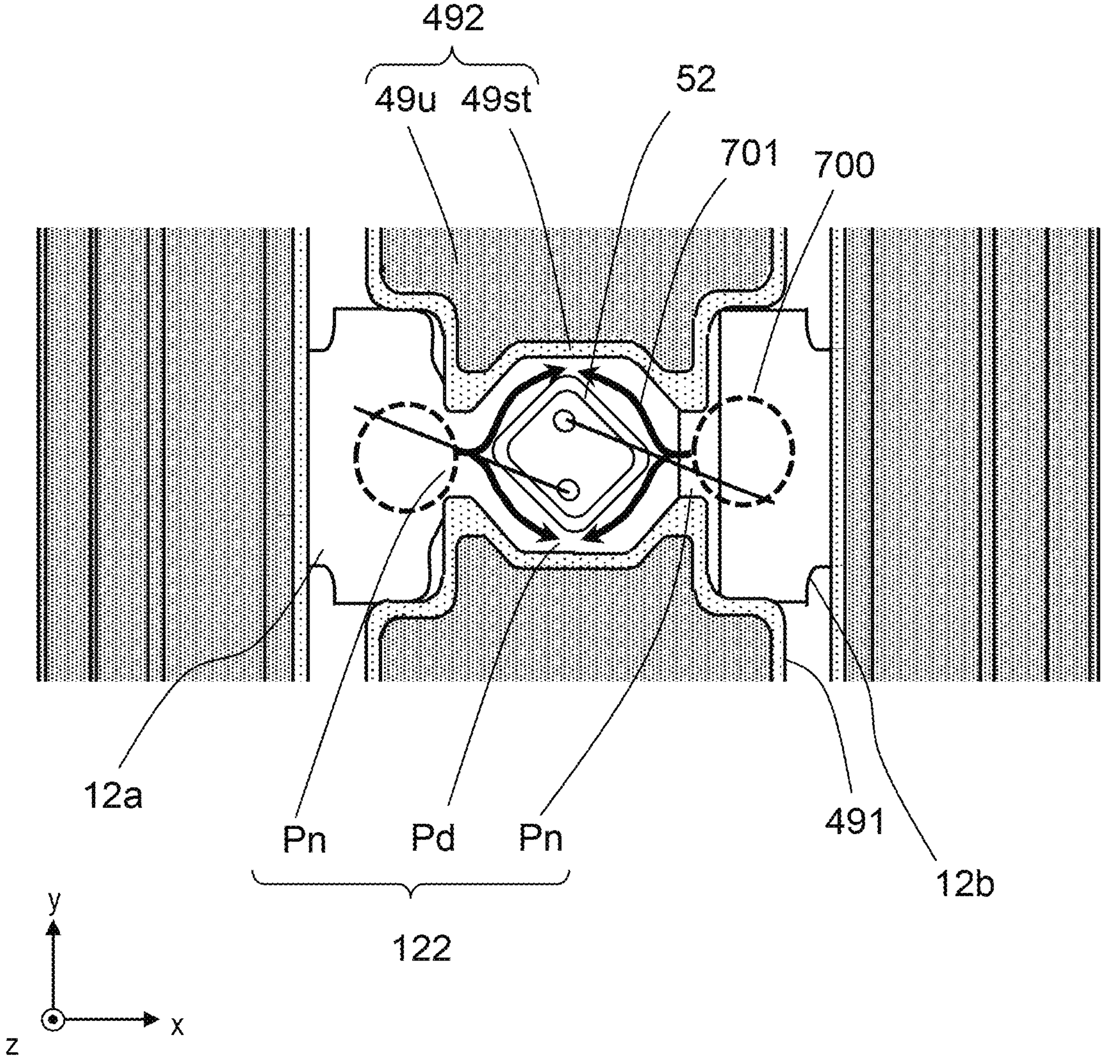
FIG. 39D is an enlarged schematic top view illustrating a part of the light-emitting device illustrated in FIG. 38.

An example of a method of arranging the reflective members 150 will be described below with reference to FIG. 39D by using the second region 122 as an example. In the light-emitting device 4000, for example, regions positioned on the +x side and the −x side of the second region 122 (regions that are to become the connection regions wr) can each be used as a nozzle arrangement region 700 in which a nozzle for applying the first resin material is arranged. The first resin material is a resin material that is to be cured and to become the reflective member 150. When the nozzle is placed in each of the nozzle arrangement regions 700 and the first resin material is ejected, the first resin material flows through the constricted portion Pn and into the portion Pd of the second region 122 by capillary action, as indicated by arrows 701. The first resin material flowing in from the constricted portions Pn enters around between the lateral surface of the second light-emitting element 52 and the lateral surface of the protruding portion 491 and around between the lateral surface of the second light-emitting element 52 and the lateral surface of the protruding portion 492. In this way, it is possible to arrange the reflective member 150 in a space between the lateral surface of the second light-emitting element 52 and the lateral surface of the protruding portion 491 and a space between the lateral surface of the second light-emitting element 52 and the lateral surface of the protruding portion 492.

The mold resin portion may include a portion disposed in each of the constricted portions Pn. A surface area of the second resin portion 42 is increased by an amount equivalent to that of the constricted portions Pn, making it possible to increase a contact area with the mold resin portion. By the presence of the constricted portions Pn, an adhesive force between the mold resin portion and the resin package 100 can be increased, making it possible to fix the mold resin portion more stably to the resin package 100.

In the example illustrated in FIG. 38, in the recessed portion 27, the second dark-colored resin member 190 is disposed in a region defined by a portion of the lateral surface of each protruding portion 49 that extends in the y-axis direction and a lateral surface of the second resin portion 42. The plurality of leads 11*a* to 13*b* can be covered by the second dark-colored resin member 190. Thus, the contrast of the light-emitting device 4000 can be improved. By including a difference in width in the y-axis direction between the second width portion and the third width portion in the protruding portion 49, it is possible to reduce the overlapping of the second dark-colored resin member 190 on the upper surface of the light-emitting element 50. Note that the second dark-colored resin member 190 may not be disposed.

Figure 40:
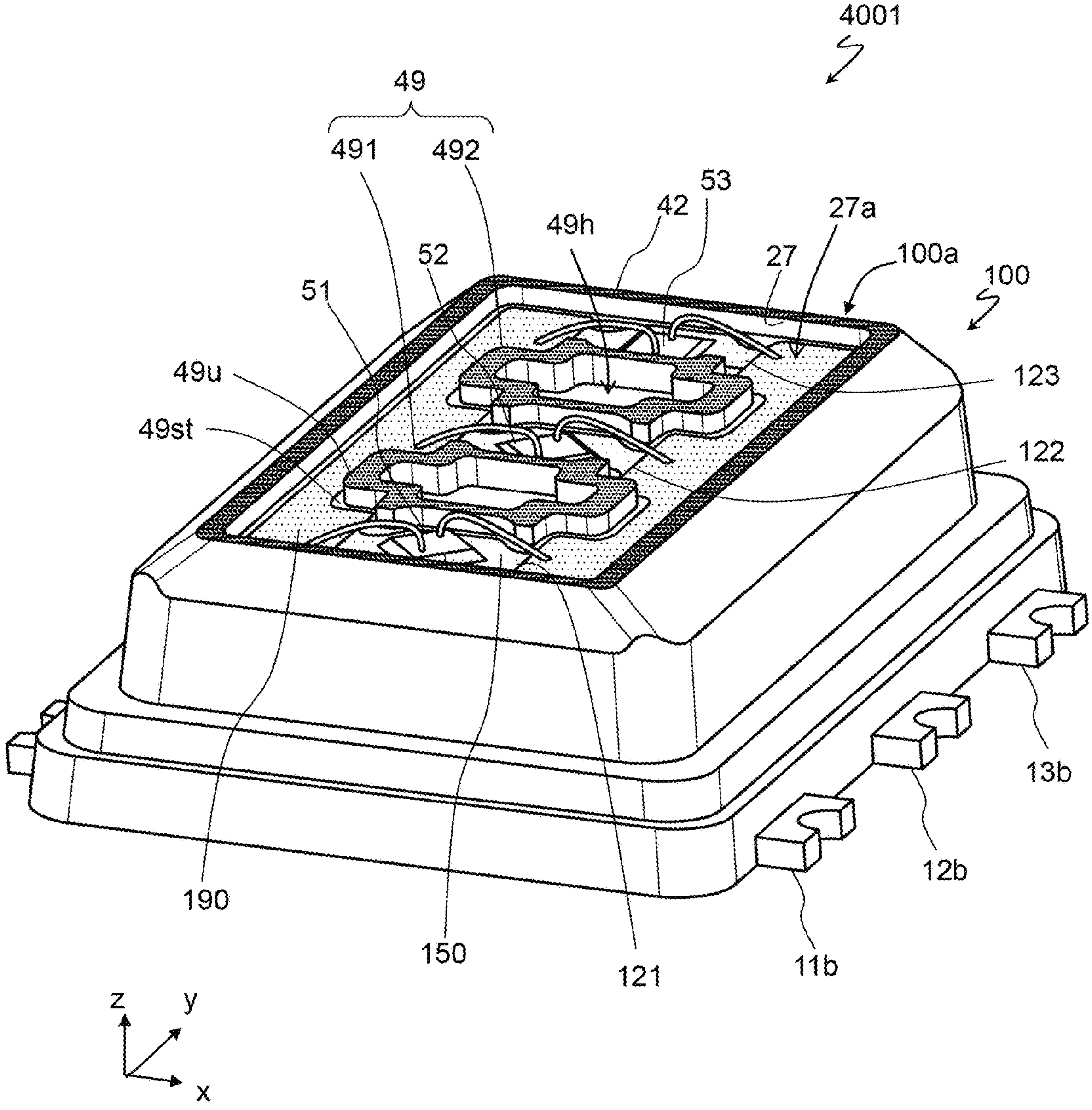
FIG. 40 is a schematic perspective view of another light-emitting device according to a thirteenth modified example, with the mold resin portion removed.

FIG. 40 is a schematic perspective view of another light-emitting device 4001 according to a thirteenth modified example, with the mold resin portion removed. The light-emitting device 4001 differs from the light-emitting device 4000 illustrated in FIG. 38 in that, on the primary surface 100*a* of the resin package 100, the upper surface 49*u* of the at least one protruding portion 49 includes a depression 49*h*.

For example, the mold resin portion 60 includes a portion positioned in an interior of the depression 49*h* of each protruding portion 49. At this time, an inner surface of the depression 49*h* is in contact with the mold resin portion. For example, when the mold resin portion is formed, a resin material that is to become the mold resin portion is applied so as to fill the depression 49*h* of each protruding portion 49, and then cured. This makes it possible to increase the adhesive force between the mold resin portion and the resin package 100 (anchor effect). Accordingly, the mold resin portion can be more stably fixed to the resin package 100. Note that the interior of the depression 49*h* may be in contact with the light-transmissive resin member 180. The light-transmissive resin member 180 may be disposed in a part of the interior of the depression 49*h*, and the mold resin portion may be disposed in another part of the interior of the depression 49*h*. In the example illustrated in FIG. 40, an inner upper surface of the depression 49*h* has a cross shape in which a portion extending in the x-axis direction and a portion extending in the y-axis direction intersect in a plan view. In this way, the anchor effect can be further improved. In a top view, a shape of an opening of the recessed portion 27 is, for example, substantially rectangular. In the example illustrated in FIG. 40, an outer edge of the recessed portion 27 is rounded at corner portions of the rectangle (quadrangle with rounded corners). Further, in the example illustrated in FIG. 40, the second resin portion 42 extending in the x-axis direction is linear. In the example illustrated in FIG. 40, a width in the y-axis direction of the second resin portion 42 extending in the x-axis direction in a plan view is constant. Note that a part of the second resin portion 42 in the shape of the opening of the recessed portion 27 may have a deformed shape. For example, the second resin portion 42 may partially or fully include a curved line in a plan view or may have an elliptical shape in a plan view.

Figure 41:
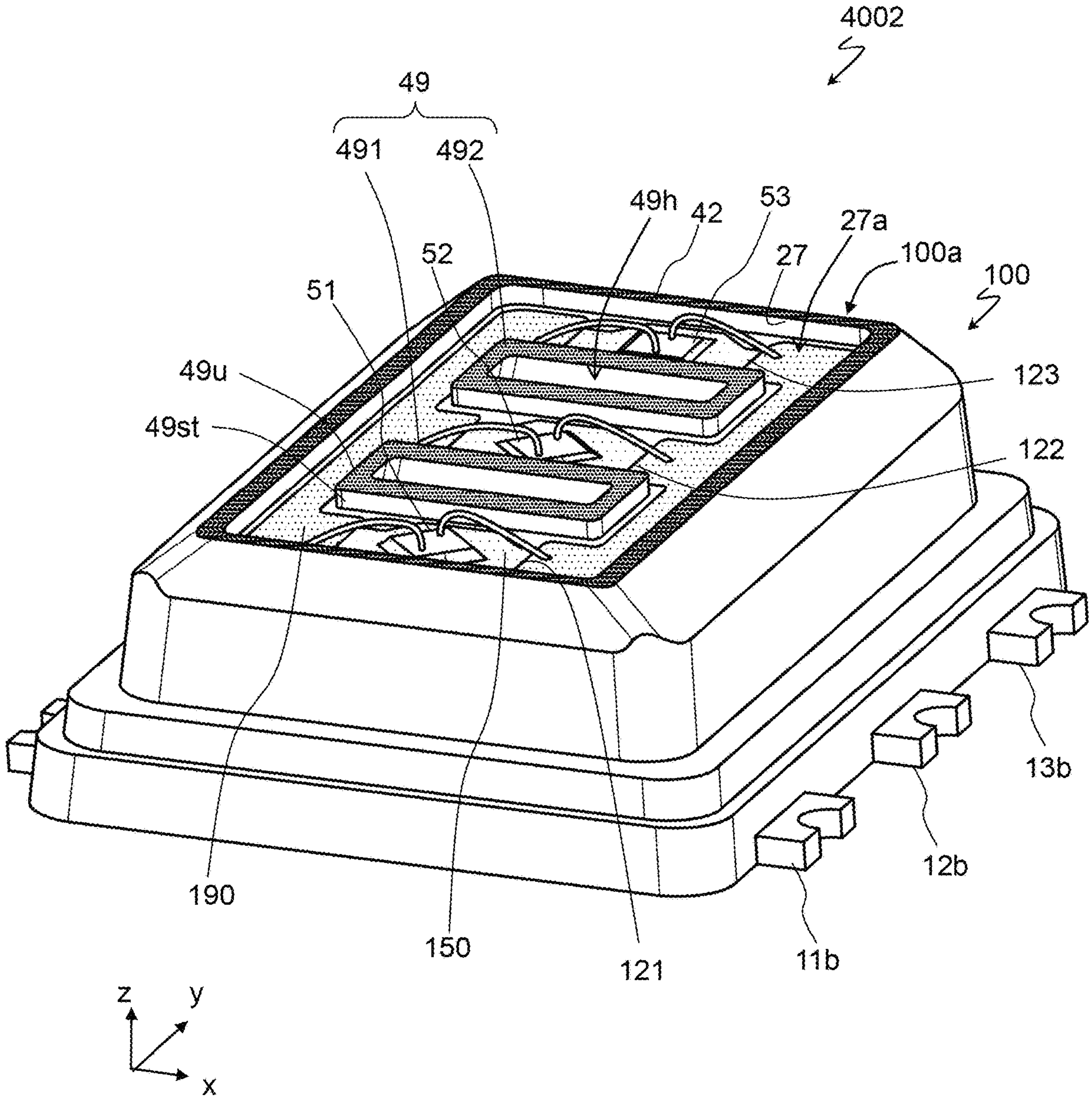
FIG. 41 is a schematic perspective view of yet another light-emitting device of the thirteenth modified example, with the mold resin portion removed.

FIG. 41 is a schematic perspective view of yet another light-emitting device 4002 according to the thirteenth modified example, with the mold resin portion removed. The light-emitting device 4002 differs from the light-emitting device 4001 illustrated in FIG. 40 in that, in a plan view, an outer edge of each of the two protruding portions 49 disposed in the recessed portion 27 of the resin package 100 has rectangular shape. In the example illustrated in FIG. 41, an outer edge of the depression 49*h* of each protruding portion 49 has rectangular shape.

According to the light-emitting device 4002, respective widths of the first region 121 to the third region 123 in the y-axis direction can be made larger than those of the light-emitting device 4001. Accordingly, for example, respectively arranging the light-emitting elements 50, which are covered at lateral surfaces by the reflective members 150 in advance, in the first region 121 to the third region 123 is relatively easy.

In the example illustrated in FIG. 41, in a cross-section parallel to the yz plane, a width of the opening of the depression 49*h* may be greater than a width of a bottom portion (inner upper surface) of the depression 49*h*. This makes it easy to fill the interior of the depression 49*h* with the resin material that is to become the mold resin portion. Note that a width of an opening of the depression 49*h* may be the same as or may be smaller than a width of a bottom portion of the depression 49*h*. In the example illustrated in FIG. 41, an inner lateral surface of the depression 49*h* is a flat surface inclined relative to the xz plane. The depression 49*h* has a cross-sectional shape that is V-shaped, for example.

The light-emitting device according to the present disclosure can be suitably used as a light-emitting device in various applications. In particular, the light-emitting device according to the present disclosure is suitably used in a display device such as an LED display. The LED display is utilized for billboards, large televisions, advertisements, traffic signs, stereoscopic display devices, and lighting devices, for example.

What is claimed is:

1. A light-emitting device comprising:
- a resin package comprising:
  - a plurality of leads, and
  - a resin member configured to fix at least a part of the plurality of leads,
  - the resin package being provided, on a primary surface, with a plurality of recessed portions comprising a first recessed portion, a second recessed portion, and a third recessed portion each being defined by the resin member and the plurality of leads,
  - an inner upper surface of each of the first recessed portion, the second recessed portion, and the third recessed portion comprising an exposed region where a part of any one of the plurality of leads is exposed;
- a first light-emitting element disposed in the exposed region of the first recessed portion;
- a second light-emitting element disposed in the exposed region of the second recessed portion;
- a third light-emitting element disposed in the exposed region of the third recessed portion;
- a first reflective member disposed in the first recessed portion and surrounding, in a plan view, the first light-emitting element;
- a second reflective member disposed in the second recessed portion and surrounding, in the plan view, the second light-emitting element;
- a third reflective member disposed in the third recessed portion and surrounding, in the plan view, the third light-emitting element; and
- a mold resin portion comprising:
  - a first lens portion positioned above the first light-emitting element,
  - a second lens portion positioned above the second light-emitting element, and
  - a third lens portion positioned above the third light-emitting element,
  - the first lens portion, the second lens portion, and the third lens portion each having a convex shape protruding upward from the primary surface,
- in the plan view,
- a maximum width of the first lens portion being less than a maximum width of the inner upper surface of the first recessed portion,
- a maximum width of the second lens portion being less than a maximum width of the inner upper surface of the second recessed portion,
- a maximum width of the third lens portion being less than a maximum width of the inner upper surface of the third recessed portion.

2. The light-emitting device according to claim 1, wherein in the plan view,
- the inner upper surface of each of the first recessed portion, the second recessed portion, and the third recessed portion has a shape longer in one direction than in another direction, and a width of each inner upper surface in a longer direction is at least 1.5 times a width in a shorter direction.

3. The light-emitting device according to claim 1, wherein in the plan view,
- the inner upper surface of each of the first recessed portion, the second recessed portion, and the third recessed portion has a shape longer in one direction than in another direction, a width of the inner upper surface of each of the first recessed portion, the second recessed portion, and the third recessed portion in a longer direction is greater than a maximum width of corresponding one of the first lens portion, the second lens portion and the third lens portion in a longer direction, and a width of the inner upper surface of each of the first recessed portion, the second recessed portion, and the third recessed portion in a shorter direction is less than a maximum width of corresponding one of the first lens portion, the second lens portion and the third lens portion in a shorter direction.

4. The light-emitting device according to claim 1, wherein in the plan view,
- the first lens portion overlaps the first light-emitting element and at least a part of the first reflective member,
- the second lens portion overlaps the second light-emitting element and at least a part of the second reflective member, and
- the third lens portion overlaps the third light-emitting element and at least a part of the third reflective member.

5. The light-emitting device according to claim 4, wherein in the plan view,
- a part of the first reflective member is positioned outward of the first lens portion,
- a part of the second reflective member is positioned outward of the second lens portion, and
- a part of the third reflective member is positioned outward of the third lens portion.

6. The light-emitting device according to claim 1, wherein
- a width of the first lens portion in a cross-section where the width of the first lens portion is minimized, among cross-sections comprising a line connecting a vertex of the first lens portion and a center point, in the plan view, of the first lens portion, is no greater than 5 times a width of the first light-emitting element,
- a width of the second lens portion in a cross-section where the width of the second lens portion is minimized, among cross-sections comprising a line connecting a vertex of the second lens portion and a center point, in the plan view, of the second lens portion, is no greater than 5 times a width of the second light-emitting element, and a width of the third lens portion in a cross-section where the width of the third lens portion is minimized, among cross-sections comprising a line connecting a vertex of the third lens portion and a center point, in the plan view, of the third lens portion, is no greater than 5 times a width of the third light-emitting element.

7. The light-emitting device according to claim 1, wherein the inner upper surface of the first recessed portion comprises a first connection region and a second connection region where parts of corresponding two leads of the plurality of leads are respectively exposed, and the first light-emitting element is electrically connected to the first connection region and the second connection region by a wire.

8. The light-emitting device according to claim 7, wherein the first recessed portion comprises a resin wall formed of the resin member in an interior of the first recessed portion, the resin wall is positioned between the first light-emitting element and at least one of the first connection region or the second connection region in the plan view, and a side wall of the resin wall proximate to the first light-emitting element is in contact with the first reflective member.

9. The light-emitting device according to claim 8, wherein the plurality of recessed portions on the primary surface of the resin package further comprise at least one fourth recessed portion positioned in a region different from regions of the first recessed portion, the second recessed portion, and the third recessed portion, an inner upper surface of the at least one fourth recessed portion comprises a connection region where a part of any one of the plurality of leads is exposed, and at least one light-emitting element of the first light-emitting element, the second light-emitting element, or the third light-emitting element is electrically connected to the connection region of the at least one fourth recessed portion by a wire.

10. The light-emitting device according to claim 1, wherein the first light-emitting element emits first light, the second light-emitting element emits second light, the third light-emitting element emits third light, the first light, the second light, and the third light have wavelengths different from one another, and the light-emitting device further comprises:

a first colored resin member disposed in the first recessed portion and having a color similar to the first light, a second colored resin member disposed in the second recessed portion and having a color similar to the second light, and a third colored resin member disposed in the third recessed portion and having a color similar to the third light.

11. A light-emitting device comprising:

a resin package comprising:

a plurality of leads, and a resin member configured to fix at least a part of the plurality of leads, the resin package being provided, on a primary surface, with a first region, a second region, and a third region each being defined by the resin member and the plurality of leads, the first region, the second region, and the third region each comprising an exposed region where a part of any one of the plurality of leads is exposed;

a first light-emitting element disposed in the exposed region of the first region;

a second light-emitting element disposed in the exposed region of the second region;

a third light-emitting element disposed in the exposed region of the third region;

a first reflective member disposed in the first region and surrounding, in a plan view, the first light-emitting element;

a second reflective member disposed in the second region and surrounding, in the plan view, the second light-emitting element;

a third reflective member disposed in the third region and surrounding, in the plan view, the third light-emitting element; and a mold resin portion comprising:

a first lens portion positioned above the first light-emitting element, a second lens portion positioned above the second light-emitting element, and a third lens portion positioned above the third light-emitting element, the first lens portion, the second lens portion, and the third lens portion each having a convex shape protruding upward from the primary surface, a width of the first lens portion in a cross-section where the width of the first lens portion is minimized, among cross-sections comprising a line connecting a vertex of the first lens portion and a center point, in the plan view, of the first lens portion, being no greater than 5 times a width of the first light-emitting element, a width of the second lens portion in a cross-section where the width of the second lens portion is minimized, among cross-sections comprising a line connecting a vertex of the second lens portion and a center point, in the plan view, of the second lens portion, being no greater than 5 times a width of the second light-emitting element, a width of the third lens portion in a cross-section where the width of the third lens portion is minimized, among cross-sections comprising a line connecting a vertex of the third lens portion and a center point, in the plan view, of the third lens portion, being no greater than 5 times a width of the third light-emitting element.

12. The light-emitting device according to claim 11, wherein on the primary surface of the resin package, the resin member comprises a plurality of resin walls spaced apart from each other, and the plurality of resin walls comprise, in the plan view, at least one first resin wall defining a part of a peripheral edge of the first reflective member, at least one second resin wall defining a part of a peripheral edge of the second reflective member, and at least one third resin wall defining a part of a peripheral edge of the third reflective member.

13. The light-emitting device according to claim 12, wherein in the plan view, the at least one first resin wall comprises a pair of first resin walls facing each other across the first light-emitting element, and at least a part of the first reflective member is positioned between the pair of first resin walls.

14. The light-emitting device according to claim 13, wherein the pair of first resin walls face each other across the first light-emitting element in a first direction in the plan view, the first region comprises, in the plan view, a first portion positioned between the pair of first resin walls and where the first light-emitting element is disposed, and a pair of second portions each positioned across the first portion in a second direction orthogonal to the first direction, each of the pair of second portions is in contact with the first portion, and a width of each of the pair of second portions in the first direction is greater than or equal to a width of the first portion in the first direction.

15. The light-emitting device according to claim 14, wherein the primary surface of the resin package comprises at least one third portion at least partially in contact with the pair of second portions in the plan view, and an upper surface of the at least one third portion is positioned below an upper surface of each of the pair of second portions.

16. The light-emitting device according to claim 15, wherein in the plan view, the at least one third portion comprises two third portions each positioned across the pair of second portions in the first direction and each defining a width of corresponding one of the pair of second portions in the first direction.

17. The light-emitting device according to claim 12, wherein each of the first light-emitting element, the second light-emitting element, and the third light-emitting element has a quadrangular planar shape, and the at least one first resin wall comprises two pairs of the first resin walls, one pair of the two pairs of the first resin walls face each other across one set of two sets of sides of the quadrangular planar shape of the first light-emitting element in the plan view, and the other pair of the two pairs of the first resin walls face each other across the other set of the two sets of sides of the quadrangular planar shape of the first light-emitting element in the plan view.

18. The light-emitting device according to claim 12, wherein the plurality of resin walls comprise at least one resin wall comprising:

a first lateral surface in contact with any one of the first reflective member, the second reflective member, and the third reflective member, an upper surface, and a tapered surface positioned between the first lateral surface and the upper surface, the upper surface of the at least one resin wall is positioned above an upper end of the first lateral surface, and the tapered surface is inclined from the first lateral surface toward the upper surface.

19. The light-emitting device according to claim 18, further comprising:

a light-transmissive resin member, the light-transmissive resin member disposed in a first recessed portion and covering at least the first light-emitting element and the first reflective member.

20. The light-emitting device according to claim 13, wherein the primary surface of the resin package further comprises a first connection region where a part of one lead of the plurality of leads is exposed and a second connection region where a part of another lead of the plurality of leads is exposed, the first light-emitting element is electrically connected to the first connection region and the second connection region by a wire, and the at least one first resin wall comprises a resin wall positioned between the first light-emitting element and at least one of the first connection region or the second connection region in the plan view.

21. The light-emitting device according to claim 13, wherein the primary surface of the resin package further comprises a first connection region where a part of one lead of the plurality of leads is exposed and a second connection region where a part of another lead of the plurality of leads is exposed, the first light-emitting element is electrically connected to the first connection region by a first wire and electrically connected to the second connection region by a second wire, and in the plan view, the first wire extends from the first light-emitting element across a space between the pair of first resin walls to the first connection region and the second wire extends from the first light-emitting element across the space between the pair of first resin walls to the second connection region.

22. The light-emitting device according to claim 11, wherein in the plan view, the first reflective member is positioned inside the first lens portion, the second reflective member is positioned inside the second lens portion, and the third reflective member is positioned inside the third lens portion.

23. The light-emitting device according to claim 11, wherein the first light-emitting element emits first light, the second light-emitting element emits second light, the third light-emitting element emits third light, the first light, the second light, and the third light have wavelengths different from one another, the light-emitting device further comprises:

in between the resin package and the mold resin portion, a first colored resin member having a color similar to the first light, a second colored resin member having a color similar to the second light, and a third colored resin member having a color similar to the third light, at least a part of the first colored resin member is positioned in the first region, at least a part of the second colored resin member is positioned in the second region, and at least a part of the third colored resin member is positioned in the third region.

24. The light-emitting device according to claim 10, wherein at least a part of the first colored resin member is positioned on the first reflective member, at least a part of the second colored resin member is positioned on the second reflective member, and at least a part of the third colored resin member is positioned on the third reflective member.

25. The light-emitting device according to claim 1, wherein the mold resin portion further comprises a base portion configured to seal the first light-emitting element, the second light-emitting element, and the third light-emitting element, and each of the first lens portion, the second lens portion, and the third lens portion has a convex shape protruding upward from an upper surface of the base portion.

26. The light-emitting device according to claim 1, wherein each of the first light-emitting element, the second light-emitting element, and the third light-emitting element has a rectangular planar shape, and sides of the rectangular planar shape of at least one light-emitting element of the first light-emitting element, the second light-emitting element, or the third light-emitting element, in the plan view, is non-parallel to corresponding sides of the rectangular planar shape of a light-emitting element of the first light-emitting element, the second light-emitting element, and the third light-emitting element other than the at least one light-emitting element.

27. The light-emitting device according to claim 1, wherein a height of a vertex of at least one lens portion of the first lens portion, the second lens portion, or the third lens portion is greater than a height of a vertex of a lens portion of the first lens portion, the second lens portion, and the third lens portion other than the at least one lens portion.

28. The light-emitting device according to claim 1, wherein each of the first light-emitting element, the second light-emitting element, and the third light-emitting element comprises a first surface positioned proximate to the plurality of leads, a second surface positioned opposite to the first surface, and at least one electrode positioned on the second surface, and the at least one electrode of each of the first light-emitting element, the second light-emitting element, and the third light-emitting element is disposed on a line connecting a center point, in the plan view, of the first lens portion, a center point, in the plan view, of the second lens portion, and a center point, in the plan view, of the third lens portion.

29. The light-emitting device according to claim 11, wherein the primary surface of the resin package comprises one recessed portion defined by the resin member and the plurality of leads, and an inner upper surface of the one recessed portion comprises the first region, the second region, and the third region, on the primary surface of the resin package, the resin member comprises a first resin portion positioned on the inner upper surface of the one recessed portion, and a second resin portion surrounding the inner upper surface of the one recessed portion in the plan view, the first resin portion comprises at least one protruding portion, and a height of an upper surface of the at least one protruding portion is identical to a height of the upper surface of the second resin portion.

30. The light-emitting device according to claim 29, wherein the first resin portion comprises a step surface oriented in a direction identical to the primary surface on a lateral surface of the at least one protruding portion.

31. The light-emitting device according to claim 30, wherein an upper surface of the first light-emitting element is positioned above the step surface.

32. The light-emitting device according to claim 29, wherein the upper surface of the at least one protruding portion comprises a depression.

* * * * *